(12) United States Patent
Jeong et al.

(10) Patent No.: US 9,537,509 B2
(45) Date of Patent: Jan. 3, 2017

(54) TRANSMITTING APPARATUS AND INTERLEAVING METHOD THEREOF

(71) Applicant: SAMSUNG ELECTRONICS CO., LTD., Suwon-si (KR)

(72) Inventors: Hong-sil Jeong, Suwon-si (KR); Kyung-Joong Kim, Seoul (KR); Se-ho Myung, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/130,001

(22) Filed: Apr. 15, 2016

(65) Prior Publication Data

US 2016/0233886 A1 Aug. 11, 2016

Related U.S. Application Data

(63) Continuation of application No. 14/662,379, filed on Mar. 19, 2015.

(60) Provisional application No. 61/955,410, filed on Mar. 19, 2014.

(30) Foreign Application Priority Data

Jan. 5, 2015 (KR) .................. 10-2015-0000677

(51) Int. Cl.
*H03M 13/00* (2006.01)
*H03M 13/11* (2006.01)
*H04L 1/00* (2006.01)
*H04L 27/36* (2006.01)

(52) U.S. Cl.
CPC ....... *H03M 13/1111* (2013.01); *H03M 13/611* (2013.01); *H04L 1/0041* (2013.01); *H04L 1/0057* (2013.01); *H04L 1/0071* (2013.01); *H04L 27/36* (2013.01)

(58) Field of Classification Search
None
See application file for complete search history.

(56) References Cited

U.S. PATENT DOCUMENTS 6,633,856 B2 * 10/2003 Richardson ........ H03M 13/1114
341/107
6,789,227 B2 * 9/2004 De Souza .......... H03M 13/1102
714/758

(Continued)

OTHER PUBLICATIONS

Communication dated May 29, 2015, issued by the International Search Authority in counterpart International Application No. PCT/KR2015/002677 (PCT/ISA/210).

(Continued)

*Primary Examiner* — M. Mujtaba Chaudry
(74) *Attorney, Agent, or Firm* — Sughrue Mion, PLLC

(57) ABSTRACT

A transmitting apparatus is provided. The transmitting apparatus includes: an encoder configured to generate a Low Density Parity Check (LDPC) codeword by LDPC encoding based on a parity check matrix; an interleaver configured to interleave the LDPC codeword; and a modulator configured to map the interleaved LDPC codeword onto a plurality of modulation symbols, wherein the modulator is configured to map bits included in a predetermined bit group from among a plurality of bit groups constituting the LDPC codeword onto a predetermined bit of each of the modulation symbols.

3 Claims, 22 Drawing Sheets

(56) References Cited

U.S. PATENT DOCUMENTS

| | | | |
|---|---|---|---|
| 6,895,547 B2* | 5/2005 | Eleftheriou | H03M 13/1162 714/801 |
| 2002/0051501 A1* | 5/2002 | Demjanenko | H04L 1/0013 375/298 |
| 2007/0011570 A1 | 1/2007 | Jeong et al. | |
| 2009/0063929 A1* | 3/2009 | Jeong | H03M 13/1165 714/752 |
| 2009/0125781 A1 | 5/2009 | Jeong et al. | |
| 2011/0119568 A1 | 5/2011 | Jeong et al. | |
| 2011/0258518 A1 | 10/2011 | Shen et al. | |
| 2015/0100845 A1* | 4/2015 | Myung | H03M 13/2778 714/752 |
| 2015/0121176 A1* | 4/2015 | Myung | H04L 1/0041 714/776 |
| 2015/0128005 A1* | 5/2015 | Jeong | H03M 13/036 714/752 |

OTHER PUBLICATIONS

Written Opinion dated May 29, 2015, Issued by the International Search Authority in counterpart International Application No. PCT/KR2015/002677 (PCT/ISA/237).

* cited by examiner

TRANSMITTING APPARATUS AND INTERLEAVING METHOD THEREOF

CROSS-REFERENCE TO THE RELATED APPLICATIONS

This is a continuation of U.S. patent application Ser. No. 14/662,379, filed Mar. 19, 2015, which claims priority from U.S. Provisional Application No. 61/955,410 filed on Mar. 19, 2014, and Korean Patent Application No. 10-2015-0000677 filed on Jan. 5, 2015. The entire disclosures of the prior applications are considered part of the disclosure of this continuation application, and are hereby incorporated by reference.

BACKGROUND

1. Field

Apparatuses and methods consistent with exemplary embodiments relate to a transmitting apparatus and an interleaving method thereof, and more particularly, to a transmitting apparatus which processes and transmits data, and an interleaving method thereof.

2. Description of the Related Art

In the 21st century information-oriented society, broadcasting communication services are moving into an era of digitalization, multi-channel, wideband, and high quality. In particular, as higher quality digital televisions, portable multimedia players (PMPs) and portable broadcasting equipment are increasingly used in recent years, there is an increasing demand for methods for supporting various receiving methods of digital broadcasting services.

In order to meet such demand, standard groups are establishing various standards and are providing a variety of services to satisfy users' needs. Therefore, there is a need for a method for providing improved services to users with more robust encoding, decoding and receiving performance.

SUMMARY

One or more exemplary embodiments may overcome the above disadvantages and other disadvantages not described above. However, it is understood that one or more exemplary embodiment are not required to overcome the disadvantages described above, and may not overcome any of the problems described above.

One or more exemplary embodiments provide a transmitting apparatus which can map a bit included in a predetermined group from among a plurality of groups of a Low Density Parity Check (LDPC) codeword onto a predetermined bit of a modulation symbol, and transmit the bit, and an interleaving method thereof.

According to an aspect of an exemplary embodiment, there is provided a transmitting apparatus which may include: an encoder configured to generate an LDPC codeword by LDPC encoding based on a parity check matrix; an interleaver configured to interleave the LDPC codeword; and a modulator configured to map the interleaved LDPC codeword onto a plurality of modulation symbols, wherein the modulator is configured to map bits included in a predetermined bit group from among a plurality of bit groups constituting the LDPC codeword onto a predetermined bit of each of the modulation symbols.

Each of the plurality of bit groups may be formed of M number of bits, and M may be a common divisor of $N_{ldpc}$ and $K_{ldpc}$ and determined to satisfy $Q_{ldpc}=(N_{ldpc}-K_{ldpc})/M$. $Q_{ldpc}$ may be a cyclic shift parameter value regarding columns in a column group of an information word submatrix of the parity check matrix, $N_{ldpc}$ may be a length of the LDPC codeword, and $K_{ldpc}$ may be a length of information word bits of the LDPC codeword.

The interleaver may include: a parity interleaver configured to interleave parity bits of the LDPC codeword; a group interleaver configured to perform group interleaving on the parity-interleaved LDPC codeward by dividing the parity-interleaved LDPC codeword by the plurality of bit groups and rearranging an order of the plurality of bit groups in bits group wise; and a block interleaver configured to interleave the plurality of bit groups the order of which is rearranged.

The group interleaver may be configured to rearrange the order of the plurality of bit groups in bits group wise by using Equation 15.

In Equation 15, $\pi(j)$ may be determined based on at least one of a length of the LDPC codeword, a modulation method, and a code rate.

When the LDPC codeword has a length of 64800, the modulation method is 1024-QAM, and the code rate is 6/15, $\pi(j)$ may be defined as in table 9.

When the LDPC codeword has a length of 64800, the modulation method is 1024-QAM, and the code rate is 8/15, $\pi(j)$ may be defined as in table 10.

When the LDPC codeword has a length of 64800, the modulation method is 1024-QAM, and the code rate is 12/15, $\pi(j)$ may be defined as in table 13:

The block interleaver may be configured to interleave by writing the plurality of bit groups in each of a plurality of columns in bits group wise in a column direction, and reading each row of the plurality of columns in which the plurality of bit groups are written in bits group wise in a row direction.

The block interleaver may be configured to serially write, in the plurality of columns, at least one bit group which is writable in the plurality of columns in bits group wise from among the plurality of bit groups, and divide and write bit groups other than the at least one bit group from among the plurality of bit groups in an area of the plurality of columns other than an area where the at least some bit group is written in the plurality of columns in bits group wise.

According to an aspect of another exemplary embodiment, there is provided an interleaving method of a transmitting apparatus which may include: generating an LDPC codeword by LDPC encoding based on a parity check matrix; interleaving the LDPC codeword; and mapping the interleaved LDPC codeword onto a plurality of modulation symbols, wherein the mapping comprises mapping bits included in a predetermined bit group from among a plurality of bit groups constituting the LDPC codeword onto a predetermined bit of each of the modulation symbols.

Each of the plurality of bit groups may be formed of 360 bits, and M may be a common divisor of $N_{ldpc}$ and $K_{ldpc}$ and may be determined to satisfy $Q_{ldpc}=(N_{ldpc}-K_{ldpc})/M$. $Q_{ldpc}$ may be a cyclic shift parameter value regarding columns in a column group of an information word submatrix of the parity check matrix, $N_{ldpc}$ may be a length of the LDPC codeword, and $K_{ldpc}$ may be a length of information word bits of the LDPC codeword.

The interleaving may include: interleaving parity bits of the LDPC codeword; group interleaving on the parity-interleaved LDPC codeward by dividing the parity-interleaved LDPC codeword by the plurality of bit groups and rearranging an order of the plurality of bit groups in bits group wise; and; and interleaving the plurality of bit groups the order of which is rearranged.

The rearranging in bits group wise may include rearranging the order of the plurality of bit groups in bits group wise by using Equation 15.

In Equation 15, $\pi(j)$ may be determined based on at least one of a length of the LDPC codeword, a modulation method, and a code rate.

When the LDPC codeword has a length of 64800, the modulation method is 1024-QAM, and the code rate is 6/15, $\pi(j)$ may be defined as in table 9.

When the LDPC codeword has a length of 64800, the modulation method is 1024-QAM, and the code rate is 8/15, $\pi(j)$ may be defined as in table 10.

When the LDPC codeword has a length of 64800, the modulation method is 1024-QAM, and the code rate is 12/15, $\pi(j)$ may be defined as in table 13.

The interleaving the plurality of bit groups may include interleaving by writing the plurality of bit groups in each of a plurality of columns in bits group wise in a column direction, and reading each row of the plurality of columns in which the plurality of bit groups are written in bits group wise in a row direction.

The interleaving the plurality of bit groups may include: serially writing, in the plurality of columns, at least one bit group which is writable in the plurality of columns in bits group wise from among the plurality of bit groups; and dividing and writing bit groups other than the at least one bit group from among the plurality of bit groups in an area of the plurality of columns other than an area where the at least some bit group is written in the plurality of columns in bits group wise.

According to various exemplary embodiments as described above, improved decoding and receiving performance can be provided.

BRIEF DESCRIPTION OF THE DRAWINGS

The above and/or other aspects will be more apparent by describing in detail exemplary embodiments, with reference to the accompanying drawings, in which.

DETAILED DESCRIPTION OF THE EXEMPLARY EMBODIMENTS

Figure 1:
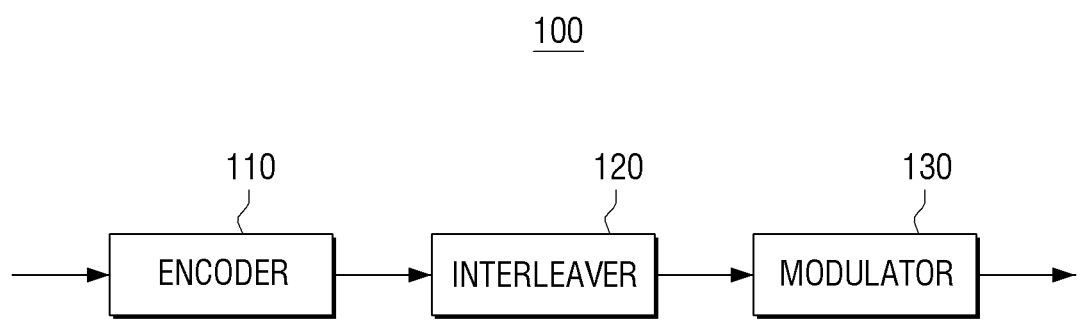
FIG. 1 is a block diagram to illustrate a configuration of a transmitting apparatus according to an exemplary embodiment.

Hereinafter, various exemplary embodiments will be described in greater detail with reference to the accompanying drawings.

In the following description, the same reference numerals are used for the same elements when they are depicted in different drawings. The matters defined in the description, such as detailed construction and elements, are provided to assist in a comprehensive understanding of the exemplary embodiments. Thus, it is apparent that the exemplary embodiments can be carried out without those specifically defined matters. Also, functions or elements known in the related art are not described in detail since they would obscure the exemplary embodiments with unnecessary detail.

FIG. 1 is a block diagram to illustrate a configuration of a transmitting apparatus according to an exemplary embodiment. Referring to FIG. 1, the transmitting apparatus 100 includes an encoder 110, an interleaver 120, and a modulator 130 (or a constellation mapper).

The encoder 110 generates a Low Density Parity Check (LDPC) codeword by performing LDPC encoding based on a parity check matrix. The encoder 110 may include an LDPC encoder (not shown) to perform the LDPC encoding.

Specifically, the encoder 110 LDPC-encodes information word (or information) bits to generate the LDPC codeword which is formed of the information word bits and parity bits (that is, LDPC parity bits). Here, bits input to the encoder 110 may be used as the information word bits. Also, since the LDPC code is a systematic code, the information word bits may be included in the LDPC codeword as they are.

The LDPC codeword is formed of the information word bits and the parity bits. For example, the LDPC codeword is formed of $N_{ldpc}$ number of bits, and includes $K_{ldpc}$ number of information word bits and $N_{parity}=N_{ldpc}-K_{ldpc}$ number of parity bits.

In this case, the encoder 110 may generate the LDPC codeword by performing the LDPC encoding based on the parity check matrix. That is, since the LDPC encoding is a process for generating an LDPC codeword to satisfy $H \cdot C^T = 0$, the encoder 110 may use the parity check matrix when performing the LDPC encoding. Herein, H is a parity check matrix and C is an LDPC codeword.

For the LDPC encoding, the transmitting apparatus 100 may include a separate memory and may pre-store parity check matrices of various formats.

For example, the transmitting apparatus 100 may pre-store parity check matrices which are defined in Digital Video Broadcasting-Cable version 2 (DVB-C2), Digital Video Broadcasting-Satellite-Second Generation (DVB-S2), Digital Video Broadcasting-Second Generation Terrestrial (DVB-T2), etc., or may pre-store parity check matrices which are defined in the North America digital broadcasting standard system Advanced Television System Committee (ATSC) 3.0 standards, which are currently being established. However, this is merely an example and the transmitting apparatus 100 may pre-store parity check matrices of other formats in addition to these parity check matrices.

Hereinafter, a parity check matrix according to various exemplary embodiments will be explained in detail with reference to the drawings. In the parity check matrix, elements other than elements with 1 have 0.

Figure 2:
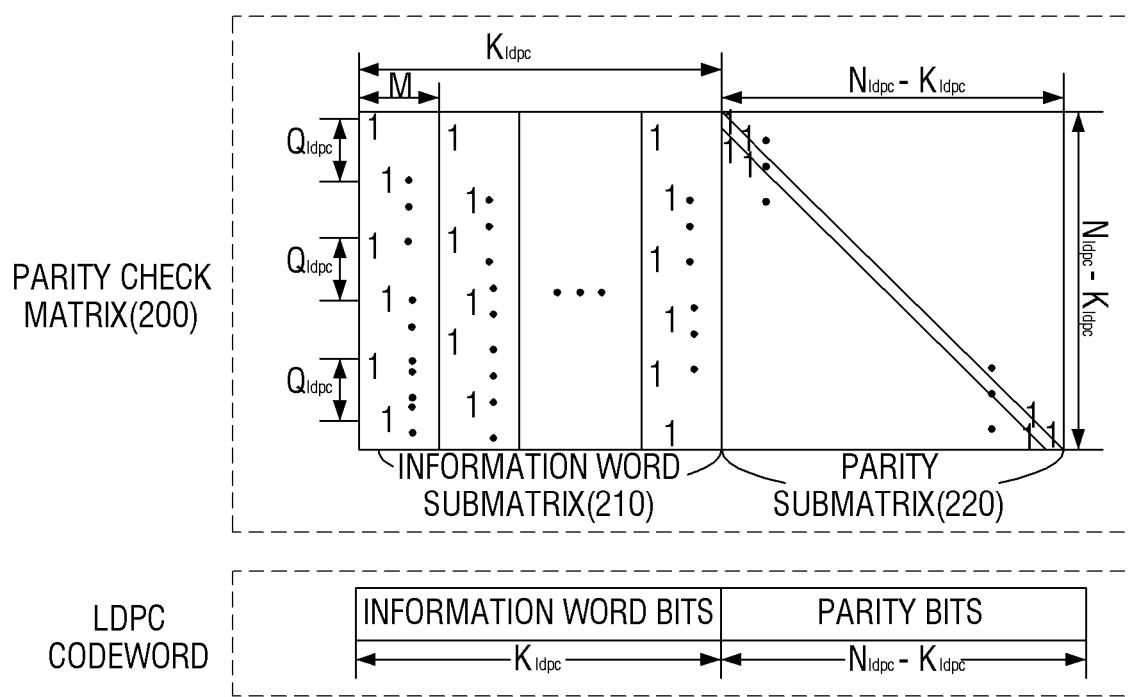
FIGS. 2 and 3 are views to illustrate a configuration of a parity check matrix according to various exemplary embodiments.
Figure 3:
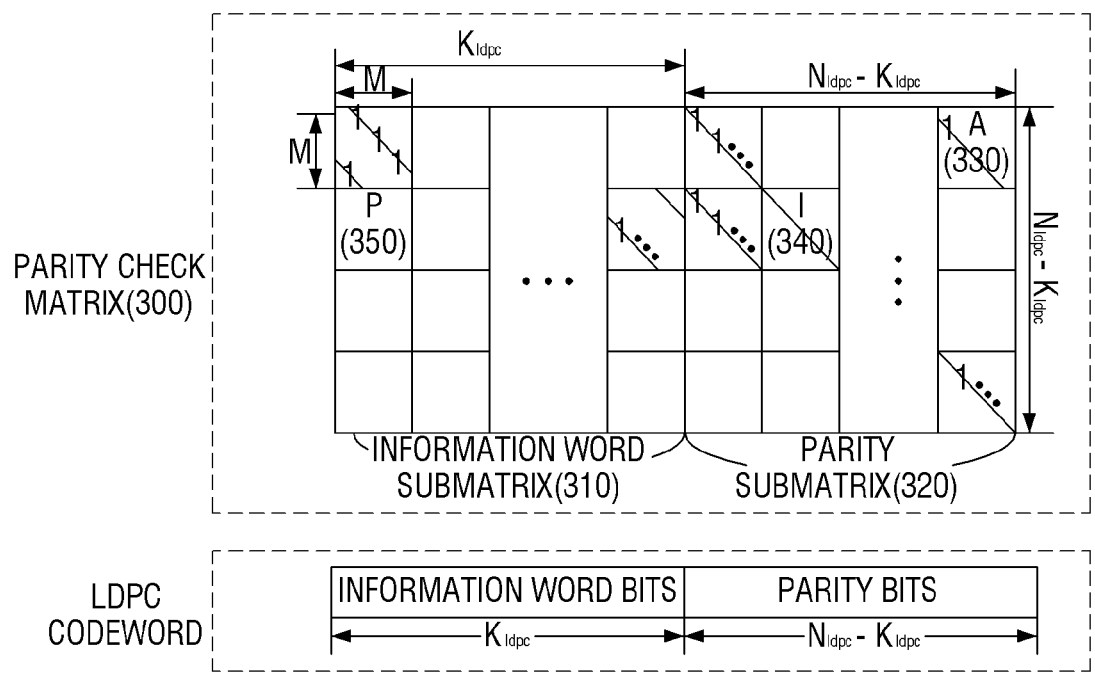

For example, the parity check matrix according to an exemplary embodiment may have the configuration of FIGS. 2 and 3.

Referring to FIG. 2, the parity check matrix 200 is formed of an information word submatrix (or information submatrix) 210 corresponding to information word bits, and a parity submatrix 220 corresponding to parity bits. In the parity check matrix 200, elements other than elements with 1 have 0.

The information word submatrix 210 includes $K_{ldpc}$ number of columns and the parity submatrix 220 includes $N_{parity}=N_{ldpc}-K_{ldpc}$ number of columns. The number of rows of the parity check matrix 200 is identical to the number of columns of the parity submatrix 220, $N_{parity}=N_{ldpc}-K_{ldpc}$.

In addition, in the parity check matrix 200, $N_{ldpc}$ is a length of an LDPC codeword, $K_{ldpc}$ is a length of information word bits, and $N_{parity}=N_{ldpc}-K_{ldpc}$ is a length of parity bits. The length of the LDPC codeword, the information word bits, and the parity bits mean the number of bits included in each of the LDPC codeword, the information word bits, and the parity bits.

Hereinafter, the configuration of the information word submatrix 210 and the parity submatrix 220 will be explained in detail.

The information word submatrix 210 includes $K_{ldpc}$ number of columns (that is, $0^{th}$ column to $(K_{ldpc}-1)^{th}$ column), and follows the following rules:

First, M number of columns from among $K_{ldpc}$ number of columns of the information word submatrix 210 belong to a same group, and $K_{ldpc}$ number of columns is divided into $K_{ldpc}/M$ number of column groups. In each column group, a column is cyclic-shifted from an immediately previous column by $Q_{ldpc}$ or $Q_{ldpc}$ number of bits. That is, $Q_{ldpc}$ may be a cyclic shift parameter value regarding columns in a column group of the information word submatrix 210 of the parity check matrix 200.

Herein, M is an interval at which a pattern of a column group, which includes a plurality of columns, is repeated in the information word submatrix 210 (e.g., M=360), and $Q_{ldpc}$ is a size by which one column is cyclic-shifted from an immediately previous column in a same column group in the information word submatrix 210. Also, M is a common divisor of $N_{ldpc}$ and $K_{ldpc}$ and is determined to satisfy $Q_{ldpc}=(N_{ldpc}-K_{ldpc})/M$. Here, M and $Q_{ldpc}$ are integers and $K_{ldpc}/M$ is also an integer. M and $Q_{ldpc}$ may have various values according to the length of the LDPC codeword and a code rate (CR) or a coding rate.

For example, when M=360 and the length of the LDPC codeword, $N_{ldpc}$, is 64800, $Q_{ldpc}$ may be defined as in Table 1 presented below, and, when M=360 and the length $N_{ldpc}$ of the LDPC codeword is 16200, $Q_{ldpc}$ may be defined as in Table 2 presented below.

TABLE 1

| Code Rate | $N_{ldpc}$ | M | $Q_{ldpc}$ |
|---|---|---|---|
| 5/15 | 64800 | 360 | 120 |
| 6/15 | 64800 | 360 | 108 |
| 7/15 | 64800 | 360 | 96 |
| 8/15 | 64800 | 360 | 84 |
| 9/15 | 64800 | 360 | 72 |

TABLE 1-continued

| Code Rate | $N_{ldpc}$ | M | $Q_{ldpc}$ |
|---|---|---|---|
| 10/15 | 64800 | 360 | 60 |
| 11/15 | 64800 | 360 | 48 |
| 12/15 | 64800 | 360 | 36 |
| 13/15 | 64800 | 360 | 24 |

TABLE 2

| Code Rate | $N_{ldpc}$ | M | $Q_{ldpc}$ |
|---|---|---|---|
| 5/15 | 16200 | 360 | 30 |
| 6/15 | 16200 | 360 | 27 |
| 7/15 | 16200 | 360 | 24 |
| 8/15 | 16200 | 360 | 21 |
| 9/15 | 16200 | 360 | 18 |
| 10/15 | 16200 | 360 | 15 |
| 11/15 | 16200 | 360 | 12 |
| 12/15 | 16200 | 360 | 9 |
| 13/15 | 16200 | 360 | 6 |

Second, when the degree of the $0^{th}$ column of the $i^{th}$ column group (i=0, 1, ..., $K_{ldpc}/M-1$) is $D_i$ (herein, the degree is the number of value 1 existing in each column and all columns belonging to the same column group have the same degree), and a position (or an index) of each row where 1 exists in the $0^{th}$ column of the $i^{th}$ column group is $R_{i,0}^{(0)}$, $R_{i,0}^{(1)}, \ldots, R_{i,0}^{(D_i-1)}$, an index $R_{i,j}^{(k)}$ of a row where $k^{th}$ 1 is located in the $j^{th}$ column in the $i^{th}$ column group is determined by following Equation 1:

$$R_{i,j}^{(k)}=R_{i,(j-1)}^{(k)}+Q_{ldpc} \bmod(N_{ldpc}-K_{ldpc}) \quad (1),$$

where k=0, 1, 2, ... $D_i-1$; i=0, 1, ..., $K_{ldpc}/M-1$; and j=1, 2, ..., M-1.

Equation 1 can be expressed as following Equation 2:

$$R_{i,j}^{(k)}=\{R_{i,0}^{(k)}+(j \bmod M) \times Q_{ldpc}\} \bmod(N_{ldpc}-K_{ldpc}) \quad (2),$$

where k=0, 1, 2, ... $D_i-1$; i=0, 1, ..., $K_{ldpc}/M-1$; and j=1, 2, ..., M-1. Since j=1, 2, ..., M-1, (j mod M) of Equation 2 may be regarded as j.

In the above equations, $R_{i,j}^{(k)}$ is an index of a row where $k^{th}$ 1 is located in the $j^{th}$ column in the $i^{th}$ column group, $N_{ldpc}$ is a length of an LDPC codeword, $K_{ldpc}$ is a length of information word bits, Di is a degree of columns belonging to the $i^{th}$ column group, M is the number of columns belonging to a single column group, and $Q_{ldpc}$ is a size by which each column in the column group is cyclic-shifted.

As a result, referring to these equations, when only $R_{i,0}^{(k)}$ is known, the index $R_{i,j}^{(k)}$ of the row where the $k^{th}$ 1 is located in the $j^{th}$ column in the $i^{th}$ column group can be known. Therefore, when the index value of the row where the $k^{th}$ 1 is located in the $0^{th}$ column of each column group is stored, a position of column and row where 1 is located in the parity check matrix 200 having the configuration of FIG. 2 (that is, in the information word submatrix 210 of the parity check matrix 200) can be known.

According to the above-described rules, all of the columns belonging to the $i^{th}$ column group have the same degree $D_i$. Accordingly, the LDPC codeword which stores information on the parity check matrix according to the above-described rules may be briefly expressed as follows.

For example, when $N_{ldpc}$ is 30, $K_{ldpc}$ is 15, and $Q_{ldpc}$ is 3, position information of the row where 1 is located in the $0^{th}$ column of the three column groups may be expressed by a sequence of Equations 3 and may be referred to as "weight-1 position sequence".

$$R_{1,0}^{(1)}=1, R_{1,0}^{(2)}=2, R_{1,0}^{(3)}=8, R_{1,0}^{(4)}=10,$$

$$R_{2,0}^{(1)}=0, R_{2,0}^{(2)}=9, R_{2,0}^{(3)}=13,$$

$$R_{3,0}^{(1)}=0, R_{3,0}^{(2)}=14. \quad (3),$$

where $R_{i,j}^{(k)}$ is an index of a row where $k^{th}$ 1 is located in the $j^{th}$ column in the $i^{th}$ column group.

The weight-1 position sequence like Equation 3 which expresses an index of a row where 1 is located in the $0^{th}$ column of each column group may be briefly expressed as in Table 3 presented below:

TABLE 3

1 2 8 10
0 9 13
0 14

Table 3 shows positions of elements having value 1 in the parity check matrix, and the $i^{th}$ weight-1 position sequence is expressed by indexes of rows where 1 is located in the $0^{th}$ column belonging to the $i^{th}$ column group.

The information word submatrix 210 of the parity check matrix according to an exemplary embodiment may be defined as in Tables 4 to 8 presented below, based on the above descriptions.

Specifically, Tables 4 to 8 show indexes of rows where 1 is located in the $0^{th}$ column of the $i^{th}$ column group of the information word submatrix 210. That is, the information word submatrix 210 is formed of a plurality of column groups each including M number of columns, and positions of 1 in the $0^{th}$ column of each of the plurality of column groups may be defined by Tables 4 to 8.

Herein, the indexes of the rows where 1 is located in the $0^{th}$ column of the $i^{th}$ column group mean "addresses of parity bit accumulators". The "addresses of parity bit accumulators" have the same meaning as defined in the DVB-C2/S2/T2 standards or the ATSC 3.0 standards which are currently being established, and thus, a detailed explanation thereof is omitted.

For example, when the length $N_{ldpc}$ of the LDPC codeword is 64800, the code rate is 6/15, and M is 360, the indexes of the rows where 1 is located in the $0^{th}$ column of the $i^{th}$ column group of the information word submatrix 210 are as shown in Table 4 presented below:

TABLE 4

| i | Index of row where 1 is located in the 0th column of the ith column group |
|---|---|
| 0 | 1606 3402 4961 6751 7132 11516 12300 12482 12592 13342 13764 14123 21576 23946 24533 25376 25667 26836 31799 34173 35462 36153 36740 37085 37152 37468 37658 |
| 1 | 4621 5007 6910 8732 9757 11508 13099 15513 16335 18052 19512 21319 23663 25628 27208 31333 32219 33003 33239 33447 36200 36473 36938 37201 37283 37495 38642 |
| 2 | 16 1094 2020 3080 4194 5098 5631 6877 7889 8237 9804 10067 11017 11366 13136 13354 15379 18934 20199 24522 26172 28666 30386 32714 36390 37015 37162 |
| 3 | 700 897 1708 6017 6490 7372 7825 9546 10398 16605 18561 18745 21625 22137 23693 24340 24966 25015 26995 28586 28895 29687 33938 34520 34858 37056 38297 |
| 4 | 159 2010 2573 3617 4452 4958 5556 5832 6481 8227 9924 10836 14954 15594 16623 18065 19249 22394 22677 23408 23731 24076 24776 27007 28222 30343 38371 |

TABLE 4-continued

| i | Index of row where 1 is located in the 0th column of the ith column group |
|---|---|
| 5 | 3118 3545 4768 4992 5227 6732 8170 9397 10522 11508 15536 20218 21921 28599 29445 29758 29968 31014 32027 33685 34378 35867 36323 36728 36870 38335 38623 |
| 6 | 1264 4254 6936 9165 9486 9950 10861 11653 13697 13961 15164 15665 18444 19470 20313 21189 24371 26431 26999 28086 28251 29261 31981 34015 35850 36129 37186 |
| 7 | 111 1307 1628 2041 2524 5358 7988 8191 10322 11905 12919 14127 15515 15711 17061 19024 21195 22902 23727 24401 24608 25111 25228 27338 35398 37794 38196 |
| 8 | 961 3035 7174 7948 13355 13607 14971 18189 18339 18665 18875 19142 20615 21136 21309 21758 23366 24745 25849 25982 27583 30006 31118 32106 36469 36583 37920 |
| 9 | 2990 3549 4273 4808 5707 6021 6509 7456 8240 10044 12262 12660 13085 14750 15680 16049 21587 23997 25803 28343 28693 34393 34860 35490 36021 37737 38296 |
| 10 | 955 4323 5145 6885 8123 9730 11840 12216 19194 20313 23056 24248 24830 25268 26617 26801 28557 29753 30745 31450 31973 32839 33025 33296 35710 37366 37509 |
| 11 | 264 605 4181 4483 5156 7238 8863 10939 11251 12964 16254 17511 20017 22395 22818 23261 23422 24064 26329 27723 28186 30434 31956 33971 34372 36764 38123 |
| 12 | 520 2562 2794 3528 3860 4402 5676 6963 8655 9018 9783 11933 16336 17193 17320 19035 20606 23579 23769 24123 24966 27866 32457 34011 34499 36620 37526 |
| 13 | 10106 10637 10906 34242 |
| 14 | 1856 15100 19378 21848 |
| 15 | 943 11191 27806 29411 |
| 16 | 4575 6359 13629 19383 |
| 17 | 4476 4953 18782 24313 |
| 18 | 5441 6381 21840 35943 |
| 19 | 9638 9763 12546 30120 |
| 20 | 9587 10626 11047 25700 |
| 21 | 4088 15298 28768 35047 |
| 22 | 2332 6363 8782 28863 |
| 23 | 4625 4933 28298 30289 |
| 24 | 3541 4918 18257 31746 |
| 25 | 1221 25233 26757 34892 |
| 26 | 8150 16677 27934 30021 |
| 27 | 8500 25016 33043 38070 |
| 28 | 7374 10207 16189 35811 |
| 29 | 611 18480 20064 38261 |
| 30 | 25416 27352 36089 38469 |
| 31 | 1667 17614 25839 32776 |
| 32 | 4118 12481 21912 37945 |
| 33 | 5573 13222 23619 31271 |
| 34 | 18271 26251 27182 30587 |
| 35 | 14690 26430 26799 34355 |
| 36 | 13688 16040 20716 34558 |
| 37 | 2740 14957 23436 32540 |
| 38 | 3491 14365 14681 36858 |
| 39 | 4796 6238 25203 27854 |
| 40 | 1731 12816 17344 26025 |
| 41 | 19182 21662 23742 27872 |
| 42 | 6502 13641 17509 34713 |
| 43 | 12246 12372 16746 27452 |
| 44 | 1589 21528 30621 34003 |
| 45 | 12328 20515 30651 31432 |
| 46 | 3415 22656 23427 36395 |
| 47 | 632 5209 25958 31085 |
| 48 | 619 3690 19648 37778 |
| 49 | 9528 13581 26965 36447 |
| 50 | 2147 26249 26968 28776 |
| 51 | 15698 18209 30683 |
| 52 | 1132 19888 34111 |
| 53 | 4608 25513 38874 |
| 54 | 475 1729 34100 |
| 55 | 7348 32277 38587 |
| 56 | 182 16473 33082 |
| 57 | 3865 9678 21265 |
| 58 | 4447 20151 27618 |
| 59 | 6335 14371 38711 |
| 60 | 704 9695 28858 |
| 61 | 4856 9757 30546 |
| 62 | 1993 19361 30732 |
| 63 | 756 28000 29138 |
| 64 | 3821 24076 31813 |
| 65 | 4611 12326 32291 |

TABLE 4-continued

Index of row
i where 1 is located in the 0th column of the ith column group

| i | |
|---|---|
| 66 | 7628 21515 34995 |
| 67 | 1246 13294 30068 |
| 68 | 6466 33233 35865 |
| 69 | 14484 23274 38150 |
| 70 | 21269 36411 37450 |
| 71 | 23129 26195 37653 |

In another example, when the length $N_{ldpc}$ of the LDPC codeword is 64800, the code rate is 8/15, and M is 360, the indexes of the rows where 1 is located in the $0^{th}$ column of the $i^{th}$ column group of the information word submatrix 210 are as shown in Table 5 presented below:

TABLE 5

Index of row
i where 1 is located in the 0th column of the ith column group

| i | |
|---|---|
| 0 | 2768 3039 4059 5856 6245 7013 8157 9341 9802 10470 11521 12083 16610 18361 20321 24601 27420 28206 29788 |
| 1 | 2739 8244 8891 9157 12624 12973 15534 16622 16919 18402 18780 19854 20220 20543 22306 25540 27478 27678 28053 |
| 2 | 1727 2268 6246 7815 9010 9556 10134 10472 11389 14599 15719 16204 17342 17666 18850 22058 25579 25860 29207 |
| 3 | 28 1346 3721 5565 7019 9240 12355 13109 14800 16040 16839 17369 17631 19357 19473 19891 20381 23911 29683 |
| 4 | 869 2450 4386 5316 6160 7107 10362 11132 11271 13149 16397 16532 17113 19894 22043 22784 27383 28615 28804 |
| 5 | 508 4292 5831 8559 10044 10412 11283 14810 15888 17243 17538 19903 20528 22090 22652 27235 27384 28208 28485 |
| 6 | 389 2248 5840 6043 7000 9054 11075 11760 12217 12565 13587 15403 19422 19528 21493 25142 27777 28566 28702 |
| 7 | 1015 2002 5764 6777 9346 9629 11039 11153 12690 13068 13990 16841 17702 20021 24106 26300 29332 30081 30196 |
| 8 | 1480 3084 3467 4401 4798 5187 7851 11368 12323 14325 14546 16360 17158 18010 21333 25612 26556 26906 27005 |
| 9 | 6925 8876 12392 14529 15253 15437 19226 19950 20321 23021 23651 24393 24653 26668 27205 28269 28529 29041 29292 |
| 10 | 2547 3404 3538 4666 5126 5468 7695 8799 14732 15072 15881 17410 18971 19609 19717 22150 24941 27908 29018 |
| 11 | 888 1581 2311 5511 7218 9107 10454 12252 13662 15714 15894 17025 18671 24304 25316 25556 28489 28977 29212 |
| 12 | 1047 1494 1718 4645 5030 6811 7868 8146 10611 15767 17682 18391 22614 23021 23763 25478 26491 29088 29757 |
| 13 | 59 1781 1900 3814 4121 8044 8906 9175 11156 14841 15789 16033 16755 17292 18550 19310 22505 29567 29850 |
| 14 | 1952 3057 4399 9476 10171 10769 11335 11569 15002 19501 20621 22642 23452 24360 25109 25290 25828 28505 29122 |
| 15 | 2895 3070 3437 4764 4905 6670 9244 11845 13352 13573 13975 14600 15871 17996 19672 20079 20579 25327 27958 |
| 16 | 612 1528 2004 4244 4599 4926 5843 7684 10122 10443 12267 14368 18413 19058 22985 24257 26202 26596 27899 |
| 17 | 1361 2195 4146 6708 7158 7538 9138 9998 14862 15359 16076 18925 21401 21573 22503 24146 24247 27778 29312 |
| 18 | 5229 6235 7134 7655 9139 13527 15408 16058 16705 18320 19909 20901 22238 22437 23654 25131 27550 28247 29903 |
| 19 | 697 2035 4887 5275 6909 9166 11805 15338 16381 18403 20425 20688 21547 24590 25171 26726 28848 29224 29412 |
| 20 | 5379 17329 22659 23062 |
| 21 | 11814 14759 22329 22936 |
| 22 | 2423 2811 10296 12727 |
| 23 | 8460 15260 16769 17290 |
| 24 | 14191 14608 29536 30187 |
| 25 | 7103 10069 20111 22850 |
| 26 | 4285 15413 26448 29069 |
| 27 | 548 2137 9189 10928 |
| 28 | 4581 7077 23382 23949 |
| 29 | 3942 17248 19486 27922 |
| 30 | 8668 10230 16922 26678 |
| 31 | 6158 9980 13788 28198 |
| 32 | 12422 16076 24206 29887 |
| 33 | 8778 10649 18747 22111 |
| 34 | 21029 22677 27150 28980 |
| 35 | 7918 15423 27672 27803 |

TABLE 5-continued

Index of row
i where 1 is located in the 0th column of the ith column group

| i | |
|---|---|
| 36 | 5927 18086 23525 |
| 37 | 3397 15058 30224 |
| 38 | 24016 25880 26268 |
| 39 | 1096 4775 7912 |
| 40 | 3259 17301 20802 |
| 41 | 129 8396 15132 |
| 42 | 17825 28119 28676 |
| 43 | 2343 8382 28840 |
| 44 | 3907 18374 20939 |
| 45 | 1132 1290 8786 |
| 46 | 1481 4710 28846 |
| 47 | 2185 3705 26834 |
| 48 | 5496 15681 21854 |
| 49 | 12697 13407 22178 |
| 50 | 12788 21227 22894 |
| 51 | 629 2854 6232 |
| 52 | 2289 18227 27458 |
| 53 | 7593 21935 23001 |
| 54 | 3836 7081 12282 |
| 55 | 7925 18440 23135 |
| 56 | 497 6342 9717 |
| 57 | 11199 22046 30067 |
| 58 | 12572 28045 28990 |
| 59 | 1240 2023 10933 |
| 60 | 19566 20629 25186 |
| 61 | 6442 13303 28813 |
| 62 | 4765 10572 16180 |
| 63 | 552 19301 24286 |
| 64 | 6782 18480 21383 |
| 65 | 11267 12288 15758 |
| 66 | 771 5652 15531 |
| 67 | 16131 20047 25649 |
| 68 | 13227 23035 24450 |
| 69 | 4839 13467 27488 |
| 70 | 2852 4677 22993 |
| 71 | 2504 28116 29524 |
| 72 | 12518 17374 24267 |
| 73 | 1222 11859 27922 |
| 74 | 9660 17286 18261 |
| 75 | 232 11296 29978 |
| 76 | 9750 11165 16295 |
| 77 | 4894 9505 23622 |
| 78 | 10861 11980 14110 |
| 79 | 2128 15883 22836 |
| 80 | 6274 17243 21989 |
| 81 | 10866 13202 22517 |
| 82 | 11159 16111 21608 |
| 83 | 3719 18787 22100 |
| 84 | 1756 2020 23901 |
| 85 | 20913 29473 30103 |
| 86 | 2729 15091 26976 |
| 87 | 4410 8217 12963 |
| 88 | 5395 24564 28235 |
| 89 | 3859 17909 23051 |
| 90 | 5733 26005 29797 |
| 91 | 1935 3492 29773 |
| 92 | 11903 21380 29914 |
| 93 | 6091 10469 29997 |
| 94 | 2895 8930 15594 |
| 95 | 1827 10028 20070 |

In another example, when the length $N_{ldpc}$ of the LDPC codeword is 64800, the code rate is 10/15, and M is 360, the indexes of rows where 1 exists in the $0^{th}$ column of the $i^{th}$ column group of the information word submatrix 210 are defined as shown in Table 6 or 7 below.

TABLE 6

Index of row
i where 1 is located in the 0th column of the ith column group

| i | |
|---|---|
| 0 | 979 1423 4166 4609 6341 8258 10334 10548 14098 14514 17051 17333 17653 17830 17990 |

TABLE 6-continued

| i | Index of row where 1 is located in the 0th column of the ith column group |
|---|---|
| 1 | 2559 4025 6344 6510 9167 9728 11312 14856 17104 17721 18600 18791 19079 19697 19840 |
| 2 | 3243 6894 7950 10539 12042 13233 13938 14752 16449 16727 17025 18297 18796 19400 21577 |
| 3 | 3272 3574 6341 6722 9191 10807 10957 12531 14036 15580 16651 17007 17309 19415 19845 |
| 4 | 155 4598 10201 10975 11086 11296 12713 15364 15978 16395 17542 18164 18451 18612 20617 |
| 5 | 1128 1999 3926 4069 5558 6085 6337 8386 10693 12450 15438 16223 16370 17308 18634 |
| 6 | 2408 2929 3630 4357 5852 7329 8536 8695 10603 11003 14304 14937 15767 18402 21502 |
| 7 | 199 3066 6446 6849 8973 9536 10452 12857 13675 15913 16717 17654 19802 20115 21579 |
| 8 | 312 870 2095 2586 5517 6196 6757 7311 7368 13046 15384 18576 20349 21424 21587 |
| 9 | 985 1591 3248 3509 3706 3847 6174 6276 7864 9033 13618 15675 16446 18355 18843 |
| 10 | 975 3774 4083 5825 6166 7218 7633 9657 10103 13052 14240 17320 18126 19544 20208 |
| 11 | 1795 2005 2544 3418 6148 8051 9066 9725 10676 10752 11512 15171 17523 20481 21059 |
| 12 | 167 315 1824 2325 2640 2868 6070 6597 7016 8109 9815 11608 16142 17912 19625 |
| 13 | 1298 1896 3039 4303 4690 8787 12241 13600 14478 15492 16602 17115 17913 19466 20597 |
| 14 | 568 3695 6045 6624 8131 8404 8590 9059 9246 11570 14336 18657 18941 19218 21506 |
| 15 | 228 1889 1967 2299 3011 5074 7044 7596 7689 9534 10244 10697 11691 17902 21410 |
| 16 | 1330 1579 1739 2234 3701 3865 5713 6677 7263 11172 12143 12765 17121 20011 21436 |
| 17 | 303 1668 2501 4925 5778 5985 9635 10140 10820 11779 11849 12058 15650 20426 20527 |
| 18 | 698 2484 3071 3219 4054 4125 5663 5939 6928 7086 8054 12173 16280 17945 19302 |
| 19 | 232 1619 3040 4901 7438 8135 9117 9233 10131 13321 17347 17436 18193 18586 19929 |
| 20 | 12 3721 6254 6609 7880 8139 10437 12262 13928 14065 14149 15032 15694 16264 18883 |
| 21 | 482 915 1548 1637 6687 9338 10163 11768 11970 15524 15695 17386 18787 19210 19340 |
| 22 | 1291 2500 4109 4511 5099 5194 10014 13165 13256 13972 15409 16113 16214 18584 20998 |
| 23 | 1761 4778 7444 7740 8129 8341 8931 9136 9207 10003 10678 13959 17673 18194 20990 |
| 24 | 3060 3522 5361 5692 6833 8342 8792 11023 11211 11548 11914 13987 15442 15541 19707 |
| 25 | 1322 2348 2970 5632 6349 7577 8782 9113 9267 9376 12042 12943 16680 16970 21321 |
| 26 | 6785 11960 21455 |
| 27 | 1223 15672 19550 |
| 28 | 5976 11335 20385 |
| 29 | 2818 9387 15317 |
| 30 | 2763 3554 18102 |
| 31 | 5230 11489 18997 |
| 32 | 5809 15779 20674 |
| 33 | 2620 17838 18533 |
| 34 | 3025 9342 9931 |
| 35 | 3728 5337 12142 |
| 36 | 2520 6666 9164 |
| 37 | 12892 15307 20912 |
| 38 | 10736 12393 16539 |
| 39 | 1075 2407 12853 |
| 40 | 4921 5411 18206 |
| 41 | 5955 15647 16838 |
| 42 | 6384 10336 19266 |
| 43 | 429 10421 17266 |
| 44 | 4880 10431 12208 |
| 45 | 2910 11895 12442 |
| 46 | 7366 18362 18772 |
| 47 | 4341 7903 14994 |
| 48 | 4564 6714 7378 |
| 49 | 4639 8652 18871 |
| 50 | 15787 18048 20246 |
| 51 | 3241 11079 13640 |
| 52 | 1559 2936 15881 |
| 53 | 2737 6349 10881 |
| 54 | 10394 16107 17073 |
| 55 | 8207 9043 12874 |
| 56 | 7805 16058 17905 |
| 57 | 11189 15767 17764 |
| 58 | 5823 12923 14316 |
| 59 | 11080 20390 20924 |
| 60 | 568 8263 17411 |
| 61 | 1845 3557 6562 |
| 62 | 2890 10936 14756 |
| 63 | 9031 14220 21517 |
| 64 | 3529 12955 15902 |
| 65 | 413 6750 8735 |
| 66 | 6784 12092 16421 |
| 67 | 12019 13794 15308 |
| 68 | 12588 15378 17676 |
| 69 | 8067 14589 19304 |
| 70 | 1244 5877 6085 |
| 71 | 15897 19349 19993 |
| 72 | 1426 2394 12264 |
| 73 | 3456 8931 12075 |
| 74 | 13342 15273 20351 |
| 75 | 9138 13352 20798 |
| 76 | 7031 7626 14081 |
| 77 | 4280 4507 15617 |
| 78 | 4170 10569 14335 |
| 79 | 3839 7514 16578 |
| 80 | 4688 12815 18782 |
| 81 | 4861 7858 9435 |
| 82 | 605 5445 12912 |
| 83 | 2280 4734 7311 |
| 84 | 6668 8128 12638 |
| 85 | 3733 10621 19534 |
| 86 | 13933 18316 19341 |
| 87 | 1786 3037 21566 |
| 88 | 2202 13239 16432 |
| 89 | 4882 5808 9300 |
| 90 | 4580 8484 16754 |
| 91 | 14630 17502 18269 |
| 92 | 6889 11119 12447 |
| 93 | 8162 9078 16330 |
| 94 | 6538 17851 18100 |
| 95 | 17763 19793 20816 |
| 96 | 2183 11907 17567 |
| 97 | 6640 14428 15175 |
| 98 | 877 12035 14081 |
| 99 | 1336 6468 12328 |
| 100 | 5948 9146 12003 |
| 101 | 3782 5699 12445 |
| 102 | 1770 7946 8244 |
| 103 | 7384 12639 14989 |
| 104 | 1469 11586 20959 |
| 105 | 7943 10450 15907 |
| 106 | 5005 8153 10035 |
| 107 | 17750 18826 21513 |
| 108 | 4725 8041 10112 |
| 109 | 3837 16266 17376 |
| 110 | 11340 17361 17512 |
| 111 | 1269 4611 4774 |
| 112 | 2322 10813 16157 |
| 113 | 16752 16843 18959 |
| 114 | 70 4325 18753 |
| 115 | 3165 8153 15384 |
| 116 | 160 8045 16823 |
| 117 | 14112 16724 16792 |
| 118 | 4291 7667 18176 |
| 119 | 5943 19879 20721 |

TABLE 7

| i | Index of row where 1 is located in the 0th column of the ith column group |
|---|---|
| 0 | 316 1271 3692 9495 12147 12849 14928 16671 16938 17864 19108 20502 21097 21115 |
| 1 | 2341 2559 2643 2816 2865 5137 5331 7000 7523 8023 10439 10797 13208 15041 |
| 2 | 5556 6858 7677 10162 10207 11349 12321 12398 14787 15743 15859 15952 19313 20879 |
| 3 | 349 573 910 2702 3654 6214 9246 9353 10638 11772 14447 14953 16620 19888 |
| 4 | 204 1390 2887 3835 6230 6533 7443 7876 9299 10291 10896 13960 18287 20086 |
| 5 | 541 2429 2838 7144 8523 8637 10490 10585 11074 12074 15762 16812 17900 18548 |
| 6 | 733 1659 3838 5323 5805 7882 9429 10682 13697 16909 18846 19587 19592 20904 |
| 7 | 1134 2136 4631 4653 4718 5197 10410 11666 14996 15305 16048 17417 18960 20303 |
| 8 | 734 1001 1283 4959 10016 10176 10973 11578 12051 15550 15915 19022 19430 20121 |
| 9 | 745 4057 5855 9885 10594 10989 13156 13219 13351 13631 13685 14577 17713 20386 |
| 10 | 968 1446 2130 2502 3092 3787 5323 8104 8418 9998 11681 13972 17747 17929 |
| 11 | 3020 3857 5275 5786 6319 8608 11943 14062 17144 17752 18001 18453 19311 21414 |
| 12 | 709 747 1038 2181 5320 8292 10584 10859 13964 15009 15277 16953 20675 21509 |
| 13 | 1663 3247 5003 5760 7186 7360 10346 14211 14717 14792 15155 16128 17355 17970 |
| 14 | 516 578 1914 6147 9419 11148 11434 13289 13325 13332 19106 19257 20962 21556 |
| 15 | 5009 5632 6531 9430 9886 10621 11765 13969 16178 16413 18110 18249 20616 20759 |
| 16 | 457 2686 3318 4608 5620 5858 6480 7430 9602 12691 14664 18777 20152 20848 |
| 17 | 33 2877 5334 6851 7907 8654 10688 15401 16123 17942 17969 18747 18931 20224 |
| 18 | 87 897 7636 8663 11425 12288 12672 14199 16435 17615 17950 18953 19667 20281 |
| 19 | 1042 1832 2545 2719 2947 3672 3700 6249 6398 6833 11114 14283 17694 20477 |
| 20 | 326 488 2662 2880 3009 5357 6587 8882 11604 14374 18781 19051 19057 20508 |
| 21 | 854 1294 2436 2852 4903 6466 7761 9072 9564 10321 13638 15658 16946 19119 |
| 22 | 194 899 1711 2408 2786 5391 7108 8079 8716 11453 17303 19484 20989 21389 |
| 23 | 1631 3121 3994 5005 7810 8850 10315 10589 13407 17162 18624 18758 19311 20301 |
| 24 | 736 2424 4792 5600 6370 10061 16053 16775 18600 |
| 25 | 1254 8163 8876 9157 12141 14587 16545 17175 18191 |
| 26 | 388 6641 8974 10607 10716 14477 16825 17191 18400 |
| 27 | 5578 6082 6824 7360 7745 8655 11402 11665 12428 |
| 28 | 3603 8729 13463 14698 15210 19112 19550 20727 21052 |
| 29 | 48 1732 3805 5158 15442 16909 19854 21071 21579 |
| 30 | 11707 14014 21531 |
| 31 | 1542 4133 4925 |
| 32 | 10083 13505 21198 |
| 33 | 14300 15765 16752 |
| 34 | 778 1237 11215 |
| 35 | 1325 3199 14534 |
| 36 | 2007 14510 20599 |
| 37 | 1996 5881 16429 |
| 38 | 5111 15018 15980 |
| 39 | 4989 10681 12810 |
| 40 | 3763 10715 16515 |
| 41 | 2259 10080 15642 |
| 42 | 9032 11319 21305 |
| 43 | 3915 15213 20884 |
| 44 | 11150 15022 20201 |
| 45 | 1147 6749 19625 |
| 46 | 12139 12939 18870 |
| 47 | 3840 4634 10244 |
| 48 | 1018 10231 17720 |
| 49 | 2708 13056 13393 |
| 50 | 5781 11588 18888 |
| 51 | 1345 2036 5252 |
| 52 | 5908 8143 15141 |
| 53 | 1804 13693 18640 |
| 54 | 10433 13965 16950 |
| 55 | 9568 10122 15945 |
| 56 | 547 6722 14015 |
| 57 | 321 12844 14095 |
| 58 | 2632 10513 14936 |
| 59 | 6369 11995 20321 |
| 60 | 9920 19136 21529 |
| 61 | 1990 2726 10183 |
| 62 | 5763 12118 15467 |
| 63 | 503 10006 19564 |
| 64 | 9839 11942 19472 |
| 65 | 11205 13552 15389 |
| 66 | 8841 13797 19697 |
| 67 | 124 6053 18224 |
| 68 | 6477 14406 21146 |
| 69 | 1224 8027 16011 |
| 70 | 3046 4422 17717 |
| 71 | 739 12308 17760 |
| 72 | 4014 4130 7835 |
| 73 | 2266 5652 11981 |
| 74 | 2711 7970 18317 |
| 75 | 2196 15229 17217 |
| 76 | 8636 13302 16764 |
| 77 | 5612 15010 16657 |
| 78 | 615 1249 4639 |
| 79 | 3821 12073 18506 |
| 80 | 1066 16522 21536 |
| 81 | 11307 18363 19740 |
| 82 | 3240 8560 10391 |
| 83 | 3124 11424 20779 |
| 84 | 1604 8861 17394 |
| 85 | 2083 7400 8093 |
| 86 | 3218 7454 9155 |
| 87 | 9855 15998 20533 |
| 88 | 316 2850 20652 |
| 89 | 5583 9768 10333 |
| 90 | 7147 7713 18339 |
| 91 | 12607 17428 21418 |
| 92 | 14216 16954 18164 |
| 93 | 8477 15970 18488 |
| 94 | 1632 8032 9751 |
| 95 | 4573 9080 13507 |
| 96 | 11747 12441 13876 |
| 97 | 1183 15605 16675 |
| 98 | 4408 10264 17109 |
| 99 | 5495 7882 12150 |
| 100 | 1010 3763 5065 |
| 101 | 9828 18054 21599 |
| 102 | 6342 7353 15358 |
| 103 | 6362 9462 19999 |
| 104 | 7184 13693 17622 |
| 105 | 4343 4654 10995 |
| 106 | 7099 8466 18520 |
| 107 | 11505 14395 15138 |
| 108 | 6779 16691 18726 |
| 109 | 7146 12644 20196 |
| 110 | 5865 16728 19634 |
| 111 | 4657 8714 21246 |
| 112 | 4580 5279 18750 |
| 113 | 3767 6620 18905 |
| 114 | 9209 13093 17575 |
| 115 | 12486 15875 19791 |
| 116 | 8046 14636 17491 |
| 117 | 2120 4643 13206 |
| 118 | 6186 9675 12601 |
| 119 | 784 5770 21585 |

In another example, when the length $N_{ldpc}$ of the LDPC codeword is 64800, the code rate is 12/15, and M is 360, the indexes of rows where 1 exists in the $0^{th}$ column of the $i^{th}$ column group of the information word submatrix 210 are defined as shown in Table 8 below.

TABLE 8

| i | Index of row where 1 is located in the 0th column of the ith column group |
|---|---|
| 0 | 584 1472 1621 1867 3338 3568 3723 4185 5126 5889 7737 8632 8940 9725 |
| 1 | 221 445 590 3779 3835 6939 7743 8280 8448 8491 9367 10042 11242 12917 |
| 2 | 4662 4837 4900 5029 6449 6687 6751 8684 9936 11681 11811 11886 12089 12909 |
| 3 | 2418 3018 3647 4210 4473 7447 7502 9490 10067 11092 11139 11256 12201 12383 |
| 4 | 2591 2947 3349 3406 4417 4519 5176 6672 8498 8863 9201 11294 11376 12184 |
| 5 | 27 101 197 290 871 1727 3911 5411 6676 8701 9350 10310 10798 12439 |
| 6 | 1765 1897 2923 3584 3901 4048 6963 7054 7132 9165 10184 10824 11278 12669 |
| 7 | 2183 3740 4808 5217 5660 6375 6787 8219 8466 9037 10353 10583 11118 12762 |
| 8 | 73 1594 2146 2715 3501 3572 3639 3725 6959 7187 8406 10120 10507 10691 |
| 9 | 240 732 1215 2185 2788 2830 3499 3881 4197 4991 6425 7061 9756 10491 |
| 10 | 831 1568 1828 3424 4319 4516 4639 6018 9702 10203 10417 11240 11518 12458 |
| 11 | 2024 2970 3048 3638 3676 4152 5284 5779 5926 9426 9945 10873 11787 11837 |
| 12 | 1049 1218 1651 2328 3493 4363 5750 6483 7613 8782 9738 9803 11744 11937 |
| 13 | 1193 2060 2289 2964 3478 4592 4756 6709 7162 8231 8326 11140 11908 12243 |
| 14 | 978 2120 2439 3338 3850 4589 6567 8745 9656 9708 10161 10542 10711 12639 |
| 15 | 2403 2938 3117 3247 3711 5593 5844 5932 7801 10152 10226 11498 12162 12941 |
| 16 | 1781 2229 2276 2533 3582 3951 5279 5774 7930 9824 10920 11038 12340 12440 |
| 17 | 289 384 1980 2230 3464 3873 5958 8656 8942 9006 10175 11425 11745 12530 |
| 18 | 155 354 1090 1330 2002 2236 3559 3705 4922 5958 6576 8564 9972 12760 |
| 19 | 303 876 2059 2142 5244 5330 6644 7576 8614 9598 10410 10718 11033 12957 |
| 20 | 3449 3617 4408 4602 4727 6182 8835 8928 9372 9644 10237 10747 11655 12747 |
| 21 | 811 2565 2820 8677 8974 9632 11069 11548 11839 12107 12411 12695 12812 12890 |
| 22 | 972 4123 4943 6385 6449 7339 7477 8379 9177 9359 10074 11709 12552 12831 |
| 23 | 842 973 1541 2262 2905 5276 6758 7099 7894 8128 8325 8663 8875 10050 |
| 24 | 474 791 968 3902 4924 4965 5085 5908 6109 6329 7931 9038 9401 10568 |
| 25 | 1397 4461 4658 5911 6037 7127 7318 8678 8924 9000 9473 9602 10446 12692 |
| 26 | 1334 7571 12881 |
| 27 | 1393 1447 7972 |
| 28 | 633 1257 10597 |
| 29 | 4843 5102 11056 |
| 30 | 3294 8015 10513 |
| 31 | 1108 10374 10546 |
| 32 | 5353 7824 10111 |
| 33 | 3398 7674 8569 |
| 34 | 7719 9478 10503 |
| 35 | 2997 9418 9581 |
| 36 | 5777 6519 11229 |
| 37 | 1966 5214 9899 |
| 38 | 6 4088 5827 |
| 39 | 836 9248 9612 |
| 40 | 483 7229 7548 |
| 41 | 7865 8289 9804 |
| 42 | 2915 11098 11900 |
| 43 | 6180 7096 9481 |
| 44 | 1431 6786 8924 |
| 45 | 748 6757 8625 |
| 46 | 3312 4475 7204 |
| 47 | 1852 8958 11020 |
| 48 | 1915 2903 4006 |
| 49 | 6776 10886 12531 |
| 50 | 2594 9998 12742 |
| 51 | 159 2002 12079 |
| 52 | 853 3281 3762 |
| 53 | 5201 5798 6413 |
| 54 | 3882 6062 12047 |
| 55 | 4133 6775 9657 |
| 56 | 228 6874 11183 |
| 57 | 7433 10728 10864 |
| 58 | 7735 8073 12734 |
| 59 | 2844 4621 11779 |
| 60 | 3909 7103 12804 |
| 61 | 6002 9704 11060 |
| 62 | 5864 6856 7681 |
| 63 | 3652 5869 7605 |
| 64 | 2546 2657 4461 |
| 65 | 2423 4203 9111 |
| 66 | 244 1855 4691 |
| 67 | 1106 2178 6371 |
| 68 | 391 1617 10126 |
| 69 | 250 9259 10603 |
| 70 | 3435 4614 6924 |
| 71 | 1742 8045 9529 |
| 72 | 7667 8875 11451 |
| 73 | 4023 6108 6911 |
| 74 | 8621 10184 11650 |
| 75 | 6726 10861 12348 |
| 76 | 3228 6302 7388 |
| 77 | 1 1137 5358 |
| 78 | 381 2424 8537 |
| 79 | 3256 7508 10044 |
| 80 | 1980 2219 4569 |
| 81 | 2468 5699 10319 |
| 82 | 2803 3314 12808 |
| 83 | 8578 9642 11533 |
| 84 | 829 4585 7923 |
| 85 | 59 329 5575 |
| 86 | 1067 5709 6867 |
| 87 | 1175 4744 12219 |
| 88 | 109 2518 6756 |
| 89 | 2105 10626 11153 |
| 90 | 5192 10696 10749 |
| 91 | 6260 7641 8233 |
| 92 | 2998 3094 11214 |
| 93 | 3398 6466 11494 |
| 94 | 6574 10448 12160 |
| 95 | 2734 10755 12780 |
| 96 | 1028 7958 10825 |
| 97 | 8545 8602 10793 |
| 98 | 392 3398 11417 |
| 99 | 6639 9291 12571 |
| 100 | 1067 7919 8934 |
| 101 | 1064 2848 12753 |
| 102 | 6076 8656 12690 |
| 103 | 5504 6193 10171 |
| 104 | 1951 7156 7356 |
| 105 | 4389 4780 7889 |
| 106 | 526 4804 9141 |
| 107 | 1238 3648 10464 |
| 108 | 2587 5624 12557 |
| 109 | 5560 5903 11963 |
| 110 | 1134 2570 3297 |
| 111 | 10041 11583 12157 |
| 112 | 1263 9585 12912 |
| 113 | 3744 7898 10646 |
| 114 | 45 9074 10315 |
| 115 | 1051 6188 10038 |
| 116 | 2242 8394 12712 |
| 117 | 3598 9025 12651 |
| 118 | 2295 3540 5610 |
| 119 | 1914 4378 12423 |
| 120 | 1766 3635 12759 |
| 121 | 5177 9586 11143 |
| 122 | 943 3590 11649 |
| 123 | 4864 6905 10454 |
| 124 | 5852 6042 10421 |
| 125 | 6095 8285 12349 |
| 126 | 2070 7171 8563 |
| 127 | 718 12234 12716 |

TABLE 8-continued

| i | Index of row where 1 is located in the 0th column of the ith column group |
|---|---|
| 128 | 512 10667 11353 |
| 129 | 3629 6485 7040 |
| 130 | 2880 8865 11466 |
| 131 | 4490 10220 11796 |
| 132 | 5440 8819 9103 |
| 133 | 5262 7543 12411 |
| 134 | 516 7779 10940 |
| 135 | 2515 5843 9202 |
| 136 | 4684 5994 10586 |
| 137 | 573 2270 3324 |
| 138 | 7870 8317 10322 |
| 139 | 6856 7638 12909 |
| 140 | 1583 7669 10781 |
| 141 | 8141 9085 12555 |
| 142 | 3903 5485 9992 |
| 143 | 4467 11998 12904 |

In the above-described examples, the length of the LDPC codeword is 64800 and the code rate is 6/15, 8/15, 10/15, and 12/15. However, this is merely an example and the position of 1 in the information word submatrix 210 may be defined variously when the length of the LDPC codeword is 16200 or the code rate has different values.

According to an exemplary embodiment, even when an order of numbers, i.e., indexes, in a sequence corresponding to the $i^{th}$ column group of the parity check matrix 200 as shown in the above-described Tables 4 to 8 is changed, the changed parity check matrix is a parity check matrix used for the same LDPC code. Therefore, a case in which the order of numbers in the sequence corresponding to the $i^{th}$ column group in Tables 4 to 8 is changed is also covered by the present inventive concept.

In addition, even when an arrangement order of sequences corresponding to each column group shown in Tables 4 to 8 is changed, cycle characteristics on a graph of the LDPC code and algebraic characteristics such as degree distribution are not changed. Therefore, a case in which the arrangement order of the sequences shown in Tables 4 to 8 is changed is also covered by the present inventive concept.

In addition, even when a multiple of $Q_{ldpc}$ is equally added to all sequences corresponding to a certain column group in Tables 4 to 8, the cycle characteristics on the graph of the LDPC code or the algebraic characteristics such as degree distribution are not changed. Therefore, a result of equally adding a multiple of $Q_{ldpc}$ to the sequences shown in Tables 4 to 8 is also covered by the present inventive concept. However, it should be noted that, when the resulting value obtained by adding the multiple of $Q_{ldpc}$ to a given sequence is greater than or equal to ($N_{ldpc}-K_{ldpc}$), a value obtained by applying a modulo operation for ($N_{ldpc}-K_{ldpc}$) to the resulting value should be applied instead.

Once positions of the rows where 1 exists in the $0^{th}$ column of the $i^{th}$ column group of the information word submatrix 210 are defined as shown in Tables 4 to 8, positions of rows where 1 exists in another column of each column group may be defined since the positions of the rows where 1 exists in the $0^{th}$ column are cyclic-shifted by $Q_{ldpc}$ in the next column.

For example, in the case of Table 4, in the $0^{th}$ column of the $0^{th}$ column group of the information word submatrix 210, 1 exists in the $1606^{th}$ row, $3402^{nd}$ row, $4961^{st}$ row, . . . .

In this case, since $Q_{ldpc}=(N_{ldpc}-K_{ldpc})/M=(64800-25920)/360=108$, the indexes of the rows where 1 is located in the $1^{st}$ column of the $0^{th}$ column group may be 1714(=1606+108), 3510(=3402+108), 5069(=4961+108), . . . , and the indexes of the rows where 1 is located in the $2^{nd}$ column of the $0^{th}$ column group may be 1822(=1714+108), 3618(=3510+108), 5177(=5069+108) . . . .

In the above-described method, the indexes of the rows where 1 is located in all columns of each column group may be defined.

The parity submatrix 220 of the parity check matrix 200 shown in FIG. 2 may be defined as follows:

The parity submatrix 220 includes $N_{ldpc}-K_{upc}$ number of columns (that is, $K_{ldpc}^{th}$ column to $(N_{lpdc}-1)^{th}$ column), and has a dual diagonal or staircase configuration. Accordingly, the degree of columns except the last column (that is, $(N_{ldpc}-1)^{th}$ column) from among the columns included in the parity submatrix 220 is 2, and the degree of the last column is 1.

As a result, the information word submatrix 210 of the parity check matrix 200 may be defined by Tables 4 to 8, and the parity submatrix 220 of the parity check matrix 200 may have a dual diagonal configuration.

When the columns and rows of the parity check matrix 200 shown in FIG. 2 are permutated based on Equation 4 and Equation 5, the parity check matrix shown in FIG. 2 may be changed to a parity check matrix 300 shown in FIG. 3.

$$Q_{ldpc} \cdot i+j \Rightarrow M \cdot j+i (0 \leq i < M, 0 \leq j < Q_{ldpc}) \quad (4)$$

$$K_{ldpc}+Q_{ldpc} \cdot k+l \Rightarrow K_{ldpc}+M \cdot l+k (0 \leq k < M, 0 \leq l < Q_{ldpc}) \quad (5)$$

The method for permutating based on Equation 4 and Equation 5 will be explained below. Since row permutation and column permutation apply the same principle, the row permutation will be explained by the way of an example.

In the case of the row permutation, regarding the $X^{th}$ row, i and j satisfying $X=Q_{ldpc} \times i+j$ are calculated and the $X^{th}$ row is permutated by assigning the calculated i and j to M×j+i. For example, regarding the $7^{th}$ row, i and j satisfying 7=2×i+j are 3 and 1, respectively. Therefore, the $7^{th}$ row is permutated to the $13^{th}$ row (10×1+3=13).

When the row permutation and the column permutation are performed in the above-described method, the parity check matrix of FIG. 2 may be converted into the parity check matrix of FIG. 3.

Referring to FIG. 3, the parity check matrix 300 is divided into a plurality of partial blocks, and a quasi-cyclic matrix of M×M corresponds to each partial block.

Accordingly, the parity check matrix 300 having the configuration of FIG. 3 is formed of matrix units of M×M. That is, the submatrices of M×M are arranged in the plurality of partial blocks, constituting the parity check matrix 300.

Since the parity check matrix 300 is formed of the quasi-cyclic matrices of M×M, M number of columns may be referred to as a column block and M number of rows may be referred to as a row block. Accordingly, the parity check matrix 300 having the configuration of FIG. 3 is formed of $N_{qc\_column}=N_{ldpc}/M$ number of column blocks and $N_{qc\_row}=N_{parity}/M$ number of row blocks.

Hereinafter, the submatrix of M×M will be explained.

First, the $(N_{qc\_column}-1)^{th}$ column block of the $0^{th}$ row block A 330 has the format of Equation 6 presented below:

$$A = \begin{bmatrix} 0 & 0 & \cdots & 0 & 0 \\ 1 & 0 & \cdots & 0 & 0 \\ 0 & 1 & \cdots & 0 & 0 \\ \vdots & \vdots & \ddots & \vdots & \vdots \\ 0 & 0 & \cdots & 1 & 0 \end{bmatrix} \quad (6)$$

As described above, A 330 is an M×M matrix, values of the $0^{th}$ row and the $(M-1)^{th}$ column are all "0", and, regarding $0 \le i \le (M-2)$, the $(i+1)^{th}$ row of the $i^{th}$ column is "1" and the other values are "0".

Second, regarding $0 \le i \le (N_{ldpc} - K_{ldpc})/M - 1$ in the parity submatrix 320, the $i^{th}$ row block of the $(K_{ldpc}/M+i)^{th}$ column block is configured by a unit matrix $I_{M \times M}$ 340. In addition, regarding $0 \le i \le (N_{ldpc} - K_{ldpc})/M - 2$, the $(i+1)^{th}$ row block of the $(K_{ldpc}/M+i)^{th}$ column block is configured by a unit matrix $I_{M \times M}$ 340.

Third, a block 350 constituting the information word submatrix 310 may have a cyclic-shifted format of a cyclic matrix P, $P^{aa_{ij}}$, or an added format of the cyclic-shifted matrix $P^{a_{ij}}$ of the cyclic matrix P (or an overlapping format).

For example, a format in which the cyclic matrix P is cyclic-shifted to the right by 1 may be expressed by Equation 7 presented below:

$$P = \begin{bmatrix} 0 & 1 & 0 & & 0 \\ 0 & 0 & 1 & \ldots & 0 \\ \vdots & \vdots & \vdots & & \vdots \\ 0 & 0 & 0 & \ldots & 1 \\ 1 & 0 & 0 & & 0 \end{bmatrix} \quad (7)$$

The cyclic matrix P is a square matrix having an M×M size and is a matrix in which a weight of each of M number of rows is 1 and a weight of each of M number of columns is 1. When $a_{ij}$ is 0, the cyclic matrix P, that is, $P^0$ indicates a unit matrix $I_{M \times M}$, and when $a_{ij}$ is $\infty$, $P^\infty$ is a zero matrix.

A submatrix existing where the $i^{th}$ row block and the $j^{th}$ column block intersect in the parity check matrix 300 of FIG. 3 may be $P^{a_{ij}}$. Accordingly, i and j indicate the number of row blocks and the number of column blocks in the partial blocks corresponding to the information word. Accordingly, in the parity check matrix 300, the total number of columns is $N_{ldpc} = M \times N_{qc\_column}$, and the total number of rows is $N_{parity} = M \times N_{qc\_row}$. That is, the parity check matrix 300 is formed of $N_{qc\_column}$ number of "column blocks" and $N_{qc\_row}$ number of "row blocks".

Hereinafter, a method for performing LDPC encoding based on the parity check matrix 200 as shown in FIG. 2 will be explained. An LDPC encoding process when the parity check matrix 200 is defined as shown in Table 4 by way of an example will be explained for the convenience of explanation.

First, when information word bits having the length of $K_{ldpc}$ are $[i_0, i_1, i_2, \ldots, i_{K_{ldpc}-1}]$, and parity bits having the length of $N_{ldpc} - K_{ldpc}$ are $[p_0, p_1, p_2, \ldots p_{N_{ldpc}-K_{ldpc}-1}]$, the LDPC encoding is performed by the following process.

Step 1) Parity bits are initialized as '0'. That is, $p_0 = p_1 = p_2 = \ldots = p_{N_{ldpc}-K_{ldpc}-1} = 0$.

Step 2) The $0^{th}$ information word bit $i_0$ is accumulated in a parity bit having the address of the parity bit defined in the first row (that is, the row of i=0) of Table 4 as the index of the parity bit. This may be expressed by Equation 8 presented below:

$P_{1606} = P_{1606} \oplus i_0 \; P_{24533} = P_{24533} \oplus i_0$ $P_{3402} = P_{3402} \oplus i_0 \; P_{25376} = P_{25376} \oplus i_0$ $P_{4961} = P_{4961} \oplus i_0 \; P_{25667} = P_{25667} \oplus i_0$ $P_{6751} = P_{6751} \oplus i_0 \; P_{26836} = P_{26836} \oplus i_0$ $P_{7132} = P_{7132} \oplus i_0 \; P_{31799} = P_{31799} \oplus i_0$ $P_{11516} = P_{11516} \oplus i_0 \; P_{34173} = P_{34173} \oplus i_0$ $P_{12300} = P_{12300} \oplus i_0 \; P_{35462} = P_{35462} \oplus i_0$ $P_{12482} = P_{12482} \oplus i_0 \; P_{36153} = P_{36153} \oplus i_0$ $P_{12592} = P_{12592} \oplus i_0 \; P_{36740} = P_{36740} \oplus i_0$ $P_{13342} = P_{13342} \oplus i_0 \; P_{37085} = P_{37085} \oplus i_0$ $P_{13764} = P_{13764} \oplus i_0 \; P_{37152} = P_{37152} \oplus i_0$ $P_{14123} = P_{14123} \oplus i_0 \; P_{37468} = P_{37468} \oplus i_0$ $P_{21576} = P_{21576} \oplus i_0 \; P_{37658} = P_{37658} \oplus i_0$ $P_{23946} = P_{23946} \oplus i_0$ \hfill (8)

Herein, $i_0$ is a $0^{th}$ information word bit, $p_i$ is an $i^{th}$ parity bit, and $\oplus$ is a binary operation. According to the binary operation, $1 \oplus 1$ equals 0, $1 \oplus 0$ equals 1, $0 \oplus 1$ equals 1, $0 \oplus 0$ equals 0.

Step 3) The other 359 information word bits $i_m$ (m=1, 2, \ldots, 359) are accumulated in the parity bit. The other information word bits may belong to the same column group as that of $i_0$. In this case, the address of the parity bit may be determined based on Equation 9 presented below:

$$(x + (m \bmod 360) \times Q_{ldpc}) \bmod (N_{ldpc} - K_{ldpc}) \quad (9)$$

In the above, x is an address of a parity bit accumulator corresponding to the information word bit $i_0$, and $Q_{ldpc}$ is a size by which each column is cyclic-shifted in the information word submatrix, and may be 108 in the case of Table 4. In addition, since m=1, 2, \ldots, 359, (m mod 360) in Equation 9 may be regarded as m.

As a result, information word bits $i_m$ (m=1, 2, \ldots, 359) are accumulated in the parity bits having addresses of the parity bits calculated based on Equation 9 as the indexes, respectively. For example, an operation as shown in Equation 10 presented below may be performed for the information word bit $P_{1714} = P_{1714} \oplus i_1 \; P_{24641} = P_{24641} \oplus i_1$ $P_{3510} = P_{3510} \oplus i_1 \; P_{25484} = P_{25484} \oplus i_1$ $P_{5069} = P_{5069} \oplus i_1 \; P_{25775} = P_{25775} \oplus i_1$ $P_{6859} = P_{6859} \oplus i_1 \; P_{26944} = P_{26944} \oplus i_1$ $P_{7240} = P_{7240} \oplus i_1 \; P_{31907} = P_{31907} \oplus i_1$ $P_{11624} = P_{11624} \oplus i_1 \; P_{34281} = P_{34281} \oplus i_1$ $P_{12408} = P_{12408} \oplus i_1 \; P_{35570} = P_{35570} \oplus i_1$ $P_{12590} = P_{12590} \oplus i_1 \; P_{36261} = P_{36261} \oplus i_1$ $P_{12700} = P_{12700} \oplus i_1 \; P_{36848} = P_{36848} \oplus i_1$ $P_{13450} = P_{13450} \oplus i_1 \; P_{37193} = P_{37193} \oplus i_i$ $P_{13872} = P_{13872} \oplus i_1 \; P_{37260} = P_{37260} \oplus i_1$ $P_{14231} = P_{14231} \oplus i_1 \; P_{37576} = P_{37576} \oplus i_1$ $P_{21684} = P_{21684} \oplus i_1 \; P_{37766} = P_{37766} \oplus i_1$ $P_{24054} = P_{24054} \oplus i_1$ \hfill (10)

Herein, $i_1$ is a $1^{st}$ information word bit, $p_i$ is an ith parity bit, and $\oplus$ is a binary operation. According to the binary operation, $1\oplus 1$ equals 0, $1\oplus 0$ equals 1, $0\oplus 1$ equals 1, $0\oplus 0$ equals 0.

Step 4) The $360^{th}$ information word bits $i_{360}$ is accumulated in a parity bit having an address of the parity bit defined in the $2^{nd}$ row (that is, the row of i=1) of Table 4 as the index of the parity bit.

Step 5) The other 359 information word bits belonging to the same group as that of the information word bit $i_{360}$ are accumulated in the parity bit. In this case, the address of the parity bit may be determined based on Equation 9. However, in this case, x is the address of the parity bit accumulator corresponding to the information word bit $i_{360}$.

Step 6) Steps 4 and 5 described above are repeated for all of the column groups of Table 4.

Step 7) As a result, a parity bit p, is calculated based on Equation 11 presented below. In this case, i is initialized as 1.

$$p_i = p_i \oplus p_{i-1} i=1,2,\ldots,N_{ldpc}-K_{ldpc}-1 \qquad (11)$$

In Equation 11, $p_i$ is an ith parity bit, $N_{ldpc}$ is a length of an LDPC codeword, $K_{ldpc}$ is a length of an information word of the LDPC codeword, and $\oplus$ is a binary operation.

As a result, the encoder 110 may calculate the parity bits according to the above-described method.

Referring back to FIG. 1, the encoder 110 may perform the LDPC encoding by using various code rates such as 3/15, 4/15, 5/15, 6/15, 7/15, 8/15, 9/15, 10/15, 11/15, 12/15, 13/15, etc. In addition, the encoder 110 may generate an LDPC codeword having various lengths such as 16200, 64800, etc., based on the length of the information word bits and the code rate.

In this case, the encoder 110 may perform the LDPC encoding by using the parity check matrix having the information word submatrix defined by Tables 4 to 8 and the parity submatrix having the dual diagonal configuration (that is, the parity check matrix shown in FIG. 2), or may perform the LDPC encoding by using the parity check matrix which is row and column permutated from the parity check matrix of FIG. 2 based on Equation 4 and Equation 5 (that is, the parity check matrix having the configuration of FIG. 3).

In addition, the encoder 110 may perform Bose, Chaudhuri, Hocquenghem (BCH) encoding as well as the LDPC encoding. To achieve this, the encoder 110 may further include a BCH encoder (not shown) to perform BCH encoding.

In this case, the encoder 110 may perform encoding in an order of BCH encoding and LDPC encoding. Specifically, the encoder 110 may add BCH parity bits to input bits by performing BCH encoding and LDPC-encodes the information word bits including the input bits and the BCH parity bits, thereby generating an LDPC codeword.

The interleaver 120 interleaves the LDPC codeword. That is, the interleaver 120 receives the LDPC codeword from the encoder 110, and interleaves the LDPC codeword based on various interleaving rules.

In particular, the interleaver 120 may interleave the LDPC codeword such that a bit included in a predetermined bit group from among a plurality of bit groups constituting the LDPC codeword (that is, a plurality of groups or a plurality of blocks) is mapped onto a predetermined bit of a modulation symbol. Accordingly, the modulator 130 may map the bit included in the predetermined group from among the plurality of bit groups constituting the LDPC codeword onto the predetermined bit of the modulation symbol.

Hereinafter, the interleaving rules used in the interleaver 120 will be explained in detail according to cases.

Exemplary Embodiment 1: Case in Which a Block Interleaver is Used

According to a first exemplary embodiment, the interleaver 120 may interleave the LDPC codeword in the method as described below, such that the bit included in a predetermined bit group from among the plurality of bit groups constituting the interleaved LDPC codeword is mapped onto a predetermined bit of a modulation symbol. This will be explained below in detail with reference to FIG. 4.

Figure 4:
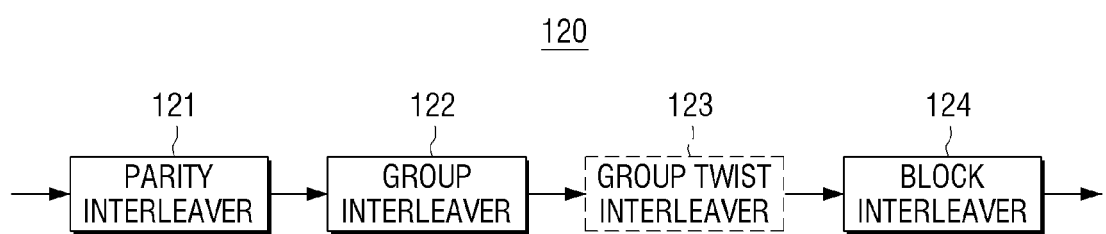
FIG. 4 is a block diagram to illustrate a configuration of an interleaver according to an exemplary embodiment.

FIG. 4 is a block diagram to illustrate the a configuration of an interleaver according to an exemplary embodiment. Referring to FIG. 4, the interleaver 120 may include a parity interleaver 121, a group interleaver 122 (or a group-wise interleaver 122), a group twist interleaver 123 and a block interleaver 124.

The parity interleaver 121 interleaves the parity bits constituting the LDPC codeword.

Specifically, when the LDPC codeword is generated based on the parity check matrix 200 having the configuration of FIG. 2, the parity interleaver 121 may interleave only the parity bits of the LDPC codeword, among the information word bits and the partiy bits of the LDPC codeword, by using Equations 12 presented below:

$u_i = c_i$ for $0 \le i < K_{ldpc}$, and $$u_{K_{ldpc}+M \cdot t+s} = c_{K_{ldpc}+Q_{ldpc} \cdot s+t} \text{ for } 0 \le s < M, 0 \le t < Q_{ldpc} \qquad (12),$$

where M is an interval at which a pattern of a column group is repeated in the information word submatrix 210, that is, the number of columns included in a column group (for example, M=360), and $Q_{ldpc}$ is a size by which each column is cyclic-shifted in the information word submatrix 210. That is, the parity interleaver 121 performs parity interleaving with respect to the LDPC codeword $c=(c_0, c_1, \ldots, c_{N_{ldpc}-1})$, and outputs $U=(u_0, u_1, \ldots, u_{N_{ldpc}-1})$.

The LDPC codeword which is parity-interleaved in the above-described method may be configured such that a predetermined number of continuous bits of the LDPC codeword have similar decoding characteristics (cycle distribution, a degree of a column, etc.).

For example, the LDPC codeword may have the same characteristics on the basis of M number of continuous bits. Herein, M is an interval at which a pattern of a column group is repeated in the information word submatrix 210 and, for example, may be 360.

Specifically, a product of the LDPC codeword bits and the parity check matrix should be "0". This means that a sum of products of the $i^{th}$ LDPC codeword bit, $c_i$ (i=0, 1, ..., $N_{ldpc}$-1) and the $i^{th}$ column of the parity check matrix should be a "0" vector. Accordingly, the $i^{th}$ LDPC codeword bit may be regarded as corresponding to the $i^{th}$ column of the parity check matrix.

In the case of the parity check matrix 200 of FIG. 2, M number of columns in the information word submatrix 210 belong to the same group and the information word submatrix 210 has the same characteristics on the basis of a column group (for example, the columns belonging to the same column group have the same degree distribution and the same cycle characteristic).

In this case, since M number of continuous bits in the information word bits correspond to the same column group of the information word submatrix 210, the information word bits may be formed of M number of continuous bits having the same codeword characteristics. When the parity bits of the LDPC codeword are interleaved by the parity interleaver 121, the parity bits of the LDPC codeword may be formed of M number of continuous bits having the same codeword characteristics.

However, regarding the LDPC codeword encoded based on the parity check matrix 300 of FIG. 3, parity interleaving may not be performed. In this case, the parity interleaver 121 may be omitted.

The group interleaver 122 may divide the parity-interleaved LDPC codeword into a plurality of bit groups and rearrange the order of the plurality of bit groups in bits group wise (group units). That is, the group interleaver 122 may interleave the plurality of bit groups in bits group wise.

To achieve this, the group interleaver 122 divides the parity-interleaved LDPC codeword into a plurality of bit groups by using Equation 13 or Equation 14 presented below.

$$X_j = \left\{ u_k \mid j = \left\lfloor \frac{k}{360} \right\rfloor, 0 \leq k < N_{ldpc} \right\} \text{for } 0 \leq j < N_{group} \quad (13)$$

$$X_j = \quad (14)$$
$$\{u_k \mid 360 \times j \leq k < 360 \times (j+1), 0 \leq k < N_{ldpc}\} \text{for } 0 \leq j < N_{group}$$

where $N_{group}$ is the total number of bit groups, $X_j$ is the $j^{th}$ bit group, and $u_k$ is the $k^{th}$ LDPC codeword bit input to the group interleaver 122. In addition, $$\left\lfloor \frac{k}{360} \right\rfloor$$

is the largest integer below k/360.

Since 360 in these equations indicates an example of the interval M at which the pattern of a column group is repeated in the information word submatrix, 360 in these equations can be changed to M.

Figure 5:
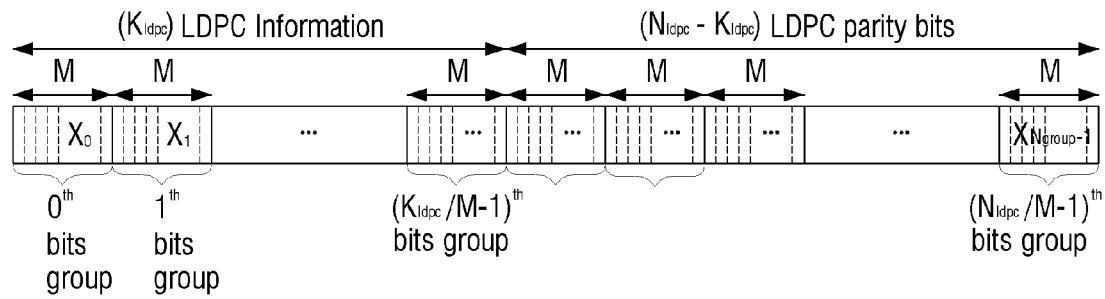
FIGS. 5 to 7 are views to illustrate a method for processing an LDPC codeword on a group basis according to exemplary embodiments.

The LDPC codeword which is divided into the plurality of bit groups may be expressed as shown in FIG. 5.

Referring to FIG. 5, the LDPC codeword is divided into the plurality of bit groups and each bit group is formed of M number of continuous bits. When M is 360, each of the plurality of bit groups may be formed of 360 bits. Accordingly, each of the bit groups may be formed of bits corresponding to each of the column groups of the parity check matrix.

Specifically, since the LDPC codeword is divided by M number of continuous bits, $K_{ldpc}$ number of information word bits are divided into ($K_{ldpc}$/M) number of bit groups, and $N_{ldpc}-K_{ldpc}$ number of parity bits are divided into ($N_{ldpc}-K_{ldpc}$)/M number of bit groups. Accordingly, the LDPC codeword may be divided into ($N_{ldpc}$/M) number of bit groups in total.

For example, when M=360 and the length $N_{ldpc}$ of the LDPC codeword is 64800, the number of bit groups $N_{groups}$ is 180 (=64800/360), and, when the length $N_{ldpc}$ of the LDPC codeword is 16200, the number of bit groups $N_{group}$ is 45 (16200/360).

As described above, the group interleaver 122 divides the LDPC codeword such that M number of continuous bits are included in a same group since the LDPC codeword has the same codeword characteristics on the basis of M number of continuous bits. Accordingly, when the LDPC codeword is grouped by M number of continuous bits, the bits having the same codeword characteristics belong to the same group.

In the above-described example, the number of bits constituting each bit group is M. However, this is merely an example and the number of bits constituting each bit group is variable.

For example, the number of bits constituting each bit group may be an aliquot part of M. That is, the number of bits constituting each bit group may be an aliquot part of the number of columns constituting a column group of the information word submatrix of the parity check matrix. In this case, each bit group may be formed of an aliquot part of M number of bits. For example, when the number of columns constituting a column group of the information word submatrix is 360, that is, M=360, the group interleaver 122 may divide the LDPC codeword into a plurality of bit groups such that the number of bits constituting each bit group is one of the aliquot parts of 360.

In the following explanation, the number of bits constituting a bit group is M by way of an example, for the convenience of explanation.

Thereafter, the group interleaver 122 interleaves the LDPC codeword in bits group wise. Specifically, the group interleaver 122 may group the LDPC codeword into the plurality of bit groups and rearrange the plurality of bit groups in bits group wise. That is, the group interleaver 122 changes positions of the plurality of bit groups constituting the LDPC codeword and rearranges the order of the plurality of bit groups constituting the LDPC codeword in bits group wise.

According to an exemplary embodiment, the group interleaver 122 may rearrange the order of the plurality of bit groups in bits group wise such that bit groups including bits mapped onto a same modulation symbol from among the plurality of bit groups are spaced apart from one another at a predetermined interval.

In this case, the group interleaver 122 may rearrange the order of the plurality of bit groups in bits group wise by considering at least one of the number of rows and columns of the block interleaver 124, the number of bit groups of the LDPC codeword, and the number of bits included in each bit group, such that bit groups including bits mapped onto the same modulation symbol are spaced apart from one another at the predetermined interval.

To achieve this, the group interleaver 122 may rearrange the order of the plurality of bit groups in bits group wise by using Equation 15 presented below:

$$Y_j = X_{\pi(j)}(0 \leq j < N_{group}) \quad (15),$$

where $X_j$ is the $j^{th}$ bit group before group interleaving, and $Y_j$ is the $j^{th}$ bit group after group interleaving. In addition, π(j) is a parameter indicating an interleaving order and is determined by at least one of a length of an LDPC codeword, a code rate, and a modulation method. That is, π(j) denotes a permutation order for group wise interleaving.

Accordingly, $X_{\pi(j)}$ is a $\pi(j)^{th}$ bit group before group interleaving, and Equation 15 means that the pre-interleaving $\pi(j)^{th}$ bit group is interleaved into the $j^{th}$ bit group.

According to an exemplary embodiment, an example of π(j) may be defined as in Tables 9 to 13 presented below.

In this case, π(j) is defined according to a length of an LPDC codeword and a code rate, and a parity check matrix is also defined according to a length of an LDPC codeword and a code rate. Accordingly, when LDPC encoding is performed based on a specific parity check matrix according to a length of an LDPC codeword and a code rate, the LDPC codeword may be interleaved in bits group wise based on π(j) satisfying the corresponding length of the LDPC codeword and code rate.

For example, when the encoder 110 performs LDPC encoding at a code rate of 6/15 to generate an LDPC codeword of a length of 64800, the group interleaver 122 may perform interleaving by using π(j) which is defined according to the length of the LDPC codeword of 64800 and the code rate of 6/15 in Tables 9 to 13 presented below, for example, by using π(j) defined as shown in Table 9.

For example, when the length $N_{ldpc}$ of the LDPC codeword is 64800, the code rate is 6/15, and the modulation method is 1024-Quadrature Amplitude Modulation (QAM), π(j) may be defined as in Table 9 presented below.

In the case of Table 10, Equation 15 may be expressed as $Y_0=X_{\pi(0)}=X_{77}$, $Y_1=X_{\pi(1)}=X_{48}$, $Y_2=X_{\pi(2)}=X_{82}$, . . . , $Y_{178}=X_{\pi(178)}=X_7$, and $Y_{179}=X_{\pi(179)}=X_{25}$. Accordingly, the group interleaver 122 may rearrange the order of the plu-

TABLE 9

Order of bits group to be block interleaved π(j) (0 ≤ j < 180)

| | | | | | | | | | | | | | | | | | | |
|---|---|---|---|---|---|---|---|---|---|---|---|---|---|---|---|---|---|---|
| j-th block of Group-wise interleaver output | 0 | 1 | 2 | 3 | 4 | 5 | 6 | 7 | 8 | 9 | 10 | 11 | 12 | 13 | 14 | 15 | 16 | 17 |
| | 18 | 19 | 20 | 21 | 22 | 23 | 24 | 25 | 26 | 27 | 28 | 29 | 30 | 31 | 32 | 33 | 34 | 35 |
| | 36 | 37 | 38 | 39 | 40 | 41 | 42 | 43 | 44 | 45 | 46 | 47 | 48 | 49 | 50 | 51 | 52 | 53 |
| | 54 | 55 | 56 | 57 | 58 | 59 | 60 | 61 | 62 | 63 | 64 | 65 | 66 | 67 | 68 | 69 | 70 | 71 |
| | 72 | 73 | 74 | 75 | 76 | 77 | 78 | 79 | 80 | 81 | 82 | 83 | 84 | 85 | 86 | 87 | 88 | 89 |
| | 90 | 91 | 92 | 93 | 94 | 95 | 96 | 97 | 98 | 99 | 100 | 101 | 102 | 103 | 104 | 105 | 106 | 107 |
| | 108 | 109 | 110 | 111 | 112 | 113 | 114 | 115 | 116 | 117 | 118 | 119 | 120 | 121 | 122 | 123 | 124 | 125 |
| | 126 | 127 | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 | 160 | 161 |
| | 162 | 163 | 164 | 165 | 166 | 167 | 168 | 169 | 170 | 171 | 172 | 173 | 174 | 175 | 176 | 177 | 178 | 179 |
| π(j)-th block of Group-wise interleaver input | 66 | 21 | 51 | 55 | 54 | 24 | 33 | 12 | 70 | 63 | 47 | 65 | 145 | 8 | 0 | 57 | 23 | 71 |
| | 59 | 14 | 40 | 42 | 62 | 56 | 2 | 43 | 64 | 58 | 67 | 53 | 68 | 61 | 39 | 52 | 69 | 1 |
| | 22 | 31 | 161 | 38 | 30 | 19 | 17 | 18 | 4 | 41 | 25 | 44 | 136 | 29 | 36 | 26 | 126 | 177 |
| | 15 | 37 | 148 | 9 | 13 | 45 | 46 | 152 | 50 | 49 | 27 | 77 | 60 | 35 | 48 | 178 | 28 | 34 |
| | 106 | 127 | 76 | 131 | 105 | 138 | 75 | 130 | 101 | 167 | 117 | 173 | 113 | 108 | 92 | 135 | 124 | 121 |
| | 97 | 149 | 143 | 81 | 32 | 96 | 3 | 78 | 107 | 86 | 98 | 16 | 162 | 150 | 111 | 158 | 172 | 139 |
| | 74 | 142 | 166 | 7 | 5 | 119 | 20 | 144 | 151 | 90 | 11 | 156 | 100 | 175 | 83 | 155 | 159 | 128 |
| | 88 | 87 | 93 | 103 | 94 | 140 | 165 | 6 | 137 | 157 | 10 | 85 | 141 | 129 | 146 | 122 | 73 | 112 |
| | 132 | 125 | 174 | 169 | 168 | 79 | 84 | 118 | 179 | 147 | 91 | 160 | 163 | 115 | 89 | 80 | 102 | 104 |
| | 134 | 82 | 95 | 133 | 164 | 154 | 120 | 110 | 170 | 114 | 153 | 72 | 109 | 171 | 176 | 99 | 116 | 123 |

In the case of Table 9, Equation 15 may be expressed as $Y_0=X_{\pi(0)}=X_{66}$, $Y_1=X_{\pi(1)}=X_{21}$, $Y_2=X_{\pi(2)}=X_{51}$, . . . , $Y_{178}=X_{\pi(178)}=X_{116}$, and $Y_{179}=X_{\pi(179)}=X_{123}$. Accordingly, the group interleaver 122 may rearrange the order of the plurality of bit groups in bits group wise by changing the $66^{th}$ bit group to the $0^{th}$ bit group, the $21^{st}$ bit group to the $1^{st}$ bit group, the $51^{st}$ bit group to the $2^{nd}$ bit group, . . . , the $116^{th}$ bit group to the $178^{th}$ bit group, and the $123^{rd}$ bit group to the $179^{th}$ bit group.

In another example, when the length $N_{ldpc}$ of the LDPC codeword is 64800, the code rate is 8/15, and the modulation method is 1024-QAM, π(j) may be defined as in Table 10 presented below.

rality of bit groups in bits group wise by changing the $77^{th}$ bit group to the $0^{th}$ bit group, the $48^{th}$ bit group to the $1^{st}$ bit group, the $82^{nd}$ bit group to the $2^{nd}$ bit group, . . . , the $7^{th}$ bit group to the $178^{th}$ bit group, and the $25^{th}$ bit group to the $179^{th}$ bit group.

In another example, when the length $N_{ldpc}$ of the LDPC codeword is 64800, the code rate is 10/15, and the modulation method is 1024-QAM, π(j) may be defined as in Table 11 presented below. In particular, when the encoder 110 performs LDPC encoding based on the parity check matrix defined by Table 6, the group interleaver 122 may perform group interleaving by using π(j) defined as in Table 11 presented below:

TABLE 10

Order of bits group to be block interleaved π(j) (0 ≤ j < 180)

| | | | | | | | | | | | | | | | | | | |
|---|---|---|---|---|---|---|---|---|---|---|---|---|---|---|---|---|---|---|
| j-th block of Group-wise interleaver output | 0 | 1 | 2 | 3 | 4 | 5 | 6 | 7 | 8 | 9 | 10 | 11 | 12 | 13 | 14 | 15 | 16 | 17 |
| | 18 | 19 | 20 | 21 | 22 | 23 | 24 | 25 | 26 | 27 | 28 | 29 | 30 | 31 | 32 | 33 | 34 | 35 |
| | 36 | 37 | 38 | 39 | 40 | 41 | 42 | 43 | 44 | 45 | 46 | 47 | 48 | 49 | 50 | 51 | 52 | 53 |
| | 54 | 55 | 56 | 57 | 58 | 59 | 60 | 61 | 62 | 63 | 64 | 65 | 66 | 67 | 68 | 69 | 70 | 71 |
| | 72 | 73 | 74 | 75 | 76 | 77 | 78 | 79 | 80 | 81 | 82 | 83 | 84 | 85 | 86 | 87 | 88 | 89 |
| | 90 | 91 | 92 | 93 | 94 | 95 | 96 | 97 | 98 | 99 | 100 | 101 | 102 | 103 | 104 | 105 | 106 | 107 |
| | 108 | 109 | 110 | 111 | 112 | 113 | 114 | 115 | 116 | 117 | 118 | 119 | 120 | 121 | 122 | 123 | 124 | 125 |
| | 126 | 127 | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 | 160 | 161 |
| | 162 | 163 | 164 | 165 | 166 | 167 | 168 | 169 | 170 | 171 | 172 | 173 | 174 | 175 | 176 | 177 | 178 | 179 |
| π(j)-th block of Group-wise interleaver input | 77 | 48 | 82 | 51 | 57 | 69 | 65 | 6 | 71 | 90 | 84 | 81 | 50 | 88 | 61 | 55 | 53 | 73 |
| | 39 | 13 | 79 | 75 | 41 | 18 | 38 | 89 | 49 | 93 | 36 | 64 | 47 | 40 | 42 | 76 | 70 | 56 |
| | 3 | 72 | 2 | 54 | 52 | 145 | 19 | 78 | 80 | 63 | 87 | 67 | 86 | 10 | 1 | 58 | 17 | 14 |
| | 175 | 91 | 68 | 85 | 94 | 15 | 43 | 74 | 60 | 66 | 37 | 92 | 4 | 9 | 16 | 83 | 46 | 44 |
| | 102 | 30 | 112 | 122 | 110 | 29 | 20 | 105 | 138 | 101 | 174 | 33 | 137 | 136 | 131 | 166 | 59 | 34 |
| | 62 | 125 | 28 | 26 | 45 | 24 | 23 | 21 | 157 | 98 | 35 | 95 | 22 | 32 | 103 | 27 | 113 | 31 |
| | 119 | 173 | 168 | 118 | 120 | 114 | 149 | 159 | 155 | 179 | 160 | 161 | 130 | 123 | 172 | 139 | 124 | 153 |
| | 0 | 109 | 167 | 128 | 107 | 117 | 147 | 177 | 96 | 164 | 152 | 11 | 148 | 158 | 129 | 163 | 176 | 151 |
| | 171 | 8 | 106 | 144 | 150 | 169 | 108 | 162 | 143 | 111 | 141 | 133 | 178 | 134 | 146 | 99 | 132 | 142 |
| | 104 | 115 | 135 | 121 | 100 | 12 | 170 | 156 | 126 | 5 | 127 | 154 | 97 | 140 | 116 | 165 | 7 | 25 |

TABLE 11

Order of bits group to be block interleaved π(j) (0 ≤ j < 180)

| | | | | | | | | | | | | | | | | | | |
|---|---|---|---|---|---|---|---|---|---|---|---|---|---|---|---|---|---|---|
| j-th block of | 0 | 1 | 2 | 3 | 4 | 5 | 6 | 7 | 8 | 9 | 10 | 11 | 12 | 13 | 14 | 15 | 16 | 17 |
| Group-wise | 18 | 19 | 20 | 21 | 22 | 23 | 24 | 25 | 26 | 27 | 28 | 29 | 30 | 31 | 32 | 33 | 34 | 35 |
| interleaver | 36 | 37 | 38 | 39 | 40 | 41 | 42 | 43 | 44 | 45 | 46 | 47 | 48 | 49 | 50 | 51 | 52 | 53 |
| output | 54 | 55 | 56 | 57 | 58 | 59 | 60 | 61 | 62 | 63 | 64 | 65 | 66 | 67 | 68 | 69 | 70 | 71 |
| | 72 | 73 | 74 | 75 | 76 | 77 | 78 | 79 | 80 | 81 | 82 | 83 | 84 | 85 | 86 | 87 | 88 | 89 |
| | 90 | 91 | 92 | 93 | 94 | 95 | 96 | 97 | 98 | 99 | 100 | 101 | 102 | 103 | 104 | 105 | 106 | 107 |
| | 108 | 109 | 110 | 111 | 112 | 113 | 114 | 115 | 116 | 117 | 118 | 119 | 120 | 121 | 122 | 123 | 124 | 125 |
| | 126 | 127 | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 | 160 | 161 |
| | 162 | 163 | 164 | 165 | 166 | 167 | 168 | 169 | 170 | 171 | 172 | 173 | 174 | 175 | 176 | 177 | 178 | 179 |
| π(j)-th block of | 7 | 58 | 108 | 59 | 1 | 14 | 54 | 115 | 57 | 29 | 64 | 65 | 8 | 101 | 113 | 60 | 46 | 104 |
| Group-wise | 87 | 9 | 93 | 81 | 94 | 71 | 106 | 50 | 44 | 15 | 52 | 4 | 100 | 90 | 111 | 77 | 89 | 92 |
| interleaver | 5 | 82 | 10 | 116 | 109 | 75 | 91 | 47 | 80 | 99 | 103 | 30 | 105 | 76 | 107 | 88 | 95 | 28 |
| input | 66 | 102 | 25 | 39 | 78 | 53 | 118 | 112 | 0 | 83 | 22 | 36 | 51 | 55 | 85 | 86 | 45 | 119 |
| | 23 | 79 | 35 | 72 | 33 | 98 | 40 | 38 | 24 | 63 | 73 | 20 | 48 | 27 | 96 | 68 | 26 | 110 |
| | 42 | 12 | 41 | 97 | 2 | 21 | 61 | 117 | 70 | 62 | 34 | 11 | 67 | 37 | 49 | 114 | 56 | 32 |
| | 149 | 163 | 173 | 159 | 132 | 170 | 179 | 69 | 139 | 133 | 154 | 160 | 128 | 168 | 84 | 171 | 162 | 31 |
| | 43 | 135 | 123 | 178 | 130 | 127 | 145 | 157 | 176 | 177 | 140 | 151 | 134 | 126 | 18 | 129 | 137 | 74 |
| | 148 | 147 | 167 | 136 | 164 | 146 | 153 | 138 | 161 | 6 | 143 | 124 | 17 | 174 | 131 | 175 | 165 | 150 |
| | 16 | 172 | 3 | 155 | 169 | 142 | 156 | 120 | 122 | 19 | 144 | 158 | 13 | 152 | 141 | 166 | 125 | 121 |

In the case of Table 11, Equation 15 may be expressed as $Y_0=X_{\pi(0)}=X_7$, $Y_1=X_{\pi(1)}=X_{58}$, $Y_2=X_{\pi(2)}=X_{108}$, ..., $Y_{178}=X_{\pi(178)}=X_{125}$, and $Y_{179}=X_{\pi(179)}=X_{121}$. Accordingly, the group interleaver 122 may rearrange the order of the plurality of bit groups in bits group wise by changing the $7^{th}$ bit group to the $0^{th}$ bit group, the $58^{th}$ bit group to the $1^{st}$ bit group, the $108^{th}$ bit group to the $2^{nd}$ bit group, ..., the $125^{th}$ bit group to the $178^{th}$ bit group, and the $121^{st}$ bit group to the $179^{th}$ bit group.

In another example, when the length $N_{ldpc}$ of the LDPC codeword is 64800, the code rate is 10/15, and the modulation method is 1024-QAM, π(j) may be defined as in Table 12 presented below. In particular, when the encoder 110 performs LDPC encoding based on the parity check matrix defined by Table 7, the group interleaver 122 may perform group interleaving by using π(j) defined as in Table 12 presented below:

In the case of Table 12, Equation 15 may be expressed as $Y_0=X_{\pi(0)}=X_{111}$, $Y_1=X_{\pi(1)}=X_{45}$, $Y_2=X_{\pi(2)}=X_{78}$, ..., $Y_{178}=X_{\pi(178)}=X_{18}$, and $Y_{179}=X_{\pi(179)}=X_{140}$. Accordingly, the group interleaver 122 may rearrange the order of the plurality of bit groups in bits group wise by changing the $111^{th}$ bit group to the $0^{th}$ bit group, the $45^{th}$ bit group to the $1^{st}$ bit group, the $78^{th}$ bit group to the $2^{nd}$ bit group, ..., the $18^{th}$ bit group to the $178^{th}$ bit group, and the $140^{th}$ bit group to the $179^{th}$ bit group.

In another example, when the length $N_{ldpc}$ of the LDPC codeword is 64800, the code rate is 12/15, and the modulation method is 1024-QAM, π(j) may be defined as in Table 13 presented below.

TABLE 12

Order of bits group to be block interleaved π(j) (0 ≤ j < 180)

| | | | | | | | | | | | | | | | | | | |
|---|---|---|---|---|---|---|---|---|---|---|---|---|---|---|---|---|---|---|
| j-th block of | 0 | 1 | 2 | 3 | 4 | 5 | 6 | 7 | 8 | 9 | 10 | 11 | 12 | 13 | 14 | 15 | 16 | 17 |
| Group-wise | 18 | 19 | 20 | 21 | 22 | 23 | 24 | 25 | 26 | 27 | 28 | 29 | 30 | 31 | 32 | 33 | 34 | 35 |
| interleaver | 36 | 37 | 38 | 39 | 40 | 41 | 42 | 43 | 44 | 45 | 46 | 47 | 48 | 49 | 50 | 51 | 52 | 53 |
| output | 54 | 55 | 56 | 57 | 58 | 59 | 60 | 61 | 62 | 63 | 64 | 65 | 66 | 67 | 68 | 69 | 70 | 71 |
| | 72 | 73 | 74 | 75 | 76 | 77 | 78 | 79 | 80 | 81 | 82 | 83 | 84 | 85 | 86 | 87 | 88 | 89 |
| | 90 | 91 | 92 | 93 | 94 | 95 | 96 | 97 | 98 | 99 | 100 | 101 | 102 | 103 | 104 | 105 | 106 | 107 |
| | 108 | 109 | 110 | 111 | 112 | 113 | 114 | 115 | 116 | 117 | 118 | 119 | 120 | 121 | 122 | 123 | 124 | 125 |
| | 126 | 127 | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 | 160 | 161 |
| | 162 | 163 | 164 | 165 | 166 | 167 | 168 | 169 | 170 | 171 | 172 | 173 | 174 | 175 | 176 | 177 | 178 | 179 |
| π(j)-th block of | 111 | 45 | 78 | 97 | 75 | 63 | 35 | 15 | 9 | 25 | 39 | 94 | 24 | 84 | 100 | 49 | 44 | 41 |
| Group-wise | 32 | 101 | 82 | 23 | 79 | 68 | 98 | 31 | 107 | 19 | 110 | 48 | 58 | 71 | 87 | 43 | 62 | 85 |
| interleaver | 70 | 95 | 57 | 10 | 50 | 99 | 118 | 73 | 27 | 12 | 1 | 17 | 61 | 55 | 90 | 56 | 14 | 47 |
| input | 77 | 2 | 117 | 20 | 74 | 106 | 83 | 102 | 109 | 113 | 72 | 88 | 115 | 37 | 30 | 116 | 29 | 26 |
| | 54 | 38 | 60 | 114 | 59 | 105 | 67 | 103 | 0 | 80 | 64 | 4 | 91 | 66 | 46 | 108 | 33 | 104 |
| | 93 | 7 | 42 | 51 | 40 | 119 | 8 | 21 | 81 | 76 | 112 | 28 | 34 | 36 | 86 | 69 | 92 | 53 |
| | 122 | 126 | 131 | 160 | 154 | 6 | 22 | 142 | 141 | 136 | 157 | 162 | 123 | 159 | 150 | 171 | 174 | 137 |
| | 65 | 13 | 177 | 166 | 139 | 167 | 172 | 176 | 153 | 89 | 152 | 168 | 135 | 52 | 170 | 138 | 127 | 96 |
| | 165 | 156 | 148 | 179 | 163 | 3 | 133 | 143 | 121 | 132 | 169 | 147 | 173 | 155 | 149 | 178 | 158 | 16 |
| | 144 | 128 | 11 | 175 | 134 | 124 | 130 | 146 | 161 | 145 | 120 | 129 | 164 | 125 | 5 | 151 | 18 | 140 |

TABLE 13

Order of bits group to be block interleaved π(j) (0 ≤ j < 180)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|---|
| | 18 | 19 | 20 | 21 | 22 | 23 | 24 | 25 | 26 | 27 | 28 | 29 | 30 | 31 | 32 | 33 | 34 | 35 |
| | 36 | 37 | 38 | 39 | 40 | 41 | 42 | 43 | 44 | 45 | 46 | 47 | 48 | 49 | 50 | 51 | 52 | 53 |
| | 54 | 55 | 56 | 57 | 58 | 59 | 60 | 61 | 62 | 63 | 64 | 65 | 66 | 67 | 68 | 69 | 70 | 71 |
| | 72 | 73 | 74 | 75 | 76 | 77 | 78 | 79 | 80 | 81 | 82 | 83 | 84 | 85 | 86 | 87 | 88 | 89 |
| | 90 | 91 | 92 | 93 | 94 | 95 | 96 | 97 | 98 | 99 | 100 | 101 | 102 | 103 | 104 | 105 | 106 | 107 |
| | 108 | 109 | 110 | 111 | 112 | 113 | 114 | 115 | 116 | 117 | 118 | 119 | 120 | 121 | 122 | 123 | 124 | 125 |
| | 126 | 127 | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 | 160 | 161 |
| | 162 | 163 | 164 | 165 | 166 | 167 | 168 | 169 | 170 | 171 | 172 | 173 | 174 | 175 | 176 | 177 | 178 | 179 |
| π(j)-th block of Group-wise interleaver input | 91 | 19 | 11 | 106 | 14 | 40 | 20 | 67 | 32 | 22 | 31 | 23 | 78 | 68 | 79 | 141 | 117 | 95 |
| | 88 | 136 | 52 | 121 | 1 | 133 | 4 | 2 | 21 | 122 | 38 | 12 | 69 | 111 | 81 | 82 | 58 | 46 |
| | 112 | 60 | 33 | 73 | 53 | 92 | 75 | 48 | 47 | 110 | 80 | 76 | 138 | 87 | 85 | 65 | 130 | 57 |
| | 102 | 83 | 64 | 86 | 100 | 39 | 49 | 125 | 108 | 119 | 6 | 118 | 35 | 61 | 71 | 30 | 45 | 94 |
| | 26 | 116 | 98 | 37 | 55 | 44 | 70 | 25 | 7 | 34 | 114 | 135 | 128 | 137 | 84 | 51 | 28 | 97 |
| | 27 | 89 | 29 | 62 | 50 | 139 | 56 | 109 | 77 | 59 | 127 | 142 | 96 | 105 | 99 | 90 | 13 | 124 |
| | 120 | 115 | 126 | 143 | 149 | 74 | 41 | 178 | 129 | 18 | 131 | 42 | 165 | 101 | 134 | 36 | 140 | 132 |
| | 103 | 72 | 164 | 93 | 54 | 166 | 43 | 123 | 113 | 0 | 154 | 10 | 63 | 107 | 162 | 157 | 66 | 104 |
| | 17 | 147 | 167 | 174 | 179 | 3 | 173 | 160 | 155 | 161 | 152 | 156 | 177 | 24 | 170 | 9 | 159 | 16 |
| | 15 | 148 | 5 | 146 | 163 | 172 | 175 | 151 | 169 | 176 | 150 | 153 | 171 | 158 | 168 | 144 | 8 | 145 |

In the case of Table 13, Equation 15 may be expressed as $Y_0=X_{\pi(0)}=X_{91}$, $Y_1=X_{\pi(1)}=X_{19}$, $Y_2=X_{\pi(2)}=X_{11}$, ..., $Y_{178}=X_{\pi(178)}=X_8$, and $Y_{179}=X_{\pi(179)}=X_{145}$. Accordingly, the group interleaver 122 may rearrange the order of the plurality of bit groups in bits group wise by changing the 91$^{st}$ bit group to the 0$^{th}$ bit group, the 19$^{th}$ bit group to the 1$^{st}$ bit group, the 11$^{th}$ bit group to the 2$^{nd}$ bit group, ..., the 8$^{th}$ bit group to the 178$^{th}$ bit group, and the 145$^{th}$ bit group to the 179$^{th}$ bit group.

In the above-described examples, the length of the LDPC codeword is 64800 and the code rate is 6/15, 8/15, 10/15, and 12/15. However, this is merely an example and the interleaving pattern may be defined variously when the length of the LDPC codeword is 16200 or the code rate has different values.

As described above, the group interleaver 122 may rearrange the order of the plurality of bit groups in bits group wise by using Equation 15 and Tables 9 to 13.

"j-th block of Group-wise Interleaver output" in Tables 9 to 13 indicates the j-th bit group output from the group interleaver 122 after interleaving, and "π(j)-th block of Group-wise Interleaver input" indicates the π(j)-th bit group input to the group interleaver 122.

In addition, since the order of the bit groups constituting the LDPC codeword is rearranged by the group interleaver 122 in bits group wise, and then the bit groups are block-interleaved by the block interleaver 124, which will be described below, "Order of bits groups to be block interleaved" is set forth in Tables 9 to 13 in relation to π(j).

π(j) defined as shown in Tables 9 to 13 may be arranged according to the code rates as shown in Table 14 presented below:

TABLE 14

| j-th block of Group-wise Interleaver output | (CR 6/15) π(j)-th block of Group-wise Interleaver input | (CR 8/15) π(j)-th block of Group-wise Interleaver input | (CR 10/15) π(j)-th block of Group-wise Interleaver input | (CR 10/15) π(j)-th block of Group-wise Interleaver input | (CR 12/15) π(j)-th block of Group-wise Interleaver input |
|---|---|---|---|---|---|
| 0 | 66 | 77 | 7 | 111 | 91 |
| 1 | 21 | 48 | 58 | 45 | 19 |
| 2 | 51 | 82 | 108 | 78 | 11 |
| 3 | 55 | 51 | 59 | 97 | 106 |
| 4 | 54 | 57 | 1 | 75 | 14 |
| 5 | 24 | 69 | 14 | 63 | 40 |
| 6 | 33 | 65 | 54 | 35 | 20 |
| 7 | 12 | 6 | 115 | 15 | 67 |
| 8 | 70 | 71 | 57 | 9 | 32 |
| 9 | 63 | 90 | 29 | 25 | 22 |
| 10 | 47 | 84 | 64 | 39 | 31 |
| 11 | 65 | 81 | 65 | 94 | 23 |
| 12 | 145 | 50 | 8 | 24 | 78 |
| 13 | 8 | 88 | 101 | 84 | 68 |
| 14 | 0 | 61 | 113 | 100 | 79 |
| 15 | 57 | 55 | 60 | 49 | 141 |
| 16 | 23 | 53 | 46 | 44 | 117 |
| 17 | 71 | 73 | 104 | 41 | 95 |
| 18 | 59 | 39 | 87 | 32 | 88 |
| 19 | 14 | 13 | 9 | 101 | 136 |
| 20 | 40 | 79 | 93 | 82 | 52 |
| 21 | 42 | 75 | 81 | 23 | 121 |
| 22 | 62 | 41 | 94 | 79 | 1 |

TABLE 14-continued

| j-th block of Group-wise Interleaver output | (CR 6/15) π(j)-th block of Group-wise Interleaver input | (CR 8/15) π(j)-th block of Group-wise Interleaver input | (CR 10/15) π(j)-th block of Group-wise Interleaver input | (CR 10/15) π(j)-th block of Group-wise Interleaver input | (CR 12/15) π(j)-th block of Group-wise Interleaver input |
|---|---|---|---|---|---|
| 23 | 56 | 18 | 71 | 68 | 133 |
| 24 | 2 | 38 | 106 | 98 | 4 |
| 25 | 43 | 89 | 50 | 31 | 2 |
| 26 | 64 | 49 | 44 | 107 | 21 |
| 27 | 58 | 93 | 15 | 19 | 122 |
| 28 | 67 | 36 | 52 | 110 | 38 |
| 29 | 53 | 64 | 4 | 48 | 12 |
| 30 | 68 | 47 | 100 | 58 | 69 |
| 31 | 61 | 40 | 90 | 71 | 111 |
| 32 | 39 | 42 | 111 | 87 | 81 |
| 33 | 52 | 76 | 77 | 43 | 82 |
| 34 | 69 | 70 | 89 | 62 | 58 |
| 35 | 1 | 56 | 92 | 85 | 46 |
| 36 | 22 | 3 | 5 | 70 | 112 |
| 37 | 31 | 72 | 82 | 95 | 60 |
| 38 | 161 | 2 | 10 | 57 | 33 |
| 39 | 38 | 54 | 116 | 10 | 73 |
| 40 | 30 | 52 | 109 | 50 | 53 |
| 41 | 19 | 145 | 75 | 99 | 92 |
| 42 | 17 | 19 | 91 | 118 | 75 |
| 43 | 18 | 78 | 47 | 73 | 48 |
| 44 | 4 | 80 | 80 | 27 | 47 |
| 45 | 41 | 63 | 99 | 12 | 110 |
| 46 | 25 | 87 | 103 | 1 | 80 |
| 47 | 44 | 67 | 30 | 17 | 76 |
| 48 | 136 | 86 | 105 | 61 | 138 |
| 49 | 29 | 10 | 76 | 55 | 87 |
| 50 | 36 | 1 | 107 | 90 | 85 |
| 51 | 26 | 58 | 88 | 56 | 65 |
| 52 | 126 | 17 | 95 | 14 | 130 |
| 53 | 177 | 14 | 28 | 47 | 57 |
| 54 | 15 | 175 | 66 | 77 | 102 |
| 55 | 37 | 91 | 102 | 2 | 83 |
| 56 | 148 | 68 | 25 | 117 | 64 |
| 57 | 9 | 85 | 39 | 20 | 86 |
| 58 | 13 | 94 | 78 | 74 | 100 |
| 59 | 45 | 15 | 53 | 106 | 39 |
| 60 | 46 | 43 | 118 | 83 | 49 |
| 61 | 152 | 74 | 112 | 102 | 125 |
| 62 | 50 | 60 | 0 | 109 | 108 |
| 63 | 49 | 66 | 83 | 113 | 119 |
| 64 | 27 | 37 | 22 | 72 | 6 |
| 65 | 77 | 92 | 36 | 88 | 118 |
| 66 | 60 | 4 | 51 | 115 | 35 |
| 67 | 35 | 9 | 55 | 37 | 61 |
| 68 | 48 | 16 | 85 | 30 | 71 |
| 69 | 178 | 83 | 86 | 116 | 30 |
| 70 | 28 | 46 | 45 | 29 | 45 |
| 71 | 34 | 44 | 119 | 26 | 94 |
| 72 | 106 | 102 | 23 | 54 | 26 |
| 73 | 127 | 30 | 79 | 38 | 116 |
| 74 | 76 | 112 | 35 | 60 | 98 |
| 75 | 131 | 122 | 72 | 114 | 37 |
| 76 | 105 | 110 | 33 | 59 | 55 |
| 77 | 138 | 29 | 98 | 105 | 44 |
| 78 | 75 | 20 | 40 | 67 | 70 |
| 79 | 130 | 105 | 38 | 103 | 25 |
| 80 | 101 | 138 | 24 | 0 | 7 |
| 81 | 167 | 101 | 63 | 80 | 34 |
| 82 | 117 | 174 | 73 | 64 | 114 |
| 83 | 173 | 33 | 20 | 4 | 135 |
| 84 | 113 | 137 | 48 | 91 | 128 |
| 85 | 108 | 136 | 27 | 66 | 137 |
| 86 | 92 | 131 | 96 | 46 | 84 |
| 87 | 135 | 166 | 68 | 108 | 51 |
| 88 | 124 | 59 | 26 | 33 | 28 |
| 89 | 121 | 34 | 110 | 104 | 97 |
| 90 | 97 | 62 | 42 | 93 | 27 |
| 91 | 149 | 125 | 12 | 7 | 89 |
| 92 | 143 | 28 | 41 | 42 | 29 |
| 93 | 81 | 26 | 97 | 51 | 62 |
| 94 | 32 | 45 | 2 | 40 | 50 |
| 95 | 96 | 24 | 21 | 119 | 139 |
| 96 | 3 | 23 | 61 | 8 | 56 |

TABLE 14-continued

| j-th block of Group-wise Interleaver output | (CR 6/15) π(j)-th block of Group-wise Interleaver input | (CR 8/15) π(j)-th block of Group-wise Interleaver input | (CR 10/15) π(j)-th block of Group-wise Interleaver input | (CR 10/15) π(j)-th block of Group-wise Interleaver input | (CR 12/15) π(j)-th block of Group-wise Interleaver input |
|---|---|---|---|---|---|
| 97 | 78 | 21 | 117 | 21 | 109 |
| 98 | 107 | 157 | 70 | 81 | 77 |
| 99 | 86 | 98 | 62 | 76 | 59 |
| 100 | 98 | 35 | 34 | 112 | 127 |
| 101 | 16 | 95 | 11 | 28 | 142 |
| 102 | 162 | 22 | 67 | 34 | 96 |
| 103 | 150 | 32 | 37 | 36 | 105 |
| 104 | 111 | 103 | 49 | 86 | 99 |
| 105 | 158 | 27 | 114 | 69 | 90 |
| 106 | 172 | 113 | 56 | 92 | 13 |
| 107 | 139 | 31 | 32 | 53 | 124 |
| 108 | 74 | 119 | 149 | 122 | 120 |
| 109 | 142 | 173 | 163 | 126 | 115 |
| 110 | 166 | 168 | 173 | 131 | 126 |
| 111 | 7 | 118 | 159 | 160 | 143 |
| 112 | 5 | 120 | 132 | 154 | 149 |
| 113 | 119 | 114 | 170 | 6 | 74 |
| 114 | 20 | 149 | 179 | 22 | 41 |
| 115 | 144 | 159 | 69 | 142 | 178 |
| 116 | 151 | 155 | 139 | 141 | 129 |
| 117 | 90 | 179 | 133 | 136 | 18 |
| 118 | 11 | 160 | 154 | 157 | 131 |
| 119 | 156 | 161 | 160 | 162 | 42 |
| 120 | 100 | 130 | 128 | 123 | 165 |
| 121 | 175 | 123 | 168 | 159 | 101 |
| 122 | 83 | 172 | 84 | 150 | 134 |
| 123 | 155 | 139 | 171 | 171 | 36 |
| 124 | 159 | 124 | 162 | 174 | 140 |
| 125 | 128 | 153 | 31 | 137 | 132 |
| 126 | 88 | 0 | 43 | 65 | 103 |
| 127 | 87 | 109 | 135 | 13 | 72 |
| 128 | 93 | 167 | 123 | 177 | 164 |
| 129 | 103 | 128 | 178 | 166 | 93 |
| 130 | 94 | 107 | 130 | 139 | 54 |
| 131 | 140 | 117 | 127 | 167 | 166 |
| 132 | 165 | 147 | 145 | 172 | 43 |
| 133 | 6 | 177 | 157 | 176 | 123 |
| 134 | 137 | 96 | 176 | 153 | 113 |
| 135 | 157 | 164 | 177 | 89 | 0 |
| 136 | 10 | 152 | 140 | 152 | 154 |
| 137 | 85 | 11 | 151 | 168 | 10 |
| 138 | 141 | 148 | 134 | 135 | 63 |
| 139 | 129 | 158 | 126 | 52 | 107 |
| 140 | 146 | 129 | 18 | 170 | 162 |
| 141 | 122 | 163 | 129 | 138 | 157 |
| 142 | 73 | 176 | 137 | 127 | 66 |
| 143 | 112 | 151 | 74 | 96 | 104 |
| 144 | 132 | 171 | 148 | 165 | 17 |
| 145 | 125 | 8 | 147 | 156 | 147 |
| 146 | 174 | 106 | 167 | 148 | 167 |
| 147 | 169 | 144 | 136 | 179 | 174 |
| 148 | 168 | 150 | 164 | 163 | 179 |
| 149 | 79 | 169 | 146 | 3 | 3 |
| 150 | 84 | 108 | 153 | 133 | 173 |
| 151 | 118 | 162 | 138 | 143 | 160 |
| 152 | 179 | 143 | 161 | 121 | 155 |
| 153 | 147 | 111 | 6 | 132 | 161 |
| 154 | 91 | 141 | 143 | 169 | 152 |
| 155 | 160 | 133 | 124 | 147 | 156 |
| 156 | 163 | 178 | 17 | 173 | 177 |
| 157 | 115 | 134 | 174 | 155 | 24 |
| 158 | 89 | 146 | 131 | 149 | 170 |
| 159 | 80 | 99 | 175 | 178 | 9 |
| 160 | 102 | 132 | 165 | 158 | 159 |
| 161 | 104 | 142 | 150 | 16 | 16 |
| 162 | 134 | 104 | 16 | 144 | 15 |
| 163 | 82 | 115 | 172 | 128 | 148 |
| 164 | 95 | 135 | 3 | 11 | 5 |
| 165 | 133 | 121 | 155 | 175 | 146 |
| 166 | 164 | 100 | 169 | 134 | 163 |
| 167 | 154 | 12 | 142 | 124 | 172 |
| 168 | 120 | 170 | 156 | 130 | 175 |
| 169 | 110 | 156 | 120 | 146 | 151 |
| 170 | 170 | 126 | 122 | 161 | 169 |

TABLE 14-continued

| j-th block of Group-wise Interleaver output | (CR 6/15) π(j)-th block of Group-wise Interleaver input | (CR 8/15) π(j)-th block of Group-wise Interleaver input | (CR 10/15) π(j)-th block of Group-wise Interleaver input | (CR 10/15) π(j)-th block of Group-wise Interleaver input | (CR 12/15) π(j)-th block of Group-wise Interleaver input |
|---|---|---|---|---|---|
| 171 | 114 | 5 | 19 | 145 | 176 |
| 172 | 153 | 127 | 144 | 120 | 150 |
| 173 | 72 | 154 | 158 | 129 | 153 |
| 174 | 109 | 97 | 13 | 164 | 171 |
| 175 | 171 | 140 | 152 | 125 | 158 |
| 176 | 176 | 116 | 141 | 5 | 168 |
| 177 | 99 | 165 | 166 | 151 | 144 |
| 178 | 116 | 7 | 125 | 18 | 8 |
| 179 | 123 | 25 | 121 | 140 | 145 |

"j-th block of Group-wise Interleaver output" in Table 14 indicates the j-th bit group output from the group interleaver 122 after interleaving, and "π(j)-th block of Group-wise Interleaver input" indicates the π(j)-th bit group input to the group interleaver 122. Referring to Table 14, it can be seen that Table 14 is arrangement of data described in Tables 9 to 13 according to the code rates.

The group interleaver 122 may interleave the LDPC codeword in bits group wise by using Equation 16 presented below:

$$Y_{\pi(j)} = X_j (0 \le j < N_{group}) \quad (16),$$

where $X_j$ is the $j^{th}$ bit group before group interleaving, and $Y_j$ is the $j^{th}$ bit group after group interleaving. In addition, π(j) is a parameter indicating an interleaving order and is determined by at least one of a length of an LDPC codeword, a code rate, and a modulation method.

Accordingly, $X_j$ is a $j^{th}$ bit group before group interleaving, and Equation 16 means that the pre-interleaving $j^{th}$ bit group is interleaved into the $π(j)^{th}$ bit group.

According to another exemplary embodiment, an example of π(j) may be defined as in Tables 15 to 19 presented below.

In this case, π(j) is defined according to a length of an LPDC codeword and a code rate, and a parity check matrix is also defined according to a length of an LDPC codeword and a code rate. Accordingly, when LDPC encoding is performed based on a specific parity check matrix according to a length of an LDPC codeword and a code rate, the LDPC codeword may be interleaved in bits group wise based on π(j) satisfying the corresponding length of the LDPC codeword and code rate.

For example, when the encoder 110 performs LDPC encoding at a code rate of 6/15 to generate an LDPC codeword of a length of 64800, the group interleaver 122 may perform interleaving by using π(j) which is defined according to the length of the LDPC codeword of 64800 and the code rate of 6/15 in Tables 15 to 19 presented below, for example, by using π(j) defined as shown in Table 15.

For example, when the length $N_{ldpc}$ of the LDPC codeword is 64800, the code rate is 6/15, and the modulation method is 1024-QAM, π(j) may be defined as in Table 15 presented below.

TABLE 15

Order of bits group to be block interleaved π(j) (0 ≤ j < 180)

| j-th block of Group-wise interleaver Intput | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|---|
| | 18 | 19 | 20 | 21 | 22 | 23 | 24 | 25 | 26 | 27 | 28 | 29 | 30 | 31 | 32 | 33 | 34 | 35 |
| | 36 | 37 | 38 | 39 | 40 | 41 | 42 | 43 | 44 | 45 | 46 | 47 | 48 | 49 | 50 | 51 | 52 | 53 |
| | 54 | 55 | 56 | 57 | 58 | 59 | 60 | 61 | 62 | 63 | 64 | 65 | 66 | 67 | 68 | 69 | 70 | 71 |
| | 72 | 73 | 74 | 75 | 76 | 77 | 78 | 79 | 80 | 81 | 82 | 83 | 84 | 85 | 86 | 87 | 88 | 89 |
| | 90 | 91 | 92 | 93 | 94 | 95 | 96 | 97 | 98 | 99 | 100 | 101 | 102 | 103 | 104 | 105 | 106 | 107 |
| | 108 | 109 | 110 | 111 | 112 | 113 | 114 | 115 | 116 | 117 | 118 | 119 | 120 | 121 | 122 | 123 | 124 | 125 |
| | 126 | 127 | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 | 160 | 161 |
| | 162 | 163 | 164 | 165 | 166 | 167 | 168 | 169 | 170 | 171 | 172 | 173 | 174 | 175 | 176 | 177 | 178 | 179 |
| π(j)-th block of Group-wise interleaver output | 14 | 35 | 24 | 96 | 44 | 112 | 133 | 111 | 13 | 57 | 136 | 118 | 7 | 58 | 19 | 54 | 101 | 42 |
| | 43 | 41 | 114 | 1 | 36 | 16 | 5 | 46 | 51 | 64 | 70 | 49 | 40 | 37 | 94 | 6 | 71 | 67 |
| | 50 | 55 | 39 | 32 | 20 | 45 | 21 | 25 | 47 | 59 | 60 | 10 | 68 | 63 | 62 | 2 | 33 | 29 |
| | 4 | 3 | 23 | 15 | 27 | 18 | 66 | 31 | 22 | 9 | 26 | 11 | 0 | 28 | 30 | 34 | 8 | 17 |
| | 173 | 142 | 108 | 78 | 74 | 65 | 97 | 149 | 159 | 93 | 163 | 122 | 150 | 137 | 99 | 127 | 126 | 158 |
| | 117 | 154 | 86 | 128 | 130 | 164 | 95 | 90 | 100 | 177 | 120 | 80 | 160 | 129 | 161 | 76 | 72 | 98 |
| | 85 | 174 | 169 | 104 | 143 | 84 | 171 | 157 | 178 | 82 | 151 | 113 | 168 | 89 | 141 | 179 | 88 | 145 |
| | 52 | 73 | 125 | 139 | 79 | 75 | 144 | 165 | 162 | 87 | 48 | 134 | 77 | 107 | 131 | 138 | 109 | 92 |
| | 115 | 12 | 140 | 153 | 56 | 91 | 103 | 116 | 61 | 172 | 167 | 123 | 119 | 135 | 105 | 124 | 155 | 38 |
| | 102 | 156 | 166 | 132 | 110 | 81 | 148 | 147 | 170 | 175 | 106 | 83 | 146 | 121 | 176 | 53 | 69 | 152 |

In the case of Table 15, Equation 16 may be expressed as $X_0 = Y_{\pi(0)} = Y_{14}$, $X_1 = Y_{\pi(1)} = Y_{35}$, $X_2 = Y_{\pi(2)} = Y_{24}$, ..., $X_{178} = Y_{\pi(178)} = Y_{69}$, and $X_{179} = Y_{\pi(179)} = Y_{152}$. Accordingly, the group interleaver 122 may rearrange the order of the plurality of bit groups in bits group wise by changing the $0^{th}$ bit group to the $14^{th}$ bit group, the $1^{st}$ bit group to the $35^{th}$ bit group, the $2^{nd}$ bit group to the $24^{th}$ bit group, ..., the $178^{th}$ bit group to the $69^{th}$ bit group, and the $179^{th}$ bit group to the $152^{nd}$ bit group.

In another example, when the length $N_{ldpc}$ of the LDPC codeword is 64800, the code rate is 8/15, and the modulation method is 1024-QAM, π(j) may be defined as in Table 16 presented below.

In the case of Table 17, Equation 16 may be expressed as $X_0 = Y_{\pi(0)} = Y_{62}$, $X_1 = Y_{\pi(1)} = Y_4$, $X_2 = Y_{\pi(2)} = Y_{94}$, ..., $X_{178} = Y_{\pi(178)} = Y_{129}$, and $X_{179} = Y_{\pi(179)} = Y_{114}$. Accordingly, the group interleaver 122 may rearrange the order of the plu-

TABLE 16

Order of bits group to be block interleaved π(j) (0 ≤ j < 180)

| | | | | | | | | | | | | | | | | | | |
|---|---|---|---|---|---|---|---|---|---|---|---|---|---|---|---|---|---|---|
| j-th block of Group-wise interleaver intput | 0 | 1 | 2 | 3 | 4 | 5 | 6 | 7 | 8 | 9 | 10 | 11 | 12 | 13 | 14 | 15 | 16 | 17 |
| | 18 | 19 | 20 | 21 | 22 | 23 | 24 | 25 | 26 | 27 | 28 | 29 | 30 | 31 | 32 | 33 | 34 | 35 |
| | 36 | 37 | 38 | 39 | 40 | 41 | 42 | 43 | 44 | 45 | 46 | 47 | 48 | 49 | 50 | 51 | 52 | 53 |
| | 54 | 55 | 56 | 57 | 58 | 59 | 60 | 61 | 62 | 63 | 64 | 65 | 66 | 67 | 68 | 69 | 70 | 71 |
| | 72 | 73 | 74 | 75 | 76 | 77 | 78 | 79 | 80 | 81 | 82 | 83 | 84 | 85 | 86 | 87 | 88 | 89 |
| | 90 | 91 | 92 | 93 | 94 | 95 | 96 | 97 | 98 | 99 | 100 | 101 | 102 | 103 | 104 | 105 | 106 | 107 |
| | 108 | 109 | 110 | 111 | 112 | 113 | 114 | 115 | 116 | 117 | 118 | 119 | 120 | 121 | 122 | 123 | 124 | 125 |
| | 126 | 127 | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 | 160 | 161 |
| | 162 | 163 | 164 | 165 | 166 | 167 | 168 | 169 | 170 | 171 | 172 | 173 | 174 | 175 | 176 | 177 | 178 | 179 |
| π(j)-th block of Group-wise interleaver output | 126 | 50 | 38 | 36 | 66 | 171 | 7 | 178 | 145 | 67 | 49 | 137 | 167 | 19 | 53 | 59 | 68 | 52 |
| | 23 | 42 | 78 | 97 | 102 | 96 | 95 | 179 | 93 | 105 | 92 | 77 | 73 | 107 | 103 | 83 | 89 | 100 |
| | 28 | 64 | 24 | 18 | 31 | 22 | 32 | 60 | 71 | 94 | 70 | 30 | 1 | 26 | 12 | 3 | 40 | 16 |
| | 39 | 15 | 35 | 4 | 51 | 88 | 62 | 14 | 90 | 45 | 29 | 6 | 63 | 47 | 56 | 5 | 34 | 8 |
| | 37 | 17 | 61 | 21 | 33 | 0 | 43 | 20 | 44 | 11 | 2 | 69 | 10 | 57 | 48 | 46 | 13 | 25 |
| | 9 | 55 | 65 | 27 | 58 | 101 | 134 | 174 | 99 | 159 | 166 | 81 | 72 | 104 | 162 | 79 | 146 | 130 |
| | 150 | 127 | 76 | 153 | 74 | 106 | 113 | 163 | 176 | 131 | 111 | 108 | 112 | 165 | 75 | 121 | 124 | 91 |
| | 170 | 172 | 129 | 140 | 120 | 86 | 160 | 155 | 157 | 164 | 85 | 84 | 80 | 123 | 175 | 154 | 161 | 152 |
| | 147 | 41 | 158 | 132 | 138 | 114 | 148 | 143 | 136 | 125 | 173 | 116 | 169 | 98 | 139 | 115 | 118 | 119 |
| | 151 | 141 | 135 | 177 | 87 | 128 | 110 | 149 | 168 | 144 | 122 | 109 | 82 | 54 | 142 | 133 | 156 | 117 |

In the case of Table 16, Equation 16 may be expressed as $X_0 = Y_{\pi(0)} = Y_{126}$, $X_1 = Y_{\pi(1)} = Y_{50}$, $X_2 = Y_{\pi(2)} = Y_{38}$, ..., $X_{178} = Y_{\pi(178)} = Y_{156}$, and $X_{179} = X_{\pi(179)} = Y_{117}$. Accordingly, the group interleaver 122 may rearrange the order of the plurality of bit groups in bits group wise by changing the $0^{th}$ bit group to the $126^{th}$ bit group, the $1^{st}$ bit group to the $50^{th}$ bit group, the $2^{nd}$ bit group to the $38^{th}$ bit group, ..., the $178^{th}$ bit group to the $156^{th}$ bit group, and the $179^{th}$ bit group to the $117^{th}$ bit group.

In another example, when the length $N_{ldpc}$ of the LDPC codeword is 64800, the code rate is 10/15, and the modulation method is 1024-QAM, π(j) may be defined as in Table 17 presented below. In particular, when the encoder 110 performs LDPC encoding based on the parity check matrix defined by Table 6, the group interleaver 122 may perform group interleaving by using π(j) defined as in Table 17 presented below:

rality of bit groups in bits group wise by changing the $0^{th}$ bit group to the $62^{nd}$ bit group, the $1^{st}$ bit group to the $4^{th}$ bit group, the $2^{nd}$ bit group to the $94^{th}$ bit group, ..., the $178^{th}$ bit group to the $129^{th}$ bit group, and the $179^{th}$ bit group to the $114^{th}$ bit group.

In another example, when the length $N_{ldpc}$ of the LDPC codeword is 64800, the code rate is 10/15, and the modulation method is 1024-QAM, π(j) may be defined as in Table 18 presented below. In particular, when the encoder 110 performs LDPC encoding based on the parity check matrix defined by Table 7, the group interleaver 122 may perform group interleaving by using π(j) defined as in Table 18 presented below:

TABLE 17

Order of bits group to be block interleaved π(j) (0 ≤ j < 180)

| | | | | | | | | | | | | | | | | | | |
|---|---|---|---|---|---|---|---|---|---|---|---|---|---|---|---|---|---|---|
| j-th block of Group-wise interleaver input | 0 | 1 | 2 | 3 | 4 | 5 | 6 | 7 | 8 | 9 | 10 | 11 | 12 | 13 | 14 | 15 | 16 | 17 |
| | 18 | 19 | 20 | 21 | 22 | 23 | 24 | 25 | 26 | 27 | 28 | 29 | 30 | 31 | 32 | 33 | 34 | 35 |
| | 36 | 37 | 38 | 39 | 40 | 41 | 42 | 43 | 44 | 45 | 46 | 47 | 48 | 49 | 50 | 51 | 52 | 53 |
| | 54 | 55 | 56 | 57 | 58 | 59 | 60 | 61 | 62 | 63 | 64 | 65 | 66 | 67 | 68 | 69 | 70 | 71 |
| | 72 | 73 | 74 | 75 | 76 | 77 | 78 | 79 | 80 | 81 | 82 | 83 | 84 | 85 | 86 | 87 | 88 | 89 |
| | 90 | 91 | 92 | 93 | 94 | 95 | 96 | 97 | 98 | 99 | 100 | 101 | 102 | 103 | 104 | 105 | 106 | 107 |
| | 108 | 109 | 110 | 111 | 112 | 113 | 114 | 115 | 116 | 117 | 118 | 119 | 120 | 121 | 122 | 123 | 124 | 125 |
| | 126 | 127 | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 | 160 | 161 |
| | 162 | 163 | 164 | 165 | 166 | 167 | 168 | 169 | 170 | 171 | 172 | 173 | 174 | 175 | 176 | 177 | 178 | 179 |
| π(j)-th block of Group-wise interleaver output | 62 | 4 | 94 | 164 | 29 | 36 | 153 | 0 | 12 | 19 | 38 | 101 | 91 | 174 | 5 | 27 | 162 | 156 |
| | 140 | 171 | 83 | 95 | 64 | 72 | 80 | 56 | 88 | 85 | 53 | 9 | 47 | 125 | 107 | 76 | 100 | 74 |
| | 65 | 103 | 79 | 57 | 78 | 92 | 90 | 126 | 26 | 70 | 16 | 43 | 84 | 104 | 25 | 66 | 28 | 59 |
| | 6 | 67 | 106 | 8 | 1 | 3 | 15 | 96 | 99 | 81 | 10 | 11 | 54 | 102 | 87 | 115 | 98 | 23 |
| | 75 | 82 | 143 | 41 | 49 | 33 | 58 | 73 | 44 | 21 | 37 | 63 | 122 | 68 | 69 | 18 | 51 | 34 |
| | 31 | 42 | 35 | 20 | 22 | 52 | 86 | 93 | 77 | 45 | 30 | 13 | 55 | 46 | 17 | 48 | 24 | 50 |
| | 2 | 40 | 89 | 32 | 61 | 14 | 105 | 7 | 39 | 97 | 60 | 71 | 169 | 179 | 170 | 128 | 155 | 178 |
| | 139 | 131 | 120 | 141 | 130 | 158 | 112 | 117 | 138 | 127 | 147 | 142 | 151 | 116 | 136 | 176 | 167 | 154 |
| | 172 | 132 | 149 | 145 | 144 | 108 | 161 | 137 | 175 | 150 | 118 | 165 | 168 | 133 | 173 | 111 | 119 | 152 |
| | 124 | 109 | 148 | 160 | 177 | 146 | 121 | 166 | 113 | 123 | 163 | 110 | 157 | 159 | 134 | 135 | 129 | 114 |

TABLE 18

Order of bits group to be block interleaved π(j) (0 ≤ j < 180)

| j-th block of Group-wise interleaver input | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|---|
| | 18 | 19 | 20 | 21 | 22 | 23 | 24 | 25 | 26 | 27 | 28 | 29 | 30 | 31 | 32 | 33 | 34 | 35 |
| | 36 | 37 | 38 | 39 | 40 | 41 | 42 | 43 | 44 | 45 | 46 | 47 | 48 | 49 | 50 | 51 | 52 | 53 |
| | 54 | 55 | 56 | 57 | 58 | 59 | 60 | 61 | 62 | 63 | 64 | 65 | 66 | 67 | 68 | 69 | 70 | 71 |
| | 72 | 73 | 74 | 75 | 76 | 77 | 78 | 79 | 80 | 81 | 82 | 83 | 84 | 85 | 86 | 87 | 88 | 89 |
| | 90 | 91 | 92 | 93 | 94 | 95 | 96 | 97 | 98 | 99 | 100 | 101 | 102 | 103 | 104 | 105 | 106 | 107 |
| | 108 | 109 | 110 | 111 | 112 | 113 | 114 | 115 | 116 | 117 | 118 | 119 | 120 | 121 | 122 | 123 | 124 | 125 |
| | 126 | 127 | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 | 160 | 161 |
| | 162 | 163 | 164 | 165 | 166 | 167 | 168 | 169 | 170 | 171 | 172 | 173 | 174 | 175 | 176 | 177 | 178 | 179 |
| π(j)-th block of Group-wise interleaver output | 80 | 46 | 55 | 149 | 83 | 176 | 113 | 91 | 96 | 8 | 39 | 164 | 45 | 127 | 52 | 7 | 161 | 47 |
| | 178 | 27 | 57 | 97 | 114 | 21 | 12 | 9 | 71 | 44 | 101 | 70 | 68 | 25 | 18 | 88 | 102 | 6 |
| | 103 | 67 | 73 | 10 | 94 | 17 | 92 | 33 | 16 | 1 | 86 | 53 | 29 | 15 | 40 | 93 | 139 | 107 |
| | 72 | 49 | 51 | 38 | 30 | 76 | 74 | 48 | 34 | 5 | 82 | 126 | 85 | 78 | 23 | 105 | 36 | 31 |
| | 64 | 43 | 58 | 4 | 99 | 54 | 2 | 22 | 81 | 98 | 20 | 60 | 13 | 35 | 104 | 32 | 65 | 135 |
| | 50 | 84 | 106 | 90 | 11 | 37 | 143 | 3 | 24 | 41 | 14 | 19 | 61 | 79 | 89 | 77 | 59 | 26 |
| | 87 | 62 | 28 | 0 | 100 | 63 | 75 | 66 | 69 | 56 | 42 | 95 | 172 | 152 | 108 | 120 | 167 | 175 |
| | 109 | 142 | 163 | 173 | 168 | 110 | 153 | 150 | 166 | 138 | 117 | 125 | 141 | 130 | 179 | 116 | 115 | 151 |
| | 162 | 171 | 169 | 155 | 146 | 158 | 122 | 177 | 136 | 134 | 112 | 157 | 145 | 118 | 160 | 121 | 111 | 170 |
| | 119 | 148 | 174 | 144 | 129 | 131 | 137 | 154 | 140 | 123 | 132 | 156 | 124 | 165 | 133 | 128 | 159 | 147 |

In the case of Table 18, Equation 16 may be expressed as $X_0=Y_{\pi(0)}=Y_{80}$, $X_1=Y_{\pi(1)}=Y_{46}$, $X_2=Y_{\pi(2)}=Y_{55}$, ..., $X_{178}=Y_{\pi(178)}=Y_{159}$, and $X_{179}=Y_{\pi(179)}=Y_{147}$. Accordingly, the group interleaver 122 may rearrange the order of the plurality of bit groups in bits group wise by changing the $0^{th}$ bit group to the $80^{th}$ bit group, the $1^{st}$ bit group to the $46^{th}$ bit group, the $2^{nd}$ bit group to the $55^{th}$ bit group, ..., the $178^{th}$ bit group to the $159^{th}$ bit group, and the $179^{th}$ bit group to the $147^{th}$ bit group.

In another example, when the length $N_{ldpc}$ of the LDPC codeword is 64800, the code rate is 12/15, and the modulation method is 1024-QAM, π(j) may be defined as in Table 19 presented below.

In the above-described examples, the length of the LDPC codeword is 64800 and the code rate is 6/15, 8/15, 10/15, and 12/15. However, this is merely an example and the interleaving pattern may be defined variously when the length of the LDPC codeword is 16200 or the code rate has different values.

As described above, the group interleaver 122 may rearrange the order of the plurality of bit groups in bits group wise by using Equation 16 and Tables 15 to 19.

"j-th block of Group-wise Interleaver input" in Tables 15 to 19 indicates the j-th bit group input to the group interleaver 122 before interleaving, and "π(j)-th block of Group-

TABLE 19

Order of bits group to be block interleaved π(j) (0 ≤ j < 180)

| j-th block of Group-wise interleaver input | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|---|
| | 18 | 19 | 20 | 21 | 22 | 23 | 24 | 25 | 26 | 27 | 28 | 29 | 30 | 31 | 32 | 33 | 34 | 35 |
| | 36 | 37 | 38 | 39 | 40 | 41 | 42 | 43 | 44 | 45 | 46 | 47 | 48 | 49 | 50 | 51 | 52 | 53 |
| | 54 | 55 | 56 | 57 | 58 | 59 | 60 | 61 | 62 | 63 | 64 | 65 | 66 | 67 | 68 | 69 | 70 | 71 |
| | 72 | 73 | 74 | 75 | 76 | 77 | 78 | 79 | 80 | 81 | 82 | 83 | 84 | 85 | 86 | 87 | 88 | 89 |
| | 90 | 91 | 92 | 93 | 94 | 95 | 96 | 97 | 98 | 99 | 100 | 101 | 102 | 103 | 104 | 105 | 106 | 107 |
| | 108 | 109 | 110 | 111 | 112 | 113 | 114 | 115 | 116 | 117 | 118 | 119 | 120 | 121 | 122 | 123 | 124 | 125 |
| | 126 | 127 | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 | 160 | 161 |
| | 162 | 163 | 164 | 165 | 166 | 167 | 168 | 169 | 170 | 171 | 172 | 173 | 174 | 175 | 176 | 177 | 178 | 179 |
| π(j)-th block of Group-wise interleaver output | 135 | 22 | 25 | 149 | 24 | 164 | 64 | 80 | 178 | 159 | 137 | 2 | 29 | 106 | 4 | 162 | 161 | 144 |
| | 117 | 1 | 6 | 26 | 9 | 11 | 157 | 79 | 72 | 90 | 88 | 92 | 69 | 10 | 8 | 38 | 81 | 66 |
| | 123 | 75 | 28 | 59 | 5 | 114 | 119 | 132 | 77 | 70 | 35 | 44 | 43 | 60 | 94 | 87 | 20 | 40 |
| | 130 | 76 | 96 | 53 | 34 | 99 | 37 | 67 | 93 | 138 | 56 | 51 | 142 | 7 | 13 | 30 | 78 | 68 |
| | 127 | 39 | 113 | 42 | 47 | 98 | 12 | 14 | 46 | 32 | 33 | 55 | 86 | 50 | 57 | 49 | 18 | 91 |
| | 105 | 0 | 41 | 129 | 71 | 17 | 102 | 89 | 74 | 104 | 58 | 121 | 54 | 126 | 143 | 103 | 3 | 139 |
| | 62 | 97 | 45 | 31 | 36 | 134 | 82 | 109 | 76 | 16 | 65 | 63 | 108 | 21 | 27 | 133 | 107 | 61 |
| | 110 | 100 | 84 | 116 | 52 | 118 | 125 | 23 | 122 | 83 | 19 | 85 | 48 | 95 | 124 | 15 | 101 | 111 |
| | 177 | 179 | 165 | 145 | 163 | 112 | 172 | 169 | 154 | 173 | 136 | 152 | 155 | 141 | 175 | 160 | 151 | 153 |
| | 140 | 166 | 128 | 120 | 131 | 146 | 176 | 170 | 158 | 174 | 167 | 150 | 147 | 168 | 171 | 156 | 115 | 148 |

In the case of Table 19, Equation 16 may be expressed as $X_0=Y_{\pi(0)}=Y_{135}$, $X_1=Y_{\pi(1)}=Y_{22}$, $X_2=Y_{\pi(2)}=Y_{25}$, ..., $X_{178}=Y_{\pi(178)}=Y_{115}$, and $X_{179}=Y_{\pi(179)}=Y_{148}$. Accordingly, the group interleaver 122 may rearrange the order of the plurality of bit groups in bits group wise by changing the $0^{th}$ bit group to the $135^{th}$ bit group, the $1^{st}$ bit group to the $22^{nd}$ bit group, the $2^{nd}$ bit group to the $25^{th}$ bit group, ..., the $178^{th}$ bit group to the $115^{th}$ bit group, and the $179^{th}$ bit group to the $148^{th}$ bit group.

wise Interleaver output" indicates the π(j)-th bit group output from the group interleaver 122 after interleaving.

In addition, since the order of the bit groups constituting the LDPC codeword is rearranged by the group interleaver 122 in bits group wise, and then the bit groups are block-interleaved by the block interleaver 124, which will be described below, "Order of bits groups to be block interleaved" is set forth in Tables 15 to 19 in relation to π(j).

π(j) defined as shown in Tables 15 to 19 may be arranged according to the code rates as shown in Table 20:

TABLE 20

| j-th block of Group-wise Interleaver input | (CR 6/15) π(j)-th block of Group-wise Interleaver output | (CR 8/15) π(j)-th block of Group-wise Interleaver output | (CR 10/15) π(j)-th block of Group-wise Interleaver output | (CR 10/15) π(j)-th block of Group-wise Interleaver output | (CR 12/15) π(j)-th block of Group-wise Interleaver output |
|---|---|---|---|---|---|
| 0 | 14 | 126 | 62 | 80 | 135 |
| 1 | 35 | 50 | 4 | 46 | 22 |
| 2 | 24 | 38 | 94 | 55 | 25 |
| 3 | 96 | 36 | 164 | 149 | 149 |
| 4 | 44 | 66 | 29 | 83 | 24 |
| 5 | 112 | 171 | 36 | 176 | 164 |
| 6 | 133 | 7 | 153 | 113 | 64 |
| 7 | 111 | 178 | 0 | 91 | 80 |
| 8 | 13 | 145 | 12 | 96 | 178 |
| 9 | 57 | 67 | 19 | 8 | 159 |
| 10 | 136 | 49 | 38 | 39 | 137 |
| 11 | 118 | 137 | 101 | 164 | 2 |
| 12 | 7 | 167 | 91 | 45 | 29 |
| 13 | 58 | 19 | 174 | 127 | 106 |
| 14 | 19 | 53 | 5 | 52 | 4 |
| 15 | 54 | 59 | 27 | 7 | 162 |
| 16 | 101 | 68 | 162 | 161 | 161 |
| 17 | 42 | 52 | 156 | 47 | 144 |
| 18 | 43 | 23 | 140 | 178 | 117 |
| 19 | 41 | 42 | 171 | 27 | 1 |
| 20 | 114 | 78 | 83 | 57 | 6 |
| 21 | 1 | 97 | 95 | 97 | 26 |
| 22 | 36 | 102 | 64 | 114 | 9 |
| 23 | 16 | 96 | 72 | 21 | 11 |
| 24 | 5 | 95 | 80 | 12 | 157 |
| 25 | 46 | 179 | 56 | 9 | 79 |
| 26 | 51 | 93 | 88 | 71 | 72 |
| 27 | 64 | 105 | 85 | 44 | 90 |
| 28 | 70 | 92 | 53 | 101 | 88 |
| 29 | 49 | 77 | 9 | 70 | 92 |
| 30 | 40 | 73 | 47 | 68 | 69 |
| 31 | 37 | 107 | 125 | 25 | 10 |
| 32 | 94 | 103 | 107 | 18 | 8 |
| 33 | 6 | 83 | 76 | 88 | 38 |
| 34 | 71 | 89 | 100 | 102 | 81 |
| 35 | 67 | 100 | 74 | 6 | 66 |
| 36 | 50 | 28 | 65 | 103 | 123 |
| 37 | 55 | 64 | 103 | 67 | 75 |
| 38 | 39 | 24 | 79 | 73 | 28 |
| 39 | 32 | 18 | 57 | 10 | 59 |
| 40 | 20 | 31 | 78 | 94 | 5 |
| 41 | 45 | 22 | 92 | 17 | 114 |
| 42 | 21 | 32 | 90 | 92 | 119 |
| 43 | 25 | 60 | 126 | 33 | 132 |
| 44 | 47 | 71 | 26 | 16 | 77 |
| 45 | 59 | 94 | 70 | 1 | 70 |
| 46 | 60 | 70 | 16 | 86 | 35 |
| 47 | 10 | 30 | 43 | 53 | 44 |
| 48 | 68 | 1 | 84 | 29 | 43 |
| 49 | 63 | 26 | 104 | 15 | 60 |
| 50 | 62 | 12 | 25 | 40 | 94 |
| 51 | 2 | 3 | 66 | 93 | 87 |
| 52 | 33 | 40 | 28 | 139 | 20 |
| 53 | 29 | 16 | 59 | 107 | 40 |
| 54 | 4 | 39 | 6 | 72 | 130 |
| 55 | 3 | 15 | 67 | 49 | 76 |
| 56 | 23 | 35 | 106 | 51 | 96 |
| 57 | 15 | 4 | 8 | 38 | 53 |
| 58 | 27 | 51 | 1 | 30 | 34 |
| 59 | 18 | 88 | 3 | 76 | 99 |
| 60 | 66 | 62 | 15 | 74 | 37 |
| 61 | 31 | 14 | 96 | 48 | 67 |
| 62 | 22 | 90 | 99 | 34 | 93 |
| 63 | 9 | 45 | 81 | 5 | 138 |
| 64 | 26 | 29 | 10 | 82 | 56 |
| 65 | 11 | 6 | 11 | 126 | 51 |
| 66 | 0 | 63 | 54 | 85 | 142 |
| 67 | 28 | 47 | 102 | 78 | 7 |
| 68 | 30 | 56 | 87 | 23 | 13 |
| 69 | 34 | 5 | 115 | 105 | 30 |
| 70 | 8 | 34 | 98 | 36 | 78 |
| 71 | 17 | 8 | 23 | 31 | 68 |
| 72 | 173 | 37 | 75 | 64 | 127 |
| 73 | 142 | 17 | 82 | 43 | 39 |

TABLE 20-continued

| j-th block of Group-wise Interleaver input | (CR 6/15) π(j)-th block of Group-wise Interleaver output | (CR 8/15) π(j)-th block of Group-wise Interleaver output | (CR 10/15) π(j)-th block of Group-wise Interleaver output | (CR 10/15) π(j)-th block of Group-wise Interleaver output | (CR 12/15) π(j)-th block of Group-wise Interleaver output |
|---|---|---|---|---|---|
| 74 | 108 | 61 | 143 | 58 | 113 |
| 75 | 78 | 21 | 41 | 4 | 42 |
| 76 | 74 | 33 | 49 | 99 | 47 |
| 77 | 65 | 0 | 33 | 54 | 98 |
| 78 | 97 | 43 | 58 | 2 | 12 |
| 79 | 149 | 20 | 73 | 22 | 14 |
| 80 | 159 | 44 | 44 | 81 | 46 |
| 81 | 93 | 11 | 21 | 98 | 32 |
| 82 | 163 | 2 | 37 | 20 | 33 |
| 83 | 122 | 69 | 63 | 60 | 55 |
| 84 | 150 | 10 | 122 | 13 | 86 |
| 85 | 137 | 57 | 68 | 35 | 50 |
| 86 | 99 | 48 | 69 | 104 | 57 |
| 87 | 127 | 46 | 18 | 32 | 49 |
| 88 | 126 | 13 | 51 | 65 | 18 |
| 89 | 158 | 25 | 34 | 135 | 91 |
| 90 | 117 | 9 | 31 | 50 | 105 |
| 91 | 154 | 55 | 42 | 84 | 0 |
| 92 | 86 | 65 | 35 | 106 | 41 |
| 93 | 128 | 27 | 20 | 90 | 129 |
| 94 | 130 | 58 | 22 | 11 | 71 |
| 95 | 164 | 101 | 52 | 37 | 17 |
| 96 | 95 | 134 | 86 | 143 | 102 |
| 97 | 90 | 174 | 93 | 3 | 89 |
| 98 | 100 | 99 | 77 | 24 | 74 |
| 99 | 177 | 159 | 45 | 41 | 104 |
| 100 | 120 | 166 | 30 | 14 | 58 |
| 101 | 80 | 81 | 13 | 19 | 121 |
| 102 | 160 | 72 | 55 | 61 | 54 |
| 103 | 129 | 104 | 46 | 79 | 126 |
| 104 | 161 | 162 | 17 | 89 | 143 |
| 105 | 76 | 79 | 48 | 77 | 103 |
| 106 | 72 | 146 | 24 | 59 | 3 |
| 107 | 98 | 130 | 50 | 26 | 139 |
| 108 | 85 | 150 | 2 | 87 | 62 |
| 109 | 174 | 127 | 40 | 62 | 97 |
| 110 | 169 | 76 | 89 | 28 | 45 |
| 111 | 104 | 153 | 32 | 0 | 31 |
| 112 | 143 | 74 | 61 | 100 | 36 |
| 113 | 84 | 106 | 14 | 63 | 134 |
| 114 | 171 | 113 | 105 | 75 | 82 |
| 115 | 157 | 163 | 7 | 66 | 109 |
| 116 | 178 | 176 | 39 | 69 | 73 |
| 117 | 82 | 131 | 97 | 56 | 16 |
| 118 | 151 | 111 | 60 | 42 | 65 |
| 119 | 113 | 108 | 71 | 95 | 63 |
| 120 | 168 | 112 | 169 | 172 | 108 |
| 121 | 89 | 165 | 179 | 152 | 21 |
| 122 | 141 | 75 | 170 | 108 | 27 |
| 123 | 179 | 121 | 128 | 120 | 133 |
| 124 | 88 | 124 | 155 | 167 | 107 |
| 125 | 145 | 91 | 178 | 175 | 61 |
| 126 | 52 | 170 | 139 | 109 | 110 |
| 127 | 73 | 172 | 131 | 142 | 100 |
| 128 | 125 | 129 | 120 | 163 | 84 |
| 129 | 139 | 140 | 141 | 173 | 116 |
| 130 | 79 | 120 | 130 | 168 | 52 |
| 131 | 75 | 86 | 158 | 110 | 118 |
| 132 | 144 | 160 | 112 | 153 | 125 |
| 133 | 165 | 155 | 117 | 150 | 23 |
| 134 | 162 | 157 | 138 | 166 | 122 |
| 135 | 87 | 164 | 127 | 138 | 83 |
| 136 | 48 | 85 | 147 | 117 | 19 |
| 137 | 134 | 84 | 142 | 125 | 85 |
| 138 | 77 | 80 | 151 | 141 | 48 |
| 139 | 107 | 123 | 116 | 130 | 95 |
| 140 | 131 | 175 | 136 | 179 | 124 |
| 141 | 138 | 154 | 176 | 116 | 15 |
| 142 | 109 | 161 | 167 | 115 | 101 |
| 143 | 92 | 152 | 154 | 151 | 111 |
| 144 | 115 | 147 | 172 | 162 | 177 |
| 145 | 12 | 41 | 132 | 171 | 179 |
| 146 | 140 | 158 | 149 | 169 | 165 |
| 147 | 153 | 132 | 145 | 155 | 145 |

TABLE 20-continued

| j-th block of Group-wise Interleaver input | (CR 6/15) π(j)-th block of Group-wise Interleaver output | (CR 8/15) π(j)-th block of Group-wise Interleaver output | (CR 10/15) π(j)-th block of Group-wise Interleaver output | (CR 10/15) π(j)-th block of Group-wise Interleaver output | (CR 12/15) π(j)-th block of Group-wise Interleaver output |
|---|---|---|---|---|---|
| 148 | 56 | 138 | 144 | 146 | 163 |
| 149 | 91 | 114 | 108 | 158 | 112 |
| 150 | 103 | 148 | 161 | 122 | 172 |
| 151 | 116 | 143 | 137 | 177 | 169 |
| 152 | 61 | 136 | 175 | 136 | 154 |
| 153 | 172 | 125 | 150 | 134 | 173 |
| 154 | 167 | 173 | 118 | 112 | 136 |
| 155 | 123 | 116 | 165 | 157 | 152 |
| 156 | 119 | 169 | 168 | 145 | 155 |
| 157 | 135 | 98 | 133 | 118 | 141 |
| 158 | 105 | 139 | 173 | 160 | 175 |
| 159 | 124 | 115 | 111 | 121 | 160 |
| 160 | 155 | 118 | 119 | 111 | 151 |
| 161 | 38 | 119 | 152 | 170 | 153 |
| 162 | 102 | 151 | 124 | 119 | 140 |
| 163 | 156 | 141 | 109 | 148 | 166 |
| 164 | 166 | 135 | 148 | 174 | 128 |
| 165 | 132 | 177 | 160 | 144 | 120 |
| 166 | 110 | 87 | 177 | 129 | 131 |
| 167 | 81 | 128 | 146 | 131 | 146 |
| 168 | 148 | 110 | 121 | 137 | 176 |
| 169 | 147 | 149 | 166 | 154 | 170 |
| 170 | 170 | 168 | 113 | 140 | 158 |
| 171 | 175 | 144 | 123 | 123 | 174 |
| 172 | 106 | 122 | 163 | 132 | 167 |
| 173 | 83 | 109 | 110 | 156 | 150 |
| 174 | 146 | 82 | 157 | 124 | 147 |
| 175 | 121 | 54 | 159 | 165 | 168 |
| 176 | 176 | 142 | 134 | 133 | 171 |
| 177 | 53 | 133 | 135 | 128 | 156 |
| 178 | 69 | 156 | 129 | 159 | 115 |
| 179 | 152 | 117 | 114 | 147 | 148 |

Table 14 is the case in which group interleaving is performed using Equation 15 and π(j) is applied as an index of an input bit group, and Table 20 is the case in which group interleaving is performed using Equation 16 and π(j) is applied as an index of an output bit group. Therefore, Tables 14 and 20 have an inverse relationship with each other.

Figure 6:
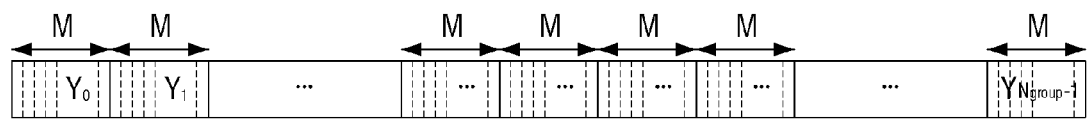

The LDPC codeword which is group-interleaved in the above-described method is illustrated in FIG. 6. Comparing the LDPC codeword of FIG. 6 and the LDPC codeword of FIG. 5 before group interleaving, it can be seen that the order of the plurality of bit groups constituting the LDPC codeword is rearranged.

That is, as shown in FIGS. 5 and 6, the groups of the LDPC codeword are arranged in order of bit group $X_0$, bit group $X_1$, . . . , bit group $X_{Ngroup-1}$ before being group-interleaved, and are arranged in an order of bit group $Y_0$, bit group $Y_1$, . . . , bit group $Y_{Ngroup-1}$ after being group-interleaved. In this case, the order of arranging the bit groups by the group interleaving may be determined based on Tables 9 to 20.

The group twist interleaver 123 interleaves bits in a same group. That is, the group twist interleaver 123 may rearrange an order of bits in a same bit group by changing the order of the bits in the same bit group.

In this case, the group twist interleaver 123 may rearrange the order of the bits in the same bit group by cyclic-shifting a predetermined number of bits from among the bits in the same bit group.

Figure 7:
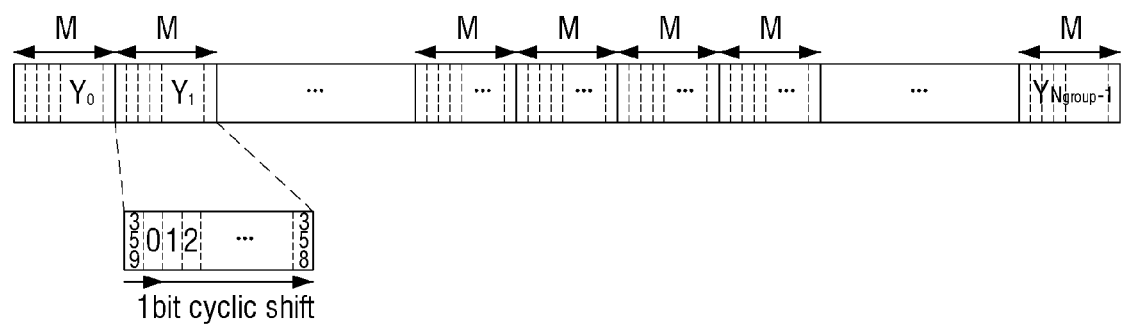

For example, as shown in FIG. 7, the group twist interleaver 123 may cyclic-shift bits included in the bit group $Y_1$ to the right by 1 bit. In this case, the bits located in the $0^{th}$ position, the $1^{st}$ position, the $2^{nd}$ position, . . . , the $358^{th}$ position, and the $359^{th}$ position in the bit group $Y_1$ as shown in FIG. 7 are cyclic-shifted to the right by 1 bit. As a result, the bit located in the $359^{th}$ position before being cyclic-shifted is located in the front of the bit group $Y_1$ and the bits located in the $0^{th}$ position, the $1^{st}$ position, the $2^{nd}$ position, . . . , the $358^{th}$ position before being cyclic-shifted are shifted to the right serially by 1 bit and located.

In addition, the group twist interleaver 123 may rearrange the order of bits in each bit group by cyclic-shifting a different number of bits in each bit group.

For example, the group twist interleaver 123 may cyclic-shift the bits included in the bit group $Y_1$ to the right by 1 bit, and may cyclic-shift the bits included in the bit group $Y_2$ to the right by 3 bits.

However, the group twist interleaver 123 may be omitted according to circumstances.

In addition, the group twist interleaver 123 is placed after the group interleaver 122 in the above-described example. However, this is merely an example. That is, the group twist interleaver 123 changes only the order of bits in a certain bit group and does not change the order of the bit groups. Therefore, the group twist interleaver 123 may be placed before the group interleaver 122.

The block interleaver 124 interleaves the plurality of bit groups the order of which has been rearranged. Specifically, the block interleaver 124 may interleave the plurality of bit groups the order of which has been rearranged by the group interleaver 122 in bits group wise (or group units). The block interleaver 124 is formed of a plurality of columns each including a plurality of rows, and may interleave by dividing the plurality of rearranged bit groups based on a modulation order determined according to a modulation method.

In this case, the block interleaver 124 may interleave the plurality of bit groups the order of which has been rearranged by the group interleaver 122 in bits group wise. Specifically, the block interleaver 124 may interleave by dividing the plurality of rearranged bit groups according to a modulation order by using a first part and a second part.

Specifically, the block interleaver 124 interleaves by dividing each of the plurality of columns into a first part and a second part, writing the plurality of bit groups in the plurality of columns of the first part serially in bits group wise, dividing bits of the other bit groups into groups (or sub bit groups) each including a predetermined number of bits based on the number of columns, and writing the sub bit groups in the plurality of columns of the second part serially.

Here, the number of bit groups which are interleaved in bits group wise may be determined by at least one of the number of rows and columns constituting the block interleaver 124, the number of bit groups, and the number of bits included in each bit group. In other words, the block interleaver 124 may determine bit groups which are to be interleaved in bits group wise considering at least one of the number of rows and columns constituting the block interleaver 124, the number of bit groups, and the number of bits included in each bit group, interleave the corresponding bit groups in bits group wise, and divide bits of the other bit groups into sub bit groups and interleave the sub bit groups. For example, the block interleaver 124 may interleave at least part of the plurality of bit groups in bits group wise using the first part, and divide bits of the other bit groups into sub bit groups and interleave the sub bit groups using the second part.

Meanwhile, interleaving bit groups in bits group wise (or in bit group units) means that bits included in a same bit group are written in a same column. In other words, the block interleaver 124, in case of bit groups which are interleaved in bits group wise, may not divide the bits included in the same bit groups and instead write the bits in the same column. However, in case of bit groups which are not interleaved in bits group wise, may divide bits in at least one of these bit groups or each of these bit groups and write the bits in different columns.

Accordingly, the number of rows constituting the first part is an integer multiple of the number of bits included in one bit group (for example, 360), and the number of rows constituting the second part may be less than the number of bits included in this bit group.

In addition, in all bit groups interleaved by the first part, bits included in a same bit group are written and interleaved in a same column of the first part, and in at least one group interleaved by the second part, bits are divided and written in at least two columns of the second part.

The interleaving method will be described later.

Meanwhile, the group twist interleaver 123 changes only an order of bits in a bit group and does not change the order of bit groups by interleaving. Accordingly, an order of bit groups to be block-interleaved by the block interleaver 124, that is, the order of the bit groups to be input to the block interleaver 124, may be determined by the group interleaver 122. For example, the order of the bit groups to be block-interleaved by the block interleaver 124 may be determined by $\pi(j)$ defined in Tables 9 to 20.

As described above, the block interleaver 124 may interleave the plurality of bit groups the order of which has been rearranged in bits group wise by using the plurality of columns each including the plurality of rows.

In this case, the block interleaver 124 may interleave the LDPC codeword by dividing the plurality of columns into at least two parts. For example, the block interleaver 124 may divide each of the plurality of columns into the first part and the second part and interleave the plurality of bit groups constituting the LDPC codeword.

In this case, the block interleaver 124 may divide each of the plurality of columns into N number of parts (N is an integer greater than or equal to 2) according to whether the number of bit groups constituting the LDPC codeword is an integer multiple of the number of columns constituting the block interleaver 124, and may perform interleaving.

When the number of bit groups constituting the LDPC codeword is an integer multiple of the number of columns constituting the block interleaver 124, the block interleaver 124 may interleave the plurality of bit groups constituting the LDPC codeword in bits group wise without dividing each of the plurality of columns into parts.

Specifically, the block interleaver 124 may interleave by writing the plurality of bit groups of the LDPC codeword on each of the columns in bits group wise in a column direction, and reading each row of the plurality of columns in which the plurality of bit groups are written in bits group wise in a row direction.

In this case, the block interleaver 124 may interleave by writing bits included in a predetermined number of bit groups, which corresponds to a quotient obtained by dividing the number of bit groups of the LDPC codeword by the number of columns of the block interleaver 124, on each of the plurality of columns serially in a column direction, and reading each row of the plurality of columns in which the bits are written in a row direction.

Hereinafter, the bit group located in the $j^{th}$ position after being interleaved by the group interleaver 122 will be referred to as group $Y_j$.

For example, it is assumed that the block interleaver 124 is formed of C number of columns each including $R_1$ number of rows. In addition, it is assumed that the LDPC codeword is formed of $N_{group}$ number of bit groups and the number of bit groups $N_{group}$ is an integer multiple of C.

In this case, when the quotient obtained by dividing $N_{group}$ number of bit groups constituting the LDPC codeword by C number of columns constituting the block interleaver 124 is A ($=N_{group}/C$) (A is an integer greater than 0), the block interleaver 124 may interleave by writing A ($=N_{group}/C$) number of bit groups on each column serially in the column direction and reading bits written on each column in the row direction.

Figure 8:
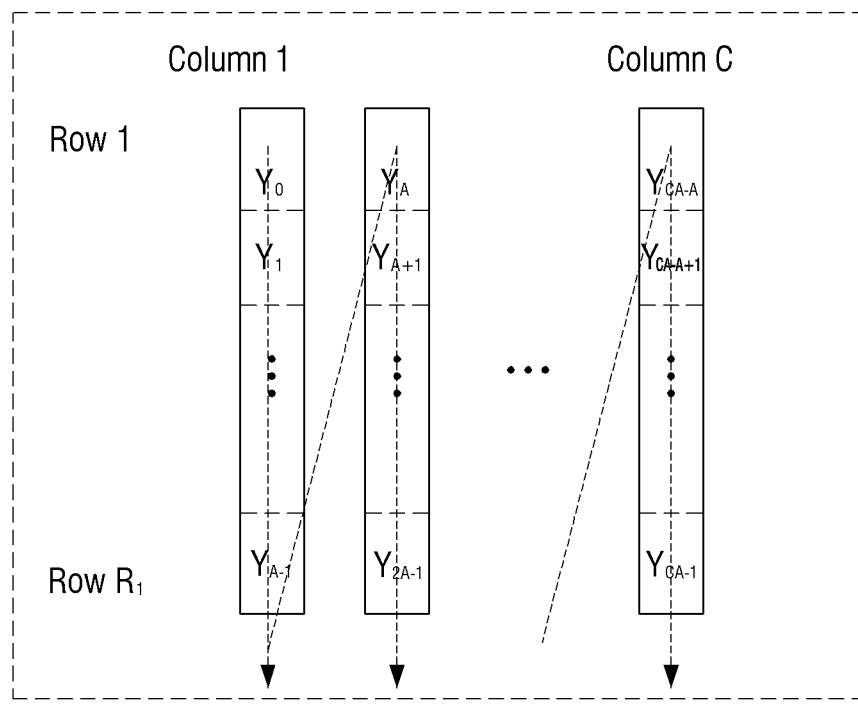
FIGS. 8 to 12 are views to illustrate a configuration of a block interleaver and an interleaving method according to exemplary embodiments.
Figure 8:
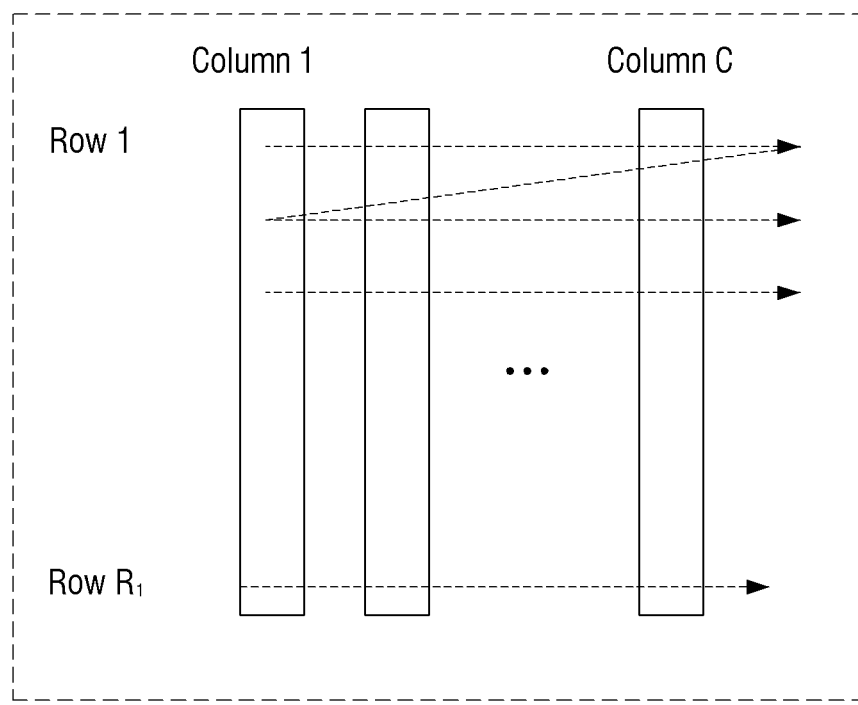

For example, as shown in FIG. 8, the block interleaver 124 writes bits included in bit group $Y_0$, bit group $Y_1, \ldots,$ bit group $Y_{A-1}$ in the 1$^{st}$ column from the 1$^{st}$ row to the $R_1^{th}$ row, writes bits included in bit group $Y_A$, bit group $Y_{A+1}, \ldots,$ bit group $Y_{2A-1}$ in the 2nd column from the 1$^{st}$ row to the $R_1^{th}$ row, $\ldots,$ and writes bits included in bit group $Y_{CA-A}$, bit group $Y_{CA-A+1}, \ldots,$ bit group $Y_{CA-1}$ in the column C from the 1$^{st}$ row to the $R_1^{th}$ row. The block interleaver 124 may read the bits written in each row of the plurality of columns in the row direction.

Accordingly, the block interleaver 124 interleaves all bit groups constituting the LDPC codeword in bits group wise.

However, when the number of bit groups of the LDPC codeword is not an integer multiple of the number of columns of the block interleaver 124, the block interleaver 124 may divide each column into two parts and interleave a part of the plurality of bit groups of the LDPC codeword in bits group wise, and divide bits of the other bit groups into sub bit groups and interleave the sub bit groups. In this case, the bits included in the other bit groups, that is, the bits included in the number of groups which correspond to the remainder when the number of bit groups constituting the LDPC codeword is divided by the number of columns are not interleaved in bits group wise, but interleaved by being divided according to the number of columns.

Specifically, the block interleaver 124 may interleave the LDPC codeword by dividing each of the plurality of columns into two parts.

In this case, the block interleaver 124 may divide the plurality of columns into the first part and the second part based on at least one of the number of rows and columns of the block interleaver 124, the number of bit groups constituting the LDPC codeword, and the number of bits constituting each of the bit groups.

Here, each of the plurality of bit groups may be formed of 360 bits. In addition, the number of bit groups of the LDPC codeword is determined based on the length of the LDPC codeword and the number of bits included in each bit group. For example, when an LDPC codeword in the length of 16200 is divided such that each bit group has 360 bits, the LDPC codeword is divided into 45 bit groups. Alternatively, when an LDPC codeword in the length of 64800 is divided such that each bit group has 360 bits, the LDPC codeword may be divided into 180 bit groups. Further, the number of columns constituting the block interleaver 124 may be determined according to a modulation method. This will be explained in detail below.

Accordingly, the number of rows constituting each of the first part and the second part may be determined based on the number of columns constituting the block interleaver 124, the number of bit groups constituting the LDPC codeword, and the number of bits constituting each of the plurality of bit groups.

Specifically, in each of the plurality of columns, the first part may be formed of as many rows as the number of bits constituting at least one bit group, which can be written in each column in bits group wise, from among the plurality of bit groups of the LDPC codeword, according to the number of columns constituting the block interleaver 124, the number of bit groups constituting the LDPC codeword, and the number of bits constituting each bit group.

In each of the plurality of columns, the second part may be formed of rows excluding as many rows as the number of bits constituting at least some bit groups, which can be written in each of the plurality of columns in bits group wise, from among the plurality of bit groups of the LDPC codeword. Specifically, the number rows of the second part may be the same value as a quotient when the number of bits included in all bit groups excluding bit groups corresponding to the first part is divided by the number of columns constituting the block interleaver 124. In other words, the number of rows of the second part may be the same value as a quotient when the number of bits included in the remaining bit groups which are not written in the first part from among bit groups constituting the LDPC codeword is divided by the number of columns.

That is, the block interleaver 124 may divide each of the plurality of columns into the first part including as many rows as the number of bits included in bit groups which can be written in each column in bits group wise, and the second part including the other rows.

Accordingly, the first part may be formed of as many rows as the number of bits included in bit groups, that is, as many rows as an integer multiple of M. However, since the number of codeword bits constituting each bit group may be an aliquot part of M as described above, the first part may be formed of as many rows as an integer multiple of the number of bits constituting each bit group.

In this case, the block interleaver 124 may interleave by writing and reading the LDPC codeword in the first part and the second part in the same method.

Specifically, the block interleaver 124 may interleave by writing the LDPC codeword in the plurality of columns constituting each of the first part and the second part in a column direction, and reading the plurality of columns constituting the first part and the second part in which the LDPC codeword is written in a row direction.

That is, the block interleaver 124 may interleave by writing the bits included in at least some bit groups, which can be written in each of the plurality of columns in bits group wise among the plurality of bit groups constituting the LDPC codeword, in each of the plurality of columns of the first part serially, dividing the bits included in the other bit groups and writing these divided bits in the plurality of columns of the second part in the column direction, and reading the bits written in each of the plurality of columns constituting each of the first part and the second part in the row direction.

In this case, the block interleaver 124 may interleave by dividing the other bit groups from among the plurality of bit groups constituting the LDPC codeword based on the number of columns constituting the block interleaver 124.

Specifically, the block interleaver 124 may interleave by dividing the bits included in the other bit groups by the number of a plurality of columns, writing each of the divided bits in each of the plurality of columns constituting the second part in the column direction, and reading the plurality of columns constituting the second part, where the divided bits are written, in the row direction.

That is, the block interleaver 124 may divide the bits included in the other bit groups among the plurality of bit groups of the LDPC codeword, that is, the bits in the number of bit groups which correspond to the remainder when the number of bit groups constituting the LDPC codeword is divided by the number of columns, by the number of columns, and may write the divided bits in each column of the second part serially in the column direction.

For example, it is assumed that the block interleaver 124 is formed of C number of columns each including $R_1$ number of rows. In addition, it is assumed that the LDPC codeword is formed of $N_{group}$ number of bit groups, the number of bit groups $N_{group}$ is not an integer multiple of C, and $A \times C + 1 = N_{group}$ (A is an integer greater than 0). In other words, it is assumed that when the number of bit groups constituting the LDPC codeword is divided by the number of columns, the quotient is A and the remainder is 1.

Figure 9:
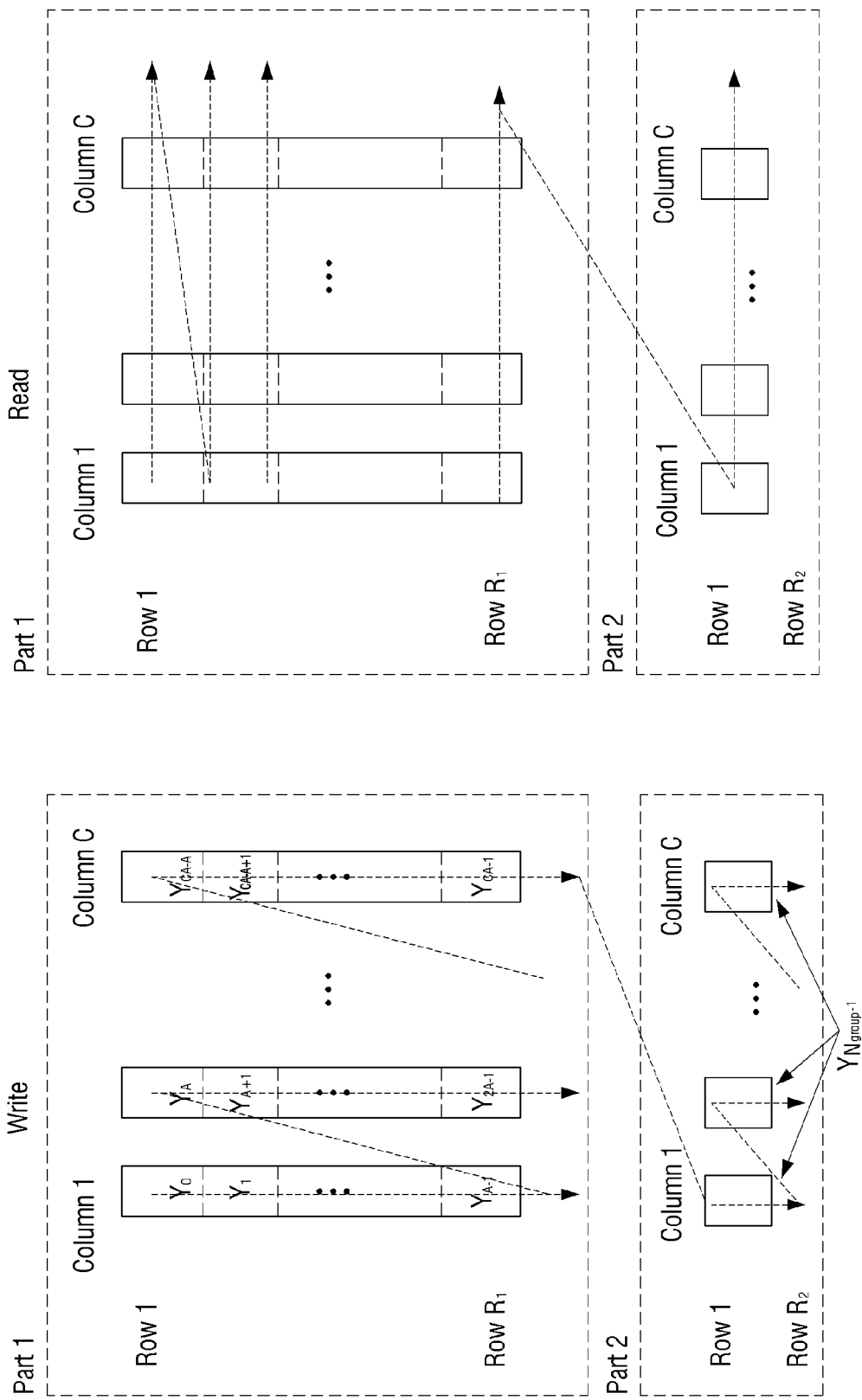
Figure 10:
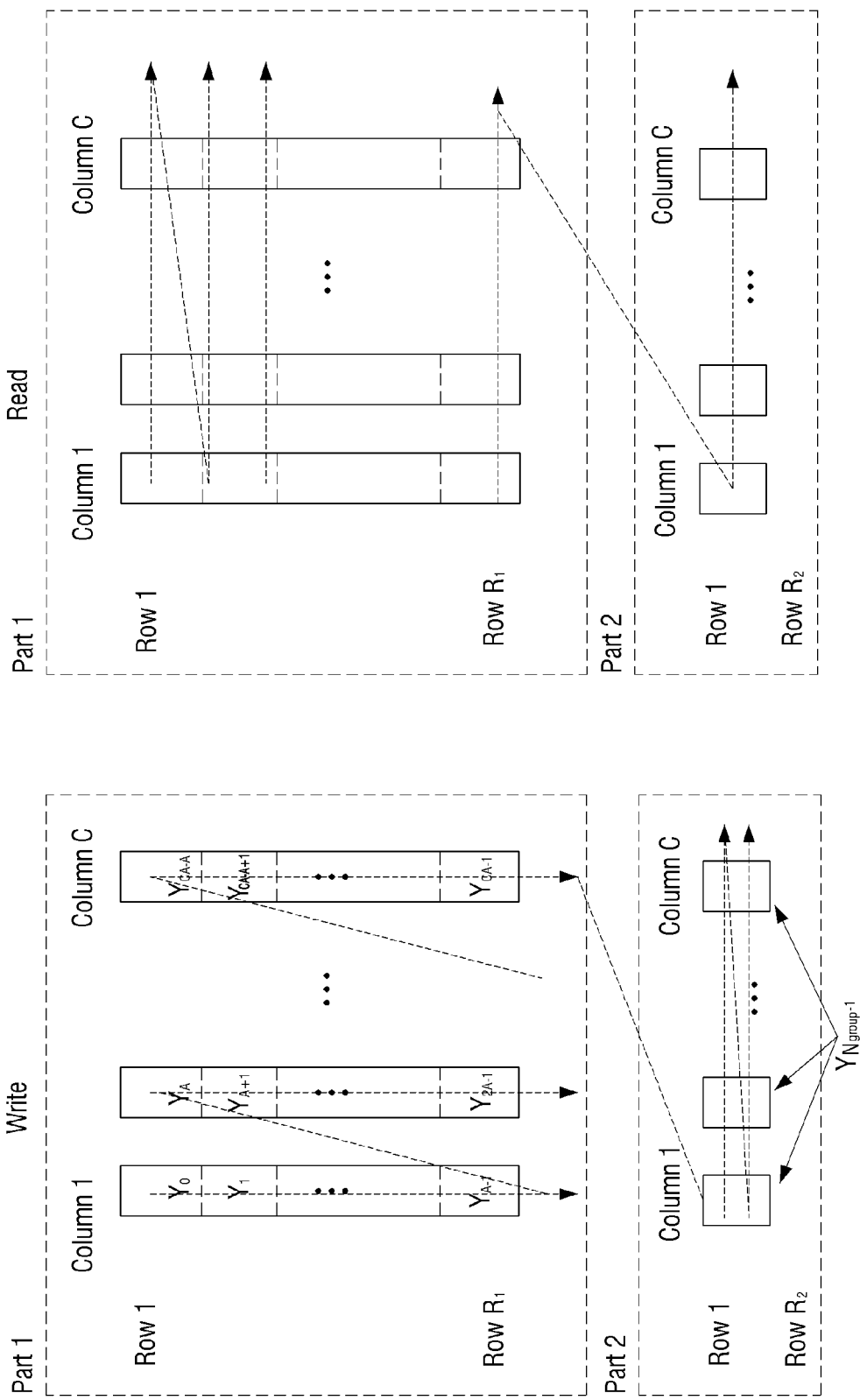

In this case, as shown in FIGS. 9 and 10, the block interleaver 124 may divide each column into a first part including $R_1$ number of rows and a second part including $R_2$ number of rows. In this case, $R_1$ may correspond to the number of bits included in bit groups which can be written in each column in bits group wise, and $R_2$ may be $R_1$ subtracted from the number of rows of each column.

That is, in the above-described example, the number of bit groups which can be written in each column in bits group wise is A, and the first part of each column may be formed of as many rows as the number of bits included in A number of bit groups, that is, may be formed of as many rows as $A \times M$ number.

In this case, the block interleaver 124 writes the bits included in the bit groups which can be written in each column in bits group wise, that is, A number of bit groups, in the first part of each column in the column direction.

That is, as shown in FIGS. 9 and 10, the block interleaver 124 writes the bits included in each of bit group $Y_0$, bit group $Y_1, \ldots,$ group $Y_{A-1}$ in the $1^{st}$ to $R_1^{th}$ rows of the first part of the $1^{st}$ column, writes bits included in each of bit group $Y_A$, bit group $Y_{A+1}, \ldots,$ bit group $Y_{2A-1}$ in the $1^{st}$ to $R_1^{th}$ rows of the first part of the $2^{nd}$ column, . . . , writes bits included in each of bit group $Y_{CA-A}$, bit group $Y_{CA-A+1}, \ldots,$ bit group $Y_{CA-1}$ in the $1^{st}$ to $R_1^{th}$ rows of the first part of the column C.

As described above, the block interleaver 124 writes the bits included in the bit groups which can be written in each column in bits group wise in the first part of each column in bits group wise.

In other words, in the above exemplary embodiment, the bits included in each of bit group ($Y_0$), bit group ($Y_1$), . . . , bit group ($Y_{A-1}$) may not be divided and all of the bits may be written in the first column, the bits included in each of bit group ($Y_A$), bit group ($Y_{A+1}$), . . . , bit group ($Y_{2A-1}$) may not be divided and all of the bits may be written in the second column, . . . , and the bits included in each of bit group ($Y_{CA-A}$), bit group ($Y_{CA-A+1}$), . . . , group ($Y_{CA-1}$) may not be divided and all of the bits may be written in the C column. As such, bits included in a same bit group in all bit groups interleaved by the first part are written in a same column of the first part.

Thereafter, the block interleaver 124 divides the bits included in the groups other than the bit groups written in the first part of each column from among the plurality of bit groups, and writes these bits in the second part of each column in the column direction. In this case, the block interleaver 124 divides the bits included in the other bit groups such that a same number of bits are written in the second part of each column in the column direction. Here, an order of writing bits in the first part and the second part may be reversed. That is, bits may be written in the second part ahead of the first part according to an exemplary embodiment.

In the above-described example, since $A \times C+1=N_{group}$, when the bit groups constituting the LDPC codeword are written in the first part serially, the last bit group $Y_{Ngroup-1}$ of the LDPC codeword is not written in the first part and remains. Accordingly, the block interleaver 124 divides the bits included in the bit group $Y_{Ngroup-1}$ into C number of sub bit groups as shown in FIG. 9, and writes the divided bits (that is, the bits corresponding to the quotient when the bits included in the last group ($Y_{Ngroup-1}$) are divided by C) in the second part of each column serially.

The bits divided based on the number of columns may be referred to as sub bit groups. In this case, each of the sub bit groups may be written in each column of the second part. That is, the bits included in the bit groups may be divided and may form the sub bit groups.

That is, the block interleaver 124 writes the bits in the $1^{st}$ to $R_2^{th}$ rows of the second part of the $1^{st}$ column, writes the bits in the $1^{st}$ to $R_2^{th}$ rows of the second part of the $2^{nd}$ column, . . . , and writes the bits in the $1^{st}$ to $R_2^{th}$ rows of the second part of the column C. In this case, the block interleaver 124 may write the bits in the second part of each column in the column direction as shown in FIG. 9.

That is, in the second part, bits constituting a bit group may not be written in a same column and may be written in a plurality of columns. In other words, in the above example, the last bit group ($Y_{Ngroup-1}$) is formed of M number of bits and thus, the bits included in the last bit group ($Y_{Ngroup-1}$) may be divided by M/C and written in each column. That is, the bits included in the last bit group ($Y_{Ngroup-1}$) are divided by M/C, forming M/C number of sub bit groups, and each of the sub bit groups may be written in each column of the second part.

Accordingly, in at least one bit group which is interleaved by the second part, the bits included in the at least one bit group are divided and written in at least two columns constituting the second part.

In the above-described example, the block interleaver 124 writes the bits in the second part in the column direction. However, this is merely an example. That is, the block interleaver 124 may write the bits in the plurality of columns of the second parts in the row direction. In this case, the block interleaver 124 may write the bits in the first part in the same method as described above.

Specifically, referring to FIG. 10, the block interleaver 124 writes the bits from the $1^{st}$ row of the second part in the $1^{st}$ column to the $1^{st}$ row of the second part in the column C, writes the bits from the $2^{nd}$ row of the second part in the $1^{st}$ column to the $2^{nd}$ row of the second part in the column C, . . . , and writes the bits from the $R_2^{th}$ row of the second part in the $1^{st}$ column to the $R_2^{th}$ row of the second part in the column C.

On the other hand, the block interleaver 124 reads the bits written in each row of each part serially in the row direction. That is, as shown in FIGS. 9 and 10, the block interleaver 124 reads the bits written in each row of the first part of the plurality of columns serially in the row direction, and reads the bits written in each row of the second part of the plurality of columns serially in the row direction.

Accordingly, the block interleaver 124 may interleave a part of the plurality of bit groups constituting the LDPC codeword in bits group wise, and divide and interleave some of the remaining bit groups. That is, the block interleaver 124 may interleave by writing the LDPC codeword constituting a predetermined number of bit groups from among the plurality of bit groups in the plurality of columns of the first part in bits group wise, dividing the bits of the other bit groups and writing the bits in each of the columns of the second part, and reading the plurality of columns of the first and second parts in the row direction.

As described above, the block interleaver 124 may interleave the plurality of bit groups in the methods described above with reference to FIGS. 8 to 10.

In particular, in the case of FIG. 9, the bits included in the bit group which does not belong to the first part are written in the second part in the column direction and read in the row direction. In view of this, the order of the bits included in the bit group which does not belong to the first part is rearranged. Since the bits included in the bit group which does not belong to the first part are interleaved as described above, Bit Error Rate (BER)/Frame Error Rate (FER) performance can be improved in comparison with a case in which such bits are not interleaved.

However, the bit group which does not belong to the first part may not be interleaved as shown in FIG. 10. That is, since the block interleaver 124 writes and read the bits included in the bit group which does not belong to the first part in and from the second part in the row direction, the order of the bits included in the bit group which does not belong to the first part is not changed and these bits are output to the modulator 130 serially. In this case, the bits included in the bit group which does not belong to the first part may be output serially to be mapped onto a modulation symbol.

In FIGS. 9 and 10, the last single bit group of the plurality of bit groups is written in the second part. However, this is merely an example. The number of bit groups written in the second part may vary according to the number of bit groups constituting the LDPC codeword, the number of bits constituting each of the bit groups, the number of columns and rows of the block interleaver, the number of transmission antennas, etc.

The block interleaver 124 may have a configuration as shown in Tables 21 and 22 presented below:

TABLE 21

| | $N_{ldpc}$ = 64800 | | | | | |
|---|---|---|---|---|---|---|
| | QPSK | 16 QAM | 64 QAM | 256 QAM | 1024 QAM | 4096 QAM |
| C | 2 | 4 | 6 | 8 | 10 | 12 |
| $R_1$ | 32400 | 16200 | 10800 | 7920 | 6480 | 5400 |
| $R_2$ | 0 | 0 | 0 | 180 | 0 | 0 |

TABLE 22

| | $N_{ldpc}$ = 16200 | | | | | |
|---|---|---|---|---|---|---|
| | QPSK | 16 QAM | 64 QAM | 256 QAM | 1024 QAM | 4096 QAM |
| C | 2 | 4 | 6 | 8 | 10 | 12 |
| $R_1$ | 7920 | 3960 | 2520 | 1800 | 1440 | 1080 |
| $R_2$ | 180 | 90 | 180 | 225 | 180 | 270 |

Herein, C (or $N_C$) is the number of columns of the block interleaver 124, $R_1$ is the number of rows constituting the first part in each column, and $R_2$ is the number of rows constituting the second part in each column.

Referring to Tables 21 and 22, C is the same value as a modulation order according to a modulation method, and each of a plurality of columns is formed of rows corresponding to a value obtained by dividing the number of bits constituting the LDPC codeword by the number of a plurality of columns.

For example, when the length $N_{ldpc}$ of the LDPC codeword is 64800 and the modulation method is 1024-QAM, the block interleaver 124 is formed of 10 columns as the modulation order is 10 in the case of 1024-QAM, and each column is formed of as many rows as $R_1+R_2=6480(=64800/10)$.

Meanwhile, referring to Tables 21 and 22, when the number of bit groups constituting the LDPC codeword is an integer multiple of the number of columns, the block interleaver 124 interleaves without dividing each column. Therefore, $R_1$ corresponds to the number of rows constituting each column, and $R_2$ is 0. In addition, when the number of bit groups constituting the LDPC codeword is not an integer multiple of the number of columns, the block interleaver 124 interleaves the groups by dividing each column into the first part formed of $R_1$ number of rows, and the second part formed of $R_2$ number of rows.

When the number of columns of the block interleaver 124 is equal to the number of bits constituting a modulation symbol as shown in Tables 21 and 22, bits included in a same bit group are mapped onto a single bit of each modulation symbol.

For example, when $N_{ldpc}$=64800 and the modulation method is 1024-QAM, the block interleaver 124 may be formed of 10 columns each including 6480 rows. In this case, the bits included in each of the plurality of bit groups are written in the 10 columns and bits written in the same row in each column are output serially. In this case, since 10 bits constitute a single modulation symbol in the modulation method of 1024-QAM, bits included in the same bit group, that is, bits output from a single column, may be mapped onto a single bit of each modulation symbol. For example, bits included in a bit group written in the $1^{st}$ column may be mapped onto a first bit of each modulation symbol.

Referring to Tables 21 and 22, the total number of rows of the block interleaver 124, that is, $R_1+R_2$, is $N_{ldpc}/C$.

In addition, the number of rows of the first part, $R_1$, is an integer multiple of the number of bits included in each group, M (e.g., M=360), and maybe expressed as $\lfloor N_{group}/C \rfloor \times M$, and the number of rows of the second part, $R_2$, may be $N_{ldpc}/C-R_1$. Herein, $\lfloor N_{group}/C \rfloor$ is the largest integer below $N_{group}/C$. Since $R_1$ is an integer multiple of the number of bits included in each group, M, bits may be written in $R_1$ in bit groups wise.

In addition, when the number of bit groups of the LDPC codeword is not an integer multiple of the number of columns, it can be seen from Tables 21 and 22 that the block interleaver 124 interleaves by dividing each column into two parts.

Specifically, the length of the LDPC codeword divided by the number of columns is the total number of rows included in the each column. In this case, when the number of bit groups of the LDPC codeword is an integer multiple of the number of columns, each column is not divided into two parts. However, when the number of bit groups of the LDPC codeword is not an integer multiple of the number of columns, each column is divided into two parts.

For example, it is assumed that the number of columns of the block interleaver 124 is identical to the number of bits constituting a modulation symbol, and an LDPC codeword is formed of 64800 bits as shown in Table 21. In this case, each bit group of the LDPC codeword is formed of 360 bits, and the LDPC codeword is formed of 64800/360 (=180) bit groups.

When the modulation method is 1024-QAM, the block interleaver 124 may be formed of 10 columns and each column may have 64800/10 (=6480) rows.

In this case, since the number of bit groups of the LDPC codeword divided by the number of columns is 180/10 (=18), bits can be written in each column in bits group wise without dividing each column into two parts. That is, bits included in 18 bit groups which is the quotient when the number of bit groups constituting the LDPC codeword is divided by the number of columns, that is, 18×360 (=6480) bits can be written in each column.

However, when the modulation method is 256-QAM, the block interleaver 124 may be formed of eight (8) columns and each column may have 64800/8 (=8100) rows.

In this case, since the number of bit groups of the LDPC codeword divided by the number of columns is 180/8=22.5, the number of bit groups constituting the LDPC codeword is not an integer multiple of the number of columns. Accordingly, the block interleaver 124 divides each of the eight (8) columns into two parts to perform interleaving in bits group wise.

In this case, since the bits should be written in the first part of each column in bits group wise, the number of bit groups which can be written in the first part of each column in bits group wise is 22 which is the quotient when the number of bit groups constituting the LDPC codeword is divided by the number of columns, and accordingly, the first part of each column has 22×360 (=7920) rows. Accordingly, 7920 bits included in 22 bit groups may be written in the first part of each column.

The second part of each column has rows which are the rows of the first part subtracted from the total rows of each column. Accordingly, the second part of each column includes 8100–7920 (=180) rows.

In this case, bits included in the other bit groups which have not been written in the first part are divided and written in the second part of each column.

Specifically, since 22×8 (=176) bit groups are written in the first part, the number of bit groups to be written in the second part is 180-176 (=4) (for example, a bit group $Y_{176}$, bit group $Y_{177}$, bit group $Y_{178}$, and bit group $Y_{179}$ from among bit group $Y_0$, bit group $Y_1$, bit group $Y_2$, . . . , bit group $Y_{178}$, and bit group $Y_{179}$ constituting the LDPC codeword).

Accordingly, the block interleaver 124 may write the four (4) bit groups which have not been written in the first part and remains from among the bit groups constituting the LDPC codeword in the second part of each column serially.

That is, the block interleaver 124 may write 180 bits of the 360 bits included in the bit group $Y_{176}$ in the $1^{st}$ row to the $180^{th}$ row of the second part of the $1^{st}$ column in the column direction, and may write the other 180 bits in the $1^{st}$ row to the $180^{th}$ row of the second part of the $2^{nd}$ column in the column direction. In addition, the block interleaver 124 may write 180 bits of the 360 bits included in the bit group $Y_{177}$ in the $1^{st}$ row to the $180^{th}$ row of the second part of the $3^{rd}$ column in the column direction, and may write the other 180 bits in the $1^{st}$ row to the $180^{th}$ row of the second part of the $4^{th}$ column in the column direction. In addition, the block interleaver 124 may write 180 bits of the 360 bits included in the bit group $Y_{178}$ in the $1^{st}$ row to the $180^{th}$ row of the second part of the $5^{th}$ column in the column direction, and may write the other 180 bits in the $1^{st}$ row to the $180^{th}$ row of the second part of the $6^{th}$ column in the column direction. In addition, the block interleaver 124 may write 180 bits of the 360 bits included in the bit group $Y_{179}$ in the $1^{st}$ row to the $180^{th}$ row of the second part of the $7^{th}$ column in the column direction, and may write the other 180 bits in the $1^{st}$ row to the $180^{th}$ row of the second part of the $8^{th}$ column in the column direction.

Accordingly, bits included in a bit group which has not been written in the first part and remains are not written in a same column in the second part and may be divided and written in a plurality of columns.

Hereinafter, the block interleaver 124 of FIG. 4 according to an exemplary embodiment will be explained in detail with reference to FIG. 11.

In a group-interleaved LDPC codeword ($v_0$, $v_1$, . . . , $v_{N_{ldpc}-1}$), $Y_j$ is continuously arranged like V={$Y_0$, $Y_1$, . . . $Y_{N_{group}-1}$}.

Figure 11:
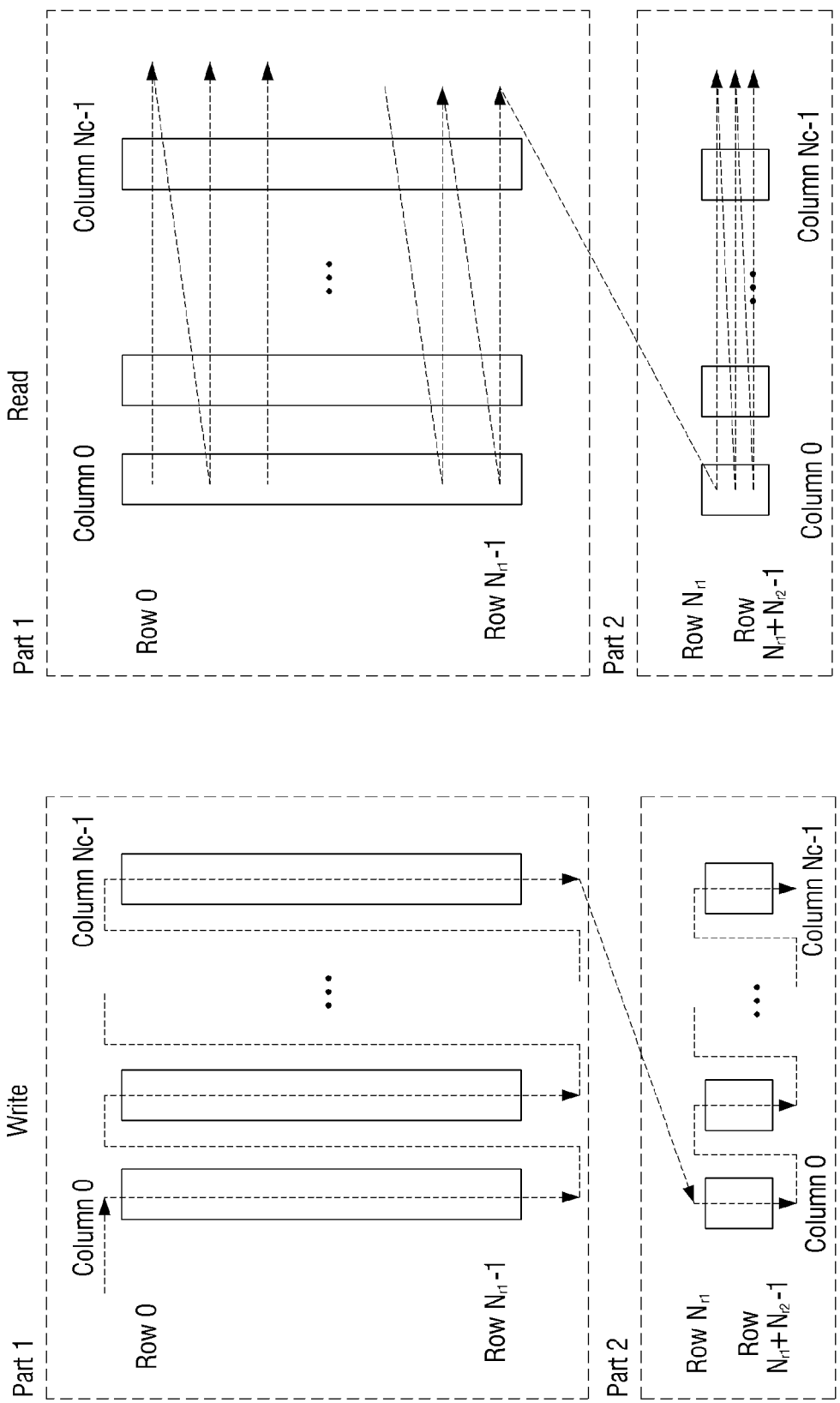

The LDPC codeword after group interleaving may be interleaved by the block interleaver 124 as shown in FIG. 11. In this case, the block interleaver 124 divides a plurality of columns into the first part (Part 1) and the second part (Part 2) based on the number of columns of the block interleaver 124 and the number of bits of a bit group. In this case, in the first part, bits constituting a bit group may be written in a same column, and in the second part, bits constituting a bit group may be written in a plurality of columns (i.e. bits constituting a bit group may be written in at least two columns).

Specifically, input bits vi are written serially from the first part to the second part column wise, and then read out serially from the first part to the second part row wise. That is, the data bits $v_i$ are written serially into the block interleaver column-wise starting in the first part and continuing column-wise finishing in the second part, and then read out serially row-wise from the first part and then row-wise from the second part. Accordingly, each bit included in a same bit group in the first part may be mapped onto a single bit of each modulation symbol.

In this case, the number of columns and the number of rows of the first part and the second part of the block interleaver 124 vary according to a modulation format and a length of the LDPC codeword as in Table 23 presented below. That is, the first part and the second part block interleaving configurations for each modulation format and code length are specified in Table 23 presented below. Herein, the number of columns of the block interleaver 124 may be equal to the number of bits constituting a modulation symbol. In addition, a sum of the number of rows of the first part, $N_{r1}$ and the number of rows of the second part, $N_{r2}$, is equal to $N_{ldpc}/N_C$ (herein, $N_C$ is the number of columns). In addition, since $N_{r1}(=\lfloor N_{group}/N_C \rfloor \times 360)$ is a multiple of 360, a multiple of bits groups may be written in the first part.

TABLE 23

| Modulation | Rows in Part 1 $N_{r1}$ | | Rows in Part 2 $N_{r2}$ | | Columns $N_c$ |
|---|---|---|---|---|---|
| | $N_{ldpc}=$ 64800 | $N_{ldpc}=$ 16200 | $N_{ldpc}=$ 64800 | $N_{ldpc}=$ 16200 | |
| QPSK | 32400 | 7920 | 0 | 180 | 2 |
| 16-QAM | 16200 | 3960 | 0 | 90 | 4 |
| 64-QAM | 10800 | 2520 | 0 | 180 | 6 |
| 256-QAM | 7920 | 1800 | 180 | 225 | 8 |
| 1024-QAM | 6480 | 1440 | 0 | 180 | 10 |
| 4096-QAM | 5400 | 1080 | 0 | 270 | 12 |

Hereinafter, an operation of the block interleaver 124 will be explained in detail.

Specifically, as shown in FIG. 11, the input bit $v_i$ ($0 \le i < N_C \times N_{r1}$) is written in an $r_i$ row of a $c_i$ column of the first part of the block interleaver 124. Herein, $c_i$ and $r_i$ are $$c_i = \left\lfloor \frac{i}{N_{r1}} \right\rfloor$$

and $r_i$=(i mod $N_{r1}$), respectively.

In addition, the input bit $v_i$ ($N_C \times N_{r1} \le i < N_{ldpc}$) is written in an $r_i$ row of $c_i$ column of the second part of the block interleaver 124. Herein, $c_i$ and $r_i$ satisfy $$c_i = \left\lfloor \frac{(i - N_C \times N_{r1})}{N_{r2}} \right\rfloor$$

and $r_i=N_{r1}+\{(i-N_C \times N_{r1}) \bmod N_{r2}\}$, respectively.

An output bit $q_j$ ($0 \le j < N_{ldpc}$) is read from a $c_j$ column of an $r_j$ row. Herein, $r_j$ and $C_j$ satisfy $$r_j = \left\lfloor \frac{j}{N_c} \right\rfloor$$

and $c_j$=(j mod $N_C$), respectively.

For example, when the length $N_{ldpc}$ of the LDPC codeword is 64800 and the modulation method is 256-QAM, the order of bits output from the block interleaver 124 may be ($q_0$, $q_1$, $q_2$, . . . , $q_{63357}$, $q_{63358}$, $q_{63359}$, $q_{63360}$, $q_{63361}$, . . . , $q_{64799}$)=($v_0$, $v_{7920}$, $v_{15840}$, . . . , $v_{47519}$, $v_{55439}$, $v_{63359}$, $v_{63360}$, $v_{63540}$, . . . , $v_{64799}$). Here, the indexes of the right side of the foregoing equation may be specifically expressed for the eight (8) columns as 0, 7920, 15840, 23760, 31680, 39600, 47520, 55440, 1, 7921, 15841, 23761, 31681, 39601, 47521, 55441, . . . , 7919, 15839, 23759, 31679, 39599, 47519, 55439, 63359, 63360, 63540, 63720, 63900, 64080, 64260, 64440, 64620, . . . , 63539, 63719, 63899, 64079, 64259, 64439, 64619, 64799.

Hereinafter, an interleaving operation of the block interleaver 124 will be explained in detail.

The block interleaver 124 may interleave by writing a plurality of bit groups in each column in bits group wise in the column direction, and reading each row of the plurality of columns in which the plurality of bit groups are written in bits group wise in the row direction.

In this case, the number of columns constituting the block interleaver 124 may vary according to a modulation method, and the number of rows may be the length of the LDPC codeword divided by the number of columns.

For example, when the modulation method is 1024-QAM, the block interleaver 124 may be formed of 10 columns. In this case, when the length $N_{ldpc}$ of the LDPC codeword is 64800, the number of rows is 6480 (=64800/10).

Hereinafter, a method for interleaving the plurality of bit groups in bits group wise by the block interleaver 124 will be explained in detail.

When the number of bit groups constituting the LDPC codeword is an integer multiple of the number of columns, the block interleaver 124 may interleave by writing the bit groups as many as the number of bit groups divided by the number of columns in each column serially in bits group wise.

For example, when the modulation method is 1024-QAM and the length $N_{ldpc}$ of the LDPC codeword is 64800, the block interleaver 124 may be formed of 10 columns each including 6480 rows. In this case, since the LDPC codeword is divided into (64800/360=180) number of bit groups when the length $N_{ldpc}$ of the LDPC codeword is 64800, the number of bit groups (=180) of the LDPC codeword may be an integer multiple of the number of columns (=10) when the modulation method is 1024-QAM. That is, no remainder is generated when the number of bit groups of the LDPC codeword is divided by the number of columns.

As described above, when the number of bit groups of the LDPC codeword is an integer multiple of the number of columns of the block interleaver 124, the block interleaver 124 may not divide each column into parts and may interleave by writing, in each of the plurality of columns serially in the column direction, the bits included in the bit groups which correspond to the quotient when the number of bits groups of the LDPC codeword is divided by the number of columns of the block interleaver 124, and reading each row of the plurality of columns in which the bits are written in the row direction.

Figure 12:
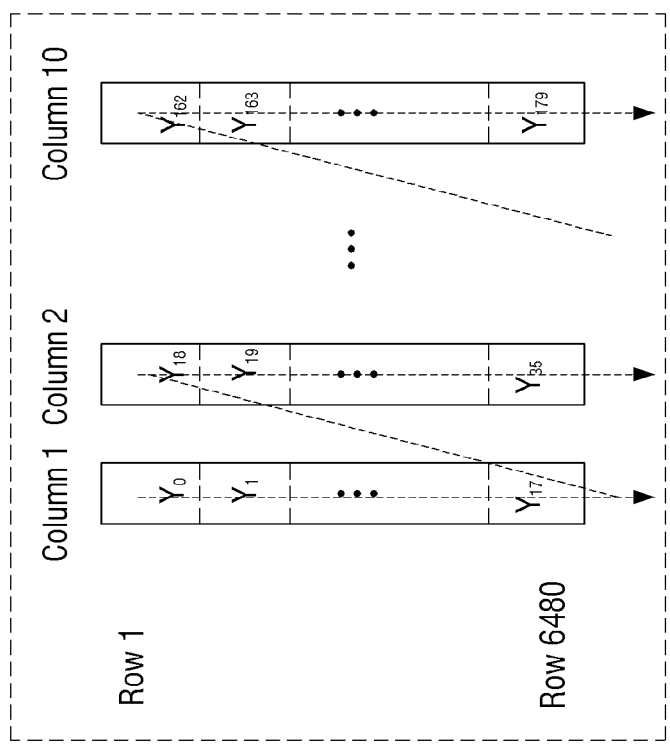
Figure 12:
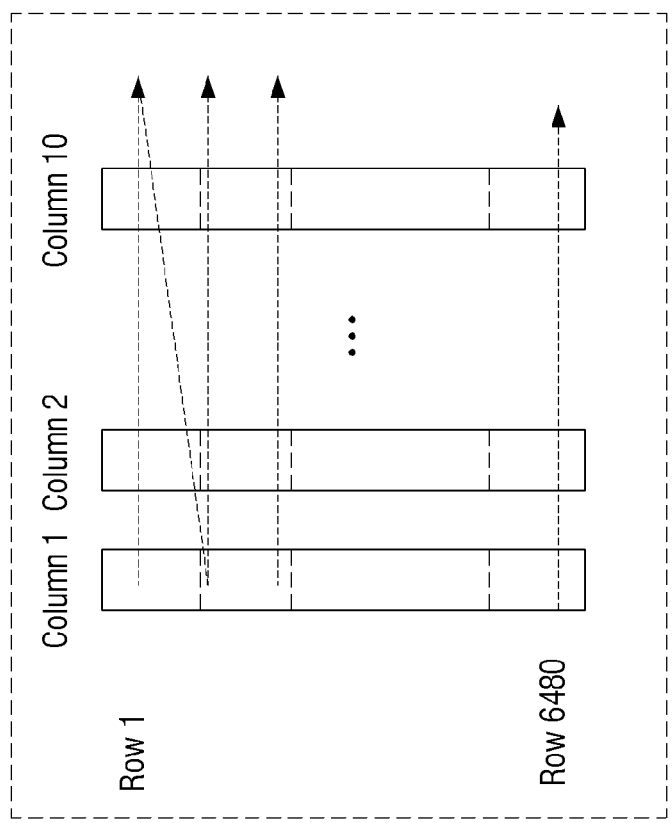

For example, as shown in FIG. 12, the block interleaver 124 writes bits included in each of bit group $Y_0$, bit group $Y_1$, . . . , bit group $Y_{17}$ in the $1^{st}$ row to $6480^{th}$ row of the first column, writes bits included in each of bit group $Y_{18}$, bit group $Y_{19}$, . . . , bit group $Y_{35}$ in the $1^{st}$ row to $6480^{th}$ row of the second column, . . . , and writes the bits included in each of bit group $Y_{162}$, bit group $Y_{163}$, . . . , bit group $Y_{179}$ in the $1^{st}$ row to $6480^{th}$ row of the $10^{th}$ column. In addition, the block interleaver 124 may read the bits written in each row of the 10 columns serially in the row direction.

As described above, when the number of bit groups constituting an LDPC codeword is an integer multiple of the number of columns of the block interleaver 124, the block interleaver 124 may interleave the plurality of bit groups in bits group wise, and accordingly, bits belonging to a same bit group may be written in a same column.

As described above, the block interleaver 124 may interleave the plurality of bit groups of the LDPC codeword in the methods described above with reference to FIGS. 8 to 12.

When the number of columns constituting the block interleaver 124 has the same value as the modulation degree as in the above-described example, bits included in a same bit group may be mapped onto a single bit of each modulation symbol.

However, this is merely an example and bits included in a same bit group may be mapped onto two bits of each modulation symbol. In this case, the block interleaver 124 may have a configuration as shown in Tables 24 and 25 presented below. In this case, the number of columns constituting the block interleaver 124 may be a half of the modulation order as shown in Tables 24 and 25.

TABLE 24

| | $N_{ldpc} = 64800$ | | | | | |
|---|---|---|---|---|---|---|
| | QPSK | 16 QAM | 64 QAM | 256 QAM | 1024 QAM | 4096 QAM |
| C | 1 | 2 | 3 | 4 | 5 | 6 |
| $R_1$ | 64800 | 32400 | 21600 | 16200 | 12960 | 10800 |
| $R_2$ | 0 | 0 | 0 | 0 | 0 | 0 |

TABLE 25

| | $N_{ldpc} = 16200$ | | | | | |
|---|---|---|---|---|---|---|
| | QPSK | 16 QAM | 64 QAM | 256 QAM | 1024 QAM | 4096 QAM |
| C | 1 | 2 | 3 | 4 | 5 | 6 |
| $R_1$ | 16200 | 7920 | 5400 | 3960 | 3240 | 2520 |
| $R_2$ | 0 | 180 | 0 | 90 | 0 | 180 |

Herein, C (or $N_C$) is the number of columns of the block interleaver 124, $R_1$ is the number of rows constituting the first part in each column, and $R_2$ is the number of rows constituting the second part in each column.

Referring to Tables 24 and 25, when the number of bit groups constituting an LDPC codeword is an integer multiple of the number of columns, the block interleaver 124 interleaves without dividing each column. Therefore, $R_1$ corresponds to the number of rows constituting each column, and $R_2$ is 0. In addition, when the number of bit groups constituting the LDPC codeword is not an integer multiple of the number of columns, the block interleaver 124 interleaves the bit groups by dividing each column into the first part formed of $R_1$ number of rows, and the second part formed of $R_2$ number of rows.

When the number of columns of the block interleaver 124 is a half of the number of bits constituting the modulation symbol as shown in Tables 24 and 25, bits included in a same bit group may be mapped onto two bits of each modulation symbol.

For example, when $N_{ldpc}$=64800 and the modulation method is 1024-QAM, the block interleaver 124 may be formed of five (5) columns each including 12960 rows. In this case, a plurality of bit groups constituting an LDPC codeword are written in the five (5) columns in bits group wise and bits written in the same row in respective columns are output serially. In this case, since 10 bits constitute a single modulation symbol in the modulation method of 1024-QAM, bits output from the two rows constitute a single modulation symbol. Accordingly, bits included in a same bit group, that is, bits output from one column, may be mapped onto two bits of a single modulation symbol. For example, bits included in a bit group written in the first column may be mapped onto bits existing in two certain positions of a single modulation symbol.

Referring back to FIG. 1, the modulator 130 maps the interleaved LDPC codeword onto a modulation symbol. Specifically, the modulator 130 may demultiplex the interleaved LDPC codeword, modulate the demultiplexed LDPC codeword, and map the LDPC codeword onto a constellation.

In this case, the modulator 130 may generate a modulation symbol using bits included in each of a plurality of bit groups.

In other words, as described above, bits included in different bit groups may be written in each column of the block interleaver 124, and the block interleaver 124 reads the bits written in each column in the row direction. In this case, the modulator 130 generates a modulation symbol by mapping bits read in each column onto each bit of the modulation symbol. Accordingly, each bit of the modulation symbol may belong to a different group.

For example, it is assumed that a modulation symbol is formed of C number of bits. In this case, bits which are read from each row of C number of columns of the block interleaver 124 may be mapped onto each bit of the modulation symbol and thus, each bit of the modulation symbol formed of C number of bits may belong to C number of different groups.

Hereinbelow, the above feature will be described in greater detail.

First, the modulator 130 may demultiplex the interleaved LDPC codeword. To achieve this, the modulator 130 may include a demultiplexer (not shown) to demultiplex the interleaved LDPC codeword.

A demultiplexer (not shown) demultiplexes the interleaved LDPC codeword. Specifically, the demultiplexer (not shown) performs serial-to-parallel conversion with respect to the interleaved LDPC codeword, and demultiplexes the interleaved LDPC codeword into a cell having a predetermined number of bits (or a data cell).

Figure 13:
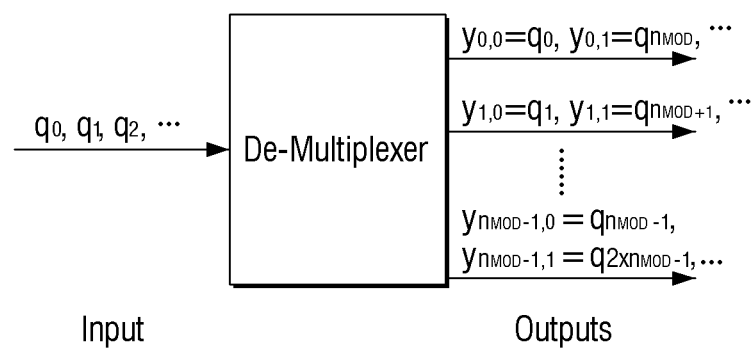
FIG. 13 is a view to illustrate an operation of a demultiplexer according to an exemplary embodiment.

For example, as shown in FIG. 13, the demultiplexer (not shown) receives an LDPC codeword $Q=(q_0, q_1, q_2, \ldots)$ output from the interleaver 120, outputs the received LDPC codeword bits to a plurality of substreams serially, converts the input LDPC codeword bits into cells, and outputs the cells.

Herein, the number of substreams, $N_{substreams}$, may be equal to the number of bits constituting a modulation symbol, $\eta_{MOD}$. Accordingly, the number of bits constituting each cell may be equal to the number of bits constituting the modulation symbol (that is, a modulation order).

$\eta_{MOD}$ may vary according to a modulation method and then number of cells generated may vary according to the length $N_{ldpc}$ of the LDPC codeword as shown in Table 26.

TABLE 26

| Modulation mode | ηMOD | Number of output data cells for $N_{ldpc}$ = 64800 | Number of output data cells for $N_{ldpc}$ = 16200 |
|---|---|---|---|
| QPSK | 2 | 32400 | 8100 |
| 16-QAM | 4 | 16200 | 4050 |
| 64-QAM | 6 | 10800 | 2700 |
| 256-QAM | 8 | 8100 | 2025 |
| 1024-QAM | 10 | 6480 | 1620 |

In this case, bits having a same index in each of the plurality of substreams may constitute a same cell. Accordingly, cells may be configured like $(y_{0,0}, y_{1,0}, \ldots, y_{\eta\ MOD-1,0})=(q_0, q_1, q_{\eta\ MOD-1})$, $(y_{0,1}, y_{1,1}, \ldots, y_{\eta\ MOD-1,1})=(q_{\eta\ MOD}, q_{\eta\ MOD+1}, \ldots, q_{2\times\eta\ MOD-1}), \ldots$ As described above, the number of substreams, $N_{substreams}$, is equal to the number of bits constituting a modulation symbol, $\eta_{MOD}$, and the number of bits constituting each cell may be equal to the number of bits constituting the modulation symbol.

The demultiplexer (not shown) may demultiplex input LDPC codeword bits in various methods. That is, the demultiplexer (not shown) may change an order of the LDPC codeword bits and output the bits to each of the plurality of substreams, or may output the bits to each of the plurality of streams serially without changing the order of the LDPC codeword bits. These operations may be determined according to the number of columns used for interleaving in the block interleaver 124.

Specifically, when the block interleaver 124 includes as many columns as half of the number of bits constituting the modulation symbol, the demultiplexer (not shown) may change the order of the input LDPC codeword bits and output the bits to each of the plurality of substreams. An example of a method for changing the order is illustrated in Table 27 presented below:

TABLE 27

| Modulation format | QPSM | | | |
|---|---|---|---|---|
| input bit di mod $N_{substreams}$ | 0 | 1 | | |
| output bit-number | 0 | 1 | | |
| Modulation format | 16 QAM | | | |
| input bit di mod $N_{substreams}$ | 0 | 1 | 2 | 3 |
| output bit-number | 0 | 2 | 1 | 3 |

TABLE 27-continued

| Modulation format | 64 QAM | | | | | | | | | | |
|---|---|---|---|---|---|---|---|---|---|---|---|
| input bit di mod $N_{substreams}$ | 0 | 1 | 2 | 2 | 4 | 5 | | | | | |
| output bit-number | 0 | 3 | 1 | 4 | 2 | 5 | | | | | |
| Modulation format | 256 QAM | | | | | | | | | | |
| input bit di mod $N_{substreams}$ | 0 | 1 | 2 | 3 | 4 | 5 | 6 | 7 | | | |
| output bit-number | 0 | 4 | 1 | 5 | 2 | 6 | 3 | 7 | | | |
| Modulation format | 1024 QAM | | | | | | | | | | |
| input bit di mod $N_{substreams}$ | 0 | 1 | 2 | 3 | 4 | 5 | 6 | 7 | 8 | 9 | |
| output bit-number | 0 | 5 | 1 | 6 | 2 | 7 | 3 | 5 | 4 | 9 | |
| Modulation format | 4096 QAM | | | | | | | | | | |
| input bit di mod $N_{substreams}$ | 0 | 1 | 2 | 3 | 4 | 5 | 6 | 7 | 8 | 9 | 10 | 11 |
| output bit-number | 0 | 6 | 1 | 7 | 2 | 6 | 3 | 9 | 4 | 10 | 5 | 11 |

According to Table 27, when the modulation method is 1024-QAM for example, the number of substreams is 10 since the number of bits constituting a modulation symbol is 10 in the case of 1024-QAM. In this case, the demultiplexer (not shown) may output, from among the serially input bits, bits with an index i satisfying i mod 10=0 to the $0^{th}$ substream, bits with an index i satisfying i mod 10=1 to the $5^{th}$ substream, bits with an index i satisfying i mode 10=2 to the $1^{st}$ substream, bits with an index i satisfying i mode 10=3 to the $6^{th}$ substream, bits with an index i satisfying i mode 10=4 to the $2^{nd}$ substream, bits with an index i satisfying i mode 10=5 to the $7^{th}$ substream, bits with an index i satisfying i mode 10=6 to the $3^{rd}$ substream, bits with an index i satisfying i mode 10=7 to the $8^{th}$ substream, bits with an index i satisfying i mode 10=8 to the $4^{th}$ substream, and bits with an index i satisfying i mode 10=9 to the $9^{th}$ substream.

Accordingly, the LDPC codeword bits input to the demultiplexer (not shown), ($q_0$, $q_1$, $q_2$, $q_3$, $q_4$, $q_5$, $q_6$, $q_7$, $q_8$, $q_9$, ... ), may be output as cells like ($y_{0,0}$, $y_{1,0}$, $y_{2,0}$, $y_{3,0}$, $y_{4,0}$, $y_{5,0}$, $y_{6,0}$, $y_{7,0}$, $y_{8,0}$, $y_{9,0}$)=($q_0$, $q_5$, $q_1$, $q_6$, $q_2$, $q_7$, $q_3$, $q_8$, $q_4$, $q_9$), ($y_{0,1}$, $y_{1,1}$, $y_{2,1}$, $y_{3,1}$, $y_{4,1}$, $y_{5,1}$, $y_{6,1}$, $y_{7,1}$, $y_{8,1}$, $y_{9,1}$)=($q_{10}$, $q_{15}$, $q_{11}$, $q_{16}$, $q_{12}$, $q_{17}$, $q_{13}$, $q_{18}$, $q_{14}$, $q_{19}$), . . . .

When the block interleaver 124 includes the same number of columns as the number of bits constituting a modulation symbol, the demultiplexer (not shown) may output the input LDPC codeword bits to each of the plurality of streams serially without changing the order of the bits. That is, as shown in FIG. 13, the demultiplexer (not shown) may output the input LDPC codeword bits ($q_0$, $q_1$, $q_2$, ... ) to each of the substreams serially, and accordingly, each cell may be configured as ($y_{0,0}$, $y_{1,0}$ ... $y_{\eta\ MOD-1,0}$)=($q_0$, $q_1$, ... , $q_{\eta\ MOD-1}$), ($y_{0,1}$, $y_{1,1}$, ... , $y_{\eta\ MOD-1,1}$)=($q_{\eta\ MOD}$, $q_{\eta\ MOD+1}$, ... , $q_{2\times\eta\ MOD-1}$), ... .

For example, when the modulation method is 1024-QPSK, the number of bits constituting a modulation symbol, $\eta_{MOD}$, is 10 and thus the number of substreams, $N_{substreams}$, is 10, and cells may be configured like ($y_{0,0}$, $y_{1,0}$, $y_{2,0}$, $y_{3,0}$, $y_{4,0}$, $y_{5,0}$, $y_{6,0}$, $y_{7,0}$, $y_{8,0}$, $y_{9,0}$)=($q_0$, $q_1$, $q_2$, $q_3$, $q_4$, $q_5$, $q_6$, $q_7$, $q_8$, $q_9$), ($y_{0,1}$, $y_{1,1}$, $y_{2,1}$, $y_{3,1}$, $y_{4,1}$, $y_{5,1}$, $y_{6,1}$, $y_{7,1}$, $y_{8,1}$, $y_{9,1}$)=($q_{10}$, $q_{11}$, $q_{12}$, $q_{13}$, $q_{14}$, $q_{15}$, $q_{16}$, $q_{17}$, $q_{18}$, $q_{19}$), . . . ($y_{0,2}$, $y_{1,2}$, $y_{2,2}$, $y_{3,2}$, $y_{4,2}$, $y_{5,2}$, $y_{6,2}$, $y_{7,2}$, $y_{8,2}$, $y_{9,2}$)=($q_{20}$, $q_{21}$, $q_{22}$, $q_{23}$, $q_{24}$, $q_{25}$, $q_{26}$, $q_{27}$, $q_{28}$, $q_{29}$)

In the above-described example, the demultiplexer (not shown) may output the input LDPC codeword bits to each of the plurality of substreams serially without changing the order of the LDPC codeword bits. However, this is merely an example. According to an exemplary embodiment, when the block interleaver 124 includes the same number of columns as the number of bits of the modulation symbol, the demultiplexer (not shown) may be omitted.

The modulator 130 may map the demultiplexed LDPC codeword onto modulation symbols. However, when the demultiplexer (not shown) is omitted as described, the modulator 130 may map the LDPC codeword bits output from the interleaver 120, that is, the block-interleaved LDPC codeword bits, onto the modulation symbols.

Specifically, the modulator 130 may modulate the bits (that is, cells) output from the demultiplexer (not shown) in various modulation methods such as QPSK, 16-QAM, 64-QAM, 256-QAM, 1024-QAM, and 4096-QAM. For example, when the modulation method is QPSK, 16-QAM, 64-QAM, 256-QAM, 1024-QAM, and 4096-QAM, the number of bits constituting the modulation symbol, $\eta_{MOD}$, may be 2, 4, 6, 8, 10 and 12, respectively.

In this case, since each cell output from the demultiplexer (not shown) is formed of as many bits as the number of bits constituting a modulation symbol, the modulator 130 may generate the modulation symbol by mapping each cell output from the demultiplexer (not shown) onto a constellation point serially. Herein, a modulation symbol corresponds to a constellation point on the constellation.

However, the above-described demultiplexer (not shown) may be omitted according to circumstances. In this case, the modulator 130 may generate modulation symbols by grouping a predetermined number of bits from interleaved bits serially and mapping the predetermined number of bits onto constellation points. In this case, the modulator 130 may generate the modulation symbols by mapping $\eta_{MOD}$ number of bits onto the constellation points serially according to a modulation method.

The modulator 130 may modulate by mapping cells output from the demultiplexer (not shown) onto constellation points in a non-uniform constellation (NUC) method. For example, the modulator 130 may modulate bits output from the demultiplexer (not shown) in various modulation methods such as non-uniform 16-QAM, non-uniform 64-QAM, non-uniform 256-QAM, non-uniform 1024-QAM, non-uniform 4096-QAM, etc.

In the non-uniform constellation method, once a constellation point of the first quadrant is defined, constellation points in the other three quadrants may be determined as follows. For example, when a set of constellation points defined for the first quadrant is X, the set is $-\text{conj}(X)$ in the case of the second quadrant, is $\text{conj}(X)$ in the case of the third quadrant, and is $-(X)$ in the case of the fourth quadrant.

That is, once the first quadrant is defined, the other quadrants may be expressed as follows:

1 Quarter (first quadrant)=$X$

2 Quarter (second quadrant)=$-\text{conj}(X)$

3 Quarter (third quadrant)=$\text{conj}(X)$

4 Quarter (fourth quadrant)=$-X$

Specifically, when the non-uniform M-QAM is used, M number of constellation points may be defined as $z = \{z_0, z_1, \ldots, z_{M-1}\}$. In this case, when the constellation points existing in the first quadrant are defined as $\{x_0, x_1, x_2, \ldots, x_{M/4-1}\}$, z may be defined as follows:

from $z_0$ to $Z_{M/4-1}$=from $x_0$ to $X_{M/4}$ from $z_{M/4}$ to $Z_{2\times M/4-1}$=$-\text{conj}$(from $x_0$ to $x_{M/4}$)

from $Z_{2\times M/4}$ to $Z_{3\times M/4-1}$=$\text{conj}$(from $x_0$ to $x_{M/4}$)

from $Z_{3\times M/4}$ to $Z_{4\times M/4-1}$=$-$(from $X_0$ to $x_{M/4}$)

Accordingly, the modulator 130 may map the bits $[y_0, \ldots, y_{M-1}]$ output from the demultiplexer (not shown) onto constellation points in the non-uniform constellation method by mapping the output bits onto $z_L$ having an index of $$L = \sum_{i=0}^{m-1} (y_1 \times 2^{m-1}).$$

An example of the constellation defined according to the non-uniform 1024-QAM method may be expressed as in Table 28 presented below when the code rate is 6/15, 8/15, 10/15, 12/15. In this case, the constellation point of the first quadrant may be defined with reference to Table 28, and the constellation points in the other three quadrants may be defined in the above-described method.

TABLE 28

| Label (int.) | CR 6/15 Constellation | CR 8/15 Constellation | CR 10/15 Constellation | CR 12/15 Constellation |
|---|---|---|---|---|
| 0 | 1.5031 + 1.5031i | 1.4800 + 1.4800i | 1.4377 + 1.4377i | 1.3675 + 1.3675i |
| 1 | 1.5031 + 1.2286i | 1.4800 + 1.2281i | 1.4377 + 1.2232i | 1.3675 + 1.1917i |
| 2 | 1.2286 + 1.5031i | 1.2281 + 1.4800i | 1.2232 + 1.4377i | 1.1917 + 1.3675i |
| 3 | 1.2286 + 1.2286i | 1.2281 + 1.2281i | 1.2232 + 1.2232i | 1.1917 + 1.1917i |
| 4 | 1.5031 + 0.9418i | 1.4800 + 0.9212i | 1.4377 + 0.9302i | 1.3675 + 0.9386i |
| 5 | 1.5031 + 1.0048i | 1.4800 + 1.0349i | 1.4377 + 1.0579i | 1.3675 + 1.0529i |
| 6 | 1.2286 + 0.9418i | 1.2281 + 0.9212i | 1.2232 + 0.9302i | 1.1917 + 0.9386i |
| 7 | 1.2286 + 1.0048i | 1.2281 + 1.0349i | 1.2232 + 1.0579i | 1.1917 + 1.0529i |
| 8 | 0.9418 + 1.5031i | 0.9212 + 1.4800i | 0.9302 + 1.4377i | 0.9386 + 1.3675i |
| 9 | 0.9418 + 1.2286i | 0.9212 + 1.2281i | 0.9302 + 1.2232i | 0.9386 + 1.1917i |
| 10 | 1.0048 + 1.5031i | 1.0349 + 1.4800i | 1.0579 + 1.4377i | 1.0529 + 1.3675i |
| 11 | 1.0048 + 1.2286i | 1.0349 + 1.2281i | 1.0579 + 1.2232i | 1.0529 + 1.1917i |
| 12 | 0.9418 + 0.9418i | 0.9212 + 0.9212i | 0.9302 + 0.9302i | 0.9386 + 0.9386i |
| 13 | 0.9418 + 1.0048i | 0.9212 + 1.0349i | 0.9302 + 1.0579i | 0.9386 + 1.0529i |
| 14 | 1.0048 + 0.9418i | 1.0349 + 0.9212i | 1.0579 + 0.9302i | 1.0529 + 0.9386i |
| 15 | 1.0048 + 1.0048i | 1.0349 + 1.0349i | 1.0579 + 1.0579i | 1.0529 + 1.0529i |
| 16 | 1.5031 + 0.6097i | 1.4800 + 0.5810i | 1.4377 + 0.5505i | 1.3675 + 0.5763i |
| 17 | 1.5031 + 0.6072i | 1.4800 + 0.5872i | 1.4377 + 0.6150i | 1.3675 + 0.6531i |
| 18 | 1.2286 + 0.6097i | 1.2281 + 0.5810i | 1.2232 + 0.5505i | 1.1917 + 0.5763i |
| 19 | 1.2286 + 0.6072i | 1.2281 + 0.5872i | 1.2232 + 0.6150i | 1.1917 + 0.6531i |
| 20 | 1.5031 + 0.7196i | 1.4800 + 0.7604i | 1.4377 + 0.8066i | 1.3675 + 0.8324i |
| 21 | 1.5031 + 0.7113i | 1.4800 + 0.7213i | 1.4377 + 0.7158i | 1.3675 + 0.7417i |
| 22 | 1.2286 + 0.7196i | 1.2281 + 0.7604i | 1.2232 + 0.8066i | 1.1917 + 0.8324i |
| 23 | 1.2286 + 0.7113i | 1.2281 + 0.7213i | 1.2232 + 0.7158i | 1.1917 + 0.7417i |
| 24 | 0.9418 + 0.6097i | 0.9212 + 0.5810i | 0.9302 + 0.5505i | 0.9386 + 0.5763i |
| 25 | 0.9418 + 0.6072i | 0.9212 + 0.5872i | 0.9302 + 0.6150i | 0.9386 + 0.6531i |
| 26 | 1.0048 + 0.6097i | 1.0349 + 0.5810i | 1.0579 + 0.5505i | 1.0529 + 0.5763i |
| 27 | 1.0048 + 0.6072i | 1.0349 + 0.5872i | 1.0579 + 0.6150i | 1.0529 + 0.6531i |
| 28 | 0.9418 + 0.7196i | 0.9212 + 0.7604i | 0.9302 + 0.8066i | 0.9386 + 0.8324i |
| 29 | 0.9418 + 0.7113i | 0.9212 + 0.7213i | 0.9302 + 0.7158i | 0.9386 + 0.7417i |
| 30 | 1.0048 + 0.7196i | 1.0349 + 0.7604i | 1.0579 + 0.8066i | 1.0529 + 0.8324i |
| 31 | 1.0048 + 0.7113i | 1.0349 + 0.7213i | 1.0579 + 0.7158i | 1.0529 + 0.7417i |
| 32 | 0.6097 + 1.5031i | 0.5810 + 1.4800i | 0.5505 + 1.4377i | 0.5763 + 1.3675i |
| 33 | 0.6097 + 1.2286i | 0.5810 + 1.2281i | 0.5505 + 1.2232i | 0.5763 + 1.1917i |
| 34 | 0.6072 + 1.5031i | 0.5872 + 1.4800i | 0.6150 + 1.4377i | 0.6531 + 1.3675i |
| 35 | 0.6072 + 1.2286i | 0.5872 + 1.2281i | 0.6150 + 1.2232i | 0.6531 + 1.1917i |
| 36 | 0.6097 + 0.9418i | 0.5810 + 0.9212i | 0.5505 + 0.9302i | 0.5763 + 0.9386i |
| 37 | 0.6097 + 1.0048i | 0.5810 + 1.0349i | 0.5505 + 1.0579i | 0.5763 + 1.0529i |
| 38 | 0.6072 + 0.9418i | 0.5872 + 0.9212i | 0.6150 + 0.9302i | 0.6531 + 0.9386i |
| 39 | 0.6072 + 1.0048i | 0.5872 + 1.0349i | 0.6150 + 1.0579i | 0.6531 + 1.0529i |
| 40 | 0.7196 + 1.5031i | 0.7604 + 1.4800i | 0.8066 + 1.4377i | 0.8324 + 1.3675i |
| 41 | 0.7196 + 1.2286i | 0.7604 + 1.2281i | 0.8066 + 1.2232i | 0.8324 + 1.1917i |
| 42 | 0.7113 + 1.5031i | 0.7213 + 1.4800i | 0.7158 + 1.4377i | 0.7417 + 1.3675i |
| 43 | 0.7113 + 1.2286i | 0.7213 + 1.2281i | 0.7158 + 1.2232i | 0.7417 + 1.1917i |
| 44 | 0.7196 + 0.9418i | 0.7604 + 0.9212i | 0.8066 + 0.9302i | 0.8324 + 0.9386i |
| 45 | 0.7196 + 1.0048i | 0.7604 + 1.0349i | 0.8066 + 1.0579i | 0.8324 + 1.0529i |
| 46 | 0.7113 + 0.9418i | 0.7213 + 0.9212i | 0.7158 + 0.9302i | 0.7417 + 0.9386i |

TABLE 28-continued

| Label (int.) | CR 6/15 Constellation | CR 8/15 Constellation | CR 10/15 Constellation | CR 12/15 Constellation |
|---|---|---|---|---|
| 47 | 0.7113 + 1.0048i | 0.7213 + 1.0349i | 0.7158 + 1.0579i | 0.7417 + 1.0529i |
| 48 | 0.6097 + 0.6097i | 0.5810 + 0.5810i | 0.5505 + 0.5505i | 0.5763 + 0.5763i |
| 49 | 0.6097 + 0.6072i | 0.5810 + 0.5872i | 0.5505 + 0.6150i | 0.5763 + 0.6531i |
| 50 | 0.6072 + 0.6097i | 0.5872 + 0.5810i | 0.6150 + 0.5505i | 0.6531 + 0.5763i |
| 51 | 0.6072 + 0.6072i | 0.5872 + 0.5872i | 0.6150 + 0.6150i | 0.6531 + 0.6531i |
| 52 | 0.6097 + 0.7196i | 0.5810 + 0.7604i | 0.5505 + 0.8066i | 0.5763 + 0.8324i |
| 53 | 0.6097 + 0.7113i | 0.5810 + 0.7213i | 0.5505 + 0.7158i | 0.5763 + 0.7417i |
| 54 | 0.6072 + 0.7196i | 0.5872 + 0.7604i | 0.6150 + 0.8066i | 0.6531 + 0.8324i |
| 55 | 0.6072 + 0.7113i | 0.5872 + 0.7213i | 0.6150 + 0.7158i | 0.6531 + 0.7417i |
| 56 | 0.7196 + 0.6097i | 0.7604 + 0.5810i | 0.8066 + 0.5505i | 0.8324 + 0.5763i |
| 57 | 0.7196 + 0.6072i | 0.7604 + 0.5872i | 0.8066 + 0.6150i | 0.8324 + 0.6531i |
| 58 | 0.7113 + 0.6097i | 0.7213 + 0.5810i | 0.7158 + 0.5505i | 0.7417 + 0.5763i |
| 59 | 0.7113 + 0.6072i | 0.7213 + 0.5872i | 0.7158 + 0.6150i | 0.7417 + 0.6531i |
| 60 | 0.7196 + 0.7196i | 0.7604 + 0.7604i | 0.8066 + 0.8066i | 0.8324 + 0.8324i |
| 61 | 0.7196 + 0.7113i | 0.7604 + 0.7213i | 0.8066 + 0.7158i | 0.8324 + 0.7417i |
| 62 | 0.7113 + 0.7196i | 0.7213 + 0.7604i | 0.7158 + 0.8066i | 0.7417 + 0.8324i |
| 63 | 0.7113 + 0.7113i | 0.7213 + 0.7213i | 0.7158 + 0.7158i | 0.7417 + 0.7417i |
| 64 | 1.5031 + 0.1275i | 1.4800 + 0.0773i | 1.4377 + 0.0596i | 1.3675 + 0.0354i |
| 65 | 1.5031 + 0.1276i | 1.4800 + 0.0773i | 1.4377 + 0.0642i | 1.3675 + 0.0921i |
| 66 | 1.2286 + 0.1275i | 1.2281 + 0.0773i | 1.2232 + 0.0596i | 1.1917 + 0.0354i |
| 67 | 1.2286 + 0.1276i | 1.2281 + 0.0773i | 1.2232 + 0.0642i | 1.1917 + 0.0921i |
| 68 | 1.5031 + 0.1295i | 1.4800 + 0.1614i | 1.4377 + 0.1766i | 1.3675 + 0.2185i |
| 69 | 1.5031 + 0.1294i | 1.4800 + 0.1614i | 1.4377 + 0.1669i | 1.3675 + 0.1602i |
| 70 | 1.2286 + 0.1295i | 1.2281 + 0.1614i | 1.2232 + 0.1766i | 1.1917 + 0.2185i |
| 71 | 1.2286 + 0.1294i | 1.2281 + 0.1614i | 1.2232 + 0.1669i | 1.1917 + 0.1602i |
| 72 | 0.9418 + 0.1275i | 0.9212 + 0.0773i | 0.9302 + 0.0596i | 0.9386 + 0.0354i |
| 73 | 0.9418 + 0.1276i | 0.9212 + 0.0773i | 0.9302 + 0.0642i | 0.9386 + 0.0921i |
| 74 | 1.0048 + 0.1275i | 1.0349 + 0.0773i | 1.0579 + 0.0596i | 1.0529 + 0.0354i |
| 75 | 1.0048 + 0.1276i | 1.0349 + 0.0773i | 1.0579 + 0.0642i | 1.0529 + 0.0921i |
| 76 | 0.9418 + 0.1295i | 0.9212 + 0.1614i | 0.9302 + 0.1766i | 0.9386 + 0.2185i |
| 77 | 0.9418 + 0.1294i | 0.9212 + 0.1614i | 0.9302 + 0.1669i | 0.9386 + 0.1602i |
| 78 | 1.0048 + 0.1295i | 1.0349 + 0.1614i | 1.0579 + 0.1766i | 1.0529 + 0.2185i |
| 79 | 1.0048 + 0.1294i | 1.0349 + 0.1614i | 1.0579 + 0.1669i | 1.0529 + 0.1602i |
| 80 | 1.5031 + 0.3666i | 1.4800 + 0.4163i | 1.4377 + 0.4471i | 1.3675 + 0.4947i |
| 81 | 1.5031 + 0.3675i | 1.4800 + 0.4159i | 1.4377 + 0.4043i | 1.3675 + 0.4264i |
| 82 | 1.2286 + 0.3666i | 1.2281 + 0.4163i | 1.2232 + 0.4471i | 1.1917 + 0.4947i |
| 83 | 1.2286 + 0.3675i | 1.2281 + 0.4159i | 1.2232 + 0.4043i | 1.1917 + 0.4264i |
| 84 | 1.5031 + 0.3424i | 1.4800 + 0.3086i | 1.4377 + 0.2868i | 1.3675 + 0.2910i |
| 85 | 1.5031 + 0.3431i | 1.4800 + 0.3085i | 1.4377 + 0.3091i | 1.3675 + 0.3530i |
| 86 | 1.2286 + 0.3424i | 1.2281 + 0.3086i | 1.2232 + 0.2868i | 1.1917 + 0.2910i |
| 87 | 1.2286 + 0.3431i | 1.2281 + 0.3085i | 1.2232 + 0.3091i | 1.1917 + 0.3530i |
| 88 | 0.9418 + 0.3666i | 0.9212 + 0.4163i | 0.9302 + 0.4471i | 0.9386 + 0.4947i |
| 89 | 0.9418 + 0.3675i | 0.9212 + 0.4159i | 0.9302 + 0.4043i | 0.9386 + 0.4264i |
| 90 | 1.0048 + 0.3666i | 1.0349 + 0.4163i | 1.0579 + 0.4471i | 1.0529 + 0.4947i |
| 91 | 1.0048 + 0.3675i | 1.0349 + 0.4159i | 1.0579 + 0.4043i | 1.0529 + 0.4264i |
| 92 | 0.9418 + 0.3424i | 0.9212 + 0.3086i | 0.9302 + 0.2868i | 0.9386 + 0.2910i |
| 93 | 0.9418 + 0.3431i | 0.9212 + 0.3085i | 0.9302 + 0.3091i | 0.9386 + 0.3530i |
| 94 | 1.0048 + 0.3424i | 1.0349 + 0.3086i | 1.0579 + 0.2868i | 1.0529 + 0.2910i |
| 95 | 1.0048 + 0.3431i | 1.0349 + 0.3085i | 1.0579 + 0.3091i | 1.0529 + 0.3530i |
| 96 | 0.6097 + 0.1275i | 0.5810 + 0.0773i | 0.5505 + 0.0596i | 0.5763 + 0.0354i |
| 97 | 0.6097 + 0.1276i | 0.5810 + 0.0773i | 0.5505 + 0.0642i | 0.5763 + 0.0921i |
| 98 | 0.6072 + 0.1275i | 0.5872 + 0.0773i | 0.6150 + 0.0596i | 0.6531 + 0.0354i |
| 99 | 0.6072 + 0.1276i | 0.5872 + 0.0773i | 0.6150 + 0.0642i | 0.6531 + 0.0921i |
| 100 | 0.6097 + 0.1295i | 0.5810 + 0.1614i | 0.5505 + 0.1766i | 0.5763 + 0.2185i |
| 101 | 0.6097 + 0.1294i | 0.5810 + 0.1614i | 0.5505 + 0.1669i | 0.5763 + 0.1602i |
| 102 | 0.6072 + 0.1295i | 0.5872 + 0.1614i | 0.6150 + 0.1766i | 0.6531 + 0.2185i |
| 103 | 0.6072 + 0.1294i | 0.5872 + 0.1614i | 0.6150 + 0.1669i | 0.6531 + 0.1602i |
| 104 | 0.7196 + 0.1275i | 0.7604 + 0.0773i | 0.8066 + 0.0596i | 0.8324 + 0.0354i |
| 105 | 0.7196 + 0.1276i | 0.7604 + 0.0773i | 0.8066 + 0.0642i | 0.8324 + 0.0921i |
| 106 | 0.7113 + 0.1275i | 0.7213 + 0.0773i | 0.7158 + 0.0596i | 0.7417 + 0.0354i |
| 107 | 0.7113 + 0.1276i | 0.7213 + 0.0773i | 0.7158 + 0.0642i | 0.7417 + 0.0921i |
| 108 | 0.7196 + 0.1295i | 0.7604 + 0.1614i | 0.8066 + 0.1766i | 0.8324 + 0.2185i |
| 109 | 0.7196 + 0.1294i | 0.7604 + 0.1614i | 0.8066 + 0.1669i | 0.8324 + 0.1602i |
| 110 | 0.7113 + 0.1295i | 0.7213 + 0.1614i | 0.7158 + 0.1766i | 0.7417 + 0.2185i |
| 111 | 0.7113 + 0.1294i | 0.7213 + 0.1614i | 0.7158 + 0.1669i | 0.7417 + 0.1602i |
| 112 | 0.6097 + 0.3666i | 0.5810 + 0.4163i | 0.5505 + 0.4471i | 0.5763 + 0.4947i |
| 113 | 0.6097 + 0.3675i | 0.5810 + 0.4159i | 0.5505 + 0.4043i | 0.5763 + 0.4264i |
| 114 | 0.6072 + 0.3666i | 0.5872 + 0.4163i | 0.6150 + 0.4471i | 0.6531 + 0.4947i |
| 115 | 0.6072 + 0.3675i | 0.5872 + 0.4159i | 0.6150 + 0.4043i | 0.6531 + 0.4264i |
| 116 | 0.6097 + 0.3424i | 0.5810 + 0.3086i | 0.5505 + 0.2868i | 0.5763 + 0.2910i |
| 117 | 0.6097 + 0.3431i | 0.5810 + 0.3085i | 0.5505 + 0.3091i | 0.5763 + 0.3530i |
| 118 | 0.6072 + 0.3424i | 0.5872 + 0.3086i | 0.6150 + 0.2868i | 0.6531 + 0.2910i |
| 119 | 0.6072 + 0.3431i | 0.5872 + 0.3085i | 0.6150 + 0.3091i | 0.6531 + 0.3530i |
| 120 | 0.7196 + 0.3666i | 0.7604 + 0.4163i | 0.8066 + 0.4471i | 0.8324 + 0.4947i |
| 121 | 0.7196 + 0.3675i | 0.7604 + 0.4159i | 0.8066 + 0.4043i | 0.8324 + 0.4264i |
| 122 | 0.7113 + 0.3666i | 0.7213 + 0.4163i | 0.7158 + 0.4471i | 0.7417 + 0.4947i |
| 123 | 0.7113 + 0.3675i | 0.7213 + 0.4159i | 0.7158 + 0.4043i | 0.7417 + 0.4264i |

TABLE 28-continued

| Label (int.) | CR 6/15 Constellation | CR 8/15 Constellation | CR 10/15 Constellation | CR 12/15 Constellation |
|---|---|---|---|---|
| 124 | 0.7196 + 0.3424i | 0.7604 + 0.3086i | 0.8066 + 0.2868i | 0.8324 + 0.2910i |
| 125 | 0.7196 + 0.3431i | 0.7604 + 0.3085i | 0.8066 + 0.3091i | 0.8324 + 0.3530i |
| 126 | 0.7113 + 0.3424i | 0.7213 + 0.3086i | 0.7158 + 0.2868i | 0.7417 + 0.2910i |
| 127 | 0.7113 + 0.3431i | 0.7213 + 0.3085i | 0.7158 + 0.3091i | 0.7417 + 0.3530i |
| 128 | 0.1275 + 1.5031i | 0.0773 + 1.4800i | 0.0596 + 1.4377i | 0.0354 + 1.3675i |
| 129 | 0.1275 + 1.2286i | 0.0773 + 1.2281i | 0.0596 + 1.2232i | 0.0354 + 1.1917i |
| 130 | 0.1276 + 1.5031i | 0.0773 + 1.4800i | 0.0642 + 1.4377i | 0.0921 + 1.3675i |
| 131 | 0.1276 + 1.2286i | 0.0773 + 1.2281i | 0.0642 + 1.2232i | 0.0921 + 1.1917i |
| 132 | 0.1275 + 0.9418i | 0.0773 + 0.9212i | 0.0596 + 0.9302i | 0.0354 + 0.9386i |
| 133 | 0.1275 + 1.0048i | 0.0773 + 1.0349i | 0.0596 + 1.0579i | 0.0354 + 1.0529i |
| 134 | 0.1276 + 0.9418i | 0.0773 + 0.9212i | 0.0642 + 0.9302i | 0.0921 + 0.9386i |
| 135 | 0.1276 + 1.0048i | 0.0773 + 1.0349i | 0.0642 + 1.0579i | 0.0921 + 1.0529i |
| 136 | 0.1295 + 1.5031i | 0.1614 + 1.4800i | 0.1766 + 1.4377i | 0.2185 + 1.3675i |
| 137 | 0.1295 + 1.2286i | 0.1614 + 1.2281i | 0.1766 + 1.2232i | 0.2185 + 1.1917i |
| 138 | 0.1294 + 1.5031i | 0.1614 + 1.4800i | 0.1669 + 1.4377i | 0.1602 + 1.3675i |
| 139 | 0.1294 + 1.2286i | 0.1614 + 1.2281i | 0.1669 + 1.2232i | 0.1602 + 1.1917i |
| 140 | 0.1295 + 0.9418i | 0.1614 + 0.9212i | 0.1766 + 0.9302i | 0.2185 + 0.9386i |
| 141 | 0.1295 + 1.0048i | 0.1614 + 1.0349i | 0.1766 + 1.0579i | 0.2185 + 1.0529i |
| 142 | 0.1294 + 0.9418i | 0.1614 + 0.9212i | 0.1669 + 0.9302i | 0.1602 + 0.9386i |
| 143 | 0.1294 + 1.0048i | 0.1614 + 1.0349i | 0.1669 + 1.0579i | 0.1602 + 1.0529i |
| 144 | 0.1275 + 0.6097i | 0.0773 + 0.5810i | 0.0596 + 0.5505i | 0.0354 + 0.5763i |
| 145 | 0.1275 + 0.6072i | 0.0773 + 0.5872i | 0.0596 + 0.6150i | 0.0354 + 0.6531i |
| 146 | 0.1276 + 0.6097i | 0.0773 + 0.5810i | 0.0642 + 0.5505i | 0.0921 + 0.5763i |
| 147 | 0.1276 + 0.6072i | 0.0773 + 0.5872i | 0.0642 + 0.6150i | 0.0921 + 0.6531i |
| 148 | 0.1275 + 0.7196i | 0.0773 + 0.7604i | 0.0596 + 0.8066i | 0.0354 + 0.8324i |
| 149 | 0.1275 + 0.7113i | 0.0773 + 0.7213i | 0.0596 + 0.7158i | 0.0354 + 0.7417i |
| 150 | 0.1276 + 0.7196i | 0.0773 + 0.7604i | 0.0642 + 0.8066i | 0.0921 + 0.8324i |
| 151 | 0.1276 + 0.7113i | 0.0773 + 0.7213i | 0.0642 + 0.7158i | 0.0921 + 0.7417i |
| 152 | 0.1295 + 0.6097i | 0.1614 + 0.5810i | 0.1766 + 0.5505i | 0.2185 + 0.5763i |
| 153 | 0.1295 + 0.6072i | 0.1614 + 0.5872i | 0.1766 + 0.6150i | 0.2185 + 0.6531i |
| 154 | 0.1294 + 0.6097i | 0.1614 + 0.5810i | 0.1669 + 0.5505i | 0.1602 + 0.5763i |
| 155 | 0.1294 + 0.6072i | 0.1614 + 0.5872i | 0.1669 + 0.6150i | 0.1602 + 0.6531i |
| 156 | 0.1295 + 0.7196i | 0.1614 + 0.7604i | 0.1766 + 0.8066i | 0.2185 + 0.8324i |
| 157 | 0.1295 + 0.7113i | 0.1614 + 0.7213i | 0.1766 + 0.7158i | 0.2185 + 0.7417i |
| 158 | 0.1294 + 0.7196i | 0.1614 + 0.7604i | 0.1669 + 0.8066i | 0.1602 + 0.8324i |
| 159 | 0.1294 + 0.7113i | 0.1614 + 0.7213i | 0.1669 + 0.7158i | 0.1602 + 0.7417i |
| 160 | 0.3666 + 1.5031i | 0.4163 + 1.4800i | 0.4471 + 1.4377i | 0.4947 + 1.3675i |
| 161 | 0.3666 + 1.2286i | 0.4163 + 1.2281i | 0.4471 + 1.2232i | 0.4947 + 1.1917i |
| 162 | 0.3675 + 1.5031i | 0.4159 + 1.4800i | 0.4043 + 1.4377i | 0.4264 + 1.3675i |
| 163 | 0.3675 + 1.2286i | 0.4159 + 1.2281i | 0.4043 + 1.2232i | 0.4264 + 1.1917i |
| 164 | 0.3666 + 0.9418i | 0.4163 + 0.9212i | 0.4471 + 0.9302i | 0.4947 + 0.9386i |
| 165 | 0.3666 + 1.0048i | 0.4163 + 1.0349i | 0.4471 + 1.0579i | 0.4947 + 1.0529i |
| 166 | 0.3675 + 0.9418i | 0.4159 + 0.9212i | 0.4043 + 0.9302i | 0.4264 + 0.9386i |
| 167 | 0.3675 + 1.0048i | 0.4159 + 1.0349i | 0.4043 + 1.0579i | 0.4264 + 1.0529i |
| 168 | 0.3424 + 1.5031i | 0.3086 + 1.4800i | 0.2868 + 1.4377i | 0.2910 + 1.3675i |
| 169 | 0.3424 + 1.2286i | 0.3086 + 1.2281i | 0.2868 + 1.2232i | 0.2910 + 1.1917i |
| 170 | 0.3431 + 1.5031i | 0.3085 + 1.4800i | 0.3091 + 1.4377i | 0.3530 + 1.3675i |
| 171 | 0.3431 + 1.2286i | 0.3085 + 1.2281i | 0.3091 + 1.2232i | 0.3530 + 1.1917i |
| 172 | 0.3424 + 0.9418i | 0.3086 + 0.9212i | 0.2868 + 0.9302i | 0.2910 + 0.9386i |
| 173 | 0.3424 + 1.0048i | 0.3086 + 1.0349i | 0.2868 + 1.0579i | 0.2910 + 1.0529i |
| 174 | 0.3431 + 0.9418i | 0.3085 + 0.9212i | 0.3091 + 0.9302i | 0.3530 + 0.9386i |
| 175 | 0.3431 + 1.0048i | 0.3085 + 1.0349i | 0.3091 + 1.0579i | 0.3530 + 1.0529i |
| 176 | 0.3666 + 0.6097i | 0.4163 + 0.5810i | 0.4471 + 0.5505i | 0.4947 + 0.5763i |
| 177 | 0.3666 + 0.6072i | 0.4163 + 0.5872i | 0.4471 + 0.6150i | 0.4947 + 0.6531i |
| 178 | 0.3675 + 0.6097i | 0.4159 + 0.5810i | 0.4043 + 0.5505i | 0.4264 + 0.5763i |
| 179 | 0.3675 + 0.6072i | 0.4159 + 0.5872i | 0.4043 + 0.6150i | 0.4264 + 0.6531i |
| 180 | 0.3666 + 0.7196i | 0.4163 + 0.7604i | 0.4471 + 0.8066i | 0.4947 + 0.8324i |
| 181 | 0.3666 + 0.7113i | 0.4163 + 0.7213i | 0.4471 + 0.7158i | 0.4947 + 0.7417i |
| 182 | 0.3675 + 0.7196i | 0.4159 + 0.7604i | 0.4043 + 0.8066i | 0.4264 + 0.8324i |
| 183 | 0.3675 + 0.7113i | 0.4159 + 0.7213i | 0.4043 + 0.7158i | 0.4264 + 0.7417i |
| 184 | 0.3424 + 0.6097i | 0.3086 + 0.5810i | 0.2868 + 0.5505i | 0.2910 + 0.5763i |
| 185 | 0.3424 + 0.6072i | 0.3086 + 0.5872i | 0.2868 + 0.6150i | 0.2910 + 0.6531i |
| 186 | 0.3431 + 0.6097i | 0.3085 + 0.5810i | 0.3091 + 0.5505i | 0.3530 + 0.5763i |
| 187 | 0.3431 + 0.6072i | 0.3085 + 0.5872i | 0.3091 + 0.6150i | 0.3530 + 0.6531i |
| 188 | 0.3424 + 0.7196i | 0.3086 + 0.7604i | 0.2868 + 0.8066i | 0.2910 + 0.8324i |
| 189 | 0.3424 + 0.7113i | 0.3086 + 0.7213i | 0.2868 + 0.7158i | 0.2910 + 0.7417i |
| 190 | 0.3431 + 0.7196i | 0.3085 + 0.7604i | 0.3091 + 0.8066i | 0.3530 + 0.8324i |
| 191 | 0.3431 + 0.7113i | 0.3085 + 0.7213i | 0.3091 + 0.7158i | 0.3530 + 0.7417i |
| 192 | 0.1275 + 0.1275i | 0.0773 + 0.0773i | 0.0591 + 0.0596i | 0.0354 + 0.0354i |
| 193 | 0.1275 + 0.1276i | 0.0773 + 0.0773i | 0.0591 + 0.0642i | 0.0354 + 0.0921i |
| 194 | 0.1276 + 0.1275i | 0.0773 + 0.0773i | 0.0642 + 0.0596i | 0.0921 + 0.0354i |
| 195 | 0.1276 + 0.1276i | 0.0773 + 0.0773i | 0.0642 + 0.0642i | 0.0921 + 0.0921i |
| 196 | 0.1275 + 0.1295i | 0.0773 + 0.1614i | 0.0596 + 0.1766i | 0.0354 + 0.2185i |
| 197 | 0.1275 + 0.1294i | 0.0773 + 0.1614i | 0.0596 + 0.1669i | 0.0354 + 0.1602i |
| 198 | 0.1276 + 0.1295i | 0.0773 + 0.1614i | 0.0642 + 0.1766i | 0.0921 + 0.2185i |
| 199 | 0.1276 + 0.1294i | 0.0773 + 0.1614i | 0.0642 + 0.1669i | 0.0921 + 0.1602i |
| 200 | 0.1295 + 0.1275i | 0.1614 + 0.0773i | 0.1766 + 0.0596i | 0.2185 + 0.0354i |

TABLE 28-continued

| Label (int.) | CR 6/15 Constellation | CR 8/15 Constellation | CR 10/15 Constellation | CR 12/15 Constellation |
| --- | --- | --- | --- | --- |
| 201 | 0.1295 + 0.1276i | 0.1614 + 0.0773i | 0.1766 + 0.0642i | 0.2185 + 0.0921i |
| 202 | 0.1294 + 0.1275i | 0.1614 + 0.0773i | 0.1669 + 0.0596i | 0.1602 + 0.0354i |
| 203 | 0.1294 + 0.1276i | 0.1614 + 0.0773i | 0.1669 + 0.0642i | 0.1602 + 0.0921i |
| 204 | 0.1295 + 0.1295i | 0.1614 + 0.1614i | 0.1766 + 0.1766i | 0.2185 + 0.2185i |
| 205 | 0.1295 + 0.1294i | 0.1614 + 0.1614i | 0.1766 + 0.1669i | 0.2185 + 0.1602i |
| 206 | 0.1294 + 0.1295i | 0.1614 + 0.1614i | 0.1669 + 0.1766i | 0.1602 + 0.2185i |
| 207 | 0.1294 + 0.1294i | 0.1614 + 0.1614i | 0.1669 + 0.1669i | 0.1602 + 0.1602i |
| 208 | 0.1275 + 0.3666i | 0.0773 + 0.4163i | 0.0596 + 0.4471i | 0.0354 + 0.4947i |
| 209 | 0.1275 + 0.3675i | 0.0773 + 0.4159i | 0.0596 + 0.4043i | 0.0354 + 0.4264i |
| 210 | 0.1276 + 0.3666i | 0.0773 + 0.4163i | 0.0642 + 0.4471i | 0.0921 + 0.4947i |
| 211 | 0.1276 + 0.3675i | 0.0773 + 0.4159i | 0.0642 + 0.4043i | 0.0921 + 0.4264i |
| 212 | 0.1275 + 0.3424i | 0.0773 + 0.3086i | 0.0596 + 0.2868i | 0.0354 + 0.2910i |
| 213 | 0.1275 + 0.3431i | 0.0773 + 0.3085i | 0.0596 + 0.3091i | 0.0354 + 0.3530i |
| 214 | 0.1276 + 0.3424i | 0.0773 + 0.3086i | 0.0642 + 0.2868i | 0.0921 + 0.2910i |
| 215 | 0.1276 + 0.3431i | 0.0773 + 0.3085i | 0.0642 + 0.3091i | 0.0921 + 0.3530i |
| 216 | 0.1295 + 0.3666i | 0.1614 + 0.4163i | 0.1766 + 0.4471i | 0.2185 + 0.4947i |
| 217 | 0.1295 + 0.3675i | 0.1614 + 0.4159i | 0.1766 + 0.4043i | 0.2185 + 0.4264i |
| 218 | 0.1294 + 0.3666i | 0.1614 + 0.4163i | 0.1669 + 0.4471i | 0.1602 + 0.4947i |
| 219 | 0.1294 + 0.3675i | 0.1614 + 0.4159i | 0.1669 + 0.4043i | 0.1602 + 0.4264i |
| 220 | 0.1295 + 0.3424i | 0.1614 + 0.3086i | 0.1766 + 0.2868i | 0.2185 + 0.2910i |
| 221 | 0.1295 + 0.3431i | 0.1614 + 0.3085i | 0.1766 + 0.3091i | 0.2185 + 0.3530i |
| 222 | 0.1294 + 0.3424i | 0.1614 + 0.3086i | 0.1669 + 0.2868i | 0.1602 + 0.2910i |
| 223 | 0.1294 + 0.3431i | 0.1614 + 0.3085i | 0.1669 + 0.3091i | 0.1602 + 0.3530i |
| 224 | 0.3666 + 0.1275i | 0.4163 + 0.0773i | 0.4471 + 0.0596i | 0.4947 + 0.0354i |
| 225 | 0.3666 + 0.1276i | 0.4163 + 0.0773i | 0.4471 + 0.0642i | 0.4947 + 0.0921i |
| 226 | 0.3675 + 0.1275i | 0.4159 + 0.0773i | 0.4043 + 0.0596i | 0.4264 + 0.0354i |
| 227 | 0.3675 + 0.1276i | 0.4159 + 0.0773i | 0.4043 + 0.0642i | 0.4264 + 0.0921i |
| 228 | 0.3666 + 0.1295i | 0.4163 + 0.1614i | 0.4471 + 0.1766i | 0.4947 + 0.2185i |
| 229 | 0.3666 + 0.1294i | 0.4163 + 0.1614i | 0.4471 + 0.1669i | 0.4947 + 0.1602i |
| 230 | 0.3675 + 0.1295i | 0.4159 + 0.1614i | 0.4043 + 0.1766i | 0.4264 + 0.2185i |
| 231 | 0.3675 + 0.1294i | 0.4159 + 0.1614i | 0.4043 + 0.1669i | 0.4264 + 0.1602i |
| 232 | 0.3424 + 0.1275i | 0.3086 + 0.0773i | 0.2868 + 0.0596i | 0.2910 + 0.0354i |
| 233 | 0.3424 + 0.1276i | 0.3086 + 0.0773i | 0.2868 + 0.0642i | 0.2910 + 0.0921i |
| 234 | 0.3431 + 0.1275i | 0.3085 + 0.0773i | 0.3091 + 0.0596i | 0.3530 + 0.0354i |
| 235 | 0.3431 + 0.1276i | 0.3085 + 0.0773i | 0.3091 + 0.0642i | 0.3530 + 0.0921i |
| 236 | 0.3424 + 0.1295i | 0.3086 + 0.1614i | 0.2868 + 0.1766i | 0.2910 + 0.2185i |
| 237 | 0.3424 + 0.1294i | 0.3086 + 0.1614i | 0.2868 + 0.1669i | 0.2910 + 0.1602i |
| 238 | 0.3431 + 0.1295i | 0.3085 + 0.1614i | 0.3091 + 0.1766i | 0.3530 + 0.2185i |
| 239 | 0.3431 + 0.1294i | 0.3085 + 0.1614i | 0.3091 + 0.1669i | 0.3530 + 0.1602i |
| 240 | 0.3666 + 0.3666i | 0.4163 + 0.4163i | 0.4471 + 0.4471i | 0.4947 + 0.4947i |
| 241 | 0.3666 + 0.3675i | 0.4163 + 0.4159i | 0.4471 + 0.4043i | 0.4947 + 0.4264i |
| 242 | 0.3675 + 0.3666i | 0.4159 + 0.4163i | 0.4043 + 0.4471i | 0.4264 + 0.4947i |
| 243 | 0.3675 + 0.3675i | 0.4159 + 0.4159i | 0.4043 + 0.4043i | 0.4264 + 0.4264i |
| 244 | 0.3666 + 0.3424i | 0.4163 + 0.3086i | 0.4471 + 0.2868i | 0.4947 + 0.2910i |
| 245 | 0.3666 + 0.3431i | 0.4163 + 0.3085i | 0.4471 + 0.3091i | 0.4947 + 0.3530i |
| 246 | 0.3675 + 0.3424i | 0.4159 + 0.3086i | 0.4043 + 0.2868i | 0.4264 + 0.2910i |
| 247 | 0.3675 + 0.3431i | 0.4159 + 0.3085i | 0.4043 + 0.3091i | 0.4264 + 0.3530i |
| 248 | 0.3424 + 0.3666i | 0.3086 + 0.4163i | 0.2868 + 0.4471i | 0.2910 + 0.4947i |
| 249 | 0.3424 + 0.3675i | 0.3086 + 0.4159i | 0.2868 + 0.4043i | 0.2910 + 0.4264i |
| 250 | 0.3431 + 0.3666i | 0.3085 + 0.4163i | 0.3091 + 0.4471i | 0.3530 + 0.4947i |
| 251 | 0.3431 + 0.3675i | 0.3085 + 0.4159i | 0.3091 + 0.4043i | 0.3530 + 0.4264i |
| 252 | 0.3424 + 0.3424i | 0.3086 + 0.3086i | 0.2868 + 0.2868i | 0.2910 + 0.2910i |
| 253 | 0.3424 + 0.3431i | 0.3086 + 0.3085i | 0.2868 + 0.3091i | 0.2910 + 0.3530i |
| 254 | 0.3431 + 0.3424i | 0.3085 + 0.3086i | 0.3091 + 0.2868i | 0.3530 + 0.2910i |
| 255 | 0.3431 + 0.3431i | 0.3085 + 0.3085i | 0.3091 + 0.3091i | 0.3530 + 0.3530i |

Table 28 shows an example of constellation defined according to the non-uniform 1024-QAM. However, this is merely an example. The constellation points may be defined variously in the non-uniform 1024-QAM. In addition, the constellation points may be defined variously in the other modulation methods such as non-uniform 16-QAM, non-uniform 64-QAM, non-uniform 256-QAM, non-uniform 4096-QAM, etc.

The interleaving is performed in the above-described method for the following reasons.

Specifically, when LDPC codeword bits are mapped onto a modulation symbol, the bits may have different reliability (that is, different receiving performance or different probability of reception) according to where the bits are mapped in the modulation symbol. The LDPC codeword bits may have different codeword characteristics according to the configuration of a parity check matrix. That is, the LDPC codeword bits may have different codeword characteristics according to the number of 1 existing in the column of the parity check matrix, that is, the column degree.

Accordingly, the interleaver 120 may interleave to map the LDPC codeword bits having a specific codeword characteristic onto specific bits in the modulation symbol by considering both the codeword characteristics of the LDPC codeword bits and the reliability of the bits constituting the modulation symbol.

For example, it is assumed that the encoder 110 generates an LDPC codeword formed of 64800 bits ($N_{ldpc}$=64800) by LDPC encoding using a code rate of 6/15, and the modulator 130 uses the non-uniform 1024-QAM modulation method corresponding to the code rate of 6/15 based on Table 28.

In this case, the group interleaver 122 may perform group-interleaving using Equation 15 and Table 9 (or Equation 16 and Table 15). Accordingly, the LDPC codeword formed of bit groups $X_0$ to $X_{179}$ is interleaved by the group interleaver 122 and the group interleaver 122 may output the bit groups in the order of $X_{66}$, $X_{21}$, $X_{51}$, . . . , $X_{116}$, $X_{123}$.

In this case, the number of columns constituting the block interleaver 124 may be 10 and each column may be formed of 6480 (=360×18) rows. That is, the number of rows of the first part may be 6480 and the number of rows of the second part may be 0.

Accordingly, from among the 180 groups constituting the LDPC codeword, 18 bit groups ($X_{66}$, $X_{21}$, $X_{51}$, $X_{55}$, $X_{54}$, $X_{24}$, $X_{33}$, $X_{12}$, $X_{70}$, $X_{63}$, $X_{47}$, $X_{65}$, $X_{145}$, $X_8$, $X_0$, $X_{57}$, $X_{23}$, $X_{71}$) may be inputted to the first part of the $1^{st}$ column of the block interleaver 124, 18 bit groups ($X_{59}$, $X_{14}$, $X_{40}$, $X_{42}$, $X_{62}$, $X_{56}$, $X_2$, $X_{43}$, $X_{64}$, $X_{58}$, $X_{67}$, $X_{53}$, $X_{68}$, $X_{61}$, $X_{39}$, $X_{52}$, $X_{69}$, $X_1$) may be inputted to the first part of the $2^{nd}$ column of the block interleaver 124, 18 bit groups ($X_{22}$, $X_{31}$, $X_{161}$, $X_{38}$, $X_{30}$, $X_{19}$, $X_{17}$, $X_{18}$, $X_4$, $X_{41}$, $X_{25}$, $X_{44}$, $X_{136}$, $X_{29}$, $X_{36}$, $X_{26}$, $X_{126}$, $X_{177}$) may be inputted to the first part of the $3^{rd}$ column of the block interleaver 124, 18 bit groups ($X_{15}$, $X_{37}$, $X_{148}$, $X_9$, $X_{13}$, $X_{45}$, $X_{46}$, $X_{152}$, $X_{50}$, $X_{49}$, $X_{27}$, $X_{77}$, $X_{60}$, $X_{35}$, $X_{48}$, $X_{178}$, $X_{28}$, $X_{34}$) may be inputted to the first part of the $4^{th}$ column of the block interleaver 124, 18 bit groups ($X_{106}$, $X_{127}$, $X_{76}$, $X_{131}$, $X_{105}$, $X_{138}$, $X_{75}$, $X_{130}$, $X_{101}$, $X_{167}$, $X_{117}$, $X_{173}$, $X_{113}$, $X_{108}$, $X_{92}$, $X_{135}$, $X_{124}$, $X_{121}$) may be inputted to the first part of the $5^{th}$ column of the block interleaver 124, 18 bit groups ($X_{97}$, $X_{149}$, $X_{143}$, $X_{81}$, $X_{32}$, $X_{96}$, $X_3$, $X_{78}$, $X_{107}$, $X_{86}$, $X_{98}$, $X_{16}$, $X_{162}$, $X_{150}$, $X_{111}$, $X_{158}$, $X_{172}$, $X_{139}$) may be inputted to the first part of the $6^{th}$ column of the block interleaver 124, 18 bit groups ($X_{74}$, $X_{142}$, $X_{166}$, $X_7$, $X_5$, $X_{119}$, $X_{20}$, $X_{144}$, $X_{151}$, $X_{90}$, $X_{11}$, $X_{156}$, $X_{100}$, $X_{175}$, $X_{83}$, $X_{155}$, $X_{159}$, $X_{128}$) may be inputted to the first part of the $7^{th}$ column of the block interleaver 124, 18 bit groups ($X_{88}$, $X_{87}$, $X_{93}$, $X_{103}$, $X_{94}$, $X_{140}$, $X_{165}$, $X_6$, $X_{137}$, $X_{157}$, $X_{10}$, $X_{85}$, $X_{141}$, $X_{129}$, $X_{146}$, $X_{122}$, $X_{73}$, $X_{112}$) may be inputted to the first part of the $8^{th}$ column of the block interleaver 124, 18 bit groups ($X_{132}$, $X_{125}$, $X_{174}$, $X_{169}$, $X_{168}$, $X_{79}$, $X_{84}$, $X_{118}$, $X_{179}$, $X_{147}$, $X_{91}$, $X_{160}$, $X_{163}$, $X_{115}$, $X_{89}$, $X_{80}$, $X_{102}$, $X_{104}$) may be inputted to the first part of the $9^{th}$ column of the block interleaver 124, and 18 bit groups ($X_{134}$, $X_{82}$, $X_{95}$, $X_{133}$, $X_{164}$, $X_{154}$, $X_{120}$, $X_{110}$, $X_{170}$, $X_{114}$, $X_{153}$, $X_{72}$, $X_{109}$, $X_{171}$, $X_{176}$, $X_{99}$, $X_{116}$, $X_{123}$) may be inputted to the first part of the $10^{th}$ column of the block interleaver 124.

In addition, the block interleaver 124 may output the bits inputted to the $1^{st}$ row to the last row of each column serially, and the bits outputted from the block interleaver 124 may be inputted to the modulator 130 serially. In this case, the demultiplexer (not shown) may be omitted or the demultiplexer (not shown) may output the inputted bits serially without changing the order of bits.

Accordingly, one bit included in each of the bit groups $X_{66}$, $X_{59}$, $X_{22}$, $X_{15}$, $X_{106}$, $X_{97}$, $X_{74}$, $X_{88}$, $X_{132}$, and $X_{134}$ may constitute one modulation symbol.

As described above, since a specific bit is mapped onto a specific bit in a modulation symbol through interleaving, a receiver side can achieve high receiving performance and high decoding performance.

That is, when LDPC codeword bits of high decoding performance are mapped onto high reliability bits from among bits of each modulation symbol, the receiver side may show high decoding performance, but there is a problem that the LDPC codeword bits of the high decoding performance are not received. In addition, when the LDPC codeword bits of high decoding performance are mapped onto low reliability bits from among the bits of the modulation symbol, initial receiving performance is excellent, and thus, overall performance is also excellent. However, when many bits showing poor decoding performance are received, error propagation may occur.

Accordingly, when LDPC codeword bits are mapped onto modulation symbols, an LDPC codeword bit having a specific codeword characteristic is mapped onto a specific bit of a modulation symbol by considering both codeword characteristics of the LDPC codeword bits and reliability of the bits of the modulation symbol, and is transmitted to the receiver side. Accordingly, the receiver side can achieve both the high receiving performance and the high decoding performance.

The above-described group interleaving and block interleaving is merely an example. In addition to the above-described method, other methods for making one bit included in each of the bit groups $X_{66}$, $X_{59}$, $X_{22}$, $X_{15}$, $X_{106}$, $X_{97}$, $X_{74}$, $X_{88}$, $X_{132}$, and $X_{134}$ constitute one modulation symbol are covered by the inventive concept.

Hereinafter, a method for determining π(j), which is a parameter used for group interleaving, according to various exemplary embodiments, will be explained. First, criteria to be considered are as follows:

Criterion 1) A different interleaving order is used according to a modulation method and a code rate.

Criterion 2) A performance characteristic for each bit group of the LDPC codeword and a performance characteristic for each bit of a modulation symbol should be considered simultaneously.

For example, in the case of the LDPC codeword, the leftmost bits may be good in performance, and the leftmost bits of the modulation symbol may be good in performance. That is, the relative size of receiving performance $P(y_i)$ of each of the 10 bits constituting the non-uniform 1024-QAM, $y_0$, $y_1$, $y_2$, $y_3$, $y_4$, $y_5$, $Y_6$, $y_7$, $y_8$, and $y_9$, has a relationship of $P(y_0)=P(y_1)\geq P(y_2)=P(y_3)\geq P(y_4)=P(y_5)\geq P(y_6)=P(y_7)\geq P(y_8)=P(y_9)$.

Therefore, when the length of the LDPC codeword is 64800 and the non-uniform 1024-QAM (or 1024-NUC) is used, onto which bits from among the 10 bits of the non-uniform 1024-QAM the 180 LDPC bit groups are mapped is determined by considering the characteristics of the LDPC codeword and the modulation method simultaneously. In this case, a case having the best estimated performance is determined using a Density evolution method.

That is, a plurality of cases in which 180 bit groups are mapped onto the 10 bits may be considered and a theoretically estimated threshold value may be calculated by applying the density evolution method to each case. When an LDPC code is transmitted as an SNR value, an error probability is 0 in an SNR area greater than the threshold value. Therefore, excellent performance can be guaranteed when the LDPC code is transmitted in the method as in the case of a small threshold value from among the plurality of cases for mapping. However, the method for designing the interleaver 120 based on the density evolution is a theoretical method. Therefore, the interleaver 120 may be designed by verifying the encoding performance based on a really designed parity check matrix and based on a cyclic distribution, in addition to the theoretical method of density evolution.

Meanwhile, when the 180 bits groups are mapped onto the 10 bits, bits groups related to the rows having the same degree in the parity check matrix are grouped into a same group, and, onto which bits from among the 10 1024-QAM bits some of the groups in each group are mapped is determined.

For example, it is assumed that the parity check matrix of the LDPC codeword includes rows having the degrees of 26, 3, and 2, and 14 bit groups, 118 bit groups, and 36 bit groups are related to the rows having the degrees 26, 3, and 2, respectively, In the case of the non-uniform 1024-QAM method, two bits have the same receiving performance (that is, the same probability of reception) (that is, $P(y_0)=P(y_1)$, $P(y_2)=P(y_3)$, $P(y_4)=P(y_5)$, $P(y_6)=P(y_7)$, $P(y_8)=P(y_9)$), and thus the bit groups may be mapped onto five (5) bits. Therefore, the number of cases where the bit groups are mapped onto the five (5) bits may be expressed as follows:

| modulated bits | degree | Number of cases where bits are mapped |
|---|---|---|
| $y_0, y_1$ | 26 | $_{14}C_{x1}$ |
|  | 3 | $_{118}C_{w1}$ |
|  | 2 | $_{36}C_{z1}$ |
| $y_2, y_3$ | 26 | $_{14}C_{x2}$ |
|  | 3 | $_{118}C_{w2}$ |
|  | 2 | $_{36}C_{z2}$ |
| $y_4, y_5$ | 26 | $_{14}C_{x3}$ |
|  | 3 | $_{118}C_{w3}$ |
|  | 2 | $_{36}C_{z3}$ |
| $y_6, y_7$ | 26 | $_{14}C_{x4}$ |
|  | 3 | $_{118}C_{w4}$ |
|  | 2 | $_{36}C_{z4}$ |
| $y_8, y_9$ | 26 | $_{14}C_{x5}$ |
|  | 3 | $_{118}C_{w5}$ |
|  | 2 | $_{36}C_{z5}$ |
| sum |  | 180 |

That is, regarding the bit groups to be mapped onto $y_0$ and $y_1$, the number of cases where $x_1$ number of bit groups are selected from among the bit groups related to the rows having the degree of 26, $w_1$ number of bit groups are selected from among the bit groups related to the rows having the degree of three (3), and $z_1$ number of bit groups are selected from among the bit groups related to the rows having the degree of two (2) may be $_{14}C_{x1}+_{118}C_{w1}+_{36}C_{z1}$.

In addition, regarding the bit groups to be mapped onto $y_2$ and $y_3$, the number of cases where $x_2$ number of bit groups are selected from among the bit groups related to the rows having the degree of 26, $w_2$ number of bit groups are selected from among the bit groups related to the rows having the degree of three (3), and $z_2$ number of bit groups are selected from among the bit groups related to the rows having the degree of two (2) may be $_{14}C_{x2}+_{118}C_{w2}+_{36}C_{z2}$.

In addition, regarding the bit groups to be mapped onto $y_4$ and $y_5$, the number of cases where $x_3$ number of bit groups are selected from among the bit groups related to the rows having the degree of 26, $w_3$ number of bit groups are selected from among the bit groups related to the rows having the degree of three (3), and $z_3$ number of bit groups are selected from among the bit groups related to the rows having the degree of two (2) may be $_{14}C_{x3}+_{118}C_{w3}+_{36}C_{z3}$.

In addition, regarding the bit groups to be mapped onto $y_6$ and $y_7$, the number of cases where $x_4$ number of bit groups are selected from among the bit groups related to the rows having the degree of 26, $w_4$ number of bit groups are selected from among the bit groups related to the rows having the degree of three (3), and $z_4$ number of bit groups are selected from among the bit groups related to the rows having the degree of two (2) may be $_{14}C_{x4}+_{118}C_{w4}+_{36}C_{z4}$.

In addition, regarding the bit groups to be mapped onto $y_8$ and $y_9$, the number of cases where $x_5$ number of bit groups are selected from among the bit groups related to the rows having the degree of 26, $w_5$ number of bit groups are selected from among the bit groups related to the rows having the degree of three (3), and $z_5$ number of bit groups are selected from among the bit groups related to the rows having the degree of two (2) may be $_{14}C_{x5}+_{118}C_{w5+36}C_{z5}$.

In this case, $x_1+x_2+x_3+x_4+x_5=14$, $w_1+w_2+w_3+w_4+w_5=118$, and $z_1+z_2+z_3+z_4+z_5=36$.

However, since there are a large number of cases in the above example, it may be difficult to estimate performance for each case through density evolution.

Therefore, the number of cases may be calculated by reducing the number of kinds of receiving performance, and then performance for each case may be estimated through density evolution.

For example, on the assumption that the probability of reception of $y_0$, $y_1$, $y_2$, and $y_3$ is the same and the probability of reception of $y_4$, $y_5$, $y_6$, $y_7$, $y_8$, and $y_9$ is the same as shown in a table presented below, the number of cases where the bit groups are mapped onto three (3) bits may be calculated.

| modulated bits | degree | Number of cases where bits are mapped |
|---|---|---|
| $y_0, y_1, y_2, y_3$ | 26 | $_{14}C_{x1}$ |
|  | 3 | $_{118}C_{w1}$ |
|  | 2 | $_{36}C_{z1}$ |
| $y_4, y_5, y_6, y_7, y_8, y_9$ | 26 | $_{14}C_{x2}$ |
|  | 3 | $_{118}C_{w2}$ |
|  | 2 | $_{36}C_{z2}$ |
| sum |  | 180 |

That is, regarding the bit groups to be mapped onto $y_0$, $y_1$, $y_2$, $y_3$, the number of cases where $x_1$ number of bit groups are selected from among the bit groups related to the rows having the degree of 26, $w_1$ number of bit groups are selected from among the bit groups related to the rows having the degree of three (3), and $z_1$ number of bit groups are selected from among the bit groups related to the rows having the degree of two (2) may be $_{14}C_{x1}+_{118}C_{w1}+_{36}C_{z1}$.

In addition, regarding the bit groups to be mapped onto $y_4$, $y_5$, $y_6$, $y_7$, $y_8$, $y_9$, the number of cases where $x_2$ number of bit groups are selected from among the bit groups related to the rows having the degree of 26, $w_2$ number of bit groups are selected from among the bit groups related to the rows having the degree of three (3), and $z_2$ number of bit groups are selected from among the bit groups related to the rows having the degree of two (2) may be $_{14}C_{x2}+_{118}C_{w2}+_{36}C_{z2}$.

In this case, $x_1+x_2=14$, $w_1+w_2=118$, and $z_1+z_2=36$.

Thereafter, after the performance for each case is estimated through density devolution, the case which is estimated to have the best performance is selected. That is, how many bit groups should be selected from each of the bit groups related to the rows having the degrees of 26, 3, and 2 and mapped onto $y_0$, $y_1$, $y_2$, $y_3$, and $y_4$, $y_5$, $y_6$, $y_7$, $y_8$, $y_9$ in order to have the best performance is determined through density evolution, and $x_1$, $x_2$, $w_1$, $w_1$, $z^1$, $z^2$ are determined.

Thereafter, the bits which are assumed to have the same receiving performance are determined to have different receiving performance, and the above-described process is repeated.

That is, the number of cases where the bit groups are mapped onto $y_0$, $y_1$, $y_2$, $y_3$ within $x_1$, $w_1$, $z_1$ is calculated based on determined $x_1$, $w_1$, $z_1$, and performance for each case is estimated through density evolution and the case which is estimated to have the best performance is selected.

In addition, the number of cases where the bit groups are mapped onto $y_4$, $y_5$, $y_6$, $y_7$, $y_8$, $y_9$ within $x_2$, $w_2$, $z_2$ is calculated based on determined $x_2$, $w_2$, $z_2$, and performance for each case is estimated through density evolution and the case which is estimated to have the best performance is selected.

Accordingly, how many of the bit groups related to the rows having each of the degrees should be mapped onto the 1024-QAM bits to have the best performance may be determined, and the interleaver 120 may be designed to be able to map a specific group of the LDPC codeword onto a specific bit of the modulation symbol and satisfy the case of the best performance.

In the above-described method, the group interleaving method can be designed.

Figure 18:
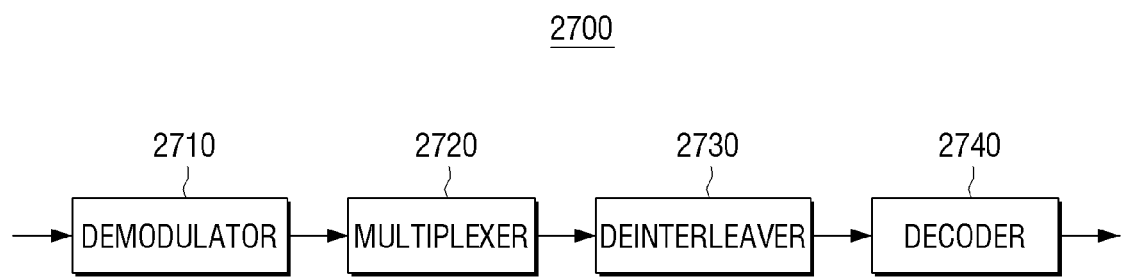
FIG. 18 is a block diagram to illustrate a configuration of a receiving apparatus according to an exemplary embodiment.

The transmitting apparatus 200 may transmit the signal mapped onto the constellation to a receiving apparatus (for example, 2700 of FIG. 18). For example, the transmitting apparatus 200 may map the signal mapped onto the constellation onto an Orthogonal Frequency Division Multiplexing (OFDM) frame using OFDM, and may transmit the signal to the receiving apparatus 2700 through an allocated channel.

Exemplary Embodiment 2: Case in Which a Block-Row Interleaver is Used

According to another exemplary embodiment, the interleaver 120 may interleave an LDPC codeword in other methods, different from the methods described in above Exemplary Embodiment 1, and may map bits included in a predetermined bit group from among a plurality of bit groups constituting the interleaved LDPC codeword onto a predetermined bit of a modulation symbol. This will be explained in detail with reference to FIG. 14.

Figure 14:
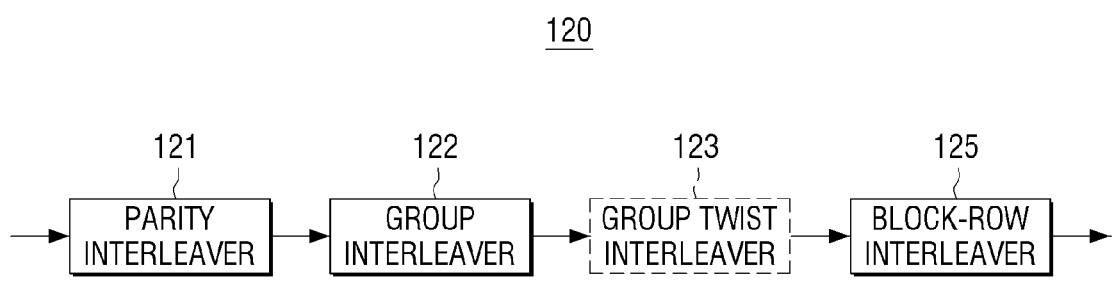
FIG. 14 is a block diagram to illustrate a configuration of an interleaver according to another exemplary embodiment.

Referring to FIG. 14, the interleaver 120 includes a parity interleaver 121, a group interleaver (or a group-wise interleaver 122), a group twist interleaver 123 and a block-row interleaver 125. Herein, the parity interleaver 121 and the group twist interleaver 123 perform the same functions as in Exemplary Embodiment 1 described above, and thus, a detailed description of these elements is omitted.

The group interleaver 122 may divide a parity-interleaved LDPC codeword into a plurality of bit groups, and may rearrange the order of the plurality of bit groups in bits group wise.

In this case, the operation of dividing the parity-interleaved LDPC codeword into the plurality of bit groups is the same as in Exemplary Embodiment 1, and thus, a detailed description thereof is omitted.

The group interleaver 122 interleaves the LDPC codeword in bits group wise. Specifically, the group interleaver 122 may group the LDPC codeword into the plurality of bit groups, and may rearrange the plurality of bit groups in bits group wise. That is, the group interleaver 122 may rearrange the order of the plurality of bit groups in the LDPC codeword in group units by changing locations of the plurality of bit groups constituting the LDPC codeword.

Herein, the group interleaver 122 may rearrange the order of the plurality of bit groups in bits group wise such that bit groups including bits mapped onto the same modulation symbol from among the plurality of bit groups are serially arranged.

In this case, the group interleaver 122 may rearrange the order of the plurality of bit groups in bits group wise by considering at least one of the number of rows and columns of the block-row interleaver 124, the number of bit groups of the LDPC codeword, and the number of bits included in each bit group, such that bit groups including bits mapped onto the same modulation symbol are serially arranged.

To achieve this, the group interleaver 122 may interleave the LDPC codeword in bits group wise by using Equation 17 presented below:

$$Y_j = X_{\pi(j)} (0 \le j < N_{group}) \quad (17),$$

where $X_j$ is the $j^{th}$ bit group before group interleaving, and $Y_j$ is the $j^{th}$ bit group after group interleaving. In addition, $\pi(j)$ is a parameter indicating an interleaving order and is determined by at least one of a length of an LDPC codeword, a code rate, and a modulation method.

Accordingly, $X_{\pi(j)}$ is a $\pi(j)^{th}$ bit group before group interleaving, and Equation 17 means that the pre-interleaving $\pi(j)^{th}$ bit group is interleaved into the $j^{th}$ bit group.

According to an exemplary embodiment, an example of $\pi(j)$ may be defined as in Tables 29 to 33 presented below.

In this case, $\pi(j)$ is defined according to a length of an LPDC codeword and a code rate, and a parity check matrix is also defined according to a length of an LDPC codeword and a code rate. Accordingly, when LDPC encoding is performed based on a specific parity check matrix according to a length of an LDPC codeword and a code rate, the LDPC codeword may be interleaved in bits group wise based on $\pi(j)$ satisfying the corresponding length of the LDPC codeword and code rate.

For example, when the encoder 110 performs LDPC encoding at a code rate of 6/15 to generate an LDPC codeword of a length of 64800, the group interleaver 122 may perform interleaving by using $\pi(j)$ which is defined according to the length of the LDPC codeword of 64800 and the code rate of 6/15 in Tables 29 to 33 presented below, for example, by using $\pi(j)$ defined as shown in Table 29.

For example, when the length $N_{ldpc}$ of the LDPC codeword is 64800, the code rate is 6/15, and the modulation method is 1024-QAM, $\pi(j)$ may be defined as in Table 29 presented below.

TABLE 29

Order of bits group to be block interleaved $\pi(j)$ ($0 \le j < 180$)

| | | | | | | | | | | | | | | | | | | |
|---|---|---|---|---|---|---|---|---|---|---|---|---|---|---|---|---|---|---|
| j-th block of | 0 | 1 | 2 | 3 | 4 | 5 | 6 | 7 | 8 | 9 | 10 | 11 | 12 | 13 | 14 | 15 | 16 | 17 |
| Group-wise | 18 | 19 | 20 | 21 | 22 | 23 | 24 | 25 | 26 | 27 | 28 | 29 | 30 | 31 | 32 | 33 | 34 | 35 |
| interleaver | 36 | 37 | 38 | 39 | 40 | 41 | 42 | 43 | 44 | 45 | 46 | 47 | 48 | 49 | 50 | 51 | 52 | 53 |
| output | 54 | 55 | 56 | 57 | 58 | 59 | 60 | 61 | 62 | 63 | 64 | 65 | 66 | 67 | 68 | 69 | 70 | 71 |
| | 72 | 73 | 74 | 75 | 76 | 77 | 78 | 79 | 80 | 81 | 82 | 83 | 84 | 85 | 86 | 87 | 88 | 89 |
| | 90 | 91 | 92 | 93 | 94 | 95 | 96 | 97 | 98 | 99 | 100 | 101 | 102 | 103 | 104 | 105 | 106 | 107 |
| | 108 | 109 | 110 | 111 | 112 | 113 | 114 | 115 | 116 | 117 | 118 | 119 | 120 | 121 | 122 | 123 | 124 | 125 |
| | 126 | 127 | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 | 160 | 161 |
| | 162 | 163 | 164 | 165 | 166 | 167 | 168 | 169 | 170 | 171 | 172 | 173 | 174 | 175 | 176 | 177 | 178 | 179 |

TABLE 29-continued

| Order of bits group to be block interleaved π(j) (0 ≤ j < 180) | | | | | | | | | | | | | | | | | | |
|---|---|---|---|---|---|---|---|---|---|---|---|---|---|---|---|---|---|---|
| π(j)-th block of Group-wise interleaver input | 66 | 59 | 22 | 15 | 106 | 97 | 74 | 88 | 132 | 134 | 21 | 14 | 31 | 37 | 127 | 149 | 142 | 87 |
| | 125 | 82 | 51 | 40 | 161 | 148 | 76 | 143 | 166 | 93 | 174 | 95 | 55 | 42 | 38 | 9 | 131 | 81 |
| | 7 | 103 | 169 | 133 | 54 | 62 | 30 | 13 | 105 | 32 | 5 | 94 | 168 | 164 | 24 | 56 | 19 | 45 |
| | 138 | 96 | 119 | 140 | 79 | 154 | 33 | 2 | 17 | 46 | 75 | 3 | 20 | 165 | 84 | 120 | 12 | 43 |
| | 18 | 152 | 130 | 78 | 144 | 6 | 118 | 110 | 70 | 64 | 4 | 50 | 101 | 107 | 151 | 137 | 179 | 170 |
| | 63 | 58 | 41 | 49 | 167 | 86 | 90 | 157 | 147 | 114 | 47 | 67 | 25 | 27 | 117 | 98 | 11 | 10 |
| | 91 | 153 | 65 | 53 | 44 | 77 | 173 | 16 | 156 | 85 | 160 | 72 | 145 | 68 | 136 | 60 | 113 | 162 |
| | 100 | 141 | 163 | 109 | 8 | 61 | 29 | 35 | 108 | 150 | 175 | 129 | 115 | 171 | 0 | 39 | 36 | 48 |
| | 92 | 111 | 83 | 146 | 89 | 176 | 57 | 52 | 26 | 178 | 135 | 158 | 155 | 122 | 80 | 99 | 23 | 69 |
| | 126 | 28 | 124 | 172 | 159 | 73 | 102 | 116 | 71 | 1 | 177 | 34 | 121 | 139 | 128 | 112 | 104 | 123 |

In the case of Table 29, Equation 17 may be expressed as $Y_0=X_{\pi(0)}=X_{66}$, $Y_1=X_{\pi(1)}=X_{59}$, $Y_2=X_{\pi(2)}=X_{22}$, ..., $Y_{178}=X_{\pi(178)}=X_{104}$, and $Y_{179}=X_{\pi(179)}=X_{123}$. Accordingly, the group interleaver 122 may rearrange the order of the plurality of bit groups in bits group wise by changing the $66^{th}$ bit group to the $0^{th}$ bit group, the $59^{th}$ bit group to the $1^{st}$ bit group, the $22^{nd}$ bit group to the $2^{nd}$ bit group, ..., the $104^{th}$ bit group to the $178^{th}$ bit group, and the $123^{rd}$ bit group to the $179^{th}$ bit group.

In another example, when the length $N_{ldpc}$ of the LDPC codeword is 64800, the code rate is 8/15, and the modulation method is 1024-QAM, π(j) may be defined as in Table 30 presented below.

TABLE 30

| Order of bits group to be block interleaved π(j) (0 ≤ j < 180) | | | | | | | | | | | | | | | | | | |
|---|---|---|---|---|---|---|---|---|---|---|---|---|---|---|---|---|---|---|
| j-th block of Group-wise interleaver output | 0 | 1 | 2 | 3 | 4 | 5 | 6 | 7 | 8 | 9 | 10 | 11 | 12 | 13 | 14 | 15 | 16 | 17 |
| | 18 | 19 | 20 | 21 | 22 | 23 | 24 | 25 | 26 | 27 | 28 | 29 | 30 | 31 | 32 | 33 | 34 | 35 |
| | 36 | 37 | 38 | 39 | 40 | 41 | 42 | 43 | 44 | 45 | 46 | 47 | 48 | 49 | 50 | 51 | 52 | 53 |
| | 54 | 55 | 56 | 57 | 58 | 59 | 60 | 61 | 62 | 63 | 64 | 65 | 66 | 67 | 68 | 69 | 70 | 71 |
| | 72 | 73 | 74 | 75 | 76 | 77 | 78 | 79 | 80 | 81 | 82 | 83 | 84 | 85 | 86 | 87 | 88 | 89 |
| | 90 | 91 | 92 | 93 | 94 | 95 | 96 | 97 | 98 | 99 | 100 | 101 | 102 | 103 | 104 | 105 | 106 | 107 |
| | 108 | 109 | 110 | 111 | 112 | 113 | 114 | 115 | 116 | 117 | 118 | 119 | 120 | 121 | 122 | 123 | 124 | 125 |
| | 126 | 127 | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 | 160 | 161 |
| | 162 | 163 | 164 | 165 | 166 | 167 | 168 | 169 | 170 | 171 | 172 | 173 | 174 | 175 | 176 | 177 | 178 | 179 |
| π(j)-th block of Group-wise interleaver input | 77 | 39 | 3 | 175 | 102 | 62 | 119 | 0 | 171 | 104 | 48 | 13 | 72 | 91 | 30 | 125 | 173 | 109 |
| | 8 | 115 | 82 | 79 | 2 | 68 | 112 | 28 | 168 | 167 | 106 | 135 | 51 | 75 | 54 | 85 | 122 | 26 |
| | 118 | 128 | 144 | 121 | 57 | 41 | 52 | 94 | 110 | 45 | 120 | 107 | 150 | 100 | 69 | 18 | 145 | 15 |
| | 29 | 24 | 114 | 117 | 169 | 12 | 65 | 38 | 19 | 43 | 20 | 23 | 149 | 147 | 108 | 170 | 6 | 89 |
| | 78 | 74 | 105 | 21 | 159 | 177 | 162 | 156 | 71 | 49 | 80 | 60 | 138 | 157 | 155 | 96 | 143 | 126 |
| | 90 | 93 | 63 | 66 | 101 | 98 | 179 | 164 | 111 | 5 | 84 | 36 | 87 | 37 | 174 | 35 | 160 | 152 |
| | 141 | 127 | 81 | 64 | 67 | 92 | 33 | 95 | 161 | 11 | 133 | 154 | 50 | 47 | 86 | 4 | 137 | 22 |
| | 130 | 148 | 178 | 97 | 88 | 40 | 10 | 9 | 136 | 32 | 123 | 158 | 134 | 140 | 61 | 42 | 1 | 16 |
| | 131 | 103 | 172 | 129 | 146 | 116 | 55 | 76 | 58 | 83 | 166 | 27 | 139 | 163 | 99 | 165 | 53 | 70 |
| | 17 | 46 | 59 | 113 | 124 | 176 | 132 | 7 | 73 | 56 | 14 | 44 | 34 | 31 | 153 | 151 | 142 | 25 |

In the case of Table 30, Equation 17 may be expressed as $Y_0=X_{\pi(0)}=X_{77}$, $Y_1=X_{\pi(1)}=X_{39}$, $Y_2=X_{\pi(2)}=X_3$, ..., $Y_{178}=X_{\pi(178)}=X_{142}$, and $Y_{179}=X_{\pi(179)}=X_{25}$. Accordingly, the group interleaver 122 may rearrange the order of the plurality of bit groups in bits group wise by changing the $77^{th}$ bit group to the $0^{th}$ bit group, the $39^{th}$ bit group to the $1^{st}$ bit group, the $3^{rd}$ bit group to the $2^{nd}$ bit group, ..., the $142^{th}$ bit group to the $178^{th}$ bit group, and the $25^{th}$ bit group to the $179^{th}$ bit group.

In another example, when the length $N_{ldpc}$ of the LDPC codeword is 64800, the code rate is 10/15, and the modulation method is 1024-QAM, π(j) may be defined as in Table 31 presented below

TABLE 31

| Order of bits group to be block interleaved π(j) (0 ≤ j < 180) | | | | | | | | | | | | | | | | | | |
|---|---|---|---|---|---|---|---|---|---|---|---|---|---|---|---|---|---|---|
| j-th block of Group-wise interleaver output | 0 | 1 | 2 | 3 | 4 | 5 | 6 | 7 | 8 | 9 | 10 | 11 | 12 | 13 | 14 | 15 | 16 | 17 |
| | 18 | 19 | 20 | 21 | 22 | 23 | 24 | 25 | 26 | 27 | 28 | 29 | 30 | 31 | 32 | 33 | 34 | 35 |
| | 36 | 37 | 38 | 39 | 40 | 41 | 42 | 43 | 44 | 45 | 46 | 47 | 48 | 49 | 50 | 51 | 52 | 53 |
| | 54 | 55 | 56 | 57 | 58 | 59 | 60 | 61 | 62 | 63 | 64 | 65 | 66 | 67 | 68 | 69 | 70 | 71 |
| | 72 | 73 | 74 | 75 | 76 | 77 | 78 | 79 | 80 | 81 | 82 | 83 | 84 | 85 | 86 | 87 | 88 | 89 |
| | 90 | 91 | 92 | 93 | 94 | 95 | 96 | 97 | 98 | 99 | 100 | 101 | 102 | 103 | 104 | 105 | 106 | 107 |
| | 108 | 109 | 110 | 111 | 112 | 113 | 114 | 115 | 116 | 117 | 118 | 119 | 120 | 121 | 122 | 123 | 124 | 125 |
| | 126 | 127 | 128 | 129 | 130 | 131 | 132 | 133 | 134 | 135 | 136 | 137 | 138 | 139 | 140 | 141 | 142 | 143 |

TABLE 31-continued

| | Order of bits group to be block interleaved π(j) (0 ≤ j < 180) | | | | | | | | | | | | | | | | | |
|---|---|---|---|---|---|---|---|---|---|---|---|---|---|---|---|---|---|---|
| | 144 | 145 | 146 | 147 | 148 | 149 | 150 | 151 | 152 | 153 | 154 | 155 | 156 | 157 | 158 | 159 | 160 | 161 |
| | 162 | 163 | 164 | 165 | 166 | 167 | 168 | 169 | 170 | 171 | 172 | 173 | 174 | 175 | 176 | 177 | 178 | 179 |
| π(j)-th block of | 7 | 87 | 5 | 66 | 23 | 42 | 149 | 43 | 148 | 16 | 58 | 9 | 82 | 102 | 79 | 12 | 163 | 135 |
| Group-wise | 147 | 172 | 108 | 93 | 10 | 25 | 35 | 41 | 173 | 123 | 167 | 3 | 59 | 81 | 116 | 39 | 72 | 97 |
| interleaver | 159 | 178 | 136 | 155 | 1 | 94 | 109 | 78 | 33 | 2 | 132 | 130 | 164 | 169 | 14 | 71 | 75 | 53 |
| input | 98 | 21 | 170 | 127 | 146 | 142 | 54 | 106 | 91 | 118 | 40 | 61 | 179 | 145 | 153 | 156 | 115 | 50 |
| | 47 | 112 | 38 | 117 | 69 | 157 | 138 | 120 | 57 | 44 | 80 | 0 | 24 | 70 | 139 | 176 | 161 | 122 |
| | 29 | 15 | 99 | 83 | 63 | 62 | 133 | 177 | 6 | 19 | 64 | 52 | 103 | 22 | 73 | 34 | 154 | 140 |
| | 143 | 144 | 65 | 4 | 30 | 36 | 20 | 11 | 160 | 151 | 124 | 158 | 8 | 100 | 105 | 51 | 48 | 67 |
| | 128 | 134 | 17 | 13 | 101 | 90 | 76 | 55 | 27 | 37 | 168 | 126 | 174 | 152 | 113 | 111 | 107 | 85 |
| | 96 | 49 | 84 | 18 | 131 | 141 | 60 | 77 | 88 | 86 | 68 | 114 | 171 | 129 | 175 | 166 | 46 | 89 |
| | 95 | 45 | 26 | 56 | 162 | 137 | 165 | 125 | 104 | 92 | 28 | 119 | 110 | 32 | 31 | 74 | 150 | 121 |

In the case of Table 31, Equation 17 may be expressed as $Y_0=X_{\pi(0)}=X_7$, $Y_1=X_{\pi(1)}=X_{87}$, $Y_2=X_{\pi(2)}=X_5$, ..., $Y_{178}=X_{\pi(178)}=X_{150}$, and $Y_{179}=X_{\pi(179)}=X_{121}$. Accordingly, the group interleaver 122 may rearrange the order of the plurality of bit groups in bits group wise by changing the $7^{th}$ bit group to the $0^{th}$ bit group, the $87^{th}$ bit group to the $1^{st}$ bit group, the $5^{th}$ bit group to the $2^{nd}$ bit group, ..., the $150^{th}$ bit group to the $178^{th}$ bit group, and the $121^{st}$ bit group to the $179^{th}$ bit group.

In another example, when the length $N_{ldpc}$ of the LDPC codeword is 64800, the code rate is 10/15, and the modulation method is 1024-QAM, π(j) may be defined as in Table 32 presented below.

TABLE 32

| | Order of bits group to be block interleaved π(j) (0 ≤ j < 180) | | | | | | | | | | | | | | | | | |
|---|---|---|---|---|---|---|---|---|---|---|---|---|---|---|---|---|---|---|
| j-th block of | 0 | 1 | 2 | 3 | 4 | 5 | 6 | 7 | 8 | 9 | 10 | 11 | 12 | 13 | 14 | 15 | 16 | 17 |
| Group-wise | 18 | 19 | 20 | 21 | 22 | 23 | 24 | 25 | 26 | 27 | 28 | 29 | 30 | 31 | 32 | 33 | 34 | 35 |
| interleaver | 36 | 37 | 38 | 39 | 40 | 41 | 42 | 43 | 44 | 45 | 46 | 47 | 48 | 49 | 50 | 51 | 52 | 53 |
| output | 54 | 55 | 56 | 57 | 58 | 59 | 60 | 61 | 62 | 63 | 64 | 65 | 66 | 67 | 68 | 69 | 70 | 71 |
| | 72 | 73 | 74 | 75 | 76 | 77 | 78 | 79 | 80 | 81 | 82 | 83 | 84 | 85 | 86 | 87 | 88 | 89 |
| | 90 | 91 | 92 | 93 | 94 | 95 | 96 | 97 | 98 | 99 | 100 | 101 | 102 | 103 | 104 | 105 | 106 | 107 |
| | 108 | 109 | 110 | 111 | 112 | 113 | 114 | 115 | 116 | 117 | 118 | 119 | 120 | 121 | 122 | 123 | 124 | 125 |
| | 126 | 127 | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 | 160 | 161 |
| | 162 | 163 | 164 | 165 | 166 | 167 | 168 | 169 | 170 | 171 | 172 | 173 | 174 | 175 | 176 | 177 | 178 | 179 |
| π(j)-th block of | 111 | 32 | 70 | 77 | 54 | 93 | 122 | 65 | 165 | 144 | 45 | 101 | 95 | 2 | 38 | 7 | 126 | 13 |
| Group-wise | 156 | 128 | 78 | 82 | 57 | 117 | 60 | 42 | 131 | 177 | 148 | 11 | 97 | 23 | 10 | 20 | 114 | 51 |
| interleaver | 160 | 166 | 179 | 175 | 75 | 79 | 50 | 74 | 59 | 40 | 154 | 139 | 163 | 134 | 63 | 68 | 99 | 106 |
| input | 105 | 119 | 6 | 167 | 3 | 124 | 35 | 98 | 118 | 83 | 67 | 8 | 22 | 172 | 133 | 130 | 15 | 31 |
| | 73 | 102 | 103 | 21 | 142 | 176 | 143 | 146 | 9 | 107 | 27 | 109 | 0 | 81 | 141 | 153 | 121 | 161 |
| | 25 | 19 | 12 | 113 | 80 | 76 | 136 | 89 | 132 | 145 | 39 | 110 | 1 | 72 | 64 | 112 | 157 | 152 |
| | 169 | 120 | 94 | 48 | 17 | 88 | 4 | 28 | 162 | 168 | 147 | 129 | 24 | 58 | 61 | 115 | 91 | 34 |
| | 123 | 135 | 173 | 164 | 84 | 71 | 55 | 37 | 66 | 36 | 159 | 52 | 155 | 125 | 100 | 87 | 90 | 30 |
| | 46 | 86 | 150 | 170 | 149 | 5 | 49 | 43 | 56 | 116 | 108 | 69 | 171 | 138 | 178 | 151 | 44 | 62 |
| | 14 | 29 | 33 | 92 | 174 | 127 | 158 | 18 | 41 | 85 | 47 | 26 | 104 | 53 | 137 | 96 | 16 | 140 |

In the case of Table 32, Equation 17 may be expressed as $Y_0=X_{\pi(0)}=X_{111}$, $Y_1=X_{\pi(1)}=X_{32}$, $Y_2=X_{\pi(2)}=X_{70}$, ..., $Y_{178}=X_{\pi(178)}=X_{16}$, and $Y_{179}=X_{\pi(179)}=X_{140}$. Accordingly, the group interleaver 122 may rearrange the order of the plurality of bit groups in bits group wise by changing the $111^{th}$ bit group to the $0^{th}$ bit group, the $32^{nd}$ bit group to the $1^{st}$ bit group, the $70^{th}$ bit group to the $2^{nd}$ bit group, ..., the $16^{th}$ bit group to the $178^{th}$ bit group, and the $140^{th}$ bit group to the $179^{th}$ bit group.

In another example, when the length $N_{ldpc}$ of the LDPC codeword is 64800, the code rate is 12/15, and the modulation method is 1024-QAM, π(j) may be defined as in Table 33 presented below.

TABLE 33

| | Order of bits group to be block interleaved π(j) (0 ≤ j < 180) | | | | | | | | | | | | | | | | | |
|---|---|---|---|---|---|---|---|---|---|---|---|---|---|---|---|---|---|---|
| j-th block of | 0 | 1 | 2 | 3 | 4 | 5 | 6 | 7 | 8 | 9 | 10 | 11 | 12 | 13 | 14 | 15 | 16 | 17 |
| Group-wise | 18 | 19 | 20 | 21 | 22 | 23 | 24 | 25 | 26 | 27 | 28 | 29 | 30 | 31 | 32 | 33 | 34 | 35 |
| interleaver | 36 | 37 | 38 | 39 | 40 | 41 | 42 | 43 | 44 | 45 | 46 | 47 | 48 | 49 | 50 | 51 | 52 | 53 |
| output | 54 | 55 | 56 | 57 | 58 | 59 | 60 | 61 | 62 | 63 | 64 | 65 | 66 | 67 | 68 | 69 | 70 | 71 |
| | 72 | 73 | 74 | 75 | 76 | 77 | 78 | 79 | 80 | 81 | 82 | 83 | 84 | 85 | 86 | 87 | 88 | 89 |
| | 90 | 91 | 92 | 93 | 94 | 95 | 96 | 97 | 98 | 99 | 100 | 101 | 102 | 103 | 104 | 105 | 106 | 107 |

TABLE 33-continued

| | Order of bits group to be block interleaved π(j) (0 ≤ j < 180) | | | | | | | | | | | | | | | | | |
|---|---|---|---|---|---|---|---|---|---|---|---|---|---|---|---|---|---|---|
| | 108 | 109 | 110 | 111 | 112 | 113 | 114 | 115 | 116 | 117 | 118 | 119 | 120 | 121 | 122 | 123 | 124 | 125 |
| | 126 | 127 | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 | 160 | 161 |
| | 162 | 163 | 164 | 165 | 166 | 167 | 168 | 169 | 170 | 171 | 172 | 173 | 174 | 175 | 176 | 177 | 178 | 179 |
| π(j)-th block of | 91 | 88 | 112 | 102 | 26 | 27 | 120 | 103 | 17 | 15 | 19 | 136 | 60 | 83 | 116 | 89 | 115 | 72 |
| Group-wise | 147 | 148 | 11 | 52 | 33 | 64 | 98 | 29 | 126 | 164 | 167 | 5 | 106 | 121 | 73 | 86 | 37 | 62 |
| interleaver | 143 | 93 | 174 | 146 | 14 | 1 | 53 | 100 | 55 | 50 | 149 | 54 | 179 | 163 | 40 | 133 | 92 | 39 |
| input | 44 | 139 | 74 | 166 | 3 | 172 | 20 | 4 | 75 | 49 | 70 | 56 | 41 | 43 | 173 | 175 | 67 | 2 |
| | 48 | 125 | 25 | 109 | 178 | 123 | 160 | 151 | 32 | 21 | 47 | 108 | 7 | 77 | 129 | 113 | 155 | 169 |
| | 22 | 122 | 110 | 119 | 34 | 59 | 18 | 0 | 161 | 176 | 31 | 38 | 80 | 6 | 114 | 127 | 131 | 154 |
| | 152 | 150 | 23 | 12 | 76 | 118 | 135 | 142 | 42 | 10 | 156 | 153 | 78 | 69 | 138 | 35 | 128 | 96 |
| | 165 | 63 | 177 | 171 | 68 | 111 | 87 | 61 | 137 | 105 | 101 | 107 | 24 | 158 | 79 | 81 | 85 | 71 |
| | 84 | 99 | 134 | 162 | 170 | 168 | 141 | 82 | 65 | 30 | 51 | 90 | 36 | 157 | 9 | 144 | 117 | 58 |
| | 130 | 45 | 28 | 13 | 140 | 66 | 159 | 8 | 95 | 46 | 57 | 94 | 97 | 124 | 132 | 104 | 16 | 145 |

In the case of Table 33, Equation 17 may be expressed as $Y_0=X_{\pi(0)}=X_{91}$, $Y_1=X_{\pi(1)}=X_{88}$, $Y_2=X_{\pi(2)}=X_{112}$, . . . , $Y_{178}=X_{\pi(178)}=X_{16}$, and $Y_{179}=X_{\pi(179)}=X_{145}$. Accordingly, the group interleaver 122 may rearrange the order of the plurality of bit groups in bits group wise by changing the 91$^{st}$ bit group to the 0$^{th}$ bit group, the 88$^{th}$ bit group to the 1$^{st}$ bit group, the 112$^{th}$ bit group to the 2$^{nd}$ bit group, . . . , the 16$^{th}$ bit group to the 178$^{th}$ bit group, and the 145$^{th}$ bit group to the 179$^{th}$ bit group.

In the above-described examples, the length of the LDPC codeword is 64800 and the code rate is 6/15, 8/15, 10/15, and 12/15. However, this is merely an example and the interleaving pattern may be defined variously when the length of the LDPC codeword is 16200 or the code rate has different values.

As described above, the group interleaver 122 may rearrange the order of the plurality of bit groups in bits group wise by using Equation 17 and Tables 29 to 33.

"j-th block of Group-wise Interleaver output" in Tables 29 to 33 indicates the j-th bit group output from the group interleaver 122 after interleaving, and "π(j)-th block of Group-wise Interleaver input" indicates the π(j)-th bit group input to the group interleaver 122.

In addition, since the order of the bit groups constituting the LDPC codeword is rearranged by the group interleaver 122 in bits group wise, and then the bit groups are block-interleaved by the block interleaver 124, which will be described below, "Order of bits groups to be block interleaved" is set forth in Tables 29 to 33 in relation to π(j).

π(j) defined as shown in Tables 29 to 33 may be arranged according to the code rates as shown in Table 34 presented below:

TABLE 34

| j-th block of Group-wise Interleaver output | (CR 6/15) π(j)-th block of Group-wise Interleaver input | (CR 8/15) π(j)-th block of Group-wise Interleaver input | (CR 10/15) π(j)-th block of Group-wise Interleaver input | (CR 10/15) π(j)-th block of Group-wise Interleaver input | (CR 12/15) π(j)-th block of Group-wise Interleaver input |
|---|---|---|---|---|---|
| 0 | 66 | 77 | 7 | 111 | 91 |
| 1 | 59 | 39 | 87 | 32 | 88 |
| 2 | 22 | 3 | 5 | 70 | 112 |
| 3 | 15 | 175 | 66 | 77 | 102 |
| 4 | 106 | 102 | 23 | 54 | 26 |
| 5 | 97 | 62 | 42 | 93 | 27 |
| 6 | 74 | 119 | 149 | 122 | 120 |
| 7 | 88 | 0 | 43 | 65 | 103 |
| 8 | 132 | 171 | 148 | 165 | 17 |
| 9 | 134 | 104 | 16 | 144 | 15 |
| 10 | 21 | 48 | 58 | 45 | 19 |
| 11 | 14 | 13 | 9 | 101 | 136 |
| 12 | 31 | 72 | 82 | 95 | 60 |
| 13 | 37 | 91 | 102 | 2 | 83 |
| 14 | 127 | 30 | 79 | 38 | 116 |
| 15 | 149 | 125 | 12 | 7 | 89 |
| 16 | 142 | 173 | 163 | 126 | 115 |
| 17 | 87 | 109 | 135 | 13 | 72 |
| 18 | 125 | 8 | 147 | 156 | 147 |
| 19 | 82 | 115 | 172 | 128 | 148 |
| 20 | 51 | 82 | 108 | 78 | 11 |
| 21 | 40 | 79 | 93 | 82 | 52 |
| 22 | 161 | 2 | 10 | 57 | 33 |
| 23 | 148 | 68 | 25 | 117 | 64 |
| 24 | 76 | 112 | 35 | 60 | 98 |
| 25 | 143 | 28 | 41 | 42 | 29 |
| 26 | 166 | 168 | 173 | 131 | 126 |
| 27 | 93 | 167 | 123 | 177 | 164 |
| 28 | 174 | 106 | 167 | 148 | 167 |

TABLE 34-continued

| j-th block of Group-wise Interleaver output | (CR 6/15) π(j)-th block of Group-wise Interleaver input | (CR 8/15) π(j)-th block of Group-wise Interleaver input | (CR 10/15) π(j)-th block of Group-wise Interleaver input | (CR 10/15) π(j)-th block of Group-wise Interleaver input | (CR 12/15) π(j)-th block of Group-wise Interleaver input |
|---|---|---|---|---|---|
| 29 | 95 | 135 | 3 | 11 | 5 |
| 30 | 55 | 51 | 59 | 97 | 106 |
| 31 | 42 | 75 | 81 | 23 | 121 |
| 32 | 38 | 54 | 116 | 10 | 73 |
| 33 | 9 | 85 | 39 | 20 | 86 |
| 34 | 131 | 122 | 72 | 114 | 37 |
| 35 | 81 | 26 | 97 | 51 | 62 |
| 36 | 7 | 118 | 159 | 160 | 143 |
| 37 | 103 | 128 | 178 | 166 | 93 |
| 38 | 169 | 144 | 136 | 179 | 174 |
| 39 | 133 | 121 | 155 | 175 | 146 |
| 40 | 54 | 57 | 1 | 75 | 14 |
| 41 | 62 | 41 | 94 | 79 | 1 |
| 42 | 30 | 52 | 109 | 50 | 53 |
| 43 | 13 | 94 | 78 | 74 | 100 |
| 44 | 105 | 110 | 33 | 59 | 55 |
| 45 | 32 | 45 | 2 | 40 | 50 |
| 46 | 5 | 120 | 132 | 154 | 149 |
| 47 | 94 | 107 | 130 | 139 | 54 |
| 48 | 168 | 150 | 164 | 163 | 179 |
| 49 | 164 | 100 | 169 | 134 | 163 |
| 50 | 24 | 69 | 14 | 63 | 40 |
| 51 | 56 | 18 | 71 | 68 | 133 |
| 52 | 19 | 145 | 75 | 99 | 92 |
| 53 | 45 | 15 | 53 | 106 | 39 |
| 54 | 138 | 29 | 98 | 105 | 44 |
| 55 | 96 | 24 | 21 | 119 | 139 |
| 56 | 119 | 114 | 170 | 6 | 74 |
| 57 | 140 | 117 | 127 | 167 | 166 |
| 58 | 79 | 169 | 146 | 3 | 3 |
| 59 | 154 | 12 | 142 | 124 | 172 |
| 60 | 33 | 65 | 54 | 35 | 20 |
| 61 | 2 | 38 | 106 | 98 | 4 |
| 62 | 17 | 19 | 91 | 118 | 75 |
| 63 | 46 | 43 | 118 | 83 | 49 |
| 64 | 75 | 20 | 40 | 67 | 70 |
| 65 | 3 | 23 | 61 | 8 | 56 |
| 66 | 20 | 149 | 179 | 22 | 41 |
| 67 | 165 | 147 | 145 | 172 | 43 |
| 68 | 84 | 108 | 153 | 133 | 173 |
| 69 | 120 | 170 | 156 | 130 | 175 |
| 70 | 12 | 6 | 115 | 15 | 67 |
| 71 | 43 | 89 | 50 | 31 | 2 |
| 72 | 18 | 78 | 47 | 73 | 48 |
| 73 | 152 | 74 | 112 | 102 | 125 |
| 74 | 130 | 105 | 38 | 103 | 25 |
| 75 | 78 | 21 | 117 | 21 | 109 |
| 76 | 144 | 159 | 69 | 142 | 178 |
| 77 | 6 | 177 | 157 | 176 | 123 |
| 78 | 118 | 162 | 138 | 143 | 160 |
| 79 | 110 | 156 | 120 | 146 | 151 |
| 80 | 70 | 71 | 57 | 9 | 32 |
| 81 | 64 | 49 | 44 | 107 | 21 |
| 82 | 4 | 80 | 80 | 27 | 47 |
| 83 | 50 | 60 | 0 | 109 | 108 |
| 84 | 101 | 138 | 24 | 0 | 7 |
| 85 | 107 | 157 | 70 | 81 | 77 |
| 86 | 151 | 155 | 139 | 141 | 129 |
| 87 | 137 | 96 | 176 | 153 | 113 |
| 88 | 179 | 143 | 161 | 121 | 155 |
| 89 | 170 | 126 | 122 | 161 | 169 |
| 90 | 63 | 90 | 29 | 25 | 22 |
| 91 | 58 | 93 | 15 | 19 | 122 |
| 92 | 41 | 63 | 99 | 12 | 110 |
| 93 | 49 | 66 | 83 | 113 | 119 |
| 94 | 167 | 101 | 63 | 80 | 34 |
| 95 | 86 | 98 | 62 | 76 | 59 |
| 96 | 90 | 179 | 133 | 136 | 18 |
| 97 | 157 | 164 | 177 | 89 | 0 |
| 98 | 147 | 111 | 6 | 132 | 161 |
| 99 | 114 | 5 | 19 | 145 | 176 |
| 100 | 47 | 84 | 64 | 39 | 31 |
| 101 | 67 | 36 | 52 | 110 | 38 |
| 102 | 25 | 87 | 103 | 1 | 80 |

TABLE 34-continued

| j-th block of Group-wise Interleaver output | (CR 6/15) π(j)-th block of Group-wise Interleaver input | (CR 8/15) π(j)-th block of Group-wise Interleaver input | (CR 10/15) π(j)-th block of Group-wise Interleaver input | (CR 10/15) π(j)-th block of Group-wise Interleaver input | (CR 12/15) π(j)-th block of Group-wise Interleaver input |
|---|---|---|---|---|---|
| 103 | 27 | 37 | 22 | 72 | 6 |
| 104 | 117 | 174 | 73 | 64 | 114 |
| 105 | 98 | 35 | 34 | 112 | 127 |
| 106 | 11 | 160 | 154 | 157 | 131 |
| 107 | 10 | 152 | 140 | 152 | 154 |
| 108 | 91 | 141 | 143 | 169 | 152 |
| 109 | 153 | 127 | 144 | 120 | 150 |
| 110 | 65 | 81 | 65 | 94 | 23 |
| 111 | 53 | 64 | 4 | 48 | 12 |
| 112 | 44 | 67 | 30 | 17 | 76 |
| 113 | 77 | 92 | 36 | 88 | 118 |
| 114 | 173 | 33 | 20 | 4 | 135 |
| 115 | 16 | 95 | 11 | 28 | 142 |
| 116 | 156 | 161 | 160 | 162 | 42 |
| 117 | 85 | 11 | 151 | 168 | 10 |
| 118 | 160 | 133 | 124 | 147 | 156 |
| 119 | 72 | 154 | 158 | 129 | 153 |
| 120 | 145 | 50 | 8 | 24 | 78 |
| 121 | 68 | 47 | 100 | 58 | 69 |
| 122 | 136 | 86 | 105 | 61 | 138 |
| 123 | 60 | 4 | 51 | 115 | 35 |
| 124 | 113 | 137 | 48 | 91 | 128 |
| 125 | 162 | 22 | 67 | 34 | 96 |
| 126 | 100 | 130 | 128 | 123 | 165 |
| 127 | 141 | 148 | 134 | 135 | 63 |
| 128 | 163 | 178 | 17 | 173 | 177 |
| 129 | 109 | 97 | 13 | 164 | 171 |
| 130 | 8 | 88 | 101 | 84 | 68 |
| 131 | 61 | 40 | 90 | 71 | 111 |
| 132 | 29 | 10 | 76 | 55 | 87 |
| 133 | 35 | 9 | 55 | 37 | 61 |
| 134 | 108 | 136 | 27 | 66 | 137 |
| 135 | 150 | 32 | 37 | 36 | 105 |
| 136 | 175 | 123 | 168 | 159 | 101 |
| 137 | 129 | 158 | 126 | 52 | 107 |
| 138 | 115 | 134 | 174 | 155 | 24 |
| 139 | 171 | 140 | 152 | 125 | 158 |
| 140 | 0 | 61 | 113 | 100 | 79 |
| 141 | 39 | 42 | 111 | 87 | 81 |
| 142 | 36 | 1 | 107 | 90 | 85 |
| 143 | 48 | 16 | 85 | 30 | 71 |
| 144 | 92 | 131 | 96 | 46 | 84 |
| 145 | 111 | 103 | 49 | 86 | 99 |
| 146 | 83 | 172 | 84 | 150 | 134 |
| 147 | 146 | 129 | 18 | 170 | 162 |
| 148 | 89 | 146 | 131 | 149 | 170 |
| 149 | 176 | 116 | 141 | 5 | 168 |
| 150 | 57 | 55 | 60 | 49 | 141 |
| 151 | 52 | 76 | 77 | 43 | 82 |
| 152 | 26 | 58 | 88 | 56 | 65 |
| 153 | 178 | 83 | 86 | 116 | 30 |
| 154 | 135 | 166 | 68 | 108 | 51 |
| 155 | 158 | 27 | 114 | 69 | 90 |
| 156 | 155 | 139 | 171 | 171 | 36 |
| 157 | 122 | 163 | 129 | 138 | 157 |
| 158 | 80 | 99 | 175 | 178 | 9 |
| 159 | 99 | 165 | 166 | 151 | 144 |
| 160 | 23 | 53 | 46 | 44 | 117 |
| 161 | 69 | 70 | 89 | 62 | 58 |
| 162 | 126 | 17 | 95 | 14 | 130 |
| 163 | 28 | 46 | 45 | 29 | 45 |
| 164 | 124 | 59 | 26 | 33 | 28 |
| 165 | 172 | 113 | 56 | 92 | 13 |
| 166 | 159 | 124 | 162 | 174 | 140 |
| 167 | 73 | 176 | 137 | 127 | 66 |
| 168 | 102 | 132 | 165 | 158 | 159 |
| 169 | 116 | 7 | 125 | 18 | 8 |
| 170 | 71 | 73 | 104 | 41 | 95 |
| 171 | 1 | 56 | 92 | 85 | 46 |
| 172 | 177 | 14 | 28 | 47 | 57 |
| 173 | 34 | 44 | 119 | 26 | 94 |
| 174 | 121 | 34 | 110 | 104 | 97 |
| 175 | 139 | 31 | 32 | 53 | 124 |
| 176 | 128 | 153 | 31 | 137 | 132 |

TABLE 34-continued

| j-th block of Group-wise Interleaver output | (CR 6/15) π(j)-th block of Group-wise Interleaver input | (CR 8/15) π(j)-th block of Group-wise Interleaver input | (CR 10/15) π(j)-th block of Group-wise Interleaver input | (CR 10/15) π(j)-th block of Group-wise Interleaver input | (CR 12/15) π(j)-th block of Group-wise Interleaver input |
|---|---|---|---|---|---|
| 177 | 112 | 151 | 74 | 96 | 104 |
| 178 | 104 | 142 | 150 | 16 | 16 |
| 179 | 123 | 25 | 121 | 140 | 145 |

"j-th block of Group-wise Interleaver output" in Table 34 indicates the j-th bit group output from the group interleaver 122 after interleaving, and "π(j)-th block of Group-wise Interleaver input" indicates the π(j)-th bit group input to the group interleaver 122. Referring to Table 34, it can be seen that Table 34 is the arrangements of data described in Tables 29 to 33 according to the code rates.

The group interleaver 122 may interleave the LDPC codeword in bits group wise by using Equation 18 presented below:

$$Y_{\pi(j)} = X_j (0 \leq j < N_{group}) \quad (18),$$

where $X_j$ is the $j^{th}$ bit group before group interleaving, and $Y_j$ is the $j^{th}$ bit group after group interleaving. In addition, π(j) is a parameter indicating an interleaving order and is determined by at least one of a length of an LDPC codeword, a code rate, and a modulation method.

Accordingly, $X_j$ is a $j^{th}$ bit group before group interleaving, and Equation 18 means that the pre-interleaving $j^{th}$ bit group is interleaved into the $\pi(j)^{th}$ bit group.

According to an exemplary embodiment, an example of π(j) may be defined as in Tables 35 to 39 presented below.

In this case, π(j) is defined according to a length of an LPDC codeword and a code rate, and a parity check matrix is also defined according to a length of an LDPC codeword and a code rate. Accordingly, when LDPC encoding is performed based on a specific parity check matrix according to a length of an LDPC codeword and a code rate, the LDPC codeword may be interleaved in bits group wise based on π(j) satisfying the corresponding length of the LDPC codeword and code rate.

For example, when the encoder 110 performs LDPC encoding at a code rate of 6/15 to generate an LDPC codeword of a length of 64800, the group interleaver 122 may perform interleaving by using π(j) which is defined according to the length of the LDPC codeword of 64800 and the code rate of 6/15 in Tables 35 to 39 presented below, for example, by using π(j) defined as shown in Table 35.

For example, when the length $N_{ldpc}$ of the LDPC codeword is 64800, the code rate is 6/15, and the modulation method is 1024-QAM, π(j) may be defined as in Table 35 presented below.

TABLE 35

Order of bits group to be block interleaved π(j) (0 ≤ j < 180)

| j-th block of Group-wise interleaver input | | | | | | | | | | | | | | | | | |
|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 |
| 18 | 19 | 20 | 21 | 22 | 23 | 24 | 25 | 26 | 27 | 28 | 29 | 30 | 31 | 32 | 33 | 34 | 35 |
| 36 | 37 | 38 | 39 | 40 | 41 | 42 | 43 | 44 | 45 | 46 | 47 | 48 | 49 | 50 | 51 | 52 | 53 |
| 54 | 55 | 56 | 57 | 58 | 59 | 60 | 61 | 62 | 63 | 64 | 65 | 66 | 67 | 68 | 69 | 70 | 71 |
| 72 | 73 | 74 | 75 | 76 | 77 | 78 | 79 | 80 | 81 | 82 | 83 | 84 | 85 | 86 | 87 | 88 | 89 |
| 90 | 91 | 92 | 93 | 94 | 95 | 96 | 97 | 98 | 99 | 100 | 101 | 102 | 103 | 104 | 105 | 106 | 107 |
| 108 | 109 | 110 | 111 | 112 | 113 | 114 | 115 | 116 | 117 | 118 | 119 | 120 | 121 | 122 | 123 | 124 | 125 |
| 126 | 127 | 128 | 129 | 130 | 131 | 132 | 133 | 134 | 135 | 136 | 137 | 138 | 139 | 140 | 141 | 142 | 143 |
| 144 | 145 | 146 | 147 | 148 | 149 | 150 | 151 | 152 | 153 | 154 | 155 | 156 | 157 | 158 | 159 | 160 | 161 |
| 162 | 163 | 164 | 165 | 166 | 167 | 168 | 169 | 170 | 171 | 172 | 173 | 174 | 175 | 176 | 177 | 178 | 179 |
| π(j)-th block of Group-wise interleaver output | | | | | | | | | | | | | | | | | |
| 140 | 171 | 61 | 65 | 82 | 46 | 77 | 36 | 130 | 33 | 107 | 106 | 70 | 43 | 11 | 3 | 115 | 62 |
| 72 | 52 | 66 | 10 | 2 | 160 | 50 | 102 | 152 | 103 | 163 | 132 | 42 | 12 | 45 | 60 | 173 | 133 |
| 142 | 143 | 32 | 141 | 21 | 92 | 31 | 71 | 112 | 53 | 63 | 100 | 143 | 93 | 83 | 20 | 151 | 111 |
| 40 | 30 | 51 | 150 | 91 | 1 | 123 | 131 | 41 | 90 | 81 | 110 | 0 | 101 | 121 | 161 | 80 | 170 |
| 119 | 167 | 6 | 64 | 24 | 113 | 75 | 58 | 158 | 35 | 19 | 146 | 68 | 117 | 95 | 17 | 7 | 148 |
| 96 | 108 | 144 | 27 | 47 | 29 | 55 | 5 | 105 | 159 | 126 | 84 | 168 | 37 | 178 | 44 | 4 | 85 |
| 134 | 129 | 79 | 145 | 177 | 124 | 99 | 138 | 169 | 104 | 78 | 56 | 69 | 174 | 157 | 179 | 164 | 18 |
| 162 | 14 | 176 | 137 | 74 | 34 | 8 | 39 | 9 | 154 | 122 | 87 | 54 | 175 | 57 | 127 | 16 | 25 |
| 76 | 120 | 147 | 98 | 23 | 15 | 135 | 86 | 73 | 109 | 59 | 156 | 116 | 97 | 155 | 166 | 118 | 22 |
| 125 | 128 | 49 | 67 | 26 | 94 | 48 | 38 | 89 | 139 | 165 | 114 | 28 | 136 | 149 | 172 | 153 | 88 |

In the case of Table 35, Equation 18 may be expressed as $X_0=Y_{\pi(0)}=Y_{140}$, $X_1=Y_{\pi(1)}=Y_{171}$, $X_2=Y_{\pi(2)}=Y_{61}$, . . . , $X_{178}=Y_{\pi(178)}=Y_{153}$, and $X_{179}=Y_{\pi(179)}=Y_{88}$. Accordingly, the group interleaver 122 may rearrange the order of the plurality of bit groups in bits group wise by changing the $0^{th}$ bit group to the $140^{th}$ bit group, the $1^{st}$ bit group to the $171^{st}$ bit group, the $2^{nd}$ bit group to the $61^{st}$ bit group, . . . , the $178^{th}$ bit group to the $153^{rd}$ bit group, and the $179^{th}$ bit group to the $88^{th}$ bit group.

In another example, when the length $N_{ldpc}$ of the LDPC codeword is 64800, the code rate is 8/15, and the modulation method is 1024-QAM, π(j) may be defined as in Table 36 presented below.

TABLE 36

| | Order of bits group to be block interleaved π(j) (0 ≤ j < 180) | | | | | | | | | | | | | | | | | |
|---|---|---|---|---|---|---|---|---|---|---|---|---|---|---|---|---|---|---|
| j-th block of | 0 | 1 | 2 | 3 | 4 | 5 | 6 | 7 | 8 | 9 | 10 | 11 | 12 | 13 | 14 | 15 | 16 | 17 |
| Group-wise | 18 | 19 | 20 | 21 | 22 | 23 | 24 | 25 | 26 | 27 | 28 | 29 | 30 | 31 | 32 | 33 | 34 | 35 |
| interleaver | 36 | 37 | 38 | 39 | 40 | 41 | 42 | 43 | 44 | 45 | 46 | 47 | 48 | 49 | 50 | 51 | 52 | 53 |
| input | 54 | 55 | 56 | 57 | 58 | 59 | 60 | 61 | 62 | 63 | 64 | 65 | 66 | 67 | 68 | 69 | 70 | 71 |
| | 72 | 73 | 74 | 75 | 76 | 77 | 78 | 79 | 80 | 81 | 82 | 83 | 84 | 85 | 86 | 87 | 88 | 89 |
| | 90 | 91 | 92 | 93 | 94 | 95 | 96 | 97 | 98 | 99 | 100 | 101 | 102 | 103 | 104 | 105 | 106 | 107 |
| | 108 | 109 | 110 | 111 | 112 | 113 | 114 | 115 | 116 | 117 | 118 | 119 | 120 | 121 | 122 | 123 | 124 | 125 |
| | 126 | 127 | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 | 160 | 161 |
| | 162 | 163 | 164 | 165 | 166 | 167 | 168 | 169 | 170 | 171 | 172 | 173 | 174 | 175 | 176 | 177 | 178 | 179 |
| π(j)-th block of | 7 | 142 | 22 | 2 | 123 | 99 | 70 | 169 | 18 | 133 | 132 | 117 | 59 | 11 | 172 | 53 | 143 | 162 |
| Group-wise | 51 | 62 | 64 | 75 | 125 | 65 | 55 | 179 | 35 | 155 | 25 | 54 | 14 | 175 | 135 | 114 | 174 | 105 |
| interleaver | 101 | 103 | 61 | 1 | 131 | 41 | 141 | 63 | 173 | 45 | 163 | 121 | 10 | 81 | 120 | 30 | 42 | 160 |
| output | 32 | 150 | 171 | 40 | 152 | 164 | 83 | 140 | 5 | 92 | 111 | 60 | 93 | 112 | 23 | 50 | 161 | 80 |
| | 12 | 170 | 73 | 31 | 151 | 0 | 72 | 21 | 82 | 110 | 20 | 153 | 100 | 33 | 122 | 102 | 130 | 71 |
| | 90 | 13 | 113 | 91 | 43 | 115 | 87 | 129 | 95 | 158 | 49 | 94 | 4 | 145 | 9 | 74 | 28 | 47 |
| | 68 | 17 | 44 | 98 | 24 | 165 | 56 | 19 | 149 | 57 | 36 | 6 | 46 | 39 | 34 | 136 | 166 | 15 |
| | 89 | 109 | 37 | 147 | 126 | 144 | 168 | 118 | 138 | 29 | 134 | 124 | 84 | 156 | 139 | 108 | 178 | 88 |
| | 38 | 52 | 148 | 67 | 127 | 66 | 48 | 177 | 107 | 176 | 119 | 86 | 79 | 85 | 137 | 76 | 106 | 116 |
| | 78 | 157 | 97 | 159 | 154 | 27 | 26 | 58 | 69 | 8 | 146 | 16 | 104 | 3 | 167 | 77 | 128 | 98 |

In the case of Table 36, Equation 18 may be expressed as $X_0=Y_{\pi(0)}=Y_7$, $X_1=Y_{\pi(1)}=Y_{142}$, $X_2=Y_{\pi(2)}=Y_{22}$, ..., $X_{178}=Y_{\pi(178)}=Y_{128}$, and $X_{179}=Y_{\pi(179)}=Y_{98}$. Accordingly, the group interleaver 122 may rearrange the order of the plurality of bit groups in bits group wise by changing the $0^{th}$ bit group to the $7^{th}$ bit group, the $1^{st}$ bit group to the $142^{nd}$ bit group, the $2^{nd}$ bit group to the $22^{nd}$ bit group, ..., the $178^{th}$ bit group to the $128^{th}$ bit group, and the $179^{th}$ bit group to the $98^{th}$ bit group.

In another example, when the length $N_{ldpc}$ of the LDPC codeword is 64800, the code rate is 10/15, and the modulation method is 1024-QAM, π(j) may be defined as in Table 37 presented below.

In the case of Table 37, Equation 18 may be expressed as $X_0=Y_{\pi(0)}=Y_{83}$, $X_1=Y_{\pi(1)}=Y_{40}$, $X_2=Y_{\pi(2)}=Y_{45}$, ..., $X_{178}=Y_{\pi(178)}=Y_{37}$, and $X_{179}=Y_{\pi(179)}=Y_{66}$. Accordingly, the group interleaver 122 may rearrange the order of the plurality of bit groups in bits group wise by changing the $0^{th}$ bit group to the $83^{rd}$ bit group, the $1^{st}$ bit group to the $40^{th}$ bit group, the $2^{nd}$ bit group to the $45^{th}$ bit group, ..., the $178^{th}$ bit group to the $37^{th}$ bit group, and the $179^{th}$ bit group to the $66^{th}$ bit group.

In another example, when the length $N_{ldpc}$ of the LDPC codeword is 64800, the code rate is 10/15, and the modulation method is 1024-QAM, π(j) may be defined as in Table 38 presented below.

TABLE 37

| | Order of bits group to be block interleaved π(j) (0 ≤ j < 180) | | | | | | | | | | | | | | | | | |
|---|---|---|---|---|---|---|---|---|---|---|---|---|---|---|---|---|---|---|
| j-th block of | 0 | 1 | 2 | 3 | 4 | 5 | 6 | 7 | 8 | 9 | 10 | 11 | 12 | 13 | 14 | 15 | 16 | 17 |
| Group-wise | 18 | 19 | 20 | 21 | 22 | 23 | 24 | 25 | 26 | 27 | 28 | 29 | 30 | 31 | 32 | 33 | 34 | 35 |
| interleaver | 36 | 37 | 38 | 39 | 40 | 41 | 42 | 43 | 44 | 45 | 46 | 47 | 48 | 49 | 50 | 51 | 52 | 53 |
| input | 54 | 55 | 56 | 57 | 58 | 59 | 60 | 61 | 62 | 63 | 64 | 65 | 66 | 67 | 68 | 69 | 70 | 71 |
| | 72 | 73 | 74 | 75 | 76 | 77 | 78 | 79 | 80 | 81 | 82 | 83 | 84 | 85 | 86 | 87 | 88 | 89 |
| | 90 | 91 | 92 | 93 | 94 | 95 | 96 | 97 | 98 | 99 | 100 | 101 | 102 | 103 | 104 | 105 | 106 | 107 |
| | 108 | 109 | 110 | 111 | 112 | 113 | 114 | 115 | 116 | 117 | 118 | 119 | 120 | 121 | 122 | 123 | 124 | 125 |
| | 126 | 127 | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 | 160 | 161 |
| | 162 | 163 | 164 | 165 | 166 | 167 | 168 | 169 | 170 | 171 | 172 | 173 | 174 | 175 | 176 | 177 | 178 | 179 |
| π(j)-th block of | 83 | 40 | 45 | 29 | 111 | 2 | 98 | 0 | 120 | 11 | 22 | 115 | 15 | 129 | 50 | 91 | 9 | 128 |
| Group-wise | 147 | 99 | 114 | 55 | 103 | 4 | 84 | 23 | 164 | 134 | 172 | 90 | 112 | 176 | 175 | 44 | 105 | 24 |
| interleaver | 113 | 135 | 74 | 33 | 64 | 25 | 5 | 7 | 81 | 163 | 160 | 72 | 124 | 145 | 71 | 123 | 101 | 53 |
| output | 60 | 133 | 165 | 80 | 10 | 30 | 150 | 65 | 95 | 94 | 100 | 110 | 3 | 125 | 154 | 76 | 85 | 51 |
| | 34 | 104 | 177 | 52 | 132 | 151 | 43 | 14 | 82 | 31 | 12 | 93 | 146 | 143 | 153 | 1 | 152 | 161 |
| | 131 | 62 | 171 | 21 | 41 | 162 | 144 | 35 | 54 | 92 | 121 | 130 | 13 | 102 | 170 | 122 | 61 | 142 |
| | 20 | 42 | 174 | 141 | 73 | 140 | 155 | 70 | 32 | 75 | 63 | 173 | 79 | 179 | 89 | 27 | 118 | 169 |
| | 137 | 57 | 126 | 157 | 47 | 148 | 46 | 96 | 127 | 17 | 38 | 167 | 78 | 86 | 107 | 149 | 59 | 108 |
| | 109 | 67 | 58 | 18 | 8 | 6 | 178 | 117 | 139 | 68 | 106 | 39 | 69 | 77 | 119 | 36 | 116 | 88 |
| | 166 | 16 | 48 | 168 | 159 | 28 | 136 | 49 | 56 | 156 | 19 | 26 | 138 | 158 | 87 | 97 | 37 | 66 |

TABLE 38

Order of bits group to be block interleaved π(j) (0 ≤ j < 180)

| j-th block of Group-wise interleaver input | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|---|
| | 18 | 19 | 20 | 21 | 22 | 23 | 24 | 25 | 26 | 27 | 28 | 29 | 30 | 31 | 32 | 33 | 34 | 35 |
| | 36 | 37 | 38 | 39 | 40 | 41 | 42 | 43 | 44 | 45 | 46 | 47 | 48 | 49 | 50 | 51 | 52 | 53 |
| | 54 | 55 | 56 | 57 | 58 | 59 | 60 | 61 | 62 | 63 | 64 | 65 | 66 | 67 | 68 | 69 | 70 | 71 |
| | 72 | 73 | 74 | 75 | 76 | 77 | 78 | 79 | 80 | 81 | 82 | 83 | 84 | 85 | 86 | 87 | 88 | 89 |
| | 90 | 91 | 92 | 93 | 94 | 95 | 96 | 97 | 98 | 99 | 100 | 101 | 102 | 103 | 104 | 105 | 106 | 107 |
| | 108 | 109 | 110 | 111 | 112 | 113 | 114 | 115 | 116 | 117 | 118 | 119 | 120 | 121 | 122 | 123 | 124 | 125 |
| | 126 | 127 | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 | 160 | 161 |
| | 162 | 163 | 164 | 165 | 166 | 167 | 168 | 169 | 170 | 171 | 172 | 173 | 174 | 175 | 176 | 177 | 178 | 179 |
| π(j)-th block of Group-wise interleaver output | 84 | 102 | 13 | 58 | 114 | 149 | 56 | 15 | 65 | 80 | 32 | 29 | 92 | 17 | 162 | 70 | 178 | 112 |
| | 169 | 91 | 33 | 75 | 66 | 31 | 120 | 90 | 173 | 82 | 115 | 163 | 143 | 71 | 1 | 164 | 125 | 60 |
| | 135 | 133 | 14 | 100 | 45 | 170 | 25 | 151 | 160 | 10 | 144 | 172 | 111 | 150 | 42 | 35 | 137 | 175 |
| | 4 | 132 | 152 | 22 | 121 | 44 | 24 | 122 | 161 | 50 | 104 | 7 | 134 | 64 | 51 | 155 | 2 | 131 |
| | 103 | 72 | 43 | 40 | 95 | 3 | 20 | 41 | 94 | 85 | 21 | 63 | 130 | 171 | 145 | 141 | 113 | 97 |
| | 142 | 124 | 165 | 5 | 110 | 12 | 177 | 30 | 61 | 52 | 140 | 11 | 73 | 74 | 174 | 54 | 53 | 81 |
| | 154 | 83 | 101 | 0 | 105 | 93 | 34 | 123 | 153 | 23 | 62 | 55 | 109 | 88 | 6 | 126 | 59 | 139 |
| | 16 | 167 | 19 | 119 | 69 | 26 | 98 | 68 | 49 | 127 | 96 | 176 | 157 | 47 | 179 | 86 | 76 | 78 |
| | 9 | 99 | 79 | 118 | 28 | 148 | 146 | 159 | 107 | 87 | 46 | 138 | 18 | 106 | 168 | 136 | 36 | 89 |
| | 116 | 48 | 129 | 8 | 37 | 57 | 117 | 108 | 147 | 156 | 67 | 128 | 166 | 39 | 77 | 71 | 158 | 38 |

In the case of Table 38, Equation 18 may be expressed as $X_0=Y_{\pi(0)}=Y_{84}$, $X_1=Y_{\pi(1)}=Y_{102}$, $X_2=Y_{\pi(2)}=Y_{13}$, . . . , $X_{178}=Y_{\pi(178)}=Y_{158}$, and $X_{179}=Y_{\pi(179)}=Y_{38}$. Accordingly, the group interleaver 122 may rearrange the order of the plurality of bit groups in bits group wise by changing the $0^{th}$ bit group to the $84^{th}$ bit group, the $1^{st}$ bit group to the $102^{th}$ bit group, the $2^{nd}$ bit group to the $13^{th}$ bit group, . . . , the $178^{th}$ bit group to the $158^{th}$ bit group, and the $179^{th}$ bit group to the $38^{th}$ bit group.

In another example, when the length $N_{ldpc}$ of the LDPC codeword is 64800, the code rate is 12/15, and the modulation method is 1024-QAM, π(j) may be defined as in Table 39 presented below.

In the above-described examples, the length of the LDPC codeword is 64800 and the code rate is 6/15, 8/15, 10/15, and 12/15. However, this is merely an example and the interleaving pattern may be defined variously when the length of the LDPC codeword is 16200 or the code rate has different values.

As described above, the group interleaver 122 may rearrange the order of the plurality of bit groups in bits group wise by using Equation 18 and Tables 35 to 39.

"j-th block of Group-wise Interleaver input" in Tables 35 to 39 indicates the j-th bit group input to the group interleaver 122 before interleaving, and "π(j)-th block of Group-

TABLE 39

Order of bits group to be block interleaved π(j) (0 ≤ j < 180)

| j-th block of Group-wise interleaver input | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|---|
| | 18 | 19 | 20 | 21 | 22 | 23 | 24 | 25 | 26 | 27 | 28 | 29 | 30 | 31 | 32 | 33 | 34 | 35 |
| | 36 | 37 | 38 | 39 | 40 | 41 | 42 | 43 | 44 | 45 | 46 | 47 | 48 | 49 | 50 | 51 | 52 | 53 |
| | 54 | 55 | 56 | 57 | 58 | 59 | 60 | 61 | 62 | 63 | 64 | 65 | 66 | 67 | 68 | 69 | 70 | 71 |
| | 72 | 73 | 74 | 75 | 76 | 77 | 78 | 79 | 80 | 81 | 82 | 83 | 84 | 85 | 86 | 87 | 88 | 89 |
| | 90 | 91 | 92 | 93 | 94 | 95 | 96 | 97 | 98 | 99 | 100 | 101 | 102 | 103 | 104 | 105 | 106 | 107 |
| | 108 | 109 | 110 | 111 | 112 | 113 | 114 | 115 | 116 | 117 | 118 | 119 | 120 | 121 | 122 | 123 | 124 | 125 |
| | 126 | 127 | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 | 160 | 161 |
| | 162 | 163 | 164 | 165 | 166 | 167 | 168 | 169 | 170 | 171 | 172 | 173 | 174 | 175 | 176 | 177 | 178 | 179 |
| π(j)-th block of Group-wise interleaver output | 97 | 41 | 71 | 58 | 61 | 29 | 103 | 84 | 169 | 158 | 117 | 20 | 111 | 165 | 40 | 9 | 178 | 8 |
| | 96 | 10 | 60 | 81 | 90 | 110 | 138 | 74 | 4 | 5 | 164 | 25 | 153 | 100 | 80 | 22 | 94 | 123 |
| | 156 | 34 | 101 | 53 | 50 | 66 | 116 | 67 | 54 | 163 | 171 | 82 | 72 | 63 | 45 | 154 | 21 | 42 |
| | 47 | 44 | 65 | 172 | 161 | 95 | 12 | 133 | 35 | 127 | 23 | 152 | 167 | 70 | 130 | 121 | 64 | 143 |
| | 17 | 32 | 56 | 62 | 112 | 85 | 120 | 140 | 102 | 141 | 151 | 13 | 144 | 142 | 33 | 132 | 1 | 15 |
| | 155 | 0 | 52 | 37 | 173 | 170 | 125 | 174 | 24 | 145 | 43 | 136 | 3 | 7 | 177 | 135 | 30 | 137 |
| | 83 | 75 | 92 | 131 | 2 | 87 | 104 | 16 | 14 | 160 | 113 | 93 | 6 | 31 | 91 | 77 | 175 | 73 |
| | 26 | 105 | 124 | 86 | 162 | 106 | 176 | 51 | 146 | 114 | 11 | 134 | 122 | 55 | 166 | 150 | 115 | 36 |
| | 159 | 179 | 39 | 18 | 19 | 46 | 109 | 79 | 108 | 119 | 107 | 88 | 118 | 157 | 139 | 168 | 78 | 98 |
| | 147 | 49 | 27 | 126 | 57 | 28 | 149 | 89 | 148 | 129 | 59 | 68 | 38 | 69 | 99 | 128 | 76 | 48 |

In the case of Table 39, Equation 18 may be expressed as $X_0=Y_{\pi(0)}=Y_{97}$, $X_1=Y_{\pi(1)}=Y_{41}$, $X_2=Y_{\pi(2)}=Y_{71}$, . . . , $X_{178}=Y_{\pi(178)}=Y_{76}$, and $X_{179}=Y_{\pi(179)}=Y_{48}$. Accordingly, the group interleaver 122 may rearrange the order of the plurality of bit groups in bits group wise by changing the $0^{th}$ bit group to the $97^{th}$ bit group, the $1^{st}$ bit group to the $41^{st}$ bit group, the $2^{nd}$ bit group to the $71^{st}$ bit group, . . . , the $178^{th}$ bit group to the $76^{th}$ bit group, and the $179^{th}$ bit group to the $48^{th}$ bit group.

wise Interleaver output" indicates the π(j)-th bit group output from the group interleaver 122 after interleaving.

In addition, since the order of the bit groups constituting the LDPC codeword is rearranged by the group interleaver 122 in bits group wise, and then the bit groups are block-interleaved by the block interleaver 124, which will be described below, "Order of bits groups to be block interleaved" is set forth in Tables 35 to 39 in relation to π(j).

π(j) defined as shown in Tables 35 to 39 may be arranged according to the code rates as shown in Table 40:

TABLE 40

| j-th block of Group-wise Interleaver input | (CR 6/15) π(j)-th block of Group-wise Interleaver output | (CR 8/15) π(j)-th block of Group-wise Interleaver output | (CR 10/15) π(j)-th block of Group-wise Interleaver output | (CR 10/15) π(j)-th block of Group-wise Interleaver output | (CR 12/15) π(j)-th block of Group-wise Interleaver output |
|---|---|---|---|---|---|
| 0 | 140 | 7 | 83 | 84 | 97 |
| 1 | 171 | 142 | 40 | 102 | 41 |
| 2 | 61 | 22 | 45 | 13 | 71 |
| 3 | 65 | 2 | 29 | 58 | 58 |
| 4 | 82 | 123 | 111 | 114 | 61 |
| 5 | 46 | 99 | 2 | 149 | 29 |
| 6 | 77 | 70 | 98 | 56 | 103 |
| 7 | 36 | 169 | 0 | 15 | 84 |
| 8 | 130 | 18 | 120 | 65 | 169 |
| 9 | 33 | 133 | 11 | 80 | 158 |
| 10 | 107 | 132 | 22 | 32 | 117 |
| 11 | 106 | 117 | 115 | 29 | 20 |
| 12 | 70 | 59 | 15 | 92 | 111 |
| 13 | 43 | 11 | 129 | 17 | 165 |
| 14 | 11 | 172 | 50 | 162 | 40 |
| 15 | 3 | 53 | 91 | 70 | 9 |
| 16 | 115 | 143 | 9 | 178 | 178 |
| 17 | 62 | 162 | 128 | 112 | 8 |
| 18 | 72 | 51 | 147 | 169 | 96 |
| 19 | 52 | 62 | 99 | 91 | 10 |
| 20 | 66 | 64 | 114 | 33 | 60 |
| 21 | 10 | 75 | 55 | 75 | 81 |
| 22 | 2 | 125 | 103 | 66 | 90 |
| 23 | 160 | 65 | 4 | 31 | 110 |
| 24 | 50 | 55 | 84 | 120 | 138 |
| 25 | 102 | 179 | 23 | 90 | 74 |
| 26 | 152 | 35 | 164 | 173 | 4 |
| 27 | 103 | 155 | 134 | 82 | 5 |
| 28 | 163 | 25 | 172 | 115 | 164 |
| 29 | 132 | 54 | 90 | 163 | 25 |
| 30 | 42 | 14 | 112 | 143 | 153 |
| 31 | 12 | 175 | 176 | 71 | 100 |
| 32 | 45 | 135 | 175 | 1 | 80 |
| 33 | 60 | 114 | 44 | 164 | 22 |
| 34 | 173 | 174 | 105 | 125 | 94 |
| 35 | 133 | 105 | 24 | 60 | 123 |
| 36 | 142 | 101 | 113 | 135 | 156 |
| 37 | 13 | 103 | 135 | 133 | 34 |
| 38 | 32 | 61 | 74 | 14 | 101 |
| 39 | 141 | 1 | 33 | 100 | 53 |
| 40 | 21 | 131 | 64 | 45 | 50 |
| 41 | 92 | 41 | 25 | 170 | 66 |
| 42 | 31 | 141 | 5 | 25 | 116 |
| 43 | 71 | 63 | 7 | 151 | 67 |
| 44 | 112 | 173 | 81 | 160 | 54 |
| 45 | 53 | 45 | 163 | 10 | 163 |
| 46 | 63 | 163 | 160 | 144 | 171 |
| 47 | 100 | 121 | 72 | 172 | 82 |
| 48 | 143 | 10 | 124 | 111 | 72 |
| 49 | 93 | 81 | 145 | 150 | 63 |
| 50 | 83 | 120 | 71 | 42 | 45 |
| 51 | 20 | 30 | 123 | 35 | 154 |
| 52 | 151 | 42 | 101 | 137 | 21 |
| 53 | 111 | 160 | 53 | 175 | 42 |
| 54 | 40 | 32 | 60 | 4 | 47 |
| 55 | 30 | 150 | 133 | 132 | 44 |
| 56 | 51 | 171 | 165 | 152 | 65 |
| 57 | 150 | 40 | 80 | 22 | 172 |
| 58 | 91 | 152 | 10 | 121 | 161 |
| 59 | 1 | 164 | 30 | 44 | 95 |
| 60 | 123 | 83 | 150 | 24 | 12 |
| 61 | 131 | 140 | 65 | 122 | 133 |
| 62 | 41 | 5 | 95 | 161 | 35 |
| 63 | 90 | 92 | 94 | 50 | 127 |
| 64 | 81 | 111 | 100 | 104 | 23 |
| 65 | 110 | 60 | 110 | 7 | 152 |
| 66 | 0 | 93 | 3 | 134 | 167 |
| 67 | 101 | 112 | 125 | 64 | 70 |
| 68 | 121 | 23 | 154 | 51 | 130 |
| 69 | 161 | 50 | 76 | 155 | 121 |
| 70 | 80 | 161 | 85 | 2 | 64 |
| 71 | 170 | 80 | 51 | 131 | 143 |
| 72 | 119 | 12 | 34 | 103 | 17 |
| 73 | 167 | 170 | 104 | 72 | 32 |

TABLE 40-continued

| j-th block of Group-wise Interleaver input | (CR 6/15) π(j)-th block of Group-wise Interleaver output | (CR 8/15) π(j)-th block of Group-wise Interleaver output | (CR 10/15) π(j)-th block of Group-wise Interleaver output | (CR 10/15) π(j)-th block of Group-wise Interleaver output | (CR 12/15) π(j)-th block of Group-wise Interleaver output |
|---|---|---|---|---|---|
| 74 | 6 | 73 | 177 | 43 | 56 |
| 75 | 64 | 31 | 52 | 40 | 62 |
| 76 | 24 | 151 | 132 | 95 | 112 |
| 77 | 113 | 0 | 151 | 3 | 85 |
| 78 | 75 | 72 | 43 | 20 | 120 |
| 79 | 58 | 21 | 14 | 41 | 140 |
| 80 | 158 | 82 | 82 | 94 | 102 |
| 81 | 35 | 110 | 31 | 85 | 141 |
| 82 | 19 | 20 | 12 | 21 | 151 |
| 83 | 146 | 153 | 93 | 63 | 13 |
| 84 | 68 | 100 | 146 | 130 | 144 |
| 85 | 117 | 33 | 143 | 171 | 142 |
| 86 | 95 | 122 | 153 | 145 | 33 |
| 87 | 17 | 102 | 1 | 141 | 132 |
| 88 | 7 | 130 | 152 | 113 | 1 |
| 89 | 148 | 71 | 161 | 97 | 15 |
| 90 | 96 | 90 | 131 | 142 | 155 |
| 91 | 108 | 13 | 62 | 124 | 0 |
| 92 | 144 | 113 | 171 | 165 | 52 |
| 93 | 27 | 91 | 21 | 5 | 37 |
| 94 | 47 | 43 | 41 | 110 | 173 |
| 95 | 29 | 115 | 162 | 12 | 170 |
| 96 | 55 | 87 | 144 | 177 | 125 |
| 97 | 5 | 129 | 35 | 30 | 174 |
| 98 | 105 | 95 | 54 | 61 | 24 |
| 99 | 159 | 158 | 92 | 52 | 145 |
| 100 | 126 | 49 | 121 | 140 | 43 |
| 101 | 84 | 94 | 130 | 11 | 136 |
| 102 | 168 | 4 | 13 | 73 | 3 |
| 103 | 37 | 145 | 102 | 74 | 7 |
| 104 | 178 | 9 | 170 | 174 | 177 |
| 105 | 44 | 74 | 122 | 54 | 135 |
| 106 | 4 | 28 | 61 | 53 | 30 |
| 107 | 85 | 47 | 142 | 81 | 137 |
| 108 | 134 | 68 | 20 | 154 | 83 |
| 109 | 129 | 17 | 42 | 83 | 75 |
| 110 | 79 | 44 | 174 | 101 | 92 |
| 111 | 145 | 98 | 141 | 0 | 131 |
| 112 | 177 | 24 | 73 | 105 | 2 |
| 113 | 124 | 165 | 140 | 93 | 87 |
| 114 | 99 | 56 | 155 | 34 | 104 |
| 115 | 138 | 19 | 70 | 123 | 16 |
| 116 | 169 | 149 | 32 | 153 | 14 |
| 117 | 104 | 57 | 75 | 23 | 160 |
| 118 | 78 | 36 | 63 | 62 | 113 |
| 119 | 56 | 6 | 173 | 55 | 93 |
| 120 | 69 | 46 | 79 | 109 | 6 |
| 121 | 174 | 39 | 179 | 88 | 31 |
| 122 | 157 | 34 | 89 | 6 | 91 |
| 123 | 179 | 136 | 27 | 126 | 77 |
| 124 | 164 | 166 | 118 | 59 | 175 |
| 125 | 18 | 15 | 169 | 139 | 73 |
| 126 | 162 | 89 | 137 | 16 | 26 |
| 127 | 14 | 109 | 57 | 167 | 105 |
| 128 | 176 | 37 | 126 | 19 | 124 |
| 129 | 137 | 147 | 157 | 119 | 86 |
| 130 | 74 | 126 | 47 | 69 | 162 |
| 131 | 34 | 144 | 148 | 26 | 106 |
| 132 | 8 | 168 | 46 | 98 | 176 |
| 133 | 39 | 118 | 96 | 68 | 51 |
| 134 | 9 | 138 | 127 | 49 | 146 |
| 135 | 154 | 29 | 17 | 127 | 114 |
| 136 | 122 | 134 | 38 | 96 | 11 |
| 137 | 87 | 124 | 167 | 176 | 134 |
| 138 | 54 | 84 | 78 | 157 | 122 |
| 139 | 175 | 156 | 86 | 47 | 55 |
| 140 | 57 | 139 | 107 | 179 | 166 |
| 141 | 127 | 108 | 149 | 86 | 150 |
| 142 | 16 | 178 | 59 | 76 | 115 |
| 143 | 25 | 88 | 108 | 78 | 36 |
| 144 | 76 | 38 | 109 | 9 | 159 |
| 145 | 120 | 52 | 67 | 99 | 179 |
| 146 | 147 | 148 | 58 | 79 | 39 |
| 147 | 98 | 67 | 18 | 118 | 18 |

TABLE 40-continued

| j-th block of Group-wise Interleaver input | (CR 6/15) π(j)-th block of Group-wise Interleaver output | (CR 8/15) π(j)-th block of Group-wise Interleaver output | (CR 10/15) π(j)-th block of Group-wise Interleaver output | (CR 10/15) π(j)-th block of Group-wise Interleaver output | (CR 12/15) π(j)-th block of Group-wise Interleaver output |
|---|---|---|---|---|---|
| 148 | 23 | 127 | 8 | 28 | 19 |
| 149 | 15 | 66 | 6 | 148 | 46 |
| 150 | 135 | 48 | 178 | 146 | 109 |
| 151 | 86 | 177 | 117 | 159 | 79 |
| 152 | 73 | 107 | 139 | 107 | 108 |
| 153 | 109 | 176 | 68 | 87 | 119 |
| 154 | 59 | 119 | 106 | 46 | 107 |
| 155 | 156 | 86 | 39 | 138 | 88 |
| 156 | 116 | 79 | 69 | 18 | 118 |
| 157 | 97 | 85 | 77 | 106 | 157 |
| 158 | 155 | 137 | 119 | 168 | 139 |
| 159 | 166 | 76 | 36 | 136 | 168 |
| 160 | 118 | 106 | 116 | 36 | 78 |
| 161 | 22 | 116 | 88 | 89 | 98 |
| 162 | 125 | 78 | 166 | 116 | 147 |
| 163 | 128 | 157 | 16 | 48 | 49 |
| 164 | 49 | 97 | 48 | 129 | 27 |
| 165 | 67 | 159 | 168 | 8 | 126 |
| 166 | 26 | 154 | 159 | 37 | 57 |
| 167 | 94 | 27 | 28 | 57 | 28 |
| 168 | 48 | 26 | 136 | 117 | 149 |
| 169 | 38 | 58 | 49 | 108 | 89 |
| 170 | 89 | 69 | 56 | 147 | 148 |
| 171 | 139 | 8 | 156 | 156 | 129 |
| 172 | 165 | 146 | 19 | 67 | 59 |
| 173 | 114 | 16 | 26 | 128 | 68 |
| 174 | 28 | 104 | 138 | 166 | 38 |
| 175 | 136 | 3 | 158 | 39 | 69 |
| 176 | 149 | 167 | 87 | 77 | 99 |
| 177 | 172 | 77 | 97 | 27 | 128 |
| 178 | 153 | 128 | 37 | 158 | 76 |
| 179 | 88 | 96 | 66 | 38 | 48 |

Table 34 is the case in which group interleaving is performed using Equation 17 and π(j) is applied as an index of an input bit group, and Table 40 is the case in which group interleaving is performed using Equation 18 and π(j) is applied as an index of an output bit group. Therefore, Tables 34 and 40 have an inverse relationship with each other.

As described above, the group interleaver 122 may rearrange the order of the plurality of bit groups in bits group wise by using Equation 18 and Tables 35 to 39.

When the group interleaving is performed in the above-described method, the order of the bit groups constituting the group-interleaved LDPC codeword is different from that of the bit groups of the LDPC codeword group-interleaved based on Tables 9 to 20.

This is because the block-row interleaver 125 is used instead of the block interleaver 124 in the present exemplary embodiment. That is, since the interleaving method used in the block interleaver 124 and the interleaving method used in the block-row interleaver 125 are different from each other, the group interleaver 122 in the present exemplary embodiment may rearrange the order of the plurality of bit groups constituting the LDPC codeword based on Tables 29 to 40.

Specifically, the group interleaver 122 may rearrange the order of the plurality of bit groups in bits group wise such that an arrangement unit, in which at least one bit group including bits to be mapped onto a same modulation symbol is serially arranged in bit group wise, is repeated.

That is, the group interleaver 122 may serially arrange one of a plurality of first bit groups including bits to be mapped onto a first specific location of each modulation symbol, one of a plurality of second bit groups including bits to be mapped onto a second specific location of each modulation symbol, . . . , one of a plurality of $n^{th}$ bit groups including bits to be mapped onto an $n^{th}$ specific location of each modulation symbol, and may arrange the other bit groups repeatedly in the same method.

The block-row interleaver 125 interleaves the plurality of bit groups the order of which has been rearranged. In this case, the block-row interleaver 125 may interleave the plurality of bit groups the order of which has been rearranged in bits group wise by using at least one row including a plurality of columns. This will be explained in detail below with reference to FIGS. 15 to 17.

Figure 15:
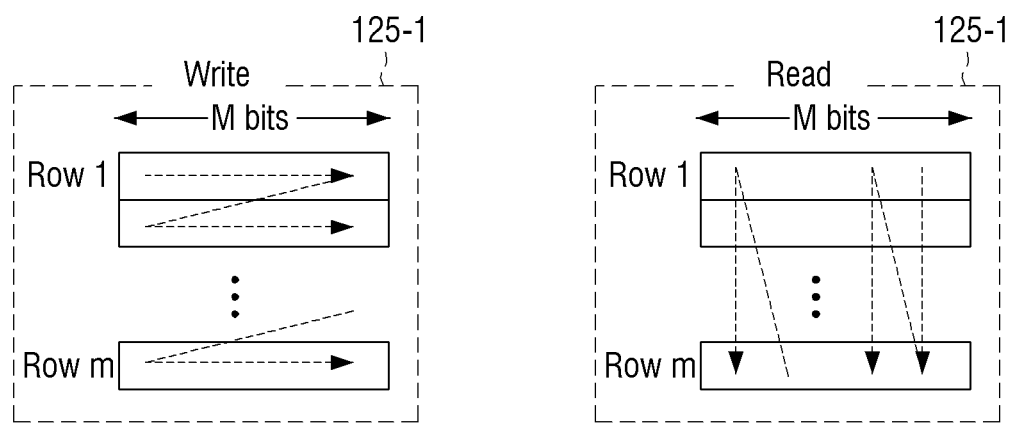
FIGS. 15-17 are views to illustrate a configuration of a block-row interleaver and an interleaving method according to exemplary embodiments.
Figure 16:
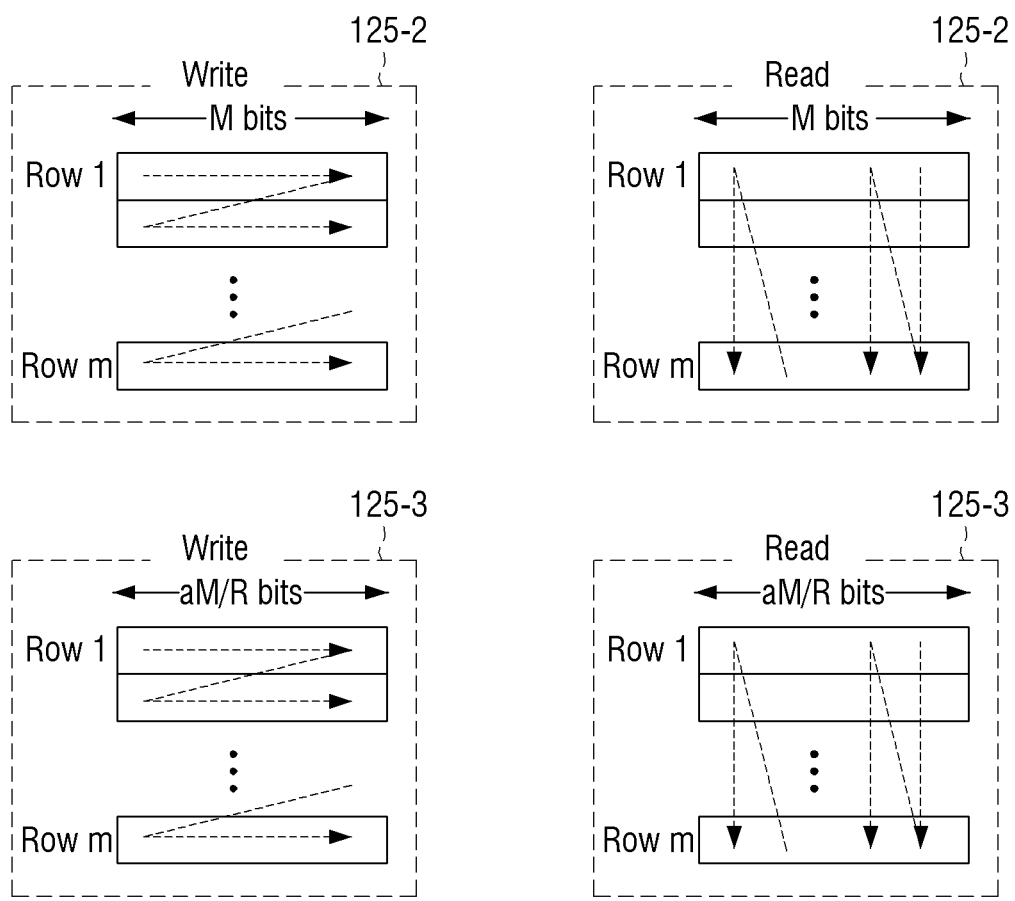
Figure 17:
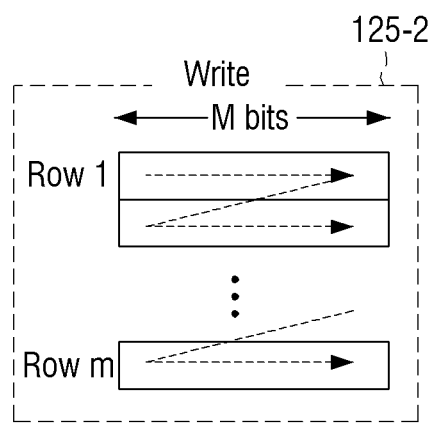
Figure 17:
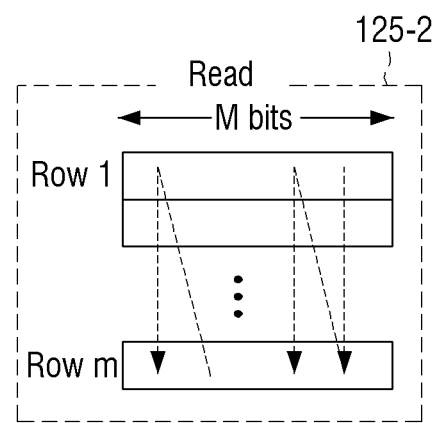
Figure 17:
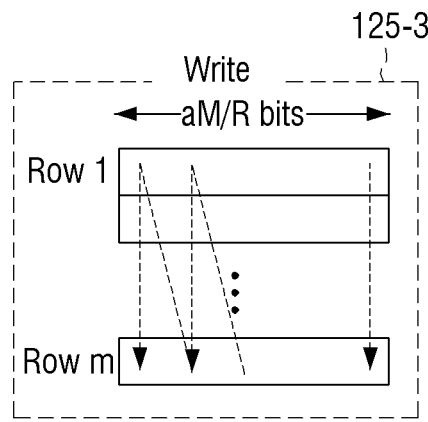
Figure 17:
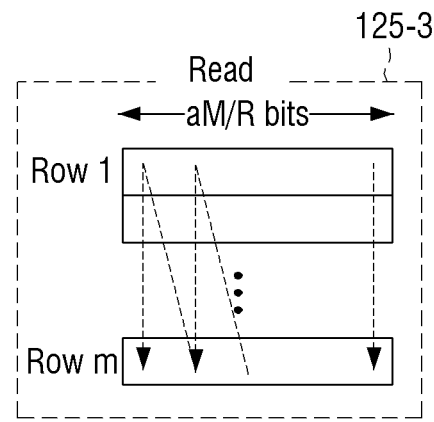

FIGS. 15 to 17 are views to illustrate a configuration of a block-row interleaver and an interleaving method according to an exemplary embodiment.

First, when $N_{group}/m$ is an integer, the block-row interleaver 125 includes an interleaver 125-1 including m number of rows each including M number of columns as shown in FIG. 15, and the block-row interleaver 125 may interleave by using $N_{group}/m$ number of interleavers 125-1 having the configuration of FIG. 15.

Herein, $N_{group}$ is the total number of bit groups constituting an LDPC codeword. In addition, M is the number of bits included in a single bit group and may be 360, for example. m may be equal to the number of bits constituting a modulation symbol or may be ½ of the number of bits constituting a modulation symbol. For example, when a non-uniform QAM is used, performance of the bits constituting the modulation symbol is different, and thus, by setting m to be equal to the number of bits constituting the modulation symbol, a single bit group can be mapped onto a single bit of each modulation symbol.

Specifically, the block-row interleaver 125 may interleave by writing each of the plurality of bit groups constituting the LDPC codeword in each row in the row direction in bits group wise, and reading each column of the plurality of rows in which the plurality of bit groups are written in bit group wise in the column direction.

For example, as shown in FIG. 15, the block-row interleaver 125 may write m number of continuous bit groups from among the plurality of bit groups in each of the m number of rows of the interleaver 125-1 in the row direction, and read each column of m number of rows in which the bits are written in the column direction. In this case, as many interleavers 125-1 as the number of bit groups divided by the number of rows, that is, $N_{group}/m$, may be used.

As described above, when the number of bit groups constituting the LDPC codeword is an integer multiple of the number of rows, the block-row interleaver 125 may interleave by writing as many bit groups as the number of rows from among the plurality of bit groups serially.

On the other hand, when the number of bit groups constituting the LDPC codeword is not an integer multiple of the number of rows, the block-row interleaver 125 may interleave by using N number of interleavers (N is an integer greater than or equal to 2) including a different number of columns.

For example, as shown in FIGS. 16 and 17, the block-row interleaver 125 may interleave by using a first interleaver 125-2 including m number of rows each including M number of columns, and a second interleaver 125-3 including m number of rows each including a×M/m number of columns. Herein, a is $N_{group} - \lfloor N_{group}/m \rfloor \times m$, and $\lfloor N_{group}/m \rfloor$ is the largest integer below $N_{group}/m$.

In this case, the first interleaver 125-2 may be used as many as $\lfloor N_{group}/M \rfloor$ and one second interleaver 125-3 may be used.

Specifically, the block-row interleaver 125 may interleave by writing each of $\lfloor N_{group}/m \rfloor \times m$ number of bit groups from among the plurality of bit groups constituting the LDPC codeword in each row in the row direction in bits group wise, and reading each column of the plurality of rows in which $\lfloor N_{group}/m \rfloor \times m$ number of bit groups are written in bits group wise in the column direction.

For example, as shown in FIGS. 16 and 17, the block-row interleaver 125 may write the same m number of continuous bit groups as the number of rows from among $\lfloor N_{group}/m \rfloor \times m$ number of bit groups in each row of the first interleaver 125-2 in the row direction, and may read each column of the plurality of rows of the first interleaver 125-2 in which m number of bit groups are written in the column direction. In this case, the first interleaver 125-2 having the configuration FIGS. 16 and 17 may be used as many as $\lfloor N_{group}/m \rfloor$.

Thereafter, the block-row interleaver 125 may divide the bits included in bit groups other than the groups written in the first interleaver 125-2, and may write these bits in each row of the second interleaver 125-3 in the row direction. In this case, the same number of bits may be written in each row of the second interleaver 125-3.

For example, as shown in FIG. 16, the block-row interleaver 125 may write, in each of m number of rows of the second interleaver 125-3, a×M/m number of bits from among the bits included in the other bit groups, in the row direction, and may read each column of m number of rows of the second interleaver 125-3 in which the bits are written in the column direction. In this case, one second interleaver 125-3 having the configuration of FIG. 16 may be used.

However, according to another exemplary embodiment, as shown in FIG. 17, the block-row interleaver 125 may write the bits in the first interleaver 125-2 in the same method as explained in FIG. 16, but may write the bits in the second interleaver 125-3 in a method different from that of FIG. 16.

That is, the block-row interleaver 125 may write the bits in the second interleaver 125-3 in the column direction.

For example, as shown in FIG. 17, the block-row interleaver 125 may write the bits included in the bit groups other than the bit groups written in the first interleaver 125-2 in each column of m number of rows each including a×M/m number of columns of the second interleaver 125-3 in the column direction, and may read each column of m number of rows of the second interleaver 125-3 in which the bits are written in the column direction. In this case, one second interleaver 125-3 having the configuration of FIG. 17 may be used.

In the method shown in FIG. 17, the block-row interleaver 125 may interleave by reading in the column direction after writing the bits in the second interleaver in the column direction. Accordingly, the bits included in the bit groups interleaved by the second interleaver are read in the order as they were written and output to the modulator 130. Accordingly, the bits included in the bit groups belonging to the second interleaver are not rearranged by the block-row interleaver 125 and may be mapped onto the modulation symbols serially.

As described above, the block-row interleaver 125 may interleave the plurality of bit groups by using the methods described above with reference to FIGS. 15 to 17.

According to the above-described method, the output of the block-row interleaver 125 may be the same as the output of the block interleaver 124. Specifically, when the block-row interleaver 125 interleaves as shown in FIG. 15, the block-row interleaver 125 may output the same value as that of the block interleaver 124 which interleaves as shown in FIG. 8. In addition, when the block-row interleaver 125 interleaves as shown in FIG. 16, the block-row interleaver 125 may output the same value as that of the block interleaver 124 which interleaves as shown in FIG. 9. In addition, when the block-row interleaver 125 interleaves as shown in FIG. 17, the block-row interleaver 125 may output the same value as that of the block interleaver 124 which interleaves as shown in FIG. 10.

Specifically, when the group interleaver 122 is used based on Equation 15 and the block interleaver 124 is used, and the output bit groups of the group interleaver 122 are $Y_j$ ($0 \leq j < N_{group}$), and, when the group interleaver 122 is used based on Equation 17 and the block-row interleaver 125 is used, and the output groups of the group interleaver 122 are $Z_j$ ($0 \leq j < N_{group}$), a relationship between the output bit groups $Z_j$ and $Y_j$ after group interleaving may be expressed as in Equations 19 and 20, and as a result, the same value may be output from the block interleaver 124:

$$Z_{i+m \times j} = Y_{\alpha \times i+j} (0 \leq i < m, 0 \leq j < \alpha) \quad (19)$$

$$Z_i = Y_i (\alpha \times m \leq i < N_{group}) \quad (20),$$

where α is $\lfloor N_{group}/m \rfloor$ and is the number of bit groups input to a single column of the first part when the block interleaver 124 is used, and $\lfloor N_{group}/m \rfloor$ is the largest integer below $N_{group}/m$. Here, m may be equal to the number of bits constituting the modulation symbol or half of the bits constituting the modulation symbol. In addition, m is the number of columns of the block interleaver 124 and m is the number of rows of the block-row interleaver 125.

The case in which group interleaving is performed by the group interleaver 122 based on Equation 15 and then block interleaving is performed by the block interleaver 124, and the case in which group interleaving is performed by the group interleaver 122 based on Equation 16 and then block interleaving is performed by the block interleaver 124 have an inverse relationship with each other.

In addition, the case in which group interleaving is performed by the group interleaver 122 based on Equation 17 and then block-row interleaving is performed by the block-row interleaver 125, and the case in which group interleaving is performed by the group interleaver 122 based on Equation 18 and then block-row interleaving is performed by the block-row interleaver 125 have an inverse relationship with each other.

Accordingly, the modulator 130 may map the bits output from the block-row interleaver 125 onto a modulation symbol in the same method as when the block interleaver 124 is used.

The bit interleaving method suggested in the exemplary embodiments is performed by the parity interleaver 121, the group interleaver 122, the group twist interleaver 123, and the block interleaver 124 as shown in FIG. 4 (the group twist interleaver 123 may be omitted according to circumstances). However, this is merely an example and the bit interleaving method is not limited to three modules or four modules described above.

For example, when the block interleaver is used and the group interleaving method expressed as in Equation 11 is used, regarding the bit groups $X_j(0 \le j < N_{group})$ defined as in Equation 9 and Equation 10, bits belonging to m number of bit groups, for example, $\{X_{\pi(i)}, X_{\pi(\alpha+i)}, \ldots, X_{\pi((m-1) \times \alpha+i)}\}$ $(0 \le i < \alpha)$, may constitute a single modulation symbol.

Herein, $\alpha$ is the number of bit groups constituting the first part of the block interleaver, and $\alpha = \lfloor N_{group}/m \rfloor$. In addition, m is the number of columns of the block interleaver and may be equal to the number of bits constituting the modulation symbol or half of the number of bits constituting the modulation symbol.

Therefore, for example, regarding parity-interleaved bits $u_i$, $\{u_{\pi(i)+j}, u_{\pi(\alpha+i)+j}, \ldots, u_{\pi((m-1) \times \alpha+i)+j}\}$ $(0 < i \le m, 0 < j \le M)$ may constitute a single modulation symbol. As described above, there are various methods for constituting a single modulation symbol.

In addition, the bit interleaving method suggested in the exemplary embodiments is performed by the parity interleaver 121, the group interleaver 122, the group twist interleaver 123, and the block-row interleaver 125 as shown in FIG. 14 (the group twist interleaver 123 may be omitted according to circumstances). However, this is merely an example and the bit interleaving method is not limited to three modules or four modules described above.

For example, when the block-row interleaver is used and the group interleaving method expressed as in Equation 17 is used, regarding the bit groups $X_j(0 \le j < N_{group})$ defined as in Equation 13 and Equation 14, bits belonging to m number of bit groups, for example, $\{X_{\pi(m \times i)}, X_{\pi(m \times i+1)}, \ldots, X_{\pi(m \times i+(m-1))}\}$ $(0 \le i < \alpha)$, may constitute a single modulation symbol.

Herein, $\alpha$ is the number of bit groups constituting the first part of the block interleaver, and $\alpha = \lfloor N_{group}/m \rfloor$. In addition, m is the number of columns of the block interleaver and may be equal to the number of bits constituting the modulation symbol or half of the number of bits constituting the modulation symbol.

Therefore, for example, regarding parity-interleaved bits $u_i$, $\{u_{\pi(m \times i)+j}, u_{\pi(m \times i+1)+j}, \ldots, u_{\pi(m \times i+(m-1))+j}\}$ $(0 < i \le m, 0 < j \le M)$ may constitute a single modulation symbol. As described above, there are various methods for constituting a single modulation symbol.

The transmitting apparatus 100 may transmit the signal mapped onto the constellation to a receiving apparatus 2700. For example, the transmitting apparatus 100 may map the signal mapped onto the constellation onto an Orthogonal Frequency Division Multiplexing (OFDM) frame using OFDM, and may transmit the signal to the receiving apparatus 2700 through an allocated channel.

FIG. 18 is a block diagram to illustrate a configuration of a receiving apparatus according to an exemplary embodiment. Referring to FIG. 18, the receiving apparatus 2700 includes a demodulator 2710, a multiplexer 2720, a deinterleaver 2730 and a decoder 2740.

The demodulator 2710 receives and demodulates a signal transmitted from the transmitting apparatus 100. Specifically, the demodulator 2710 generates a value corresponding to an LDPC codeword by demodulating the received signal, and outputs the value to the multiplexer 2720. In this case, the demodulator 2710 may use a demodulation method corresponding to a modulation method used in the transmitting apparatus 100. To do so, the transmitting apparatus 100 may transmit information regarding the modulation method to the receiving apparatus 2700, or the transmitting apparatus 100 may perform modulation using a pre-defined modulation method between the transmitting apparatus 100 and the receiving apparatus 2700.

The value corresponding to the LDPC codeword may be expressed as a channel value for the received signal. There are various methods for determining the channel value, and for example, a method for determining a Log Likelihood Ratio (LLR) value may be the method for determining the channel value.

The LLR value is a log value for a ratio of the probability that a bit transmitted from the transmitting apparatus 100 is 0 and the probability that the bit is 1. In addition, the LLR value may be a bit value which is determined by a hard decision, or may be a representative value which is determined according to a section to which the probability that the bit transmitted from the transmitting apparatus 100 is 0 or 1 belongs.

The multiplexer 2720 multiplexes the output value of the demodulator 2710 and outputs the value to the deinterleaver 2730.

Specifically, the multiplexer 2720 is an element corresponding to a demultiplexer (not shown) provided in the transmitting apparatus 100, and performs an operation corresponding to the demultiplexer (not shown). However, when the demultiplexer (not shown) is omitted from the transmitting apparatus 100, the multiplexer 2720 may be omitted from the receiving apparatus 2700.

That is, the multiplexer 2720 performs an inverse operation of the operation of the demultiplexer (not shown), and performs cell-to-bit conversion with respect to the output value of the demodulator 2710 and outputs the LLR value in the unit of bit.

In this case, when the demultiplexer (not shown) does not change the order of the LDPC codeword bits, the multiplexer 2720 may output the LLR values serially in the unit of bit without changing the order of the LLR values corresponding to the bits of the cell. Alternatively, the multiplexer 2720 may rearrange the order of the LLR values corresponding to the bits of the cell to perform an inverse operation to the demultiplexing operation of the demultiplexer (not shown) based on Table 27.

The information regarding whether the demultiplexing operation is performed or not may be provided by the transmitting apparatus 100, or may be pre-defined between the transmitting apparatus 100 and the receiving apparatus 2700.

The deinterleaver 2730 deinterleaves the output value of the multiplexer 2720 and outputs the values to the decoder 2740.

Specifically, the deinterleaver 2730 is an element corresponding to the interleaver 120 of the transmitting apparatus 100 and performs an operation corresponding to the interleaver 120. That is, the deinterleaver 2730 deinterleaves the LLR value by performing the interleaving operation of the interleaver 120 inversely.

Figure 19:
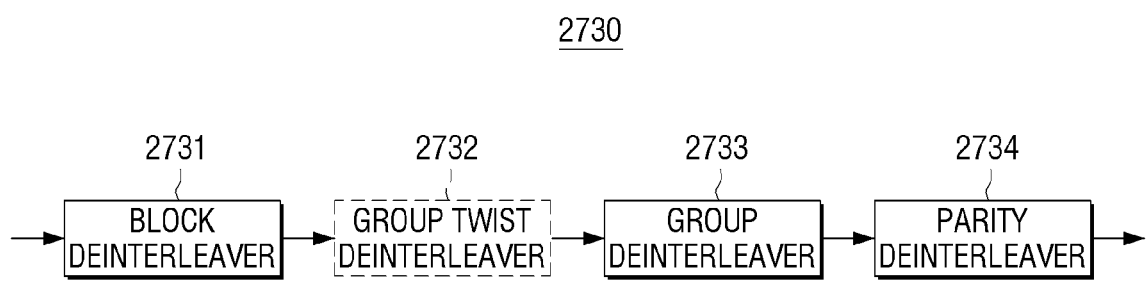
FIGS. 19 and 21 are block diagrams to illustrate a configuration of a deinterleaver according to exemplary embodiments.
Figure 21:
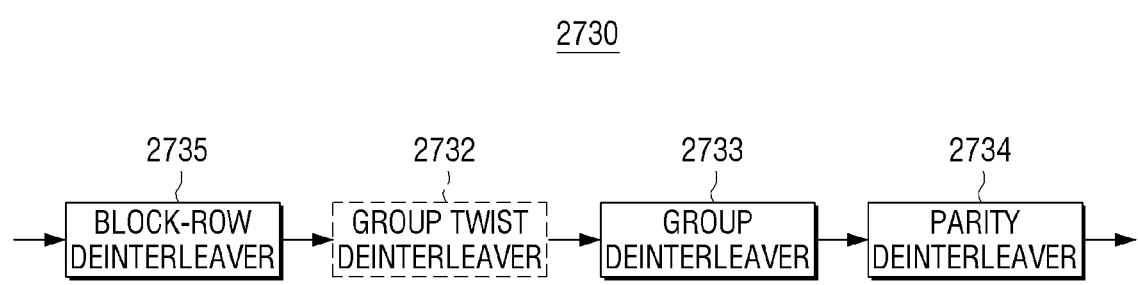

In this case, the deinterleaver 2730 may include elements as shown in FIG. 19 or 21.

First, as shown in FIG. 19, the deinterleaver 2730 may include a block deinterleaver 2731, a group twist deinterleaver 2732, a group deinterleaver 2733, and a parity deinterleaver 2734.

The block deinterleaver 2731 deinterleaves the output of the multiplexer 2720 and outputs the value to the group twist deinterleaver 2732.

Specifically, the block deinterleaver 2731 is an element corresponding to the block interleaver 124 provided in the transmitting apparatus 100 and performs the interleaving operation of the block interleaver 124 inversely.

That is, the block deinterleaver 2731 may deinterleave by using at least one row formed of a plurality of columns, that is, by writing the LLR value output from the multiplexer 2720 in each row in the row direction and reading each column of the plurality of rows in which the LLR value is written in the column direction.

In this case, when the block interleaver 124 interleaves by dividing a column into two parts, the block deinterleaver 2731 may deinterleave by dividing a row into two parts.

In addition, when the block interleaver 124 performs writing and reading with respect to a bit group which does not belong to the first part in the row direction, the block deinterleaver 2731 may deinterleave by writing and reading a value corresponding to the group which does not belong to the first part in the row direction.

Figure 20:
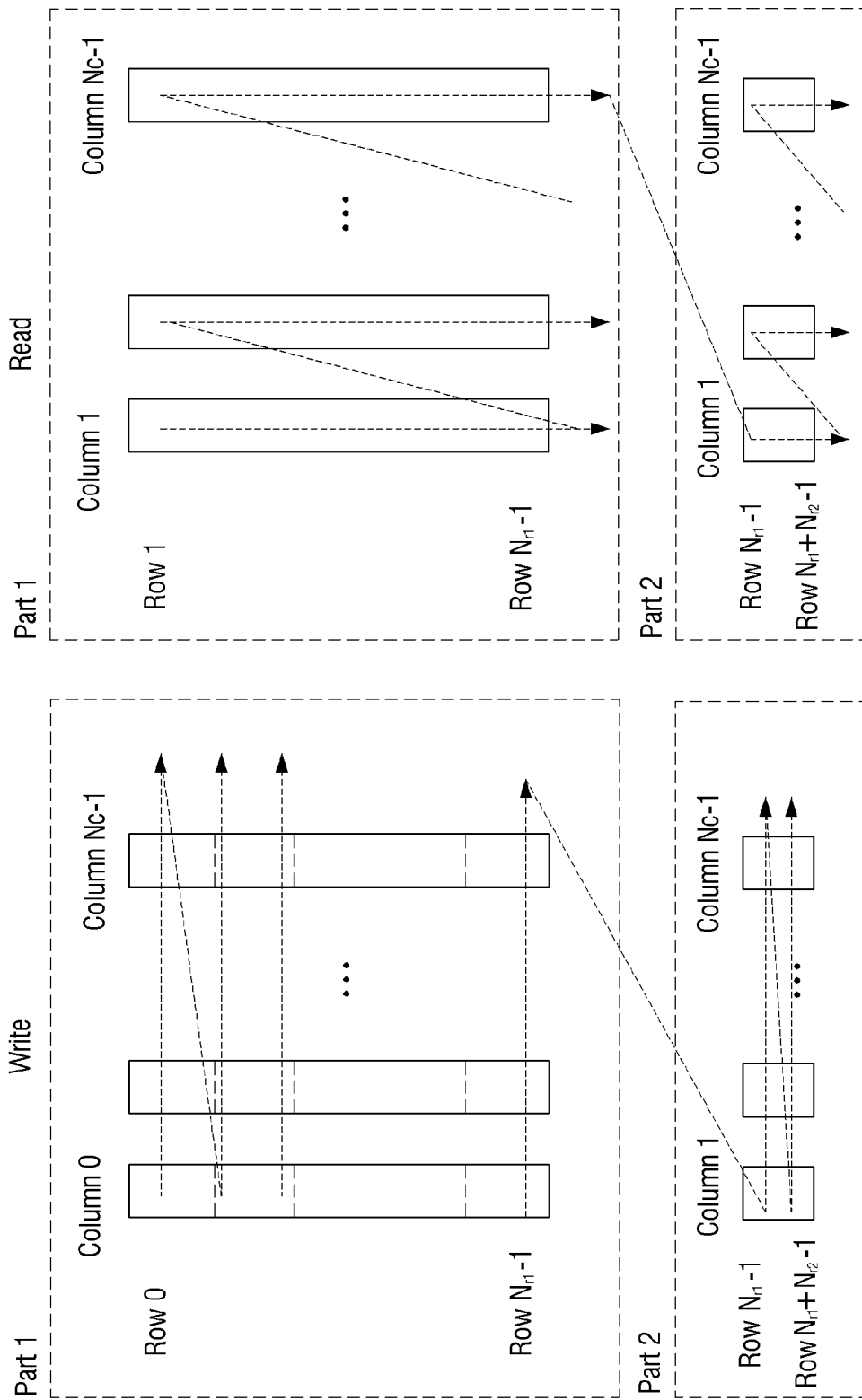
FIG. 20 is a view to illustrate a deinterleaving method of a block deinterleaver according to an exemplary embodiment.

Hereinafter, the block deinterleaver 2731 will be explained with reference to FIG. 20. However, this is merely an example and the block deinterleaver 2731 may be implemented in other methods.

An input LLR $v_i$ ($0 \le i < N_{ldpc}$) is written in a $r_i$ row and a $c_i$ column of the block deinterleaver 2431. Herein, $c_i = (i \mod N_c)$ and $$r_i = \left\lfloor \frac{i}{N_c} \right\rfloor,$$

On the other hand, an output LLR $q_i$ ($0 \le i < N_c \times N_{r1}$) is read from a $c_i$ column and a $r_i$ row of the first part of the block deinterleaver 2431. Herein, $$c_i = \left\lfloor \frac{i}{N_{r1}} \right\rfloor,$$

$r_i = (i \mod N_{r1})$.

In addition, an output LLR $q_i$ ($N_c \times N_{r1} \le i < N_{ldpc}$) is read from a $c_i$ column and a $r_i$ row of the second part. Herein, $$c_i = \left\lfloor \frac{(i - N_c \times N_{r1})}{N_{r2}} \right\rfloor,$$

$r_i = N_{r1} + \{(i - N_c \times N_{r1}) \mod N_{r2}\}$.

The group twist deinterleaver 2732 deinterleaves the output value of the block deinterleaver 2731 and outputs the value to the group deinterleaver 2733.

Specifically, the group twist deinterleaver 2732 is an element corresponding to the group twist interleaver 123 provided in the transmitting apparatus 100, and may perform the interleaving operation of the group twist interleaver 123 inversely.

That is, the group twist deinterleaver 2732 may rearrange the LLR values of the same group by changing the order of the LLR values existing in the same group. When the group twist operation is not performed in the transmitting apparatus 100, the group twist deinterleaver 2732 may be omitted.

The group deinterleaver 2733 (or the group-wise deinterleaver) deinterleaves the output value of the group twist deinterleaver 2732 and outputs the value to the parity deinterleaver 2734.

Specifically, the group deinterleaver 2733 is an element corresponding to the group interleaver 122 provided in the transmitting apparatus 100 and may perform the interleaving operation of the group interleaver 122 inversely.

That is, the group deinterleaver 2733 may rearrange the order of the plurality of bit groups in bits group wise. In this case, the group deinterleaver 2733 may rearrange the order of the plurality of bit groups in bits group wise by applying the interleaving method of Tables 9 to 20 inversely according to a length of the LDPC codeword, a modulation method and a code rate.

The parity deinterleaver 2734 performs parity deinterleaving with respect to the output value of the group deinterleaver 2733 and outputs the value to the decoder 2740.

Specifically, the parity deinterleaver 2734 is an element corresponding to the parity interleaver 121 provided in the transmitting apparatus 100 and may perform the interleaving operation of the parity interleaver 121 inversely. That is, the parity deinterleaver 2734 may deinterleave the LLR values corresponding to the parity bits from among the LLR values output from the group deinterleaver 2733. In this case, the parity deinterleaver 2734 may deinterleave the LLR values corresponding to the parity bits in an inverse method of the parity interleaving method of Equation 8.

However, the parity deinterleaver 2734 may be omitted according to the decoding method and implementation of the decoder 2740.

The deinterleaver 2730 may include a block-row deinterleaver 2735, a group twist deinterleaver 2732, a group deinterleaver 2733 and a parity deinterleaver 2734, as shown in FIG. 21. In this case, the group twist deinterleaver 2732 and the parity deinterleaver 2734 perform the same functions as in FIG. 19, and thus, a redundant explanation is omitted.

The block-row deinterleaver 2735 deinterleaves the output value of the multiplexer 2720 and outputs the value to the group twist deinterleaver 2732.

Specifically, the block-row deinterleaver 2735 is an element corresponding to the block-row interleaver 125 provided in the transmitting apparatus 100 and may perform the interleaving operation of the block-row interleaver 125 inversely.

That is, the block-row deinterleaver 2735 may deinterleave by using at least one column formed of a plurality of rows, that is, by writing the LLR values output from the multiplexer 2720 in each column in the column direction and reading each row of the plurality of columns in which the LLR value is written in the column direction.

However, when the block-row interleaver 125 performs writing and reading with respect to a bit group which does not belong to the first part in the column direction, the block-row deinterleaver 2735 may deinterleave by writing and reading a value corresponding to the bit group which does not belong to the first part in the column direction.

The group deinterleaver 2733 deinterleaves the output value of the group twist deinterleaver 2732 and outputs the value to the parity deinterleaver 2734.

Specifically, the group deinterleaver 2733 is an element corresponding to the group interleaver 122 provided in the transmitting apparatus 100 and may perform the interleaving operation of the group interleaver 122 inversely.

That is, the group deinterleaver 2733 may rearrange the order of the plurality of bit groups in bit group wise. In this case, the group deinterleaver 2733 may rearrange the order of the plurality of bit groups in bits group wise by applying the interleaving method of Tables 29 to 40 inversely according to a length of the LDPC codeword, a modulation method and a code rate.

Although the deinterleaver 2730 of FIG. 18 includes three (3) or four (4) elements as shown in FIG. 19 or 21, operations of the elements may be performed by a single element. For example, when bits each of which belongs to each of bit groups $X_a$, $X_b$, $X_c$, $X_d$, $X_e$, $X_f$, $X_g$, $X_h$, $X_i$, $X_j$ constitute a single modulation symbol, the deinterleaver 2730 may deinterleave these bits to locations corresponding to their bit groups based on the received single modulation symbol.

For example, when the code rate is 6/15 and the modulation method is 1024-QAM, the group deinterleaver 2733 may perform deinterleaving based on Table 9.

In this case, bits each of which belongs to each of bit groups $X_{66}$, $X_{59}$, $X_{22}$, $X_{15}$, $X_{106}$, $X_{97}$, $X_{74}$, $X_{88}$, $X_{132}$, $X_{134}$ constitute a single modulation symbol. Since one bit in each of the bit groups $X_{66}$, $X_{59}$, $X_{22}$, $X_{15}$, $X_{106}$, $X_{97}$, $X_{74}$, $X_{88}$, $X_{132}$, $X_{134}$ constitutes a single modulation symbol, the deinterleaver 2730 may map bits onto decoding initial values corresponding to the bit groups $X_{66}$, $X_{59}$, $X_{22}$, $X_{15}$, $X_{106}$, $X_{97}$, $X_{74}$, $X_{88}$, $X_{132}$, $X_{134}$ based on the received single modulation symbol.

The decoder 2740 may perform LDPC decoding by using the output value of the deinterleaver 2730. To achieve this, the decoder 2740 may include an LDPC decoder (not shown) to perform the LDPC decoding.

Specifically, the decoder 2740 is an element corresponding to the encoder 110 of the transmitting apparatus 100 and may correct an error by performing the LDPC decoding by using the LLR value output from the deinterleaver 2730.

For example, the decoder 2740 may perform the LDPC decoding in an iterative decoding method based on a sum-product algorithm. The sum-product algorithm is one example of a message passing algorithm, and the message passing algorithm refers to an algorithm which exchanges messages (e.g., LLR value) through an edge on a bipartite graph, calculates an output message from messages input to variable nodes or check nodes, and updates.

The decoder 2740 may use a parity check matrix when performing the LDPC decoding. In this case, an information word submatrix in the parity check matrix is defined as in Tables 4 to 20 according to a code rate and a length of the LDPC codeword, and a parity submatrix may have a dual diagonal configuration.

In addition, information on the parity check matrix and information on the code rate, etc. which are used in the LDPC decoding may be pre-stored in the receiving apparatus 2700 or may be provided by the transmitting apparatus 100.

Figure 22:
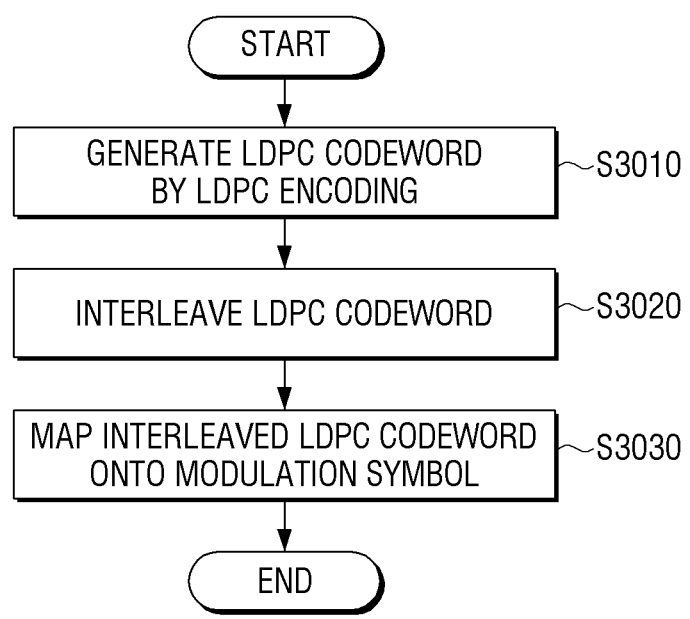
FIG. 22 is a flowchart to illustrate an interleaving method according to an exemplary embodiment.

FIG. 22 is a flowchart to illustrate an interleaving method of a transmitting apparatus according to an exemplary embodiment.

First, an LDPC codeword is generated by LDPC encoding based on a parity check matrix (S3010). In this case, in the LDPC encoding, a parity check matrix in which an information word submatrix is defined by Tables 4 to 8 and a parity submatrix has a dual diagonal configuration (that is, the parity check matrix of FIG. 2) may be used, or a parity check matrix which is row and column permutated from the parity check matrix of FIG. 2 based on Equations 4 and 5 (that is, the configuration of FIG. 3) may be used.

Thereafter, the LDPC codeword is interleaved (S3020).

Then, the interleaved LDPC codeword is mapped onto a modulation symbol (S3030). In this case, bits included in a predetermined number of bit groups from among the plurality of bit groups of the LDPC codeword may be mapped onto a predetermined bit of a modulation symbol.

In this case, each of the plurality of bit groups may be formed of M number of bits, and M may be a common divisor of $N_{ldpc}$ and $K_{ldpc}$ and may be determined to satisfy $Q_{ldpc} = (N_{ldpc} - K_{ldpc})/M$. Herein, $Q_{ldpc}$ is a cyclic shift parameter value regarding columns in a column group of an information word submatrix of the parity check matrix, $N_{ldpc}$ is a length of the LDPC codeword, and $K_{ldpc}$ is a length of information word bits of the LDPC codeword.

Operation S3020 may include interleaving parity bits of the LDPC codeword, dividing the parity-interleaved LDPC codeword by the plurality of bit groups and rearranging the order of the plurality of bit groups in bits group wise, and interleaving the plurality of bit groups the order of which has been rearranged.

Specifically, the order of the plurality of bit groups may be rearranged in bits group wise based on the above-described Equation 15 presented above. In Equation 15, π(j) is determined based on at least one of a length of the LDPC codeword, a modulation method, and a code rate.

For example, when the LDPC codeword has a length of 64800, the modulation method is 1024-QAM, and the code rate is 6/15, π(j) may be defined as in Table 9 presented above.

In another example, when the LDPC codeword has a length of 64800, the modulation method is 1024-QAM, and the code rate is 8/15, π(j) may be defined as in Table 10 presented above.

In another example, when the LDPC codeword has a length of 64800, the modulation method is 1024-QAM, and the code rate is 12/15, π(j) may be defined as in Table 13 presented above.

However, this is merely an example. π(j) may be defined as in Tables 11 or 12 described above.

In addition, Equation 16 may be used in rearranging the order of the plurality of bit groups in bits group wise. In this case, π(j) may be defined as in Tables 15 to 20 described above.

The plurality of bit groups the order of which has been rearranged may be interleaved by writing the plurality of bit groups in each of the plurality of columns in the column direction in bit group wise, and reading each row of the plurality of columns in which the plurality of bit groups are written in bits group wise in the row direction.

In this case, from among the plurality of bit groups, at least some bit group which can be written in each of the plurality of columns in bits group wise is written in each of the plurality of columns serially, and then, the other bit groups are divided and written in the other areas which remain in each of the plurality of columns after the at least some bit group has been written in bits group wise.

In operation S3020, the interleaving may be performed in other methods in addition to the above-described method.

Specifically, the interleaving may be performed by using Equation 17 and Tables 29 to 34 described above, or may be performed by using Equation 18 and Tables 35 to 40 described above.

In these cases, the order of the plurality of bit groups may be rearranged in bits group wise such that an arrangement unit, in which at least one bit groups including bits to be mapped onto the same modulation symbol is serially arranged in bits group units, is repeated.

When a plurality of bit groups are interleaved, the interleaving may be performed by writing, in each row, at least one bit group including bits to be mapped onto a same modulation symbol from among the plurality of bit groups the order of which has been rearranged, in the row direction, and reading each column of the row in which the at least one bit group is written in the column direction.

A non-transitory computer readable medium, which stores a program for performing the interleaving methods according to various exemplary embodiments in sequence, may be provided. The non-transitory computer readable medium refers to a medium that stores data semi-permanently rather than storing data for a very short time, such as a register, a cache, and a memory, and is readable by an apparatus. Specifically, the above-described various applications or programs may be stored in a non-transitory computer readable medium such as a compact disc (CD), a digital versatile disk (DVD), a hard disk, a Blu-ray disk, a universal serial bus (USB), a memory card, and a read only memory (ROM), and may be provided.

At least one of the components, elements or units represented by a block as illustrated in FIGS. 1, 4, 13, 14, 18, 19 and 21 may be embodied as various numbers of hardware, software and/or firmware structures that execute respective functions described above, according to an exemplary embodiment. For example, at least one of these components, elements or units may use a direct circuit structure, such as a memory, processing, logic, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions. Also, at least one of these components, elements or units may further include a processor such as a central processing unit (CPU) that performs the respective functions, a microprocessor, or the like. Two or more of these components, elements or units may be combined into one single component, element or unit which performs all operations or functions of the combined two or more components, elements of units. Further, although a bus is not illustrated in the above block diagrams, communication between the components, elements or units may be performed through the bus. Functional aspects of the above exemplary embodiments may be implemented in algorithms that execute on one or more processors. Furthermore, the components, elements or units represented by a block or processing steps may employ any number of related art techniques for electronics configuration, signal processing and/or control, data processing and the like.

Although a bus is not illustrated in the block diagrams of the transmitting apparatus and the receiving apparatus, communication may be performed between each element of each apparatus via the bus. In addition, each apparatus may further include a processor such as a Central Processing Unit (CPU) or a microprocessor to perform the above-described various operations.

The foregoing exemplary embodiments and advantages are merely exemplary and are not to be construed as limiting the present inventive concept. The exemplary embodiments can be readily applied to other types of apparatuses. Also, the description of the exemplary embodiments is intended to be illustrative, and not to limit the scope of the inventive concept, and many alternatives, modifications, and variations will be apparent to those skilled in the art.

What is claimed is:

1. A transmitting apparatus comprising:
a Low Density Parity Check (LDPC) encoder configured to encode input bits to generate parity bits according to a code rate of 6/15 and a code length of 64800;
an interleaver configured to interleave an LDPC codeword comprising the input bits and the parity bits; and
a mapper configured to modulate the interleaved LDPC codeword using 1024-QAM,
wherein the interleaver comprises:
a parity interleaver configured to interleave the parity bits; and
a group-wise interleaver configured to split an LDPC codeword including the interleaved parity bits into a plurality of bit groups, and interleave the plurality of bit groups using the following equation:

$$Y_j = X_{\pi(j)} \text{ for } (0 \le j < N_{group}),$$

where $X_j$ is a $j^{th}$ bit group among the plurality of bit groups, $Y_j$ is an interleaved $j^{th}$ bit group, $N_{group}$ is a total number of the plurality of bit groups, and $\pi(j)$ denotes a permutation order for group-wise interleaving,
wherein the $\pi(j)$ is defined as the table below:

| | Order of group-wise interleaving $\pi(j)$ ($0 \le j < 180$) | | | | | | | |
|---|---|---|---|---|---|---|---|---|
| Code Rate | | 0 | 1 | 2 | 3 | 4 | 5 | 6 | 7 |
| | | 23 | 24 | 25 | 26 | 27 | 28 | 29 | 30 |
| | | 46 | 47 | 48 | 49 | 50 | 51 | 52 | 53 |
| | | 69 | 70 | 71 | 72 | 73 | 74 | 75 | 76 |
| | | 92 | 93 | 94 | 95 | 96 | 97 | 98 | 99 |
| | | 115 | 116 | 117 | 118 | 119 | 120 | 121 | 122 |
| | | 138 | 139 | 140 | 141 | 142 | 143 | 144 | 145 |
| | | 161 | 162 | 163 | 164 | 165 | 166 | 167 | 168 |
| 6/15 | | 66 | 21 | 51 | 55 | 54 | 24 | 33 | 12 |
| | | 56 | 2 | 43 | 64 | 58 | 67 | 53 | 68 |
| | | 25 | 44 | 136 | 29 | 36 | 26 | 126 | 177 |
| | | 178 | 28 | 34 | 106 | 127 | 76 | 131 | 105 |
| | | 143 | 81 | 32 | 96 | 3 | 78 | 107 | 86 |
| | | 144 | 151 | 90 | 11 | 156 | 100 | 175 | 83 |
| | | 141 | 129 | 146 | 122 | 73 | 112 | 132 | 125 |
| | | 104 | 134 | 82 | 95 | 133 | 164 | 154 | 120 |

| | Order of group-wise interleaving $\pi(j)$ ($0 \le j < 180$) | | | | | | | |
|---|---|---|---|---|---|---|---|---|
| Code Rate | | 8 | 9 | 10 | 11 | 12 | 13 | 14 | 15 |
| | | 31 | 32 | 33 | 34 | 35 | 36 | 37 | 38 |
| | | 54 | 55 | 56 | 57 | 58 | 59 | 60 | 61 |
| | | 77 | 78 | 79 | 80 | 81 | 82 | 83 | 84 |
| | | 100 | 101 | 102 | 103 | 104 | 105 | 106 | 107 |
| | | 123 | 124 | 125 | 126 | 127 | 128 | 129 | 130 |
| | | 146 | 147 | 148 | 149 | 150 | 151 | 152 | 153 |
| | | 169 | 170 | 171 | 172 | 173 | 174 | 175 | 176 |

| | | | | -continued | | | | | |
|---|---|---|---|---|---|---|---|---|---|
| 6/15 | 70 | 63 | 47 | 65 | 145 | 8 | 0 | 57 | |
| | 61 | 39 | 52 | 69 | 1 | 22 | 31 | 161 | |
| | 15 | 37 | 148 | 9 | 13 | 45 | 46 | 152 | |
| | 138 | 75 | 130 | 101 | 167 | 117 | 173 | 113 | |
| | 98 | 16 | 162 | 150 | 111 | 158 | 172 | 139 | |
| | 155 | 159 | 128 | 88 | 87 | 93 | 103 | 94 | |
| | 174 | 169 | 168 | 79 | 84 | 118 | 179 | 147 | |
| | 110 | 170 | 114 | 153 | 72 | 109 | 171 | 176 | |

| | | | Order of group-wise interleaving $\pi(j)$ $(0 \leq j < 180)$ | | | | | |
|---|---|---|---|---|---|---|---|---|
| | Code | 16 | 17 | 18 | 19 | 20 | 21 | 22 |
| | Rate | 39 | 40 | 41 | 42 | 43 | 44 | 45 |
| | | 62 | 63 | 64 | 65 | 66 | 67 | 68 |
| | | 85 | 86 | 87 | 88 | 89 | 90 | 91 |
| | | 108 | 109 | 110 | 111 | 112 | 113 | 114 |
| | | 131 | 132 | 133 | 134 | 135 | 136 | 137 |
| | | 154 | 155 | 156 | 157 | 158 | 159 | 160 |
| | | 177 | 178 | 179 | | | | |
| | 6/15 | 23 | 71 | 59 | 14 | 40 | 42 | 62 |
| | | 38 | 30 | 19 | 17 | 18 | 4 | 41 |
| | | 50 | 49 | 27 | 77 | 60 | 35 | 48 |
| | | 108 | 92 | 135 | 124 | 121 | 97 | 149 |
| | | 74 | 142 | 166 | 7 | 5 | 119 | 20 |
| | | 140 | 165 | 6 | 137 | 157 | 10 | 85 |
| | | 91 | 160 | 163 | 115 | 89 | 80 | 102 |
| | | 99 | 116 | 123. | | | | |

2. The transmitting apparatus of claim 1, wherein each of the plurality of bit groups comprises 360 bits.

3. The transmitting apparatus of claim 1, wherein $\pi(j)$ is determined based on at least one of the code length, a modulation method and the code rate.

* * * * *